United States Patent
Apen et al.

(10) Patent No.: US 6,998,178 B2
(45) Date of Patent: Feb. 14, 2006

(54) ORGANIC COMPOSITIONS

(75) Inventors: Paul G. Apen, San Jose, CA (US);
William B. Bedwell, San Jose, CA (US); Nancy Iwamoto, San Diego, CA (US); Boris A. Korolev, San Jose, CA (US); Kreisler S. Lau, Sunnyvale, CA (US); Bo Li, San Jose, CA (US); Ananth Naman, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 118 days.

(21) Appl. No.: 10/404,644

(22) Filed: Apr. 2, 2003

(65) Prior Publication Data

US 2004/0002573 A1 Jan. 1, 2004

Related U.S. Application Data

(63) Continuation-in-part of application No. 10/160,773, filed on May 30, 2002.

(51) Int. Cl.
*B32B 9/04* (2006.01)

(52) U.S. Cl. .................. 428/447; 528/396; 528/397; 525/50

(58) Field of Classification Search .............. 428/447; 525/50; 528/396, 397
See application file for complete search history.

(56) References Cited

U.S. PATENT DOCUMENTS 5,347,063 A * 9/1994 Shen et al. ............. 585/352

6,552,143 B1 * 4/2003 Funaki et al. ............. 526/271

FOREIGN PATENT DOCUMENTS

JP           2000100808 A   *  4/2000

* cited by examiner

*Primary Examiner*—Margaret G. Moore
*Assistant Examiner*—Marc S. Zimmer
(74) *Attorney, Agent, or Firm*—Bingham McCutchen, LLP; Sandra P. Thompson

(57) ABSTRACT

The present invention provides a composition comprising:
(a) thermosetting component comprising (1) optionally at least one monomer of Formula I as set forth below and (2) at least one oligomer or polymer of Formula II set forth below where E is a cage compound (defined below); each Q is the same or different and selected from hydrogen, aryl, branched aryl, and substituted aryl wherein the substituents include hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl; $G_w$ is aryl or substituted aryl where substituents include halogen and alkyl; h is from 0 to 10; i is from 0 to 10; j is from 0 to 10; and w is 0 or 1;

adhesion promoter comprising compound having least bifunctionality wherein the bifunctionality may be the same or different and the first functionality is capable of interacting with the thermosetting component (a) and the second functionality is capable of interacting with a substrate when the composition is applied to the substrate. The present compositions may be used as a dielectric substrate material, etch stop, hardmask, or air bridge in microchips, multichip modules, laminated circuit boards, or printed wiring boards. The present composition may also be used as a passive coating for enveloping a completed wafer.

54 Claims, 5 Drawing Sheets

+
FIGURE 1 Products 1,3,5,7-tetrakis[3'/4'-(phenylethynyl)phenyl]adamantane 1,3/4-bis{1',3',5'-tris[3"/4"-(phenylethynyl)phenyl]adamant-7'-yl}benzene 1,3-bis{3'/4'-[1",3",5"-tris[3"",4""-(phenylethynyl)phenyl]adamant-7"-yl]phenyl}-5,7-bis(3"",4""-(phenylethynyl)phenyl]adamantane 2,4,9,11-tetrakis(3'/4'-bromophenyl)diamantane
+
FIGURE 4 Products 2,4,9,11-tetrakis[3'/4'-(phenylethynyl)phenyl]diamantane 1,3/4-bis{2',4',9'-tris[3",4"-(phenylethynyl) phenyl]diamant-11'-yl}benzene 2,4-bis{3'/4'-[2",4",9"-tris[3'''/4'''-(phenylethynyl)phenyl]diamant-11"-yl]phenyl}-9,11-bis(3''''/4''''-(phenylethynyl)phenyl]diamantane

ORGANIC COMPOSITIONS

BENEFIT OF PENDING APPLICATIONS

This application is a continuation-in-part of pending 10/160,773 filed May 30, 2002.

FIELD OF THE INVENTION

The present invention relates to semiconductor devices, and in particular, to semiconductor devices having an organic low dielectric constant material and processes for the manufacture thereof.

BACKGROUND OF THE INVENTION

In an effort to increase the performance and speed of semiconductor devices, semiconductor device manufacturers have sought to reduce the linewidth and spacing of interconnects while minimizing the transmission losses and reducing the capacitative coupling of the interconnects. One way to diminish power consumption and reduce capacitance is by decreasing the dielectric constant (also referred to as "k") of the insulating material, or dielectric, that separates the interconnects. Insulator materials having low dielectric constants are especially desirable, because they typically allow faster signal propagation, reduce capacitance and cross talk between conductor lines, and lower voltages required to drive integrated circuits.

Since air has a dielectric constant of 1.0, a major goal is to reduce the dielectric constant of insulator materials down to a theoretical limit of 1.0, and several methods are known in the art for reducing the dielectric constant of insulating materials. These techniques include adding elements such as fluorine to the composition to reduce the dielectric constant of the bulk material. Other methods to reduce k include use of alternative dielectric material matrices.

Therefore, as interconnect linewidths decrease, concomitant decreases in the dielectric constant of the insulating material are required to achieve the improved performance and speed desired of future semiconductor devices. For example, devices having interconnect linewidths of 0.13 or 0.10 micron and below seek an insulating material having a dielectric constant (k) <3.

Currently silicon dioxide ($SiO_2$) and modified versions of $SiO_2$, such as fluorinated silicon dioxide or fluorinated silicon glass (hereinafter FSG) are used. These oxides, which have a dielectric constant ranging from about 3.5–4.0, are commonly used as the dielectric in semiconductor devices. While $SiO_2$ and FSG have the mechanical and thermal stability needed to withstand the thermal cycling and processing steps of semiconductor device manufacturing, materials having a lower dielectric constant are desired in the industry.

Methods used to deposit dielectric materials may be divided into two categories: spin-on deposition (hereinafter SOD) and chemical vapor deposition (hereinafter CVD). Several efforts to develop lower dielectric constant materials include altering the chemical composition (organic, inorganic, blend of organic/inorganic) or changing the dielectric matrix (porous, non-porous). Table I summarizes the development of several materials having dielectric constants ranging from 2.0 to 3.5. (PE=plasma enhanced; HDP= high-density plasma) However, the dielectric materials and matrices disclosed in the publications shown in Table 1 fail to exhibit many of the combined physical and chemical properties desirable and even necessary for effective dielectric materials, such as higher mechanical stability, high thermal stability, high glass transition temperature, high modulus or hardness, while at the same time still being able to be solvated, spun, or deposited on to a substrate, wafer, or other surface. Therefore, it may be useful to investigate other compounds and materials that may be used as dielectric materials and layers, even though these compounds or materials may not be currently contemplated as dielectric materials in their present form.

TABLE I

| MATERIAL | DEPOSITION METHOD | DIELECTRIC CONSTANT (k) | REFERENCE |
|---|---|---|---|
| Fluorinated silicon oxide (SiOF) | PE-CVD; HDP-CVD | 3.3–3.5 | U.S. Pat. No. 6,278,174 |
| Hydrogen Silsesquioxane (HSQ) | SOD | 2.0–2.5 | U.S. Pat. Nos. 4,756,977; 5,370,903; and 5,486,564; International Patent Publication WO 00/40637; E.S. Moyer et al., "Ultra Low k Silsesquioxane Based Resins", Concepts and Needs for Low Dielectric Constant <0.15 µm Interconnect Materials: Now and the Next Millennium, Sponsored by the American Chemical Society, pages 128–146 (Nov. 14–17, 1999) |
| Methyl Silsesquioxane (MSQ) | SOD | 2.4–2.7 | U.S. Pat. No. 6,143,855 |
| Polyorganosilicon | SOD | 2.5–2.6 | U.S. Pat. No. 6,225,238 |
| Fluorinated Amorphous Carbon (a-C:F) | HDP-CVD | 2.3 | U.S. Pat. No. 5,900,290 |
| Benzocyclobutene (BCB) | SOD | 2.4–2.7 | U.S. Pat. No. 5,225,586 |
| Polyarylene Ether (PAE) | SOD | 2.4 | U.S. Pat. Nos. 5,986,045; 5,874,516; and 5,658,994 |
| Parylene (N and F) | CVD | 2.4 | U.S. Pat. No. 5,268,202 |
| Polyphenylenes | SOD | 2.6 | U.S Pat. Nos. 5,965,679 and 6,288,188B1; and Waeterloos et al., "Integration Feasibility of |

TABLE I-continued

| MATERIAL | DEPOSITION METHOD | DIELECTRIC CONSTANT (k) | REFERENCE |
|---|---|---|---|
| | | | Porous SiLK Semiconductor Dielectric", Proc. Of the 2001 International Interconnect Tech. Conf., pp. 253–254 (2001). |
| Organosilsesquioxane | CVD, SOD | <3.9 | WO 01/29052 |
| Fluorosilsesquioxane | CVD, SOD | <3.9 | WO 01/29141 |

Unfortunately, numerous organic SOD systems under development with a dielectric constant between 2.0 and 3.5 suffer from certain drawbacks in terms of mechanical and thermal properties as described above; therefore a need exists in the industry to develop improved processing and performance for dielectric films in this dielectric constant range.

Reichert and Mathias describe compounds and monomers that comprise adamantane molecules, which are in the class of cage-based molecules and are taught to be useful as diamond substitutes. (Polym, Prepr. (Am. Chem. Soc., Div. Polym. Chem.), 1993, Vol. 34 (1), pp. 495–6; Polym, Prepr. (Am. Chem. Soc., Div. Polym. Chem.), 1992, Vol. 33 (2), pp. 144–5; Chem. Mater., 1993, Vol. 5 (1), pp. 4–5; Macromolecules, 1994, Vol. 27 (24), pp. 7030–7034; Macromolecules, 1994, Vol. 27 (24), pp. 7015–7023; Polym, Prepr. (Am. Chem. Soc., Div. Polym. Chem.), 1995, Vol. 36 (1), pp. 741–742; 205th ACS National Meeting, Conference Program, 1993, pp. 312; Macromolecules, 1994, Vol. 27 (24), pp. 7024–9; Macromolecules, 1992, Vol. 25 (9), pp. 2294–306; Macromolecules, 1991, Vol. 24 (18), pp. 5232–3; Veronica R. Reichert, PhD Dissertation, 1994, Vol. 55-06B; ACS Symp. Ser.: Step-Growth Polymers for High-Performance Materials, 1996, Vol. 624, pp. 197–207; Macromolecules, 2000, Vol. 33 (10), pp. 3855–3859; Polym, Prepr. (Am. Chem. Soc., Div. Polym. Chem.), 1999, Vol. 40 (2), pp. 620–621; Polym, Prepr. (Am. Chem. Soc., Div. Polym. Chem.), 1999, Vol. 40 (2), pp. 577–78; Macromolecules, 1997, Vol. 30 (19), pp. 5970–5975; J. Polym. Sci, Part A: Polymer Chemistry, 1997, Vol. 35 (9), pp. 1743–1751; Polym, Prepr. (Am. Chem. Soc., Div. Polym. Chem.), 1996, Vol. 37 (2), pp. 243–244; Polym, Prepr. (Am. Chem. Soc., Div. Polym. Chem.), 1996, Vol. 37 (1), pp. 551–552; J. Polym. Sci., Part A: Polymer Chemistry, 1996, Vol. 34 (3), pp. 397–402; Polym, Prepr. (Am. Chem. Soc., Div. Polym. Chem.), 1995, Vol. 36 (2), pp. 140–141; Polym, Prepr. (Am. Chem. Soc., Div. Polym. Chem.), 1992, Vol. 33 (2), pp. 146–147; J. Appl. Polym. Sci., 1998, Vol. 68 (3), pp. 475–482). The adamantane-based compounds and monomers described by Reichert and Mathias are preferably used to form polymers with adamantane molecules at the core of a thermoset. The compounds disclosed by Reichert and Mathias in their studies, however, comprise only one isomer of the adamantane-based compound by design choice. Structure A shows this symmetrical para-isomer 1,3,5,7-tetrakis[4'-(phenylethynyl)phenyl]adamantane:

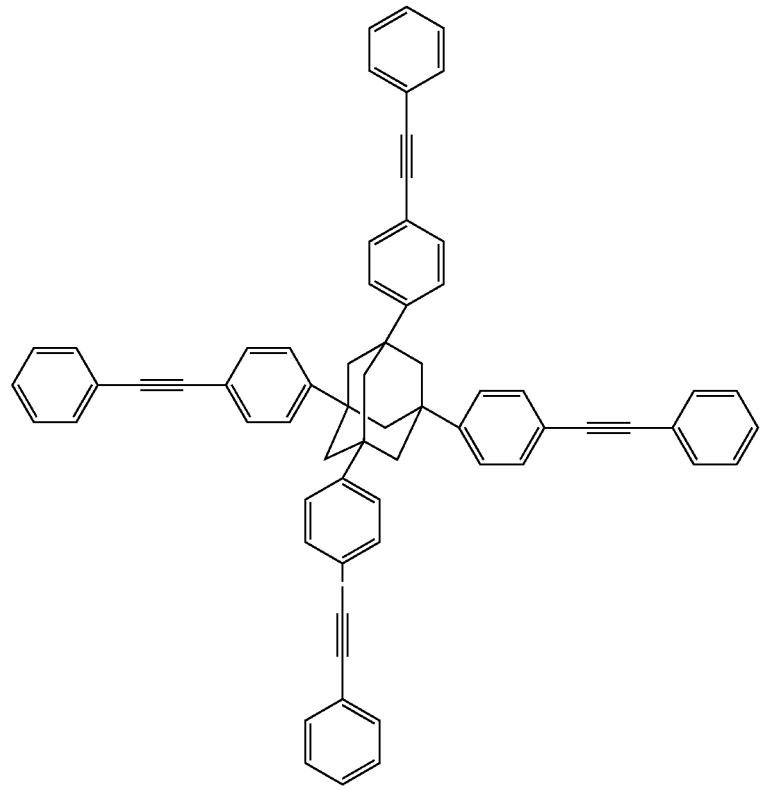

Structure A

In other words, Reichert and Mathias in their individual and joint work contemplated a useful polymer comprising only one isomer form of the target adamantane-based monomer. A significant problem exists, however, when forming and processing polymers from the single isomer form (symmetrical "all-para" isomer) 1,3,5,7-tetrakis[4'-(phenylethynyl)phenyl]adamantane of the adamantane-based monomer. According to the Reichert dissertation (supra) and *Macromolecules*, vol. 27, (pp. 7015–7034) (supra), the symmetrical all-para isomer 1,3,5,7-tetrakis[4'(phenylethynyl)phenyl]adamantane "was found to be soluble enough in chloroform that a $^1$H NMR spectrum could be obtained. However, acquisition times were found to be impractical for obtaining a solution $^{13}$C NMR spectrum." indicating that the all para isomer has low solubility. Thus, the Reichert symmetrical "all-para" isomer 1,3,5,7-tetrakis [4'(phenylethynyl)phenyl]adamantane is insoluble in standard organic solvents and therefore, would not be useful in any application requiring solubility or solvent-based processing, such as flow coating, spin coating, or dip coating.

In our commonly assigned pending patent application PCT/US01/22204 filed Oct. 17, 2001 (claiming the benefit of our commonly assigned pending patent applications U.S. Ser. No. 09/545058 filed Apr. 7, 2000; U.S. Ser. No. 09/618945 filed Jul. 19, 2000; U.S. Ser. No. 09/897936 filed Jul. 5, 2001; U.S. Ser. No. 09/902924 filed Jul. 10, 2001; and International Publication WO 01/78110 published Oct. 18, 2001), we discovered a composition comprising an isomeric thermosetting monomer or dimer mixture, wherein the mixture comprises at least one monomer or dimer having the structure correspondingly

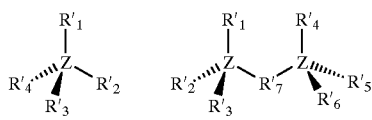

wherein Z is selected from cage compound and silicon atom; $R'_1$, $R'_2$, $R'_3$, $R'_4$, $R'_5$, and $R'_6$ are independently selected from aryl, branched aryl, and arylene ether; at least one of the aryl, the branched aryl, and the arylene ether has an ethynyl group; and $R'_7$ is aryl or substituted aryl. We also disclose methods for formation of these thermosetting mixtures. This novel isomeric thermosetting monomer or dimer mixture is useful as a dielectric material in microelectronics applications and soluble in many solvents such as cyclohexanone. These desirable properties make this isomeric thermosetting monomer or dimer mixture ideal for film formation at thicknesses of about 0.1 μm to about 1.0 μm.

Although various methods are known in the art to lower the dielectric constant of a material, these methods have disadvantages. Thus, there is still a need in the semiconductor industry to a) provide improved compositions and methods to lower the dielectric constant of dielectric layers; b) provide dielectric materials with improved mechanical properties, such as thermal stability, glass transition temperature ($T_g$), and hardness; and c) produce thermosetting compounds and dielectric materials that are capable of being solvated and spun-on to a wafer or layered material.

SUMMARY OF THE INVENTION

In response to the need in the art, we developed the following compositions. In a first embodiment, the composition comprises:

(a) thermosetting component comprising (1) optionally at least one monomer of Formula I

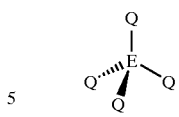

and (2) at least one oligomer or polymer of Formula II

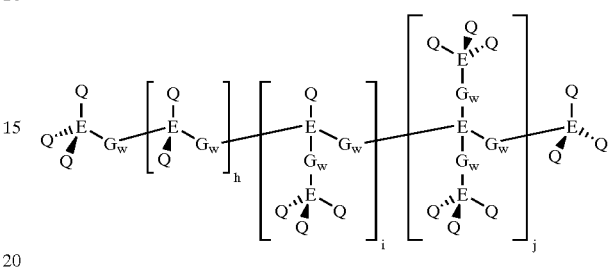

where E is a cage compound (defined below); each Q is the same or different and selected from hydrogen, aryl, branched aryl, and substituted aryl wherein the substituents include hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl; $G_w$ is aryl or substituted aryl where substituents include halogen and alkyl; h is from 0 to 10; i is from 0 to 10; j is from 0 to 10; and w is 0 or 1;

(b) adhesion promoter comprising compound having at least bifunctionality wherein the bifunctionality may be the same or different and the first functionality is capable of interacting with the thermosetting component (a) and the second functionality is capable of interacting with a substrate when the composition is applied to the substrate.

It is understood that when w is 0 in Formula II, two cage compounds are directly bonded. For each E having at least one Q attached thereto, preferably that E does not have more than one Q that is hydrogen and more preferably, that E has no Q that is hydrogen. When Q is substituted aryl, more preferably the aryl is substituted with alkenyl and alkynyl groups. The most preferred Q groups include (phenylethynyl)phenyl, bis(phenylethynyl)phenyl, phenylethynyl(phenylethynyl)phenyl, and (phenylethynyl) phenylphenyl moiety. Preferred aryls for G include phenyl, biphenyl, and terphenyl. The more preferred G group is phenyl. Preferably, w is one.

Preferably, the thermosetting component (a) comprises (1) at least one adamantane monomer of Formula III

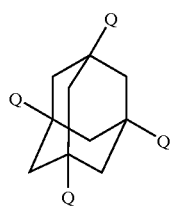

and (2) at least one oligomer or polymer of adamantane of Formula IV

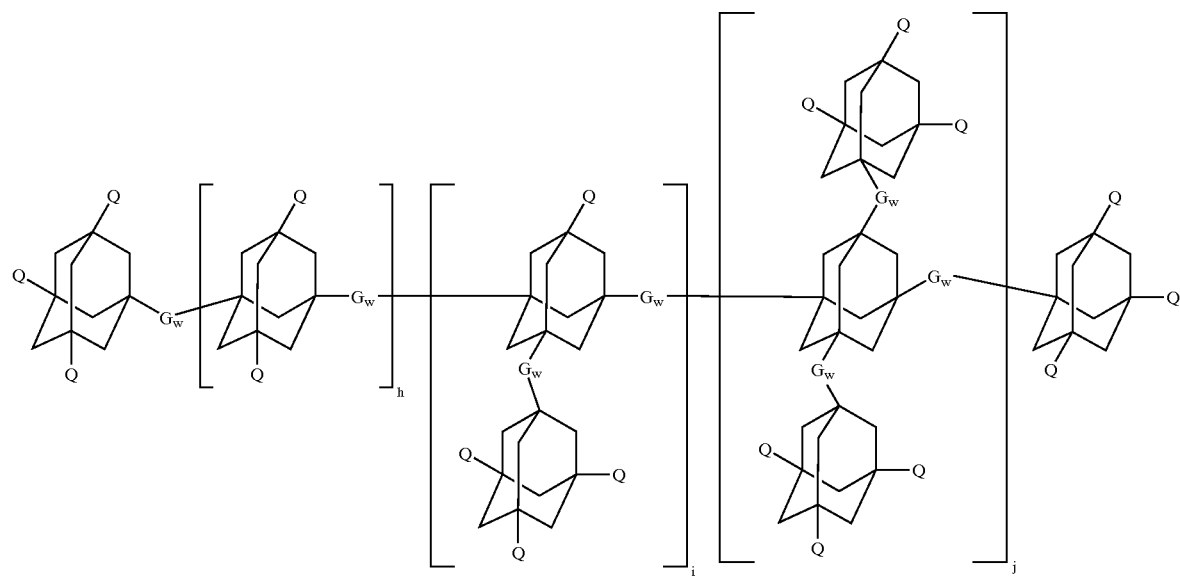
or (1) at least one diamantane monomer of Formula V
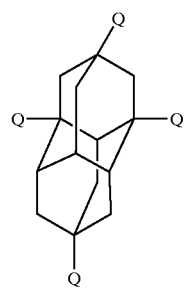
and (2) at least one oligomer or polymer of diamantane monomer of Formula VI
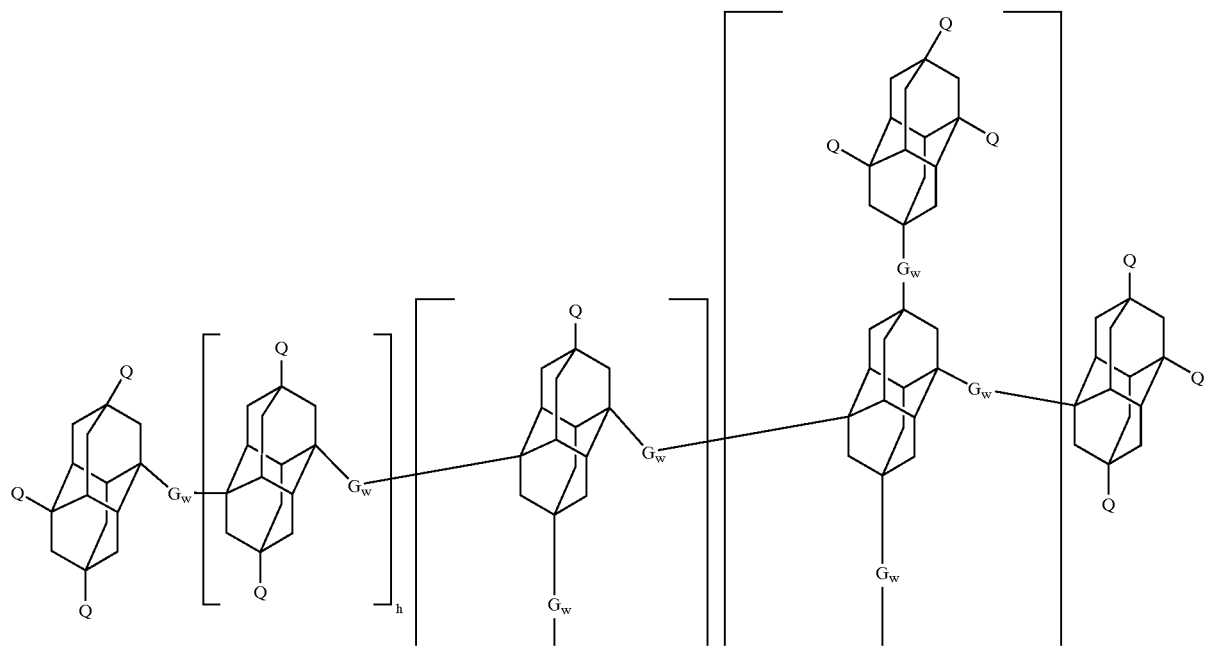

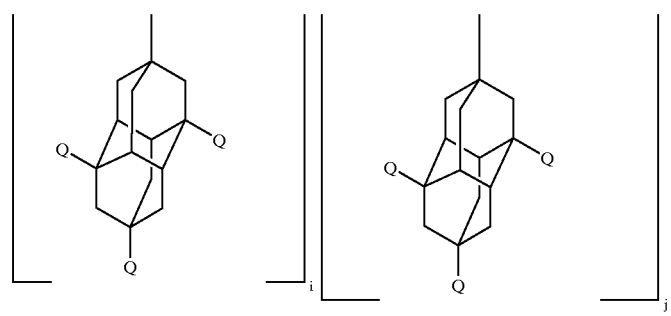
Where Q, $G_w$, h, i, j, and w are as previously defined.
Preferably, the thermosetting component (a) comprises:
(1) adamantane monomer of Formula VIIA
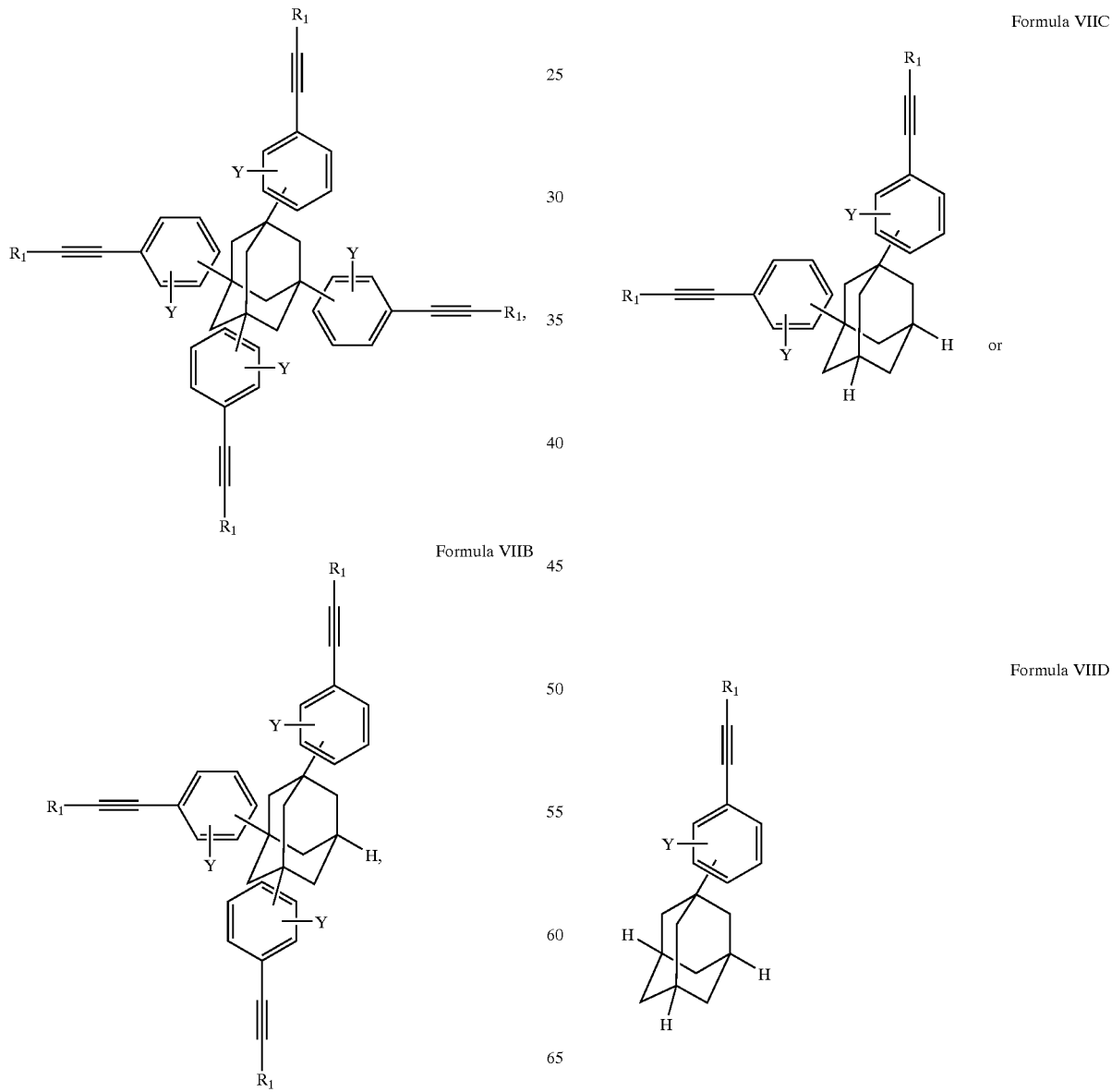
and (2) at least one oligomer or polymer of Formula VIII 11 12
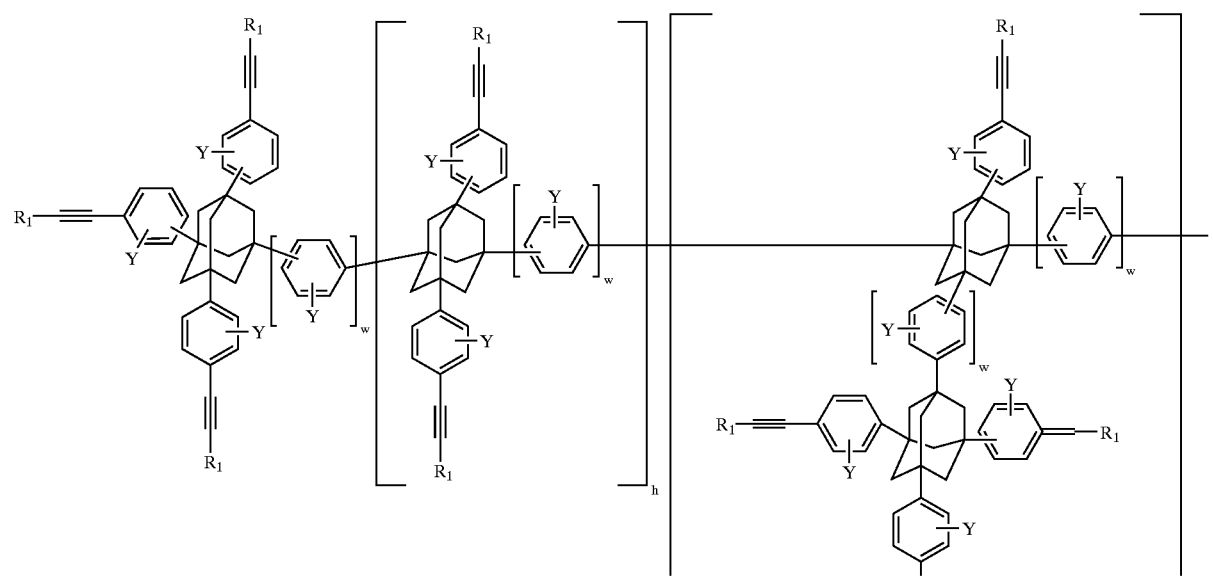
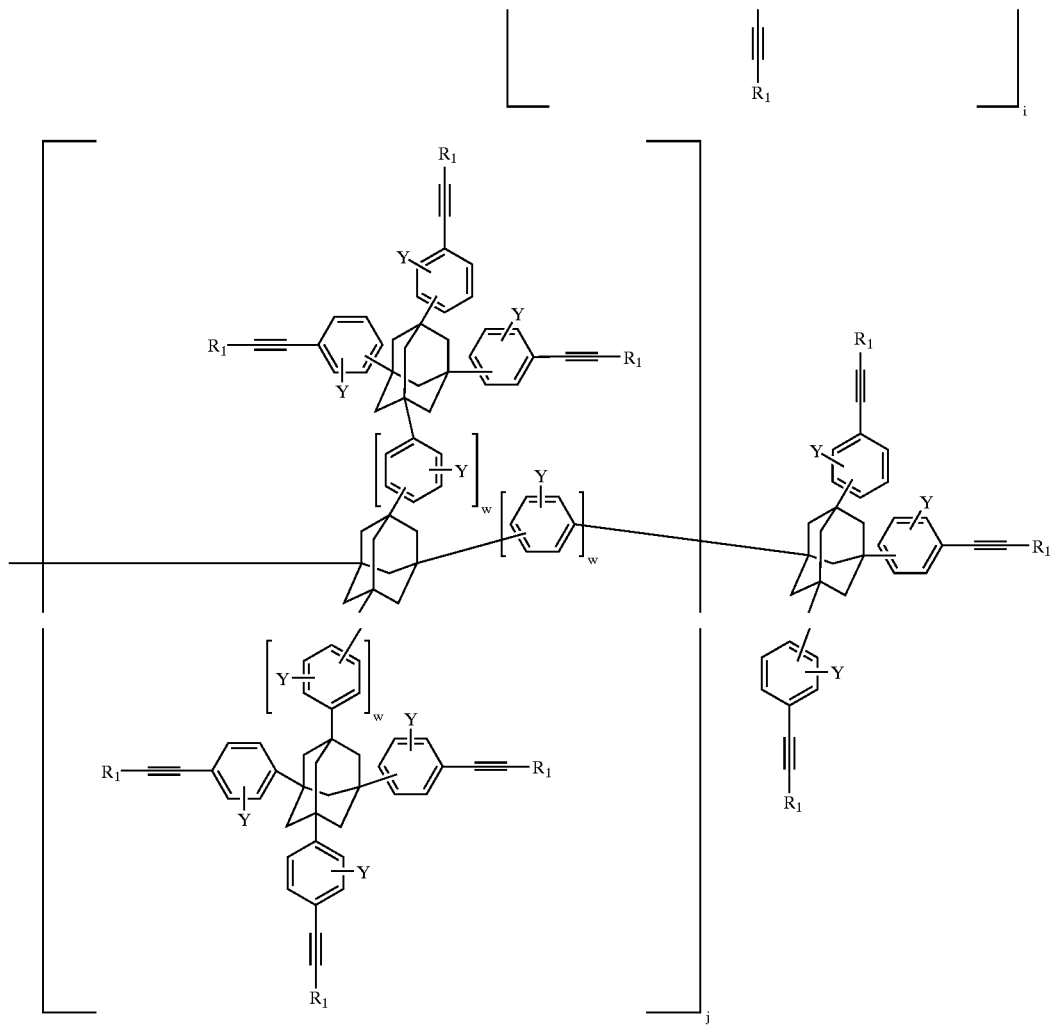

or preferably, at least one adamantane oligomer or polymer of the following formula
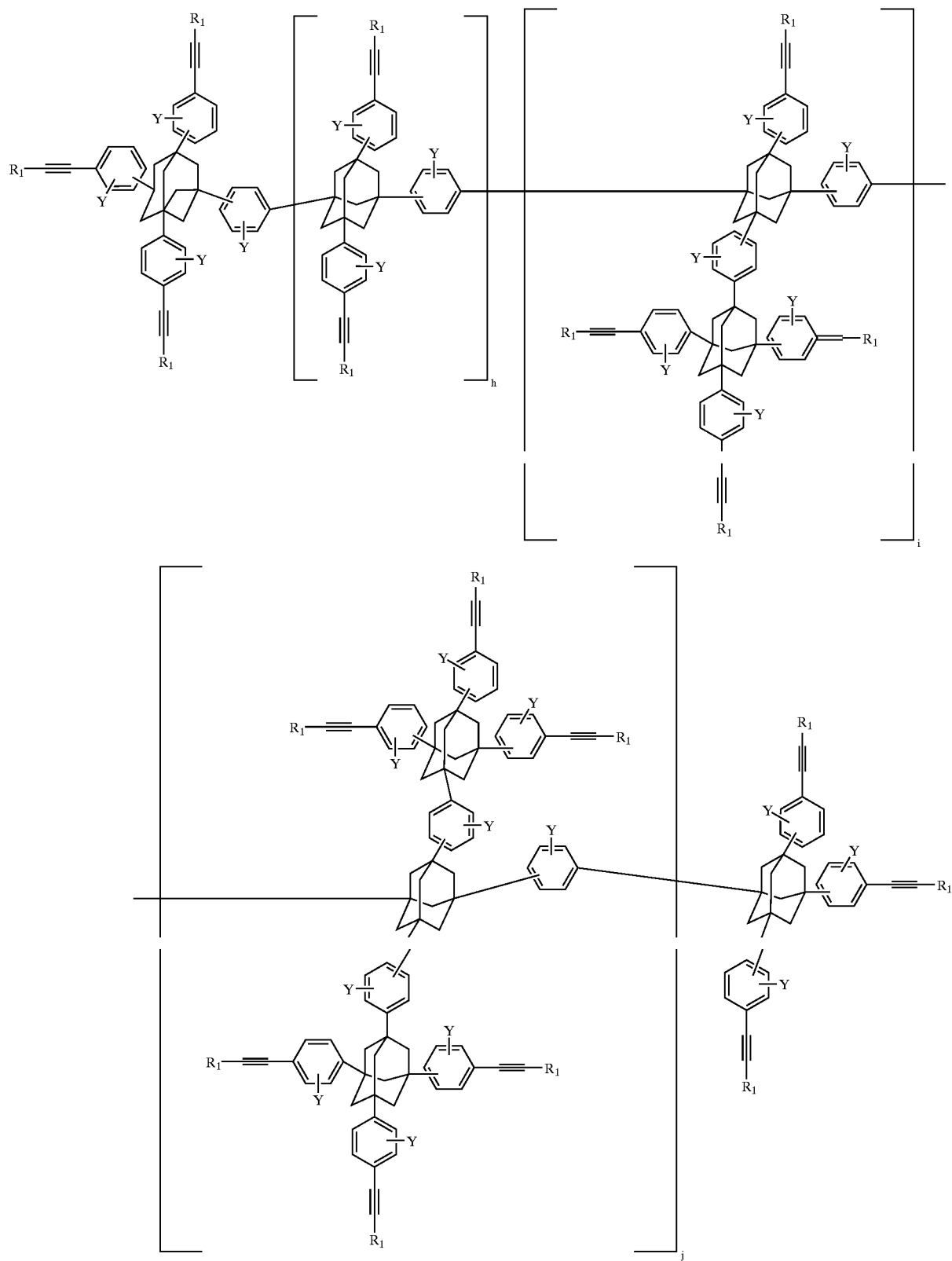

or (1) diamantane monomer of Formula IXA
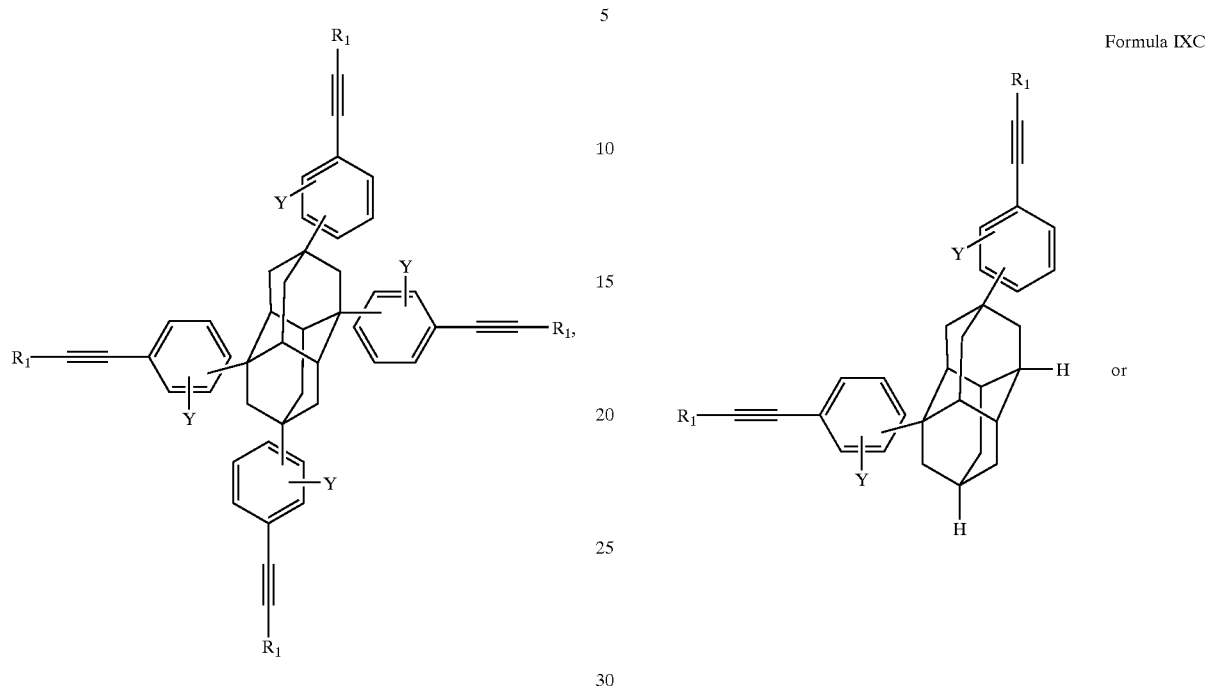
Formula IX B
Formula IXC
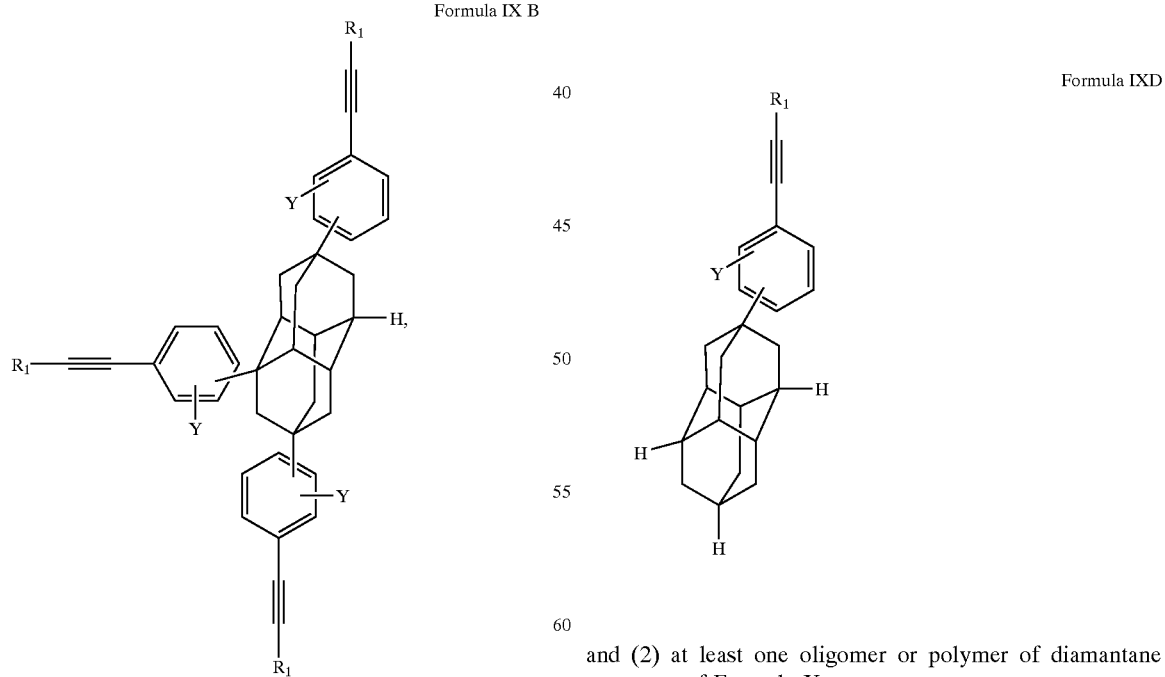
or
Formula IXD
and (2) at least one oligomer or polymer of diamantane monomer of Formula X

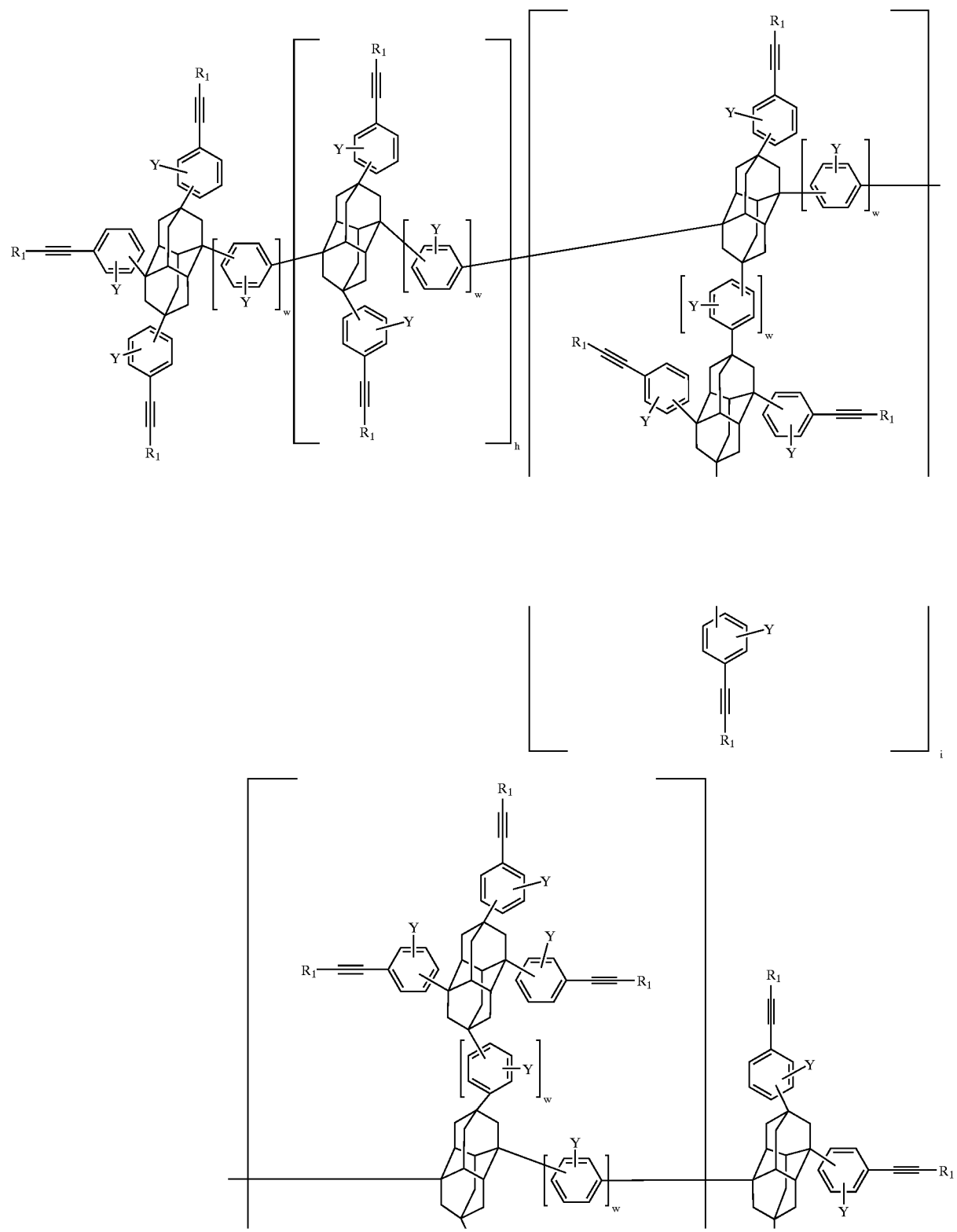

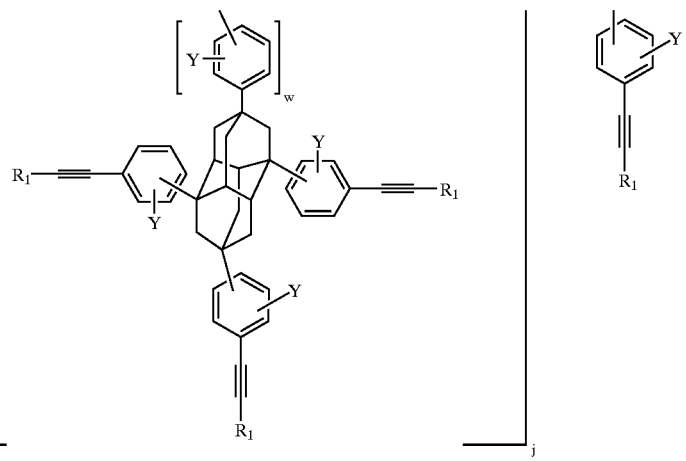
or preferably diamantane oligomer or polymer of the following formula
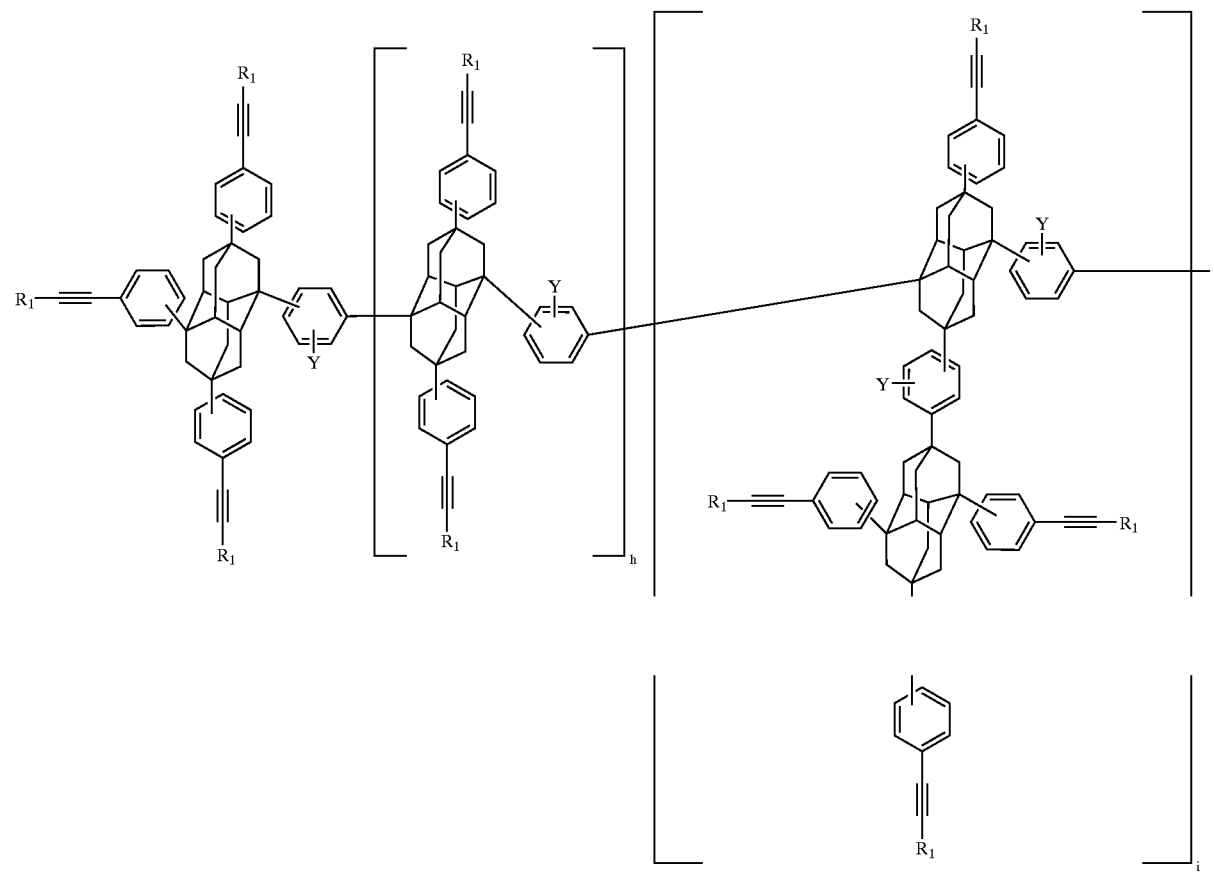

-continued

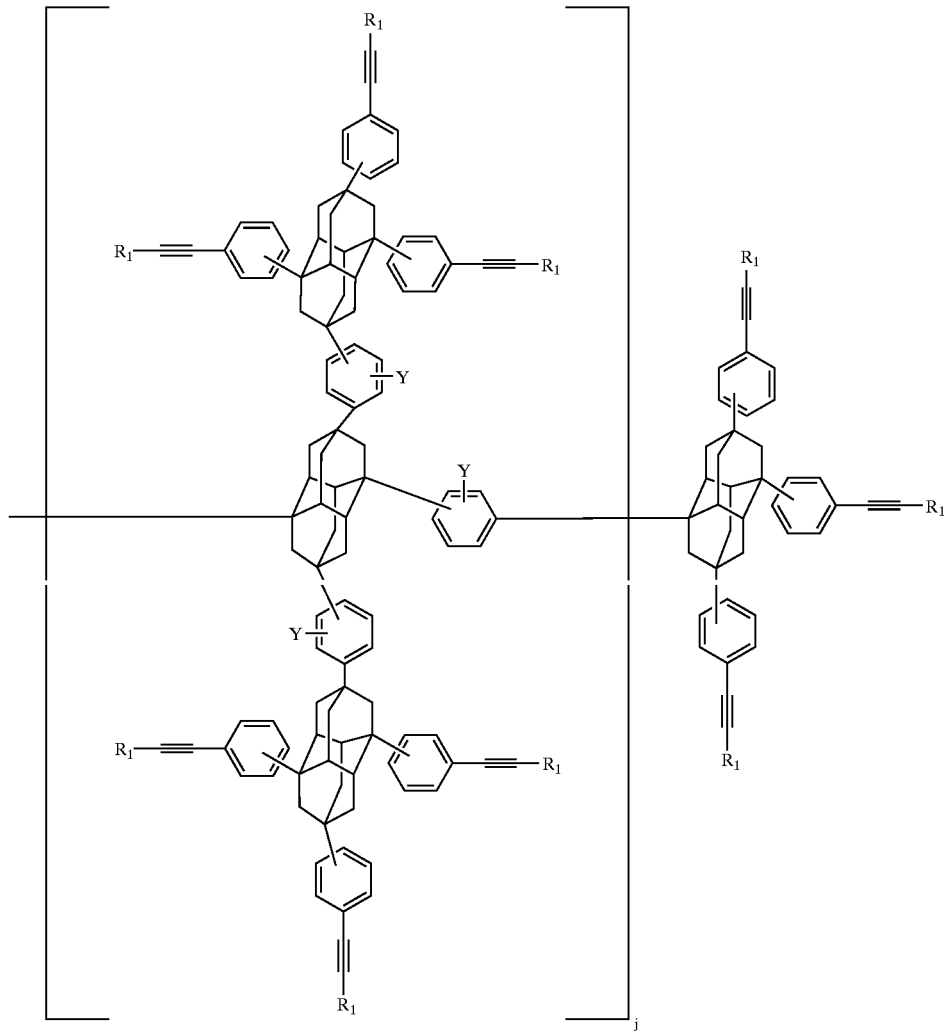

wherein h is from 0 to 10; i is from 0 to 10; j is from 0 to 10; each $R_1$ in Formulae VIIA, VIIB, VIIC, VIID, VIII, IXA, IXB, IXC, IXD, and X is the same or different and selected from hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl; and each Y in Formulae VIIA, VIIB, VIIC, VIID, VIII, IXA, IXB, IXC, IXD, and X is the same or different and selected from hydrogen, alkyl, aryl, substituted aryl, or halogen and (b) adhesion promoter as set forth above.

Formulae II, IV, VI, VIII, and X represent random or irregular structures in that any one of the units h, i, and j may or may not repeat numerous times before another unit is present. Thus, the sequence of units in Formulae II, IV, VI, VIII, and X above is random or irregular.

In adhesion promoter (b), preferably at least one of the first functionality and the second functionality is selected from Si containing groups; N containing groups; C bonded to O containing groups; hydroxyl groups; and C double bonded to C containing groups. Preferably, the Si containing groups are selected from Si—H, Si—O, and Si—N; the N containing groups are selected from such as C—$NH_2$ or other secondary and tertiary amines, imines, amides, and imides; the C bonded to O containing groups are selected from =CO, carbonyl groups such as ketones and aldehydes, esters, —COOH, alkoxyls having 1 to 5 carbon atoms, ethers, glycidyl ethers; and epoxies; the hydroxyl group is phenol; and the C double bonded to C containing groups are selected from allyl and vinyl groups.

In adhesion promoter (b), preferably the Si containing group is selected from silanes of the Formula XI: $(R_2)_k(R_3)_l Si(R_4)_m(R_5)_n$ wherein $R_2$, $R_3$, $R_4$, and $R_5$ each independently represents hydrogen, hydroxyl, unsaturated or saturated alkyl, substituted or unsubstituted alkyl where the substituent is amino or epoxy, unsaturated or saturated alkoxyl, unsaturated or saturated carboxylic acid radical, or aryl; and at least two of $R_2$, $R_3$, $R_4$, and $R_5$ represent hydrogen, hydroxyl, saturated or unsaturated alkoxyl, unsaturated alkyl, or unsaturated carboxylic acid radical; and $k+l+m+n \leq 4$; or polycarbosilane of the Formula XII:

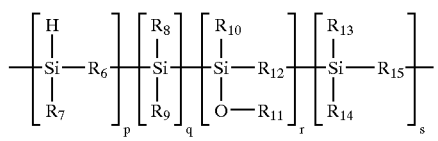

in which $R_6$, $R_{12}$, and $R_{15}$ each independently represents substituted or unsubstituted alkylene, cycloalkylene, vinylene, allylene, or arylene; $R_7$, $R_8$, $R_9$, $R_{10}$, $R_{13}$, and $R_{14}$ each independently represents hydrogen atom, alkyl, alkylene, vinyl, cycloalkyl, allyl, aryl, or arylene and may be linear or branched; $R_{11}$ represents organosilicon, silanyl, siloxyl, or organo group; and p, q, r, and s satisfy the conditions of [4≦p+q+r+s≦100,000], and q and r and s may collectively or independently be zero;

the C bonded to O containing groups are selected from glycidyl ethers, or esters of unsaturated carboxylic acids containing at least one carboxylic acid group;

the C double bonded to C containing groups is vinyl cyclic oligomers or polymers wherein the cyclic group is pyridine, aromatic, or heteroaromatic; and the hydroxyl group is phenol-formaldehyde resins or oligomers of the Formula XIII: —[$R_{16}C_6H_2(OH)(R_{17})$]$_t$— where $R_{16}$ is substituted or unsubstituted alkylene, cycloalkylene, vinyl, allyl, or aryl, $R_{17}$ is alkyl, alkylene, vinylene, cycloalkylene, allylene, or aryl, and t=3–100.

In another embodiment, the present composition comprises: (a) thermosetting component comprising at least one oligomer or polymer of Formula II above where E, Q, and $G_w$ are as previously defined; h is from 0 to 10; i is from 0 to 10; j is from 0 to 10, and w is 0 or 1; and (b) adhesion promoter comprising compound having at least bifunctionality wherein the bifunctionality may be the same or different and the first functionality is capable of interacting with the thermosetting component (a) and the second functionality is capable of interacting with a substrate when the composition is applied to the substrate. In adhesion promoter (b), preferably at least one of the first functionality and the second functionality is selected from ls containing groups; N containing groups; C bonded to O containing groups; hydroxyl groups; and C double bonded to C containing groups. Preferably, the present composition comprises at least one oligomer or polymer of Formula IV above where Q, $G_w$, h, i, j, and w are as previously defined.

We also developed a method of improving adhesion of thermosetting component comprising: (1) at least one monomer of Formula I above and (2) at least one oligomer or polymer of Formula II above where E, Q, $G_w$, h, i, j, and w are as previously described to a substrate comprising the steps of:

adding to said thermosetting component, adhesion promoter comprising compound having at least bifunctionality wherein the bifunctionality may be the same or different and the first functionality is capable of interacting with the thermosetting component and the second functionality is capable of interacting with a substrate to form a composition; and applying the composition to the substrate. In adhesion promoter (b), preferably at least one of the first functionalities and the second functionality is selected from Si containing groups; N containing groups; C bonded to O containing groups; hydroxyl groups; and C double bonded to C containing groups.

Also, we have developed a process comprising the step of: combining (a) thermosetting component comprising at least one monomer of Formula I above and (2) at least one oligomer or polymer of Formula II above where E, Q, $G_w$, h, l, j, and w are as previously defined and (b) adhesion promoter comprising compound having at least bifunctionality wherein the bifunctionality may be the same or different and the first functionality is capable of interacting with the thermosetting component (a) and the second functionality is capable of interacting with a substrate when the composition is applied to the substrate. In adhesion promoter (b), preferably at least one of the first functionality and the second functionality is selected from ls containing groups; N containing groups; C bonded to O containing groups; hydroxyl groups; and C double bonded to C containing groups. The term "combining" as used herein includes blending or reacting.

The present compositions advantageously have improved solubility. As a result, films having a thickness up to or greater than about 1.5 microns may be produced from the present composition.

Various objects, features, aspects, and advantages of the present invention will become more apparent from the following detailed description of the preferred embodiments of the invention, along with the accompanying drawings.

DETAILED DESCRIPTION OF THE INVENTION

Figure 1:
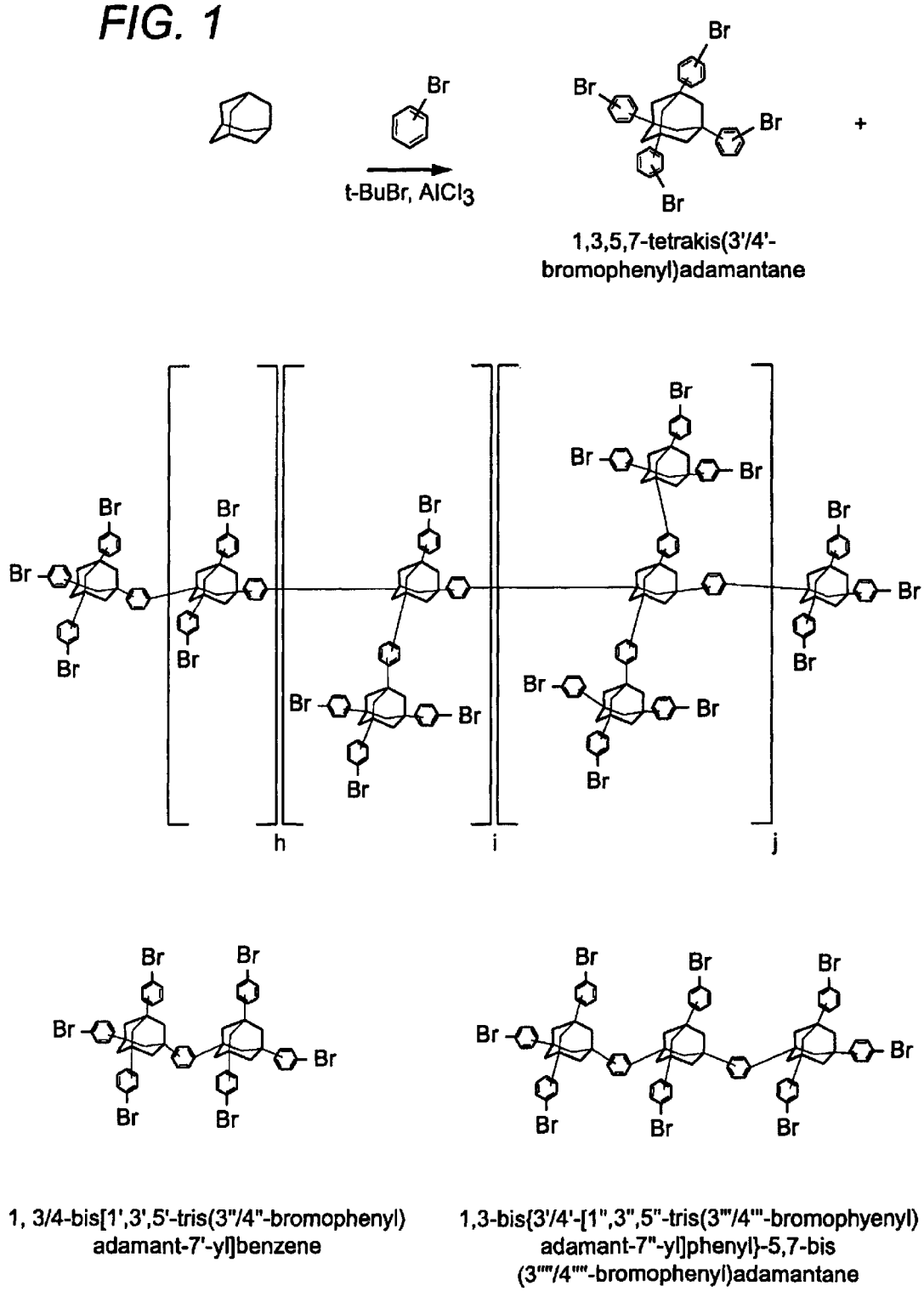
FIG. 1 illustrates a method for preparing adamantane based compositions (referred to herein as "P1 Step (a) Product" and the P2 Step (a) Product"), which is also described in Preparation 1, Step (a) and Preparation 2, Step (a) under the Examples Section and which compositions are useful as the thermosetting component in the present compositions.

The phrases "cage structure", "cage molecule", and "cage compound" as used herein are intended to be used interchangeably and refer to a molecule having at least eight atoms arranged such that at least one bridge covalently connects two or more atoms of a ring system. In other words, a cage structure, cage molecule, or cage compound comprises a plurality of rings formed by covalently bound atoms, wherein the structure, molecule, or compound defines a volume, such that a point located within the volume cannot leave the volume without passing through the ring. The bridge and/or the ring system may comprise one or more heteroatoms, and may contain aromatic groups, partially cyclic or acyclic saturated hydrocarbon groups, or cyclic or acyclic unsaturated hydrocarbon groups. Further contemplated cage structures include fullerenes, and crown ethers having at least one bridge. For example, an adamantane or diamantane is considered a cage structure, while a naphthalene or an aromatic spirocompound are not considered a cage structure under the scope of this definition, because a naphthalene or an aromatic spirocompound do not have one, or more than one bridge and thus, do not fall within the description of the cage compound above. Cage compounds are preferably adamantane and diamantane and more preferably adamantane.

The phrase "bridgehead carbon" as used herein refers to any cage structure carbon bound to three other carbons. Thus, for example, adamantane has four bridgehead carbons while diamantane has eight bridgehead carbons.

The phrase "adhesion promoter" as used herein means any component that when added to thermosetting component (a), improves the adhesion thereof to substrates compared with thermosetting component (a) alone.

The phrase "compound having at least bifunctionality" as used herein means any compound having at least two functional groups capable of interacting or reacting, or forming bonds as follows. The functional groups may react in numerous ways including addition reactions, nucleophilic and electrophilic substitutions or eliminations, radical reactions, etc. Further alternative reactions may also include the formation of non-covalent bonds, such as Van der Waals, electrostatic bonds, ionic bonds, and hydrogen bonds.

The term "layer" as used herein includes film and coating.

The term "low dielectric constant polymer" as used herein refers to an organic, organometallic, or inorganic polymer with a dielectric constant of approximately 3.0, or lower. The low dielectric material is typically manufactured in the form of a thin layer having a thickness from 100 to 25,000 Angstroms but also may be used as thick films, blocks, cylinders, spheres etc.

Thermosetting Component (a):

Thermosetting component (a) is disclosed in our commonly assigned pending patent applications Ser. No. 60/347195 filed Jan. 8, 2002; Ser. No. 60/384303 filed May 30, 2002; and P-106878 filed Jan. 3, 2003, which are incorporated herein by reference in their entirety.

First Embodiment: In the first embodiment set forth above, preferably the thermosetting component (a) comprises at least one adamantane monomer of Formula VIIA, VIIB, VIIC, or VIID above and at least one adamantane oligomer or polymer of Formula VIII above where at least one of h, i, and j is at least 1. Preferably, the thermosetting component (a) comprises diamantane monomer of Formula IXA, IXB, IXC, or IXD above and at least one diamantane oligomer or polymer of Formula X above where at least one of h, i, and j is at least 1.

When all of h, i, and j are zero in Formula IV above, the adamantane dimer is as shown in Formula XIV below

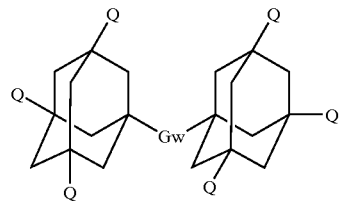

where Q and $G_w$ are as previously defined. When w is zero in Formula XIV, examples of adamantane dimers are in the following Table 2

TABLE 2

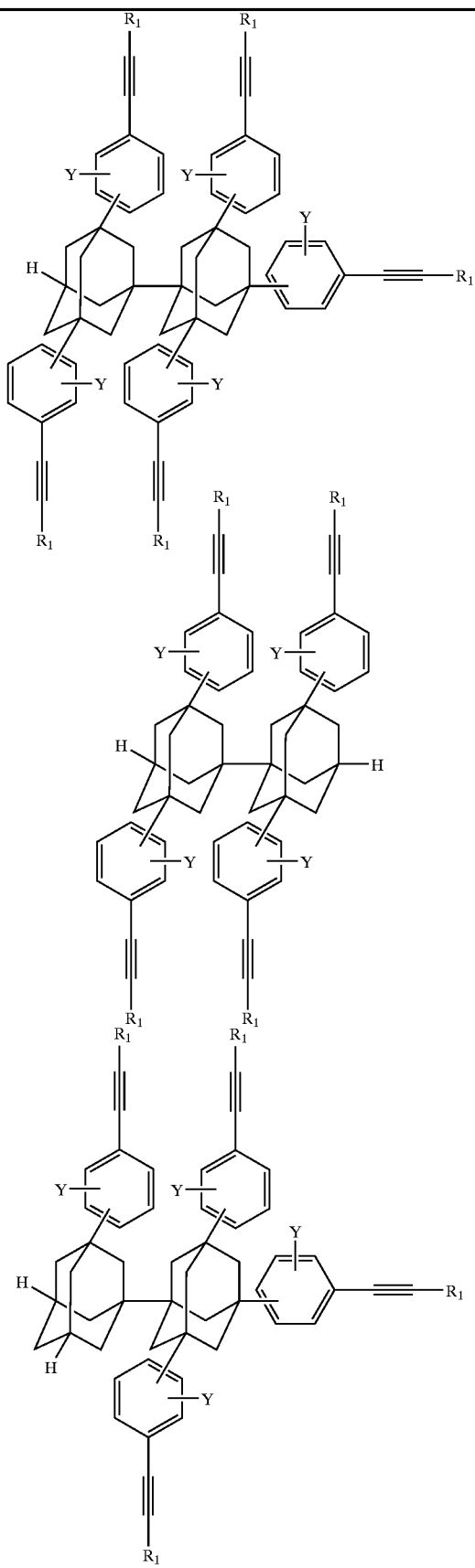

TABLE 2-continued

TABLE 2-continued
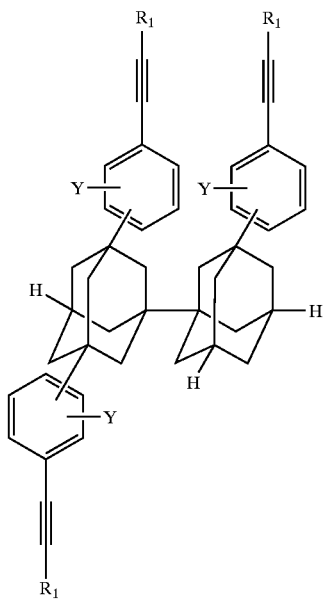
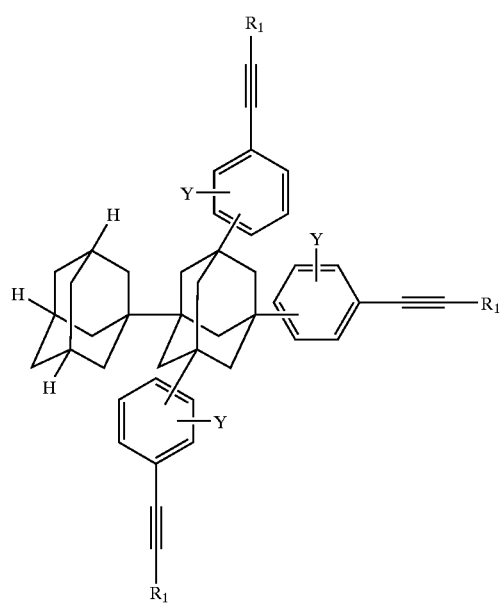
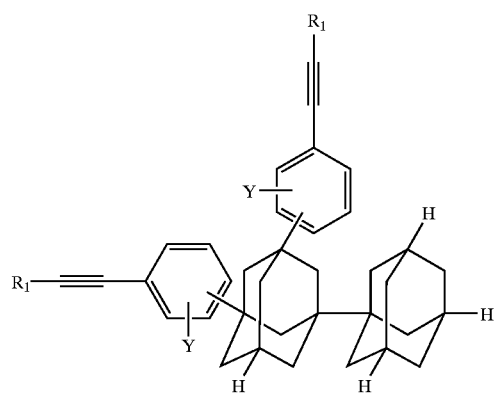
TABLE 2-continued
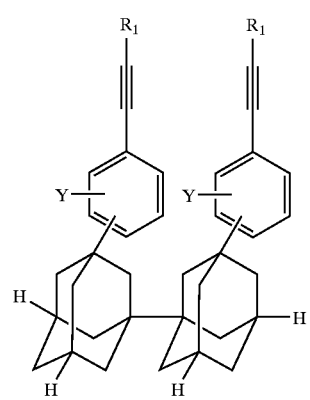
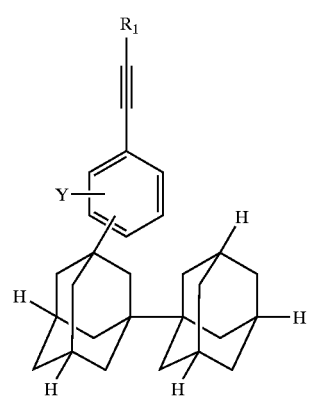
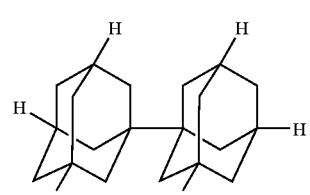
When w is preferably one in Formula XIV, examples of preferred dimers are in the following Table 3

TABLE 3
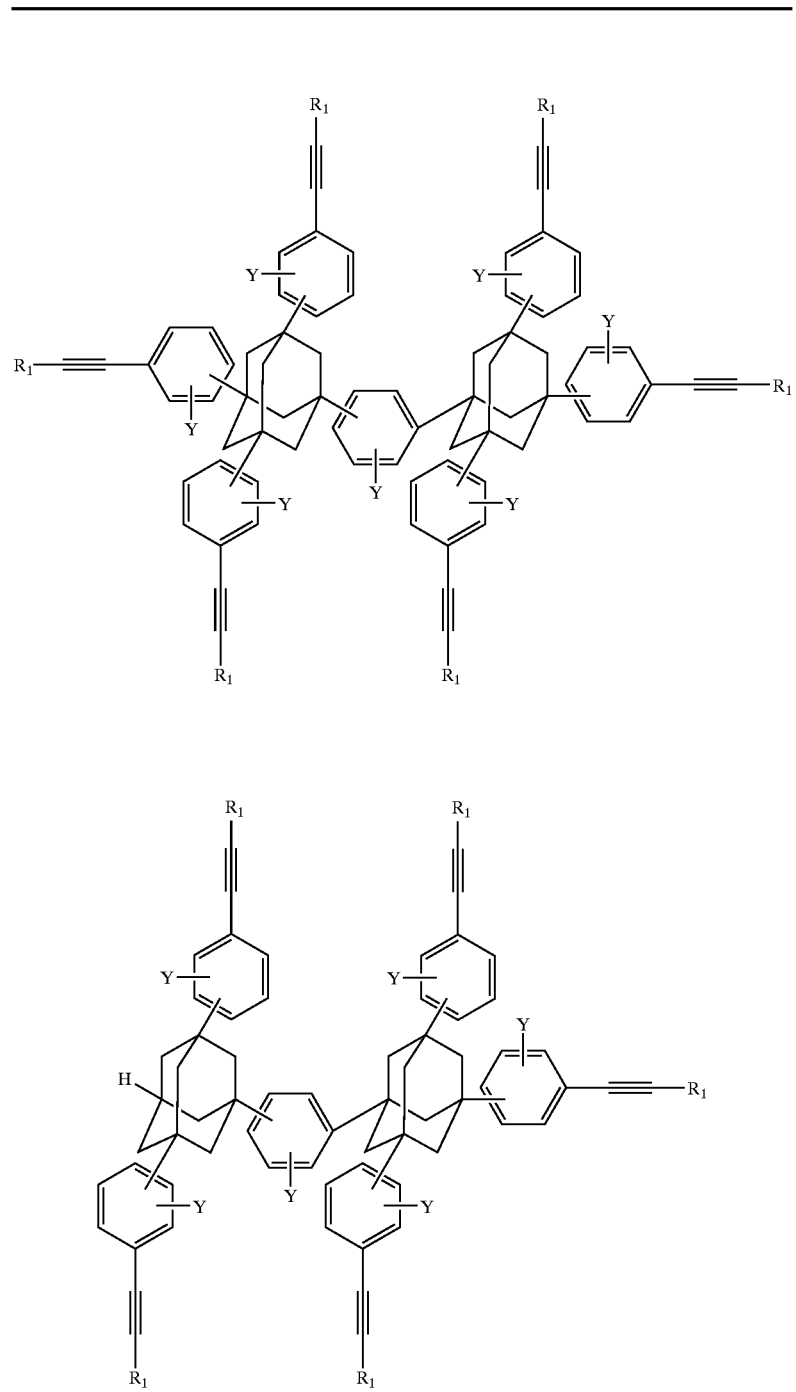

TABLE 3-continued
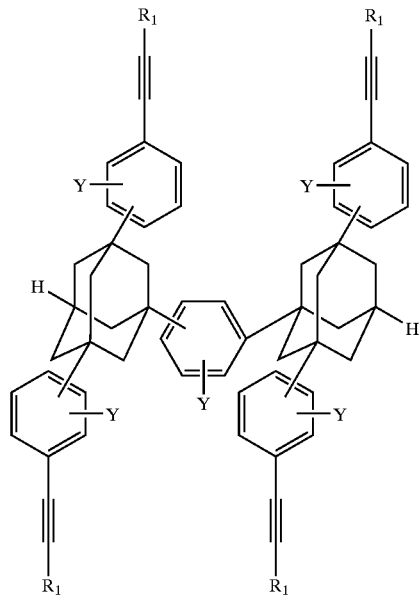
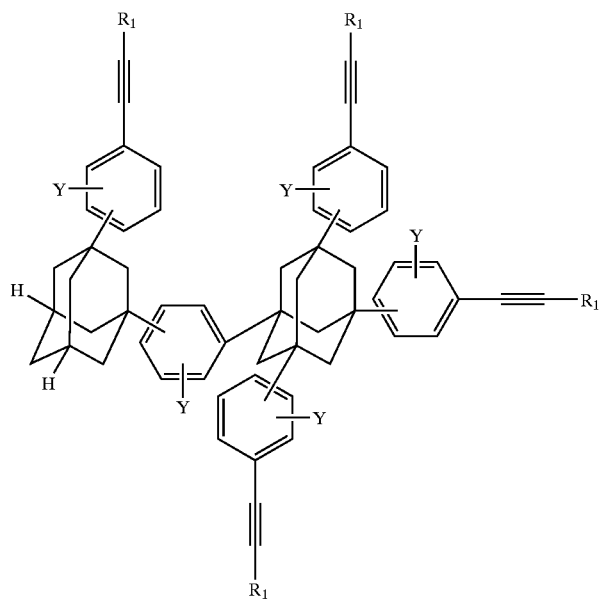

TABLE 3-continued
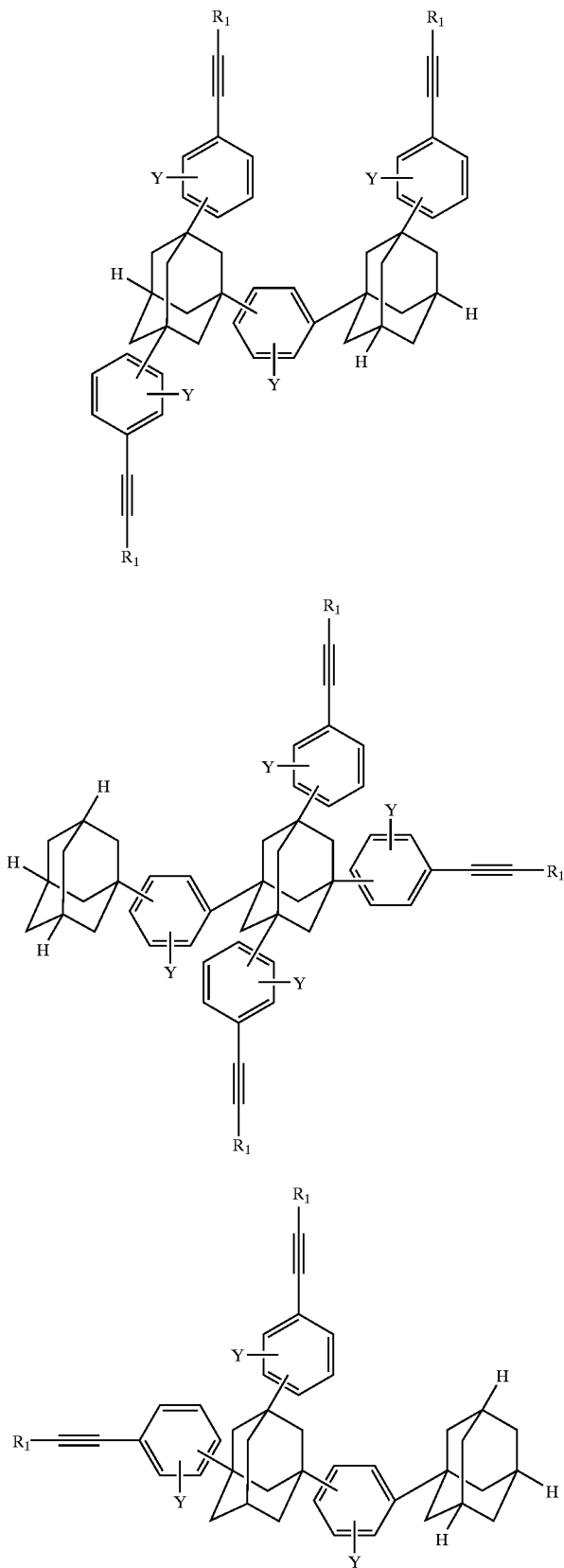

TABLE 3-continued
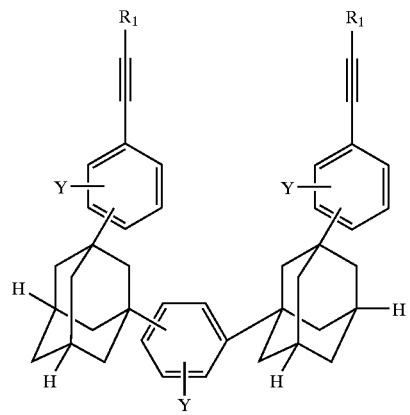
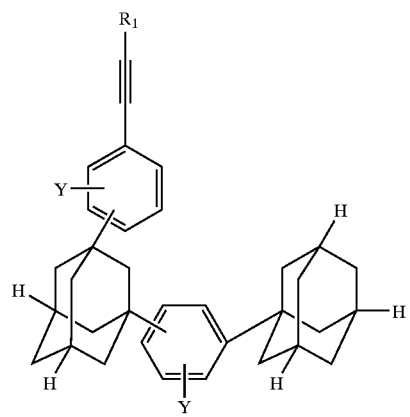
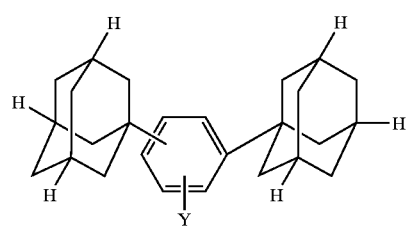
When h is 1 and i and j are zero in Formula IV above, the adamantane trimer is as shown in Formula XV below
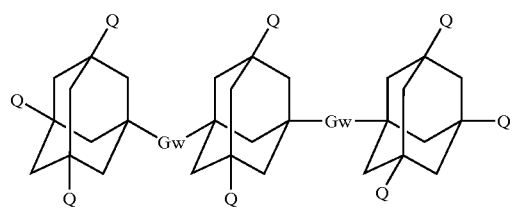

where Q and $G_w$ are as previously defined. When w is preferably one in Formula XV, examples of preferred trimers are in the following Table 4
TABLE 4
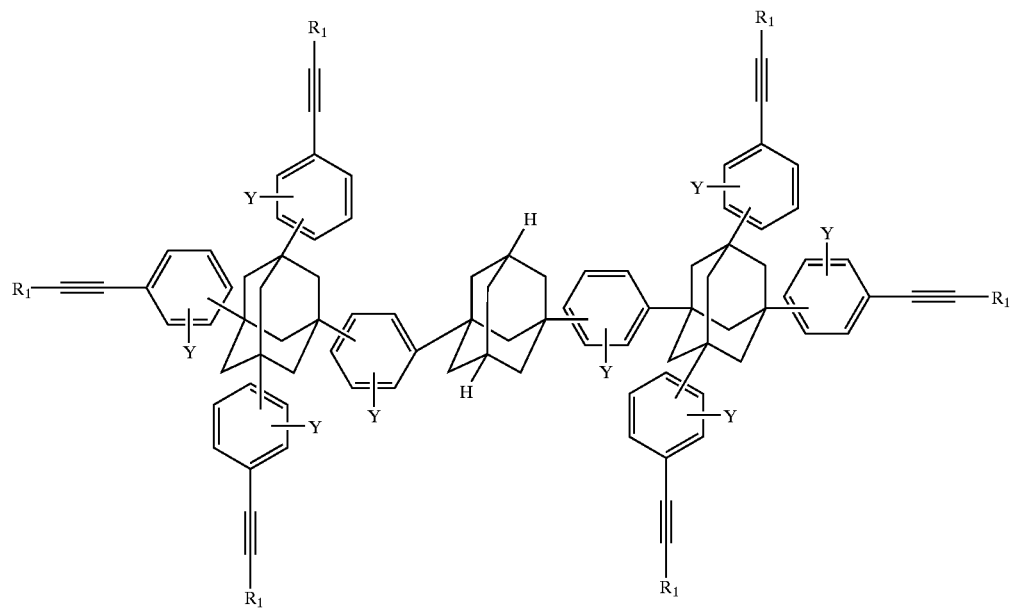
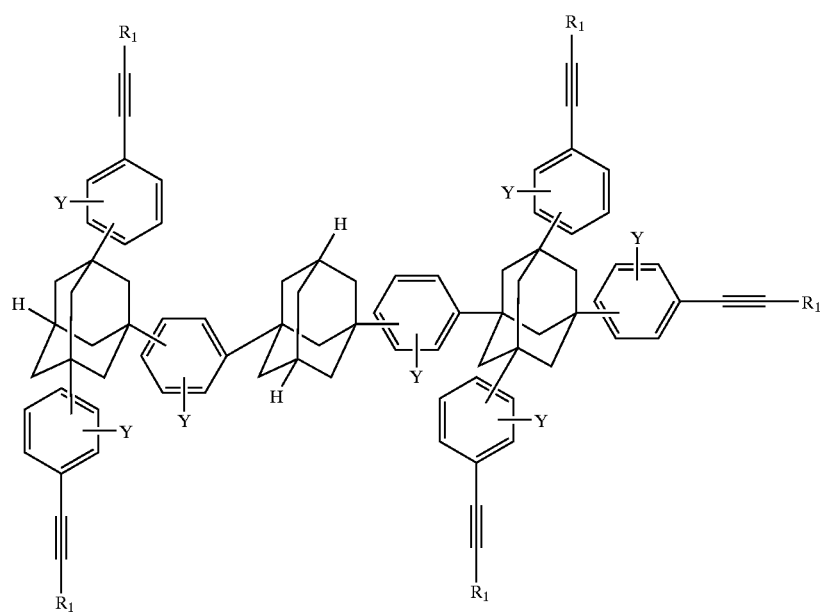

TABLE 4-continued
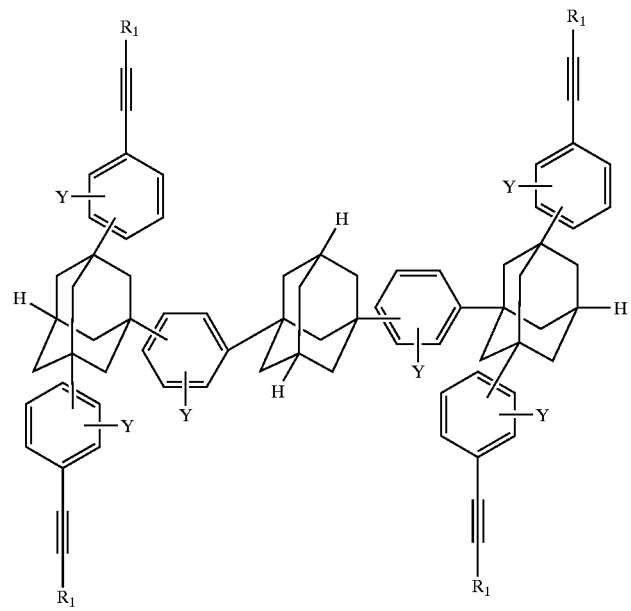
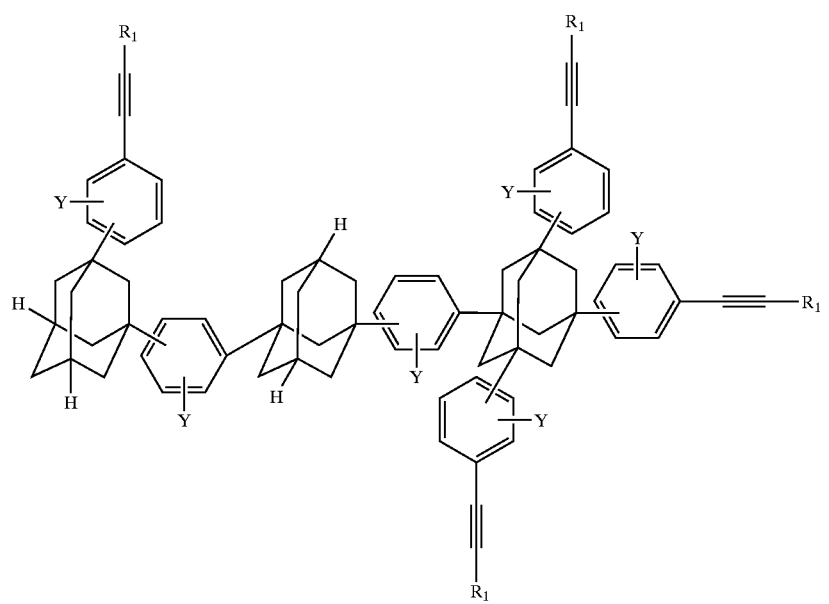

TABLE 4-continued
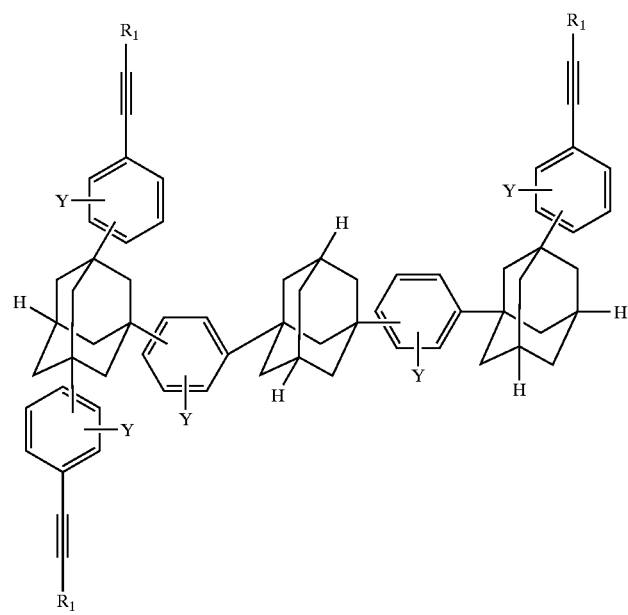
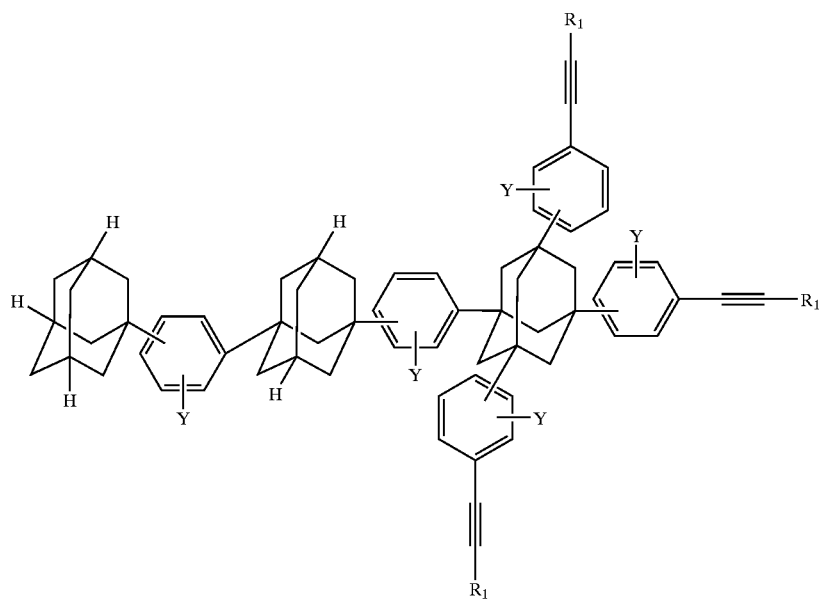

TABLE 4-continued
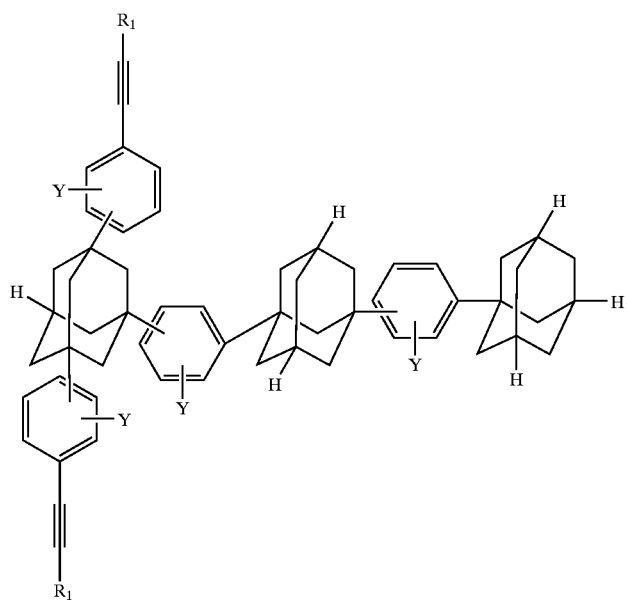
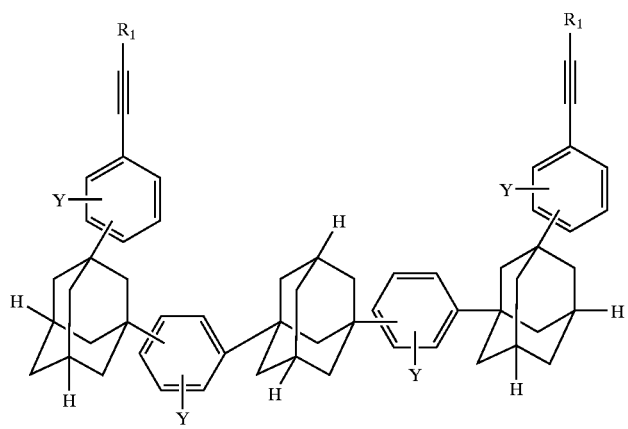
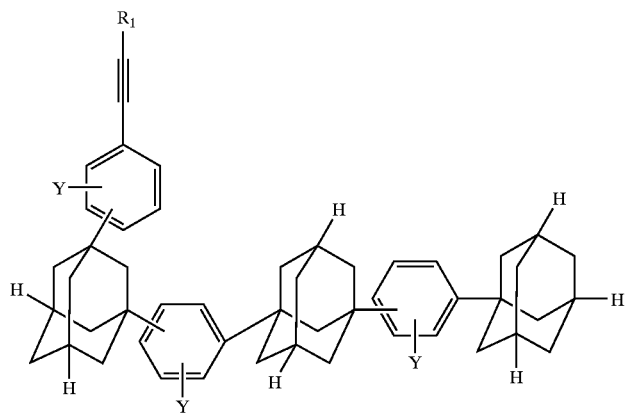

TABLE 4-continued
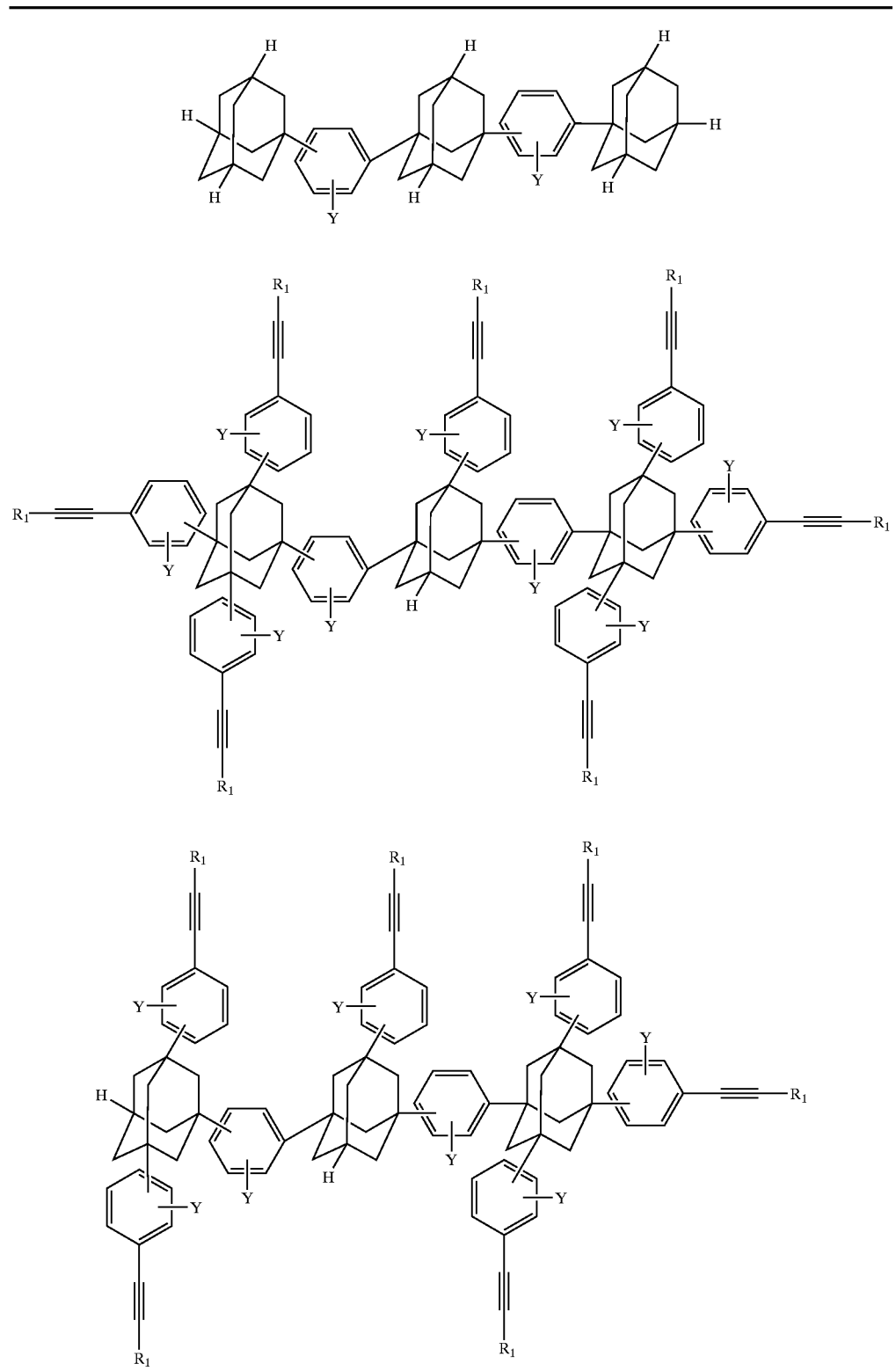

TABLE 4-continued
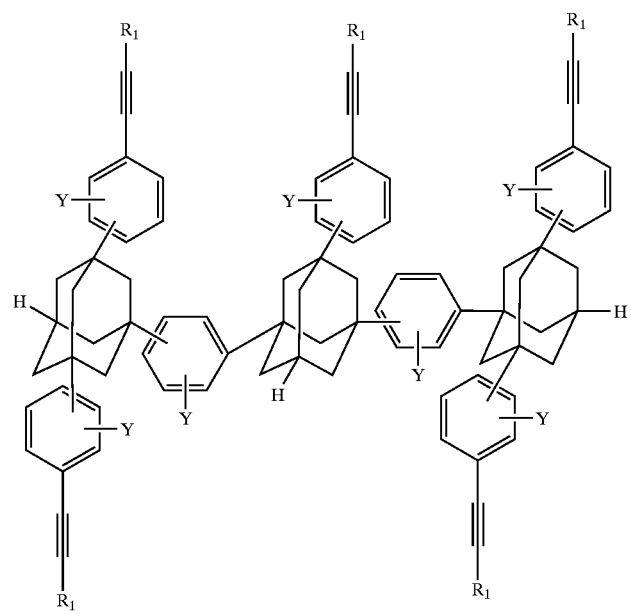
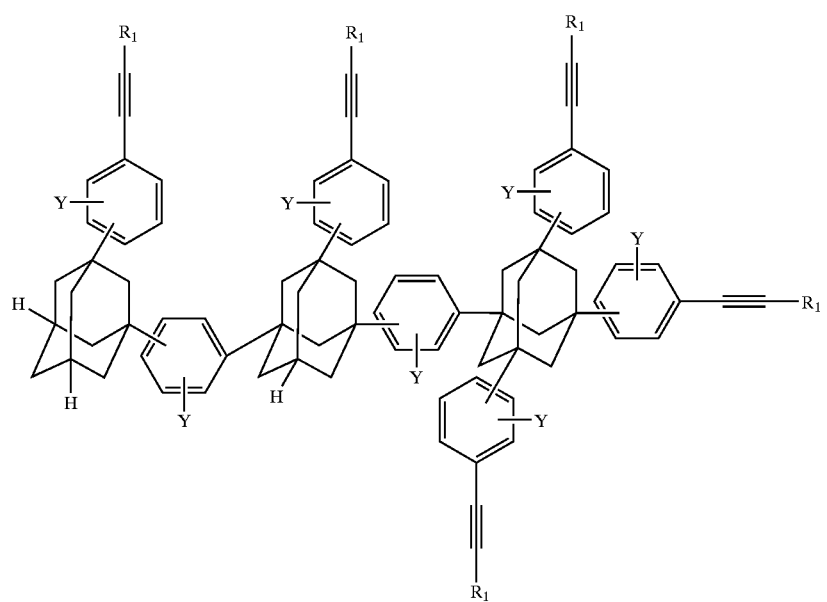

TABLE 4-continued
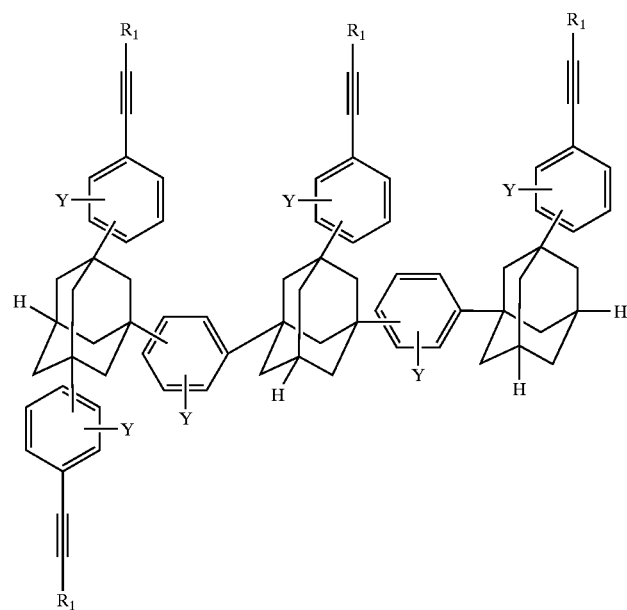
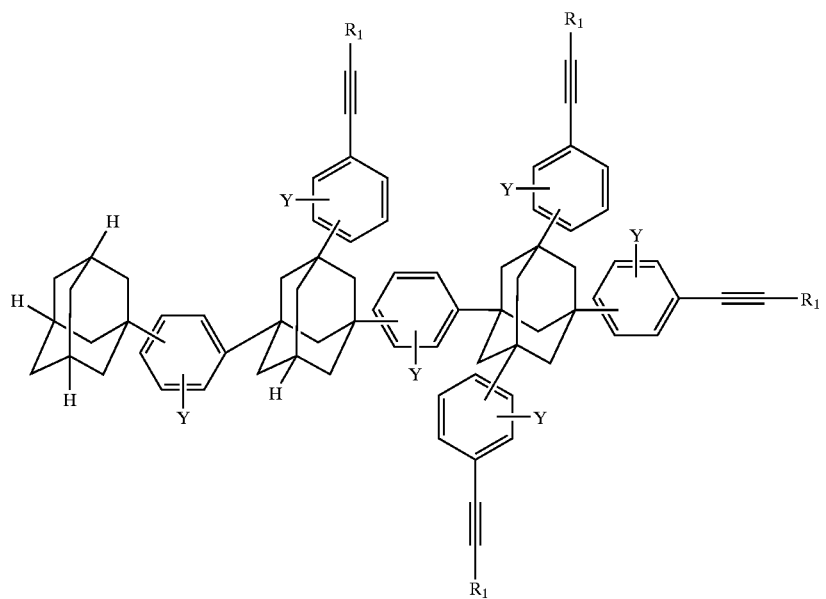

TABLE 4-continued
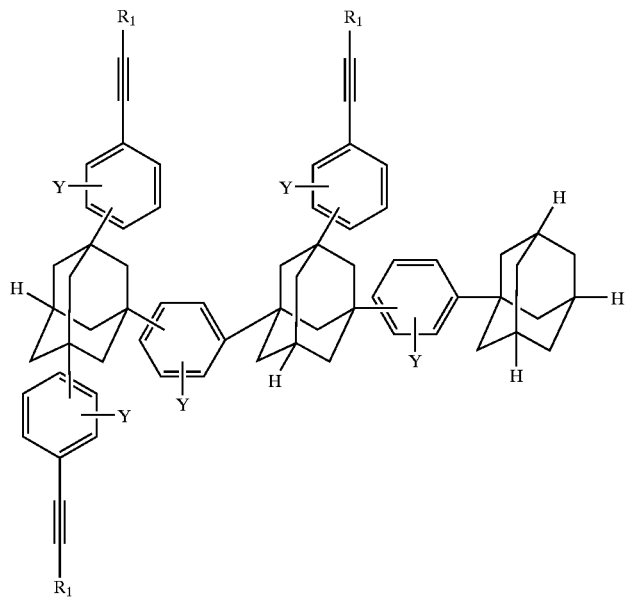
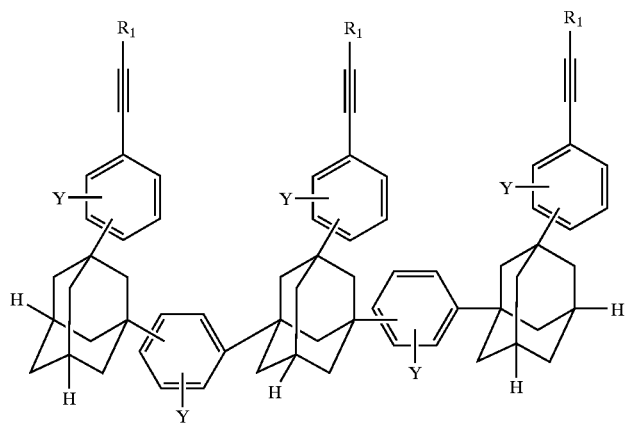
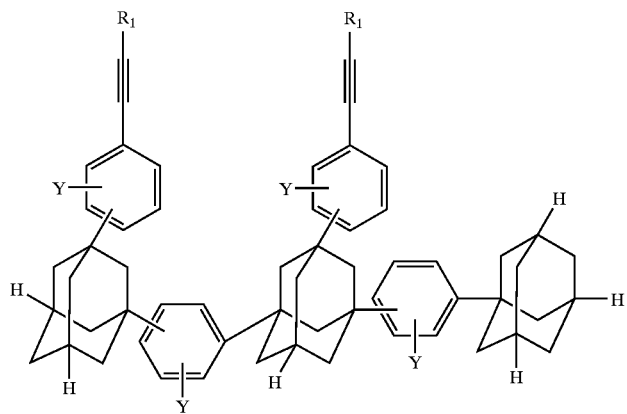

TABLE 4-continued
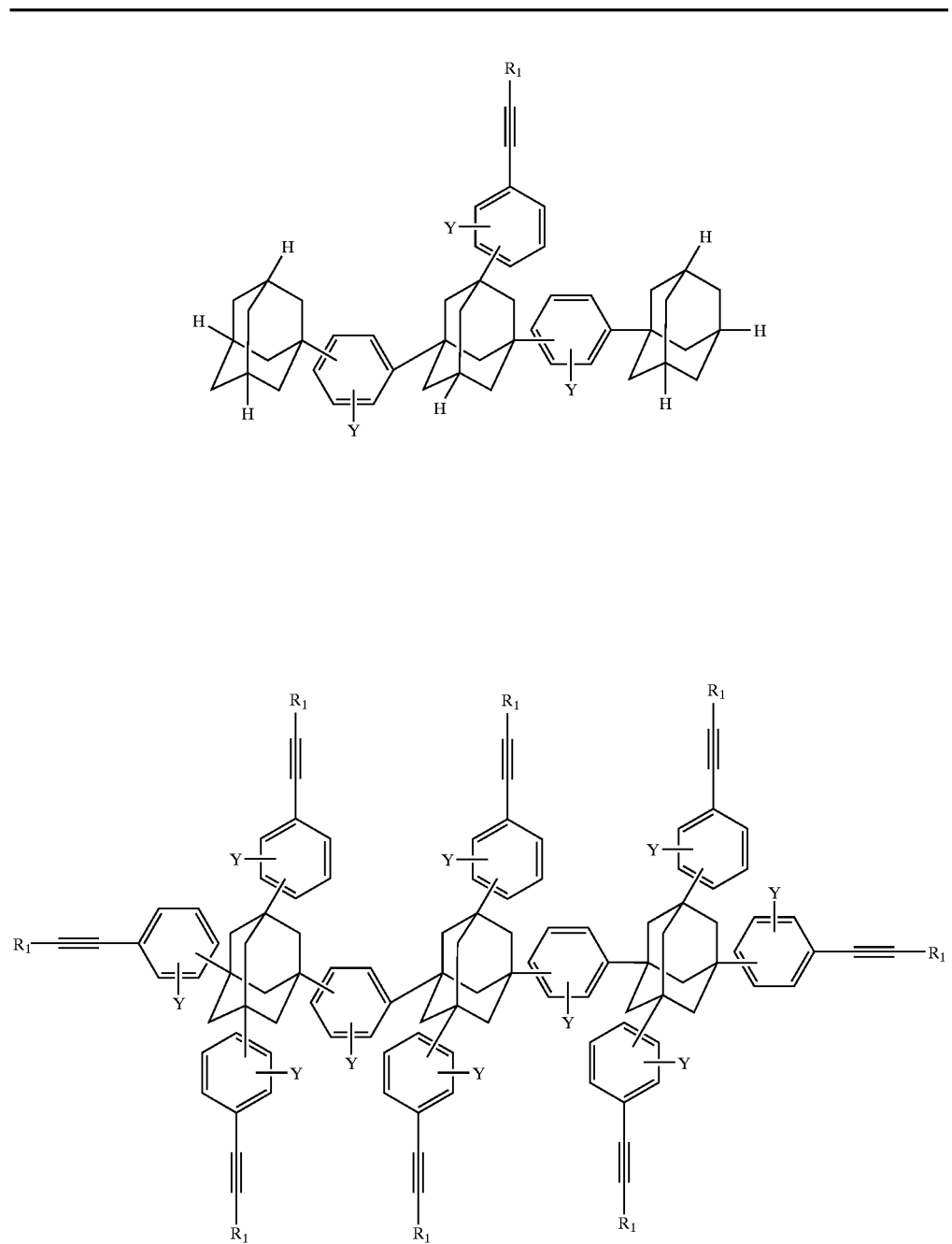

TABLE 4-continued
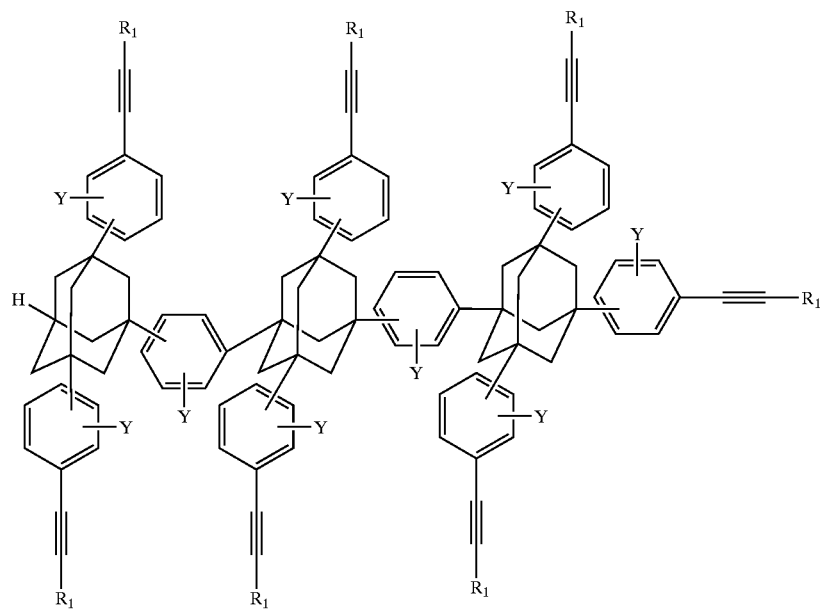
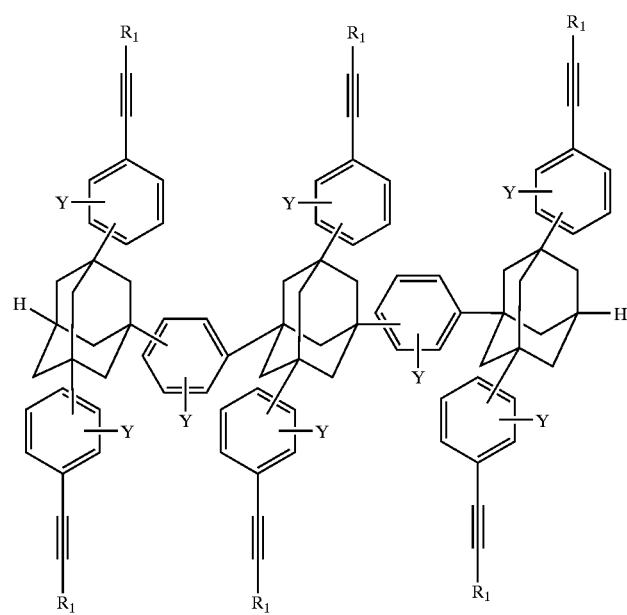

TABLE 4-continued
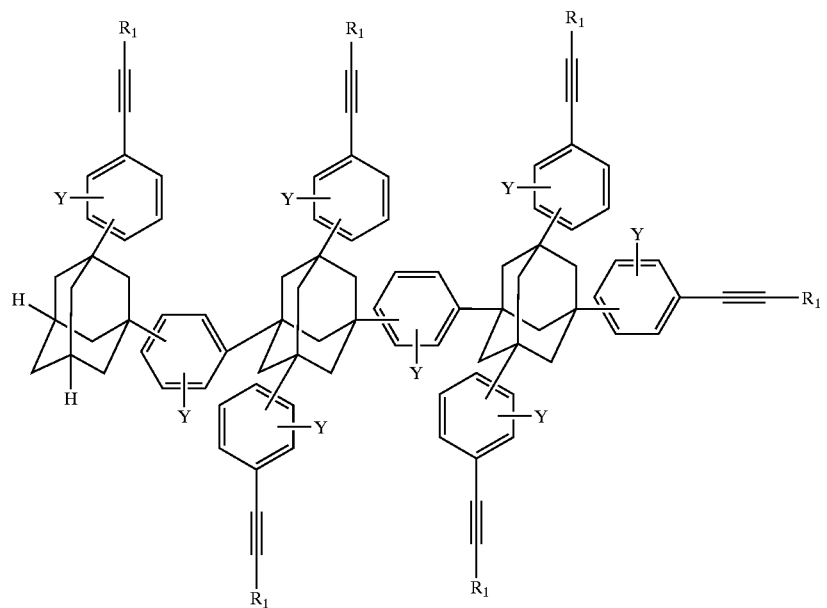
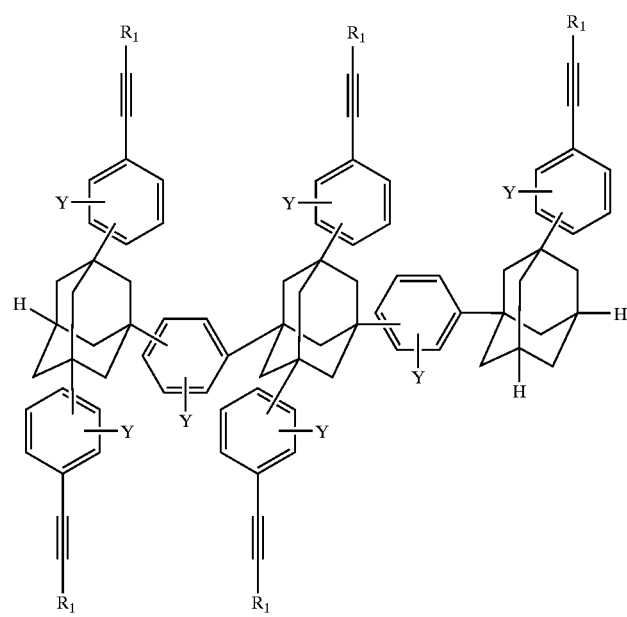

TABLE 4-continued
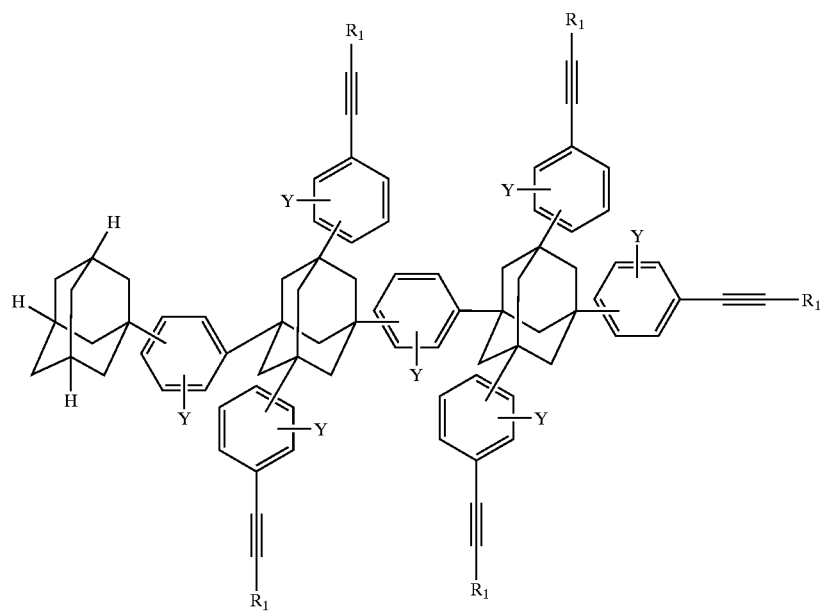
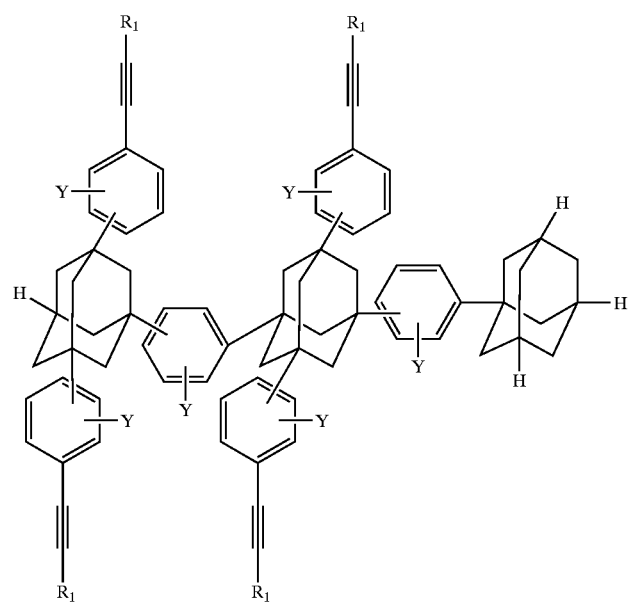

TABLE 4-continued
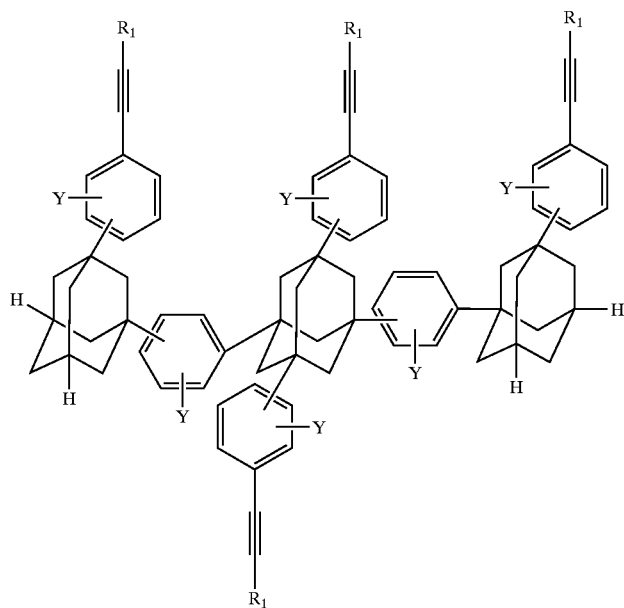
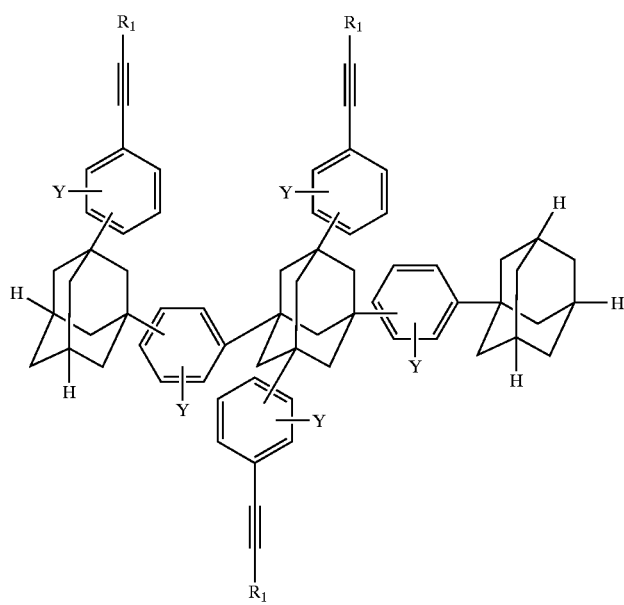

TABLE 4-continued

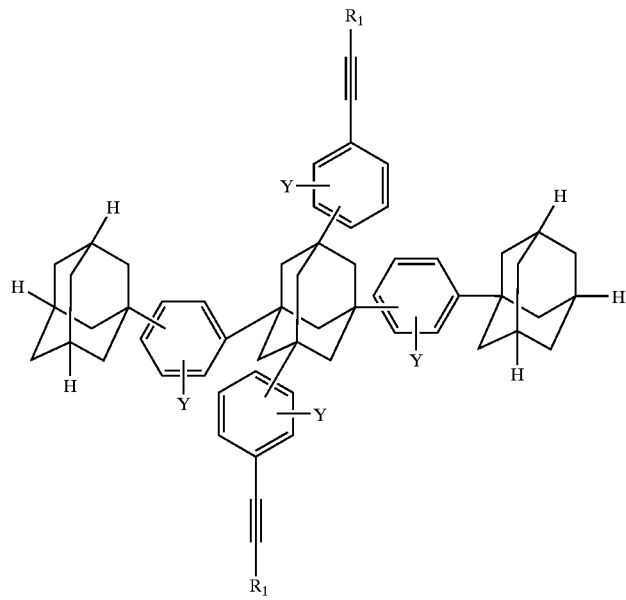

Preferably, the present composition comprises at least one oligomer or polymer of Formula VI above where Q, $G_w$, h, i, j, and w are as previously defined. When all of h, i, and j are zero in Formula VI above, the diamantane dimer is as shown in Formula XVI below

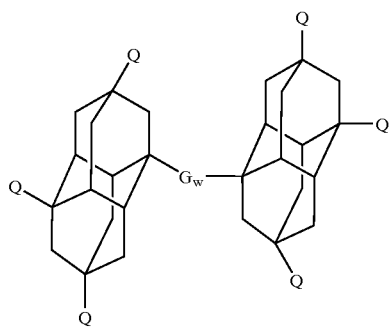

where Q and $G_w$ are as previously defined.

Preferably, the present composition comprises at least one adamantane oligomer or polymer of Formula VIII above where $R_1$, Y, h, i, j, and w are as previously defined. Preferably, the present composition comprises at least one diamantane oligomer or polymer of Formula X above where R, Y, h, i, j, and w are as previously defined.

Preferably, the thermosetting component (a) comprises adamantane monomer of Formula VIIA, VIIB, VIIC, or VIID above and adamantane oligomer or polymer of Formula XVII below where $R_1$, Y, and w are as defined above and h is 0 or 1.

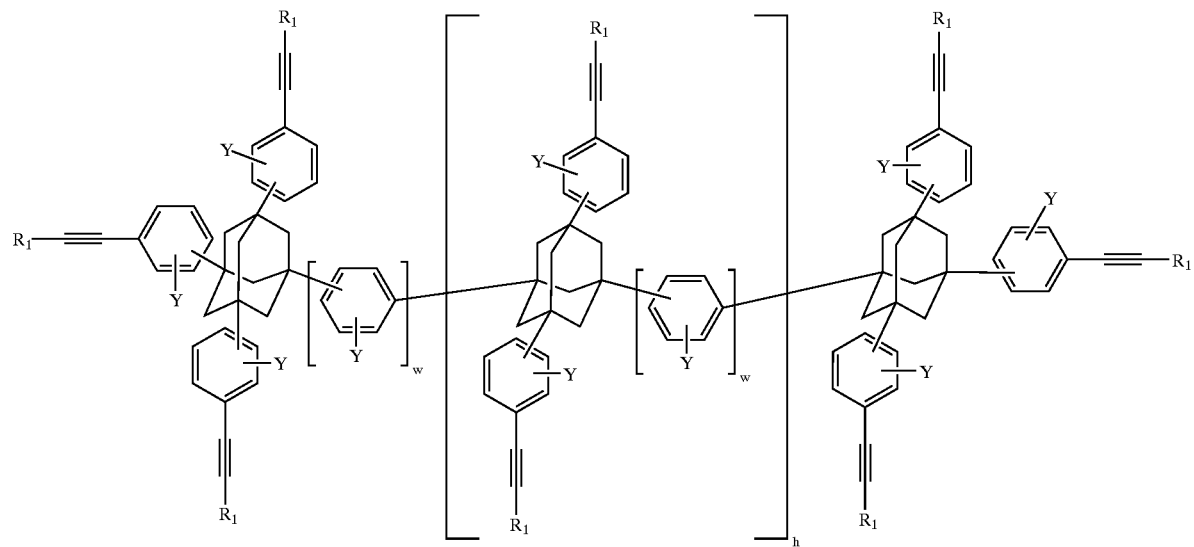
Preferably, the adamantane structure is as shown in the following formula
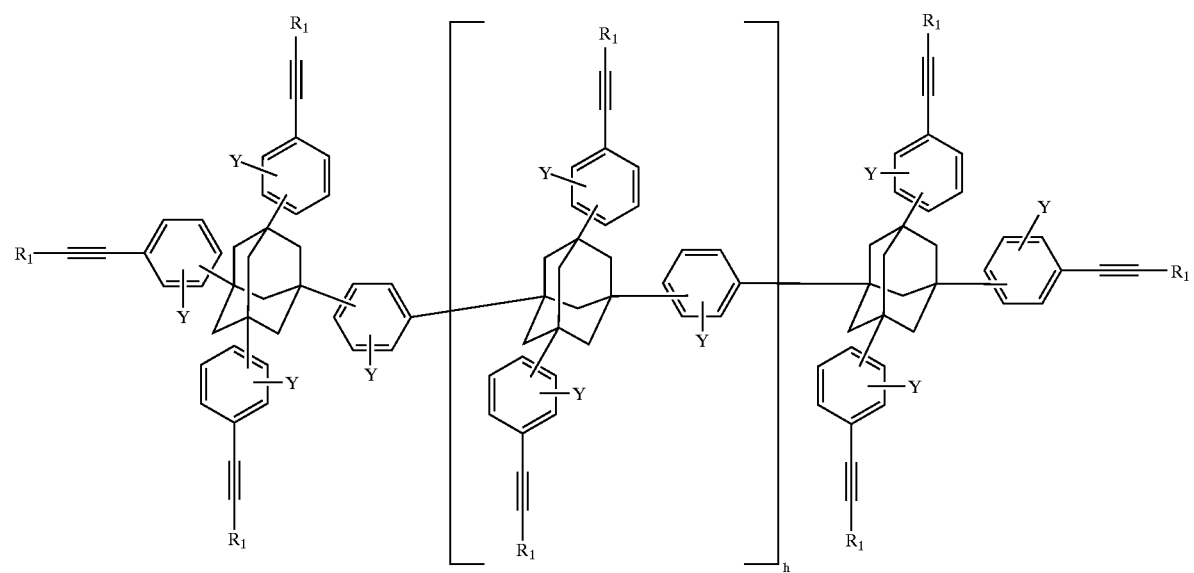

Preferably, the thermosetting component (a) comprises diamantane monomer of Formula IXA, IXB, IXC, or IXC above and diamantane oligomer or polymer of Formula XVIII below where $R_1$, Y, and w are as defined above and h is 0 or 1.
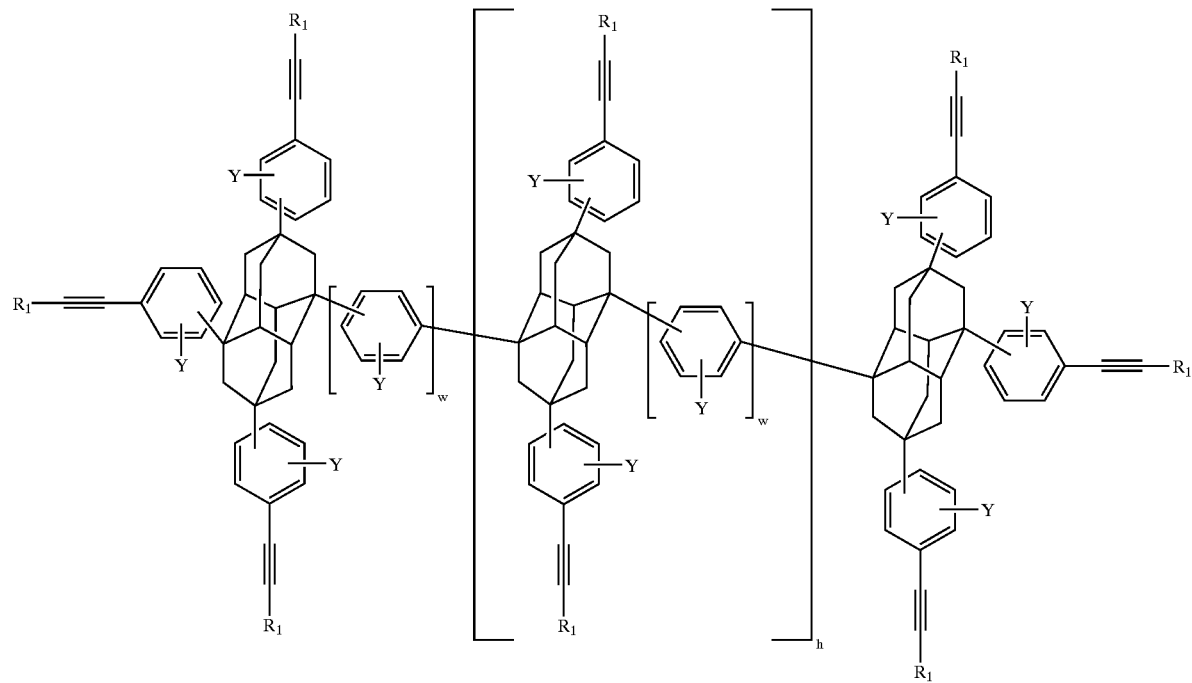
Preferably, the diamantane structure is as shown in the following formula.
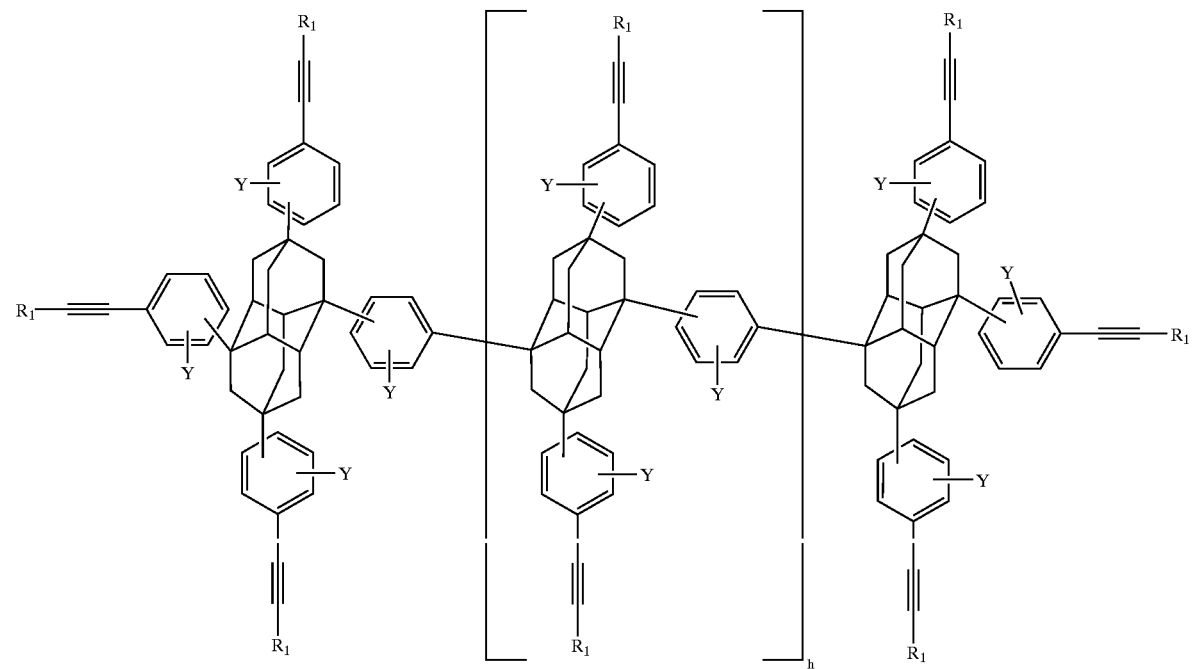

Preferably, the thermosetting component (a) comprises adamantane monomer of Formula VIIA, VIIB, VIIC, or VIID above and adamantane dimer of Formula XIX below where $R_1$, Y, and w are as defined above.
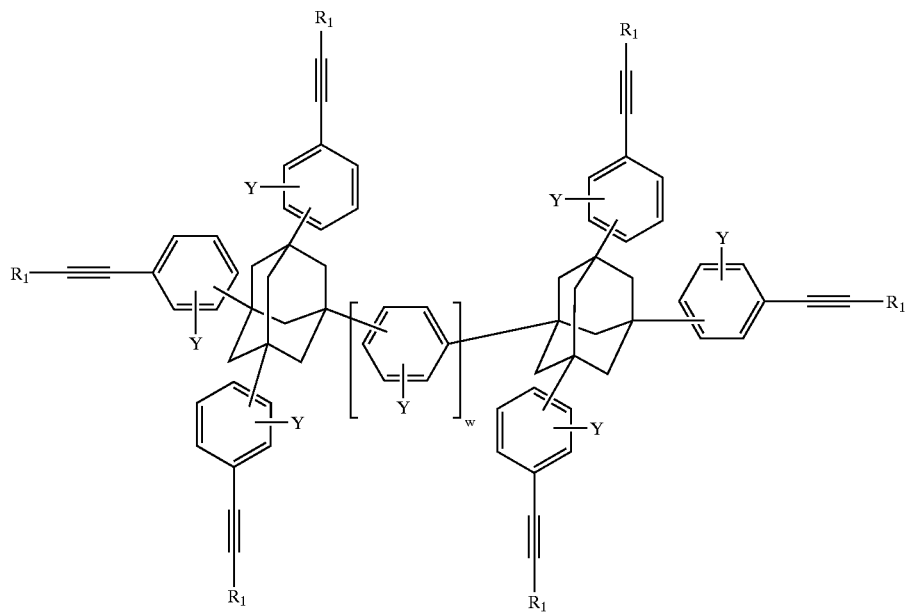
Preferably, the adamantane dimer is as shown in the following formula.
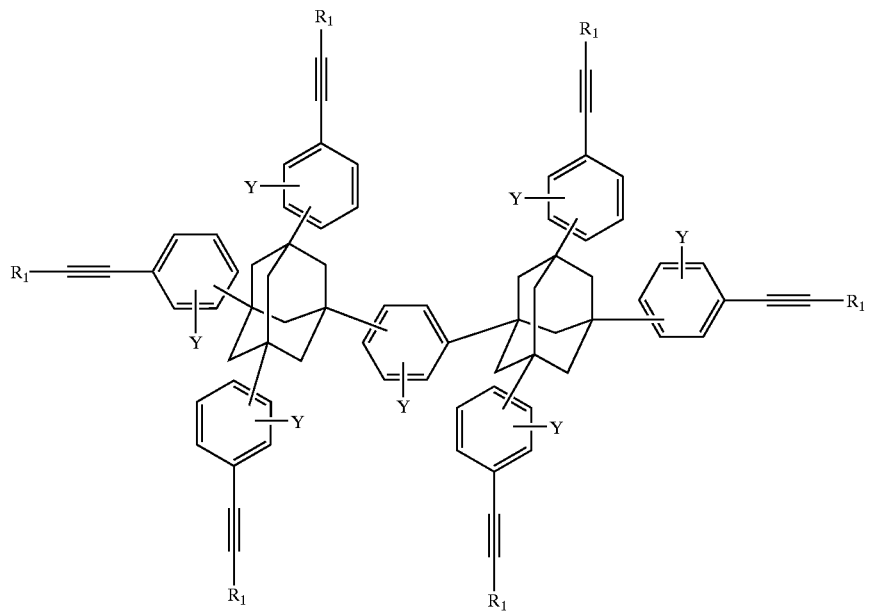

Preferably, the thermosetting component (a) comprises diamantane monomer of Formula IXA, IXB, IXC, or IXD above and diamantane dimer of Formula XX below where $R_1$, Y, and w are as defined above.
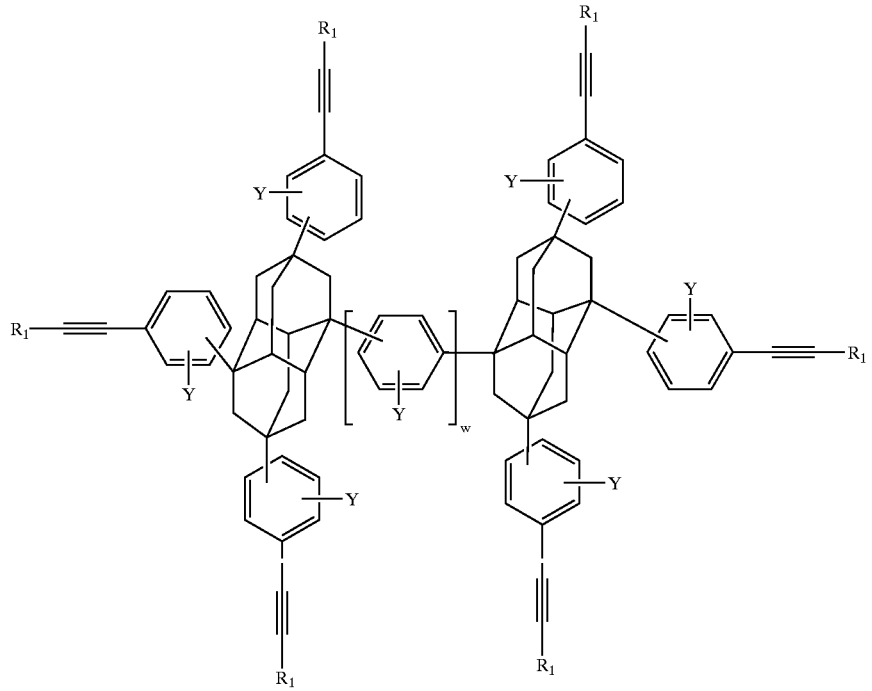
Preferably, the diamantane, dimer is as shown in the following formula.
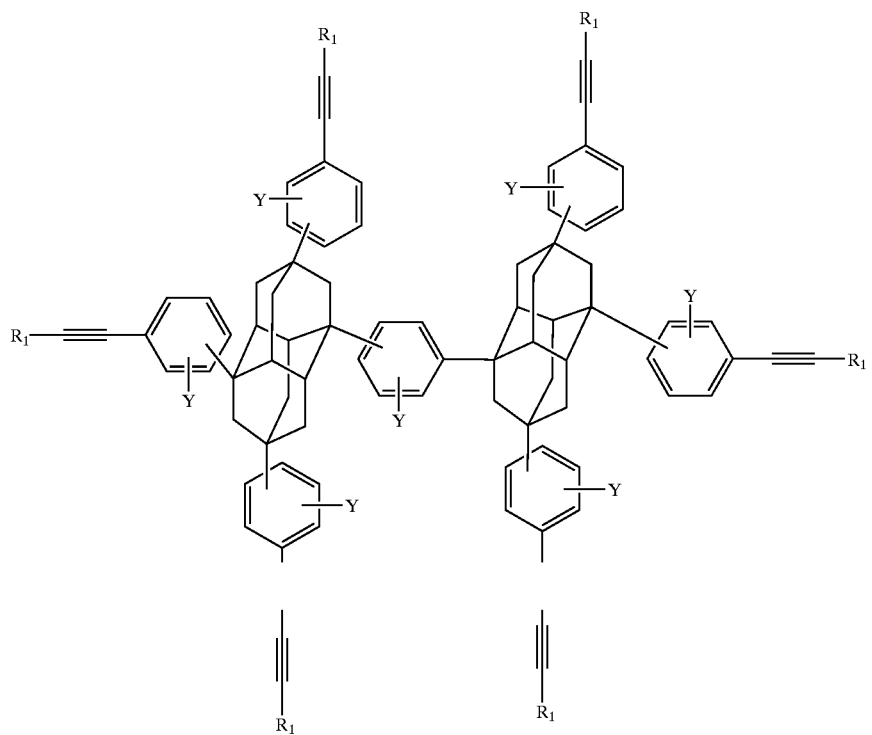

It should be understood that substitutions of the type illustrated in Tables 2, 3, and 4 above may also occur in tetramers and higher oligomers.

Preferably, the thermosetting component (a) comprises adamantane monomer of Formula VIIA, VIIB, VIIC, or VIID above and adamantane trimer of Formula XXI below where $R_1$, Y, and w are as defined above.

Preferably, the thermosetting component (a) comprises diamantane monomer of Formula IXA, IXB, IXC, or IXD above and diamantane trimer of Formula XXII below where $R_1$, Y, and w are as defined above.

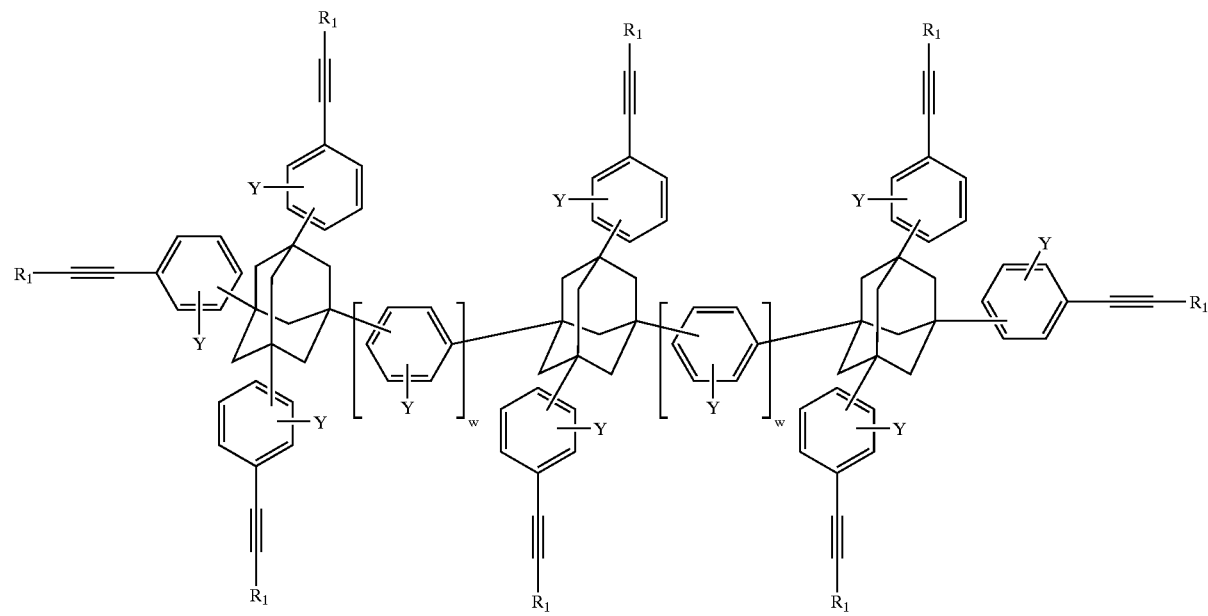

Preferably, the adamantane trimer is as shown in the following formula.

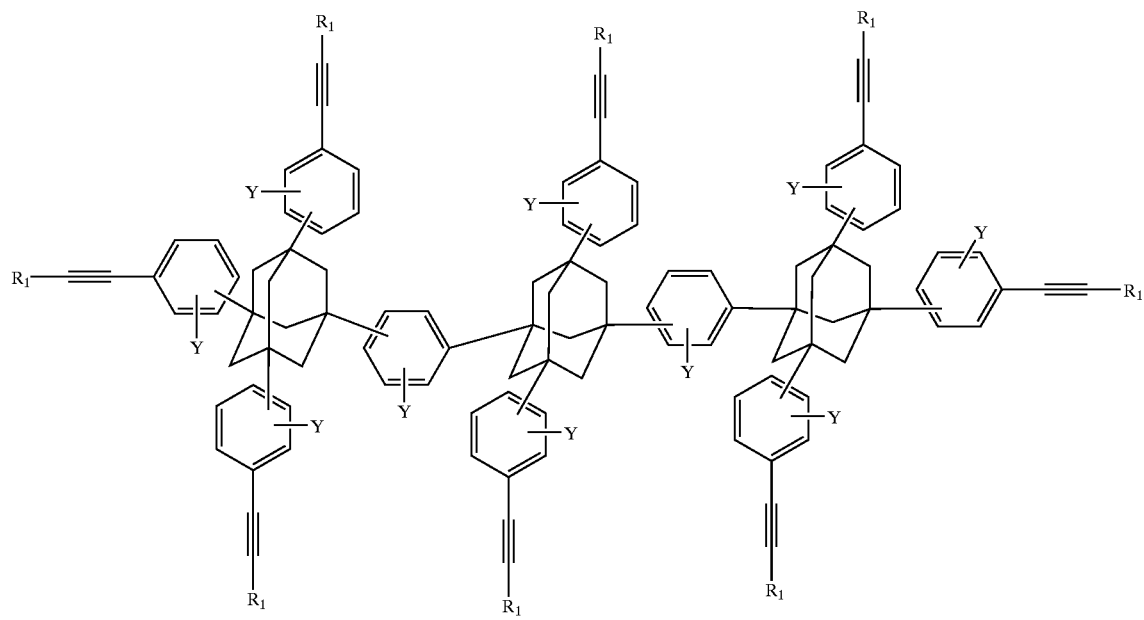

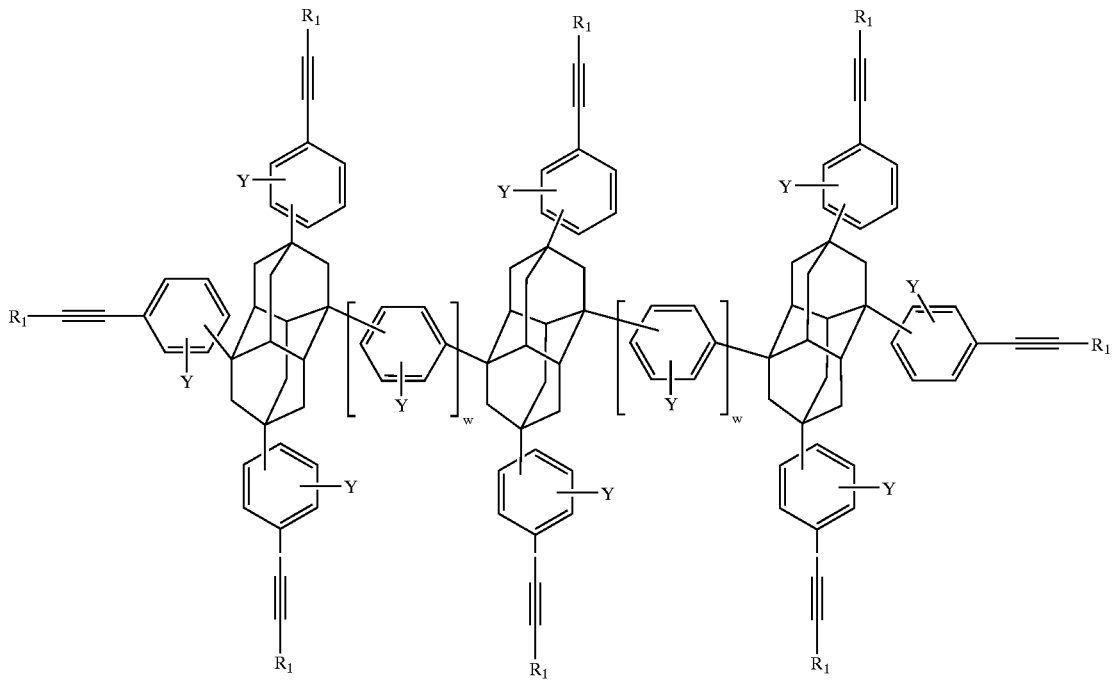

Preferably, the diamantane trimer is as shown in the following formula.

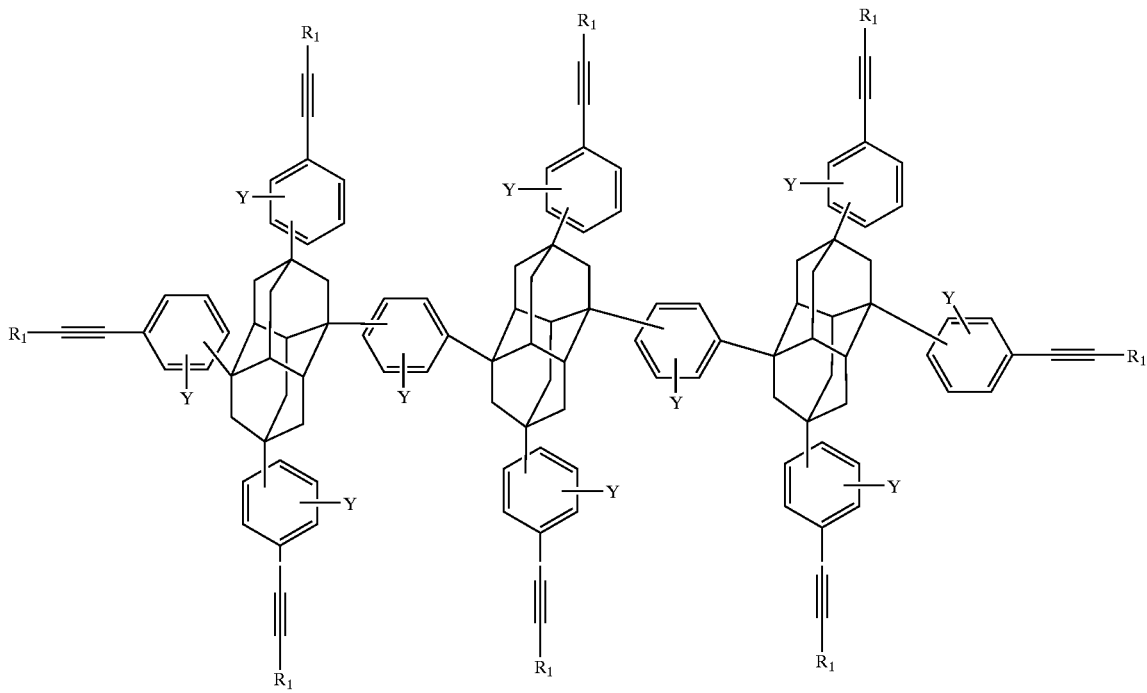

Preferably, the thermosetting component (a) comprises adamantane monomer of Formula VIIA, VIIB, VIIC, or VIID above, adamantane dimer of Formula XIX above, and at least one adamantane oligomer or polymer of Formula VIII above where at least one of h, i, and j is at least 1. Preferably, the thermosetting component (a) comprises diamantane monomer of Formula IXA, IXB, IXC, or IXD above, diamantane dimer of Formula XX above, and at least one diamantane oligomer or polymer of Formula X above where at least one of h, i, and j is at least 1.

Preferably, the thermosetting component (a) comprises adamantane monomer of Formula VIIA, VIIB, VIIC, or VIID above, adamantane dimer of Formula XIX above, adamantane trimer of Formula XXI above, and at least one adamantane oligomer or polymer of Formula VIII above where at least one of i and j is at least 1. Preferably, the thermosetting component (a) comprises diamantane monomer of Formula IXA, IXB, IXC, or IXD above, diamantane dimer of Formula XX above, diamantane trimer of Formula XXII above, and at least one diamantane oligomer or polymer of Formula X above where at least one of i and j is at least 1.

The thermosetting component (a) comprises adamantane monomer of Formula VIIA, VIIB, VIIC, or VIID that is a tetrasubstituted adamantane or a diamantane monomer of Formula IXA, IXB, IXC, or IXD that is a tetrasubstituted diamantane. The preferred monomer is the adamantane monomer of Formula VIIA. The adamantane framework carries a substituted aryl radical in each of positions 1, 3, 5, and 7. The compound with the Formula VIII is an oligomer or polymer, linked via unsubstituted and/or substituted aryl units, of the adamantane monomer of Formula VIIA, VIIB, VIIC, or VIID. The compound with the Formula X is an oligomer or polymer, linked via unsubstituted and/or substituted aryl units, of the diamantane monomer of Formula IXA, IXB, IXC, or IXD. Generally, h, i, and j are whole numbers from 0 to 10, preferably 0 to 5, and more preferably 0 to 2. The simplest adamantane oligomer is thus the dimer (h is 0, i is 0, and j is 0 in Formula VIII) as shown in Formula XIX above, in which two adamantane frameworks are linked via an unsubstituted or substituted aryl unit. The simplest diamantane oligomer is thus the dimer (h is 0, i is 0, and j is 0 in Formula X) as shown in Formula XX above, in which two diamantane frameworks are linked via an unsubstituted or substituted aryl unit.

Second Embodiment: In the second embodiment set forth above, preferably the present thermosetting component (a) comprises at least one adamantane oligomer or polymer of Formula VIII above where h is from 0 to 10, i is from 0 to 10, j is from 0 to 10, and w is 0 or 1. Preferably, the present thermosetting component (a) comprises at least one diamantane oligomer or polymer of Formula X above where h is from 0 to 10, i is from 0 to 10, j is from 0 to 10, and w is 0 or 1.

Preferably, the present thermosetting component (a) comprises at least one adamantane oligomer or polymer of Formula VIII above where h is 0 or 1, i is 0, j is 0, and w is 0 or 1. This adamantane structure is shown as Formula XVII above.

Preferably, the present thermosetting component (a) comprises at least one diamantane oligomer or polymer of Formula X above where h is 0 or 1, i is 0, j is 0, and w is 0 or 1. This diamantane structure is shown as Formula XVIII above.

Preferably, the thermosetting component (a) comprises at least one adamantane oligomer or polymer of Formula VIII above where h is 0, i is 0, j is 0, and w is 0 or 1. This adamantane dimer is shown as Formula XIX above.

Preferably, the thermosetting component (a) comprises at least one diamantane oligomer or polymer of Formula. X above where h is 0, i is 0, j is 0, and w is 0 or 1. This diamantane dimer is shown as Formula XX above.

Preferably, the thermosetting component (a) comprises at least one adamantane oligomer or polymer of Formula VIII above where h is 1, i is 0, j is 0, and w is 0 or 1. This adamantane trimer is as shown in Formula XXI above.

Preferably, the thermosetting component (a) comprises at least one diamantane oligomer or polymer of Formula X above where h is 1, i is 0, j is 0, and w is 0 or 1. This diamantane trimer is as shown in Formula XXII above.

Preferably, the thermosetting component (a) comprises a mixture of at least one adamantane oligomer or polymer of Formula VIII above where h is 2, i is 0, and j is 0 (linear oligomer or polymer) and h is 0, i is 1, and j is 0 (branched oligomer or polymer). Thus, this composition comprises a mixture of an adamantane linear tetramer as shown in Formula XXIII below where $R_1$, Y, and w are as defined above

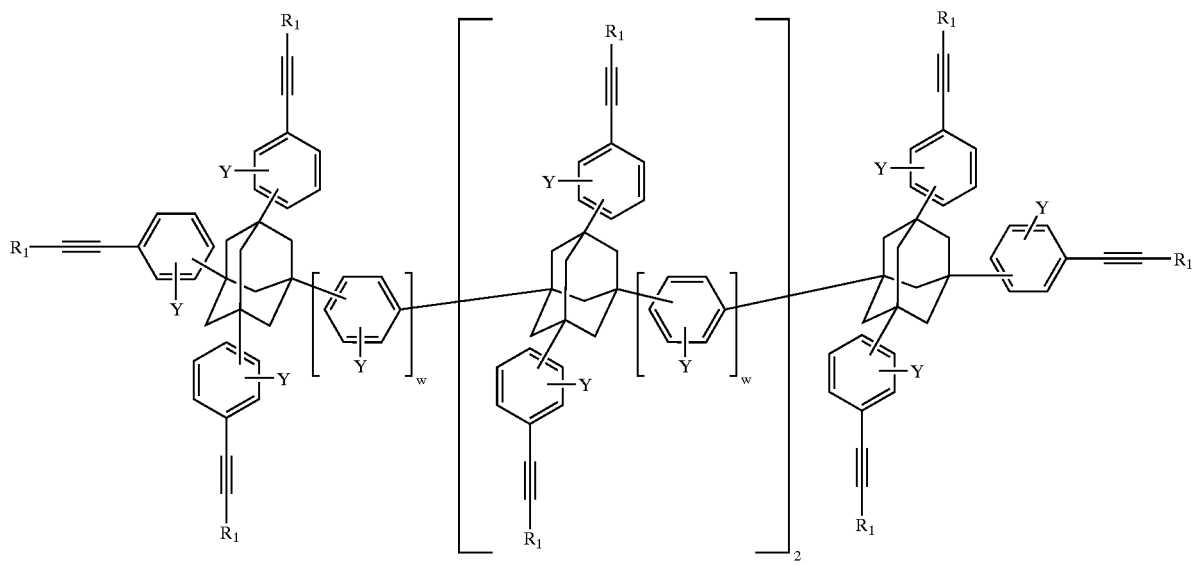

and preferably, the linear adamantane tetramer in the following formula
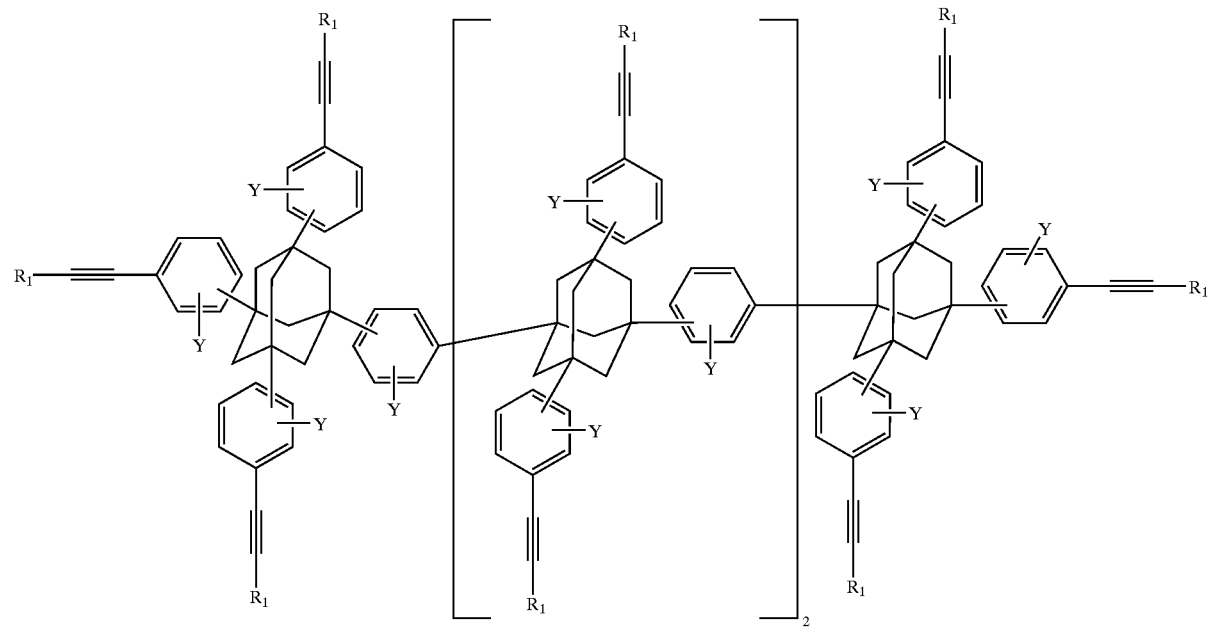
and adamantane branched tetramer as shown Formula XXIV below
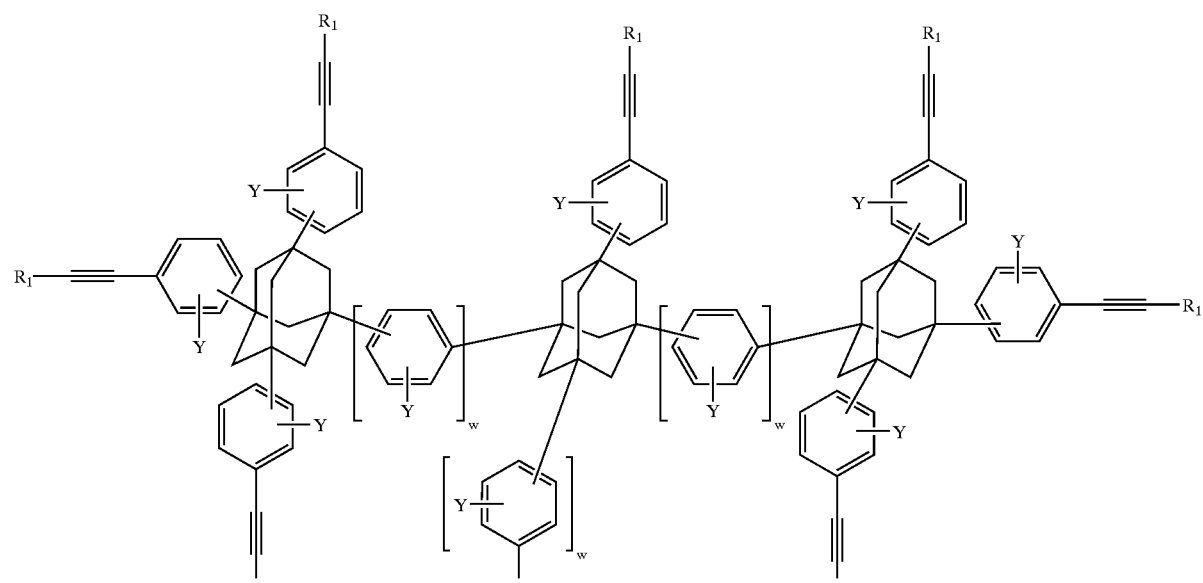

-continued
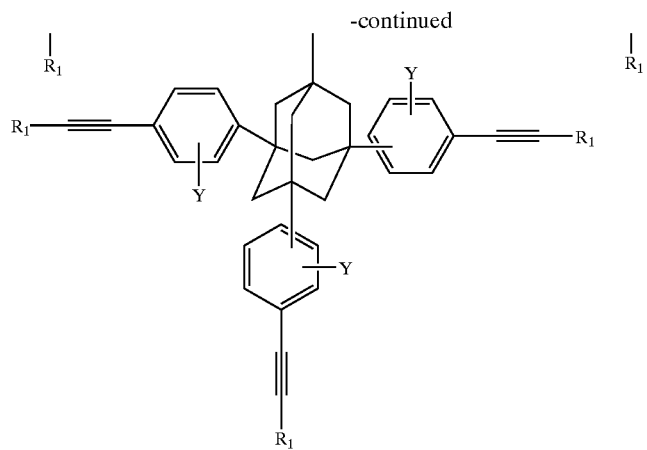
and preferably, the branched adamantane tetramer in the following formula
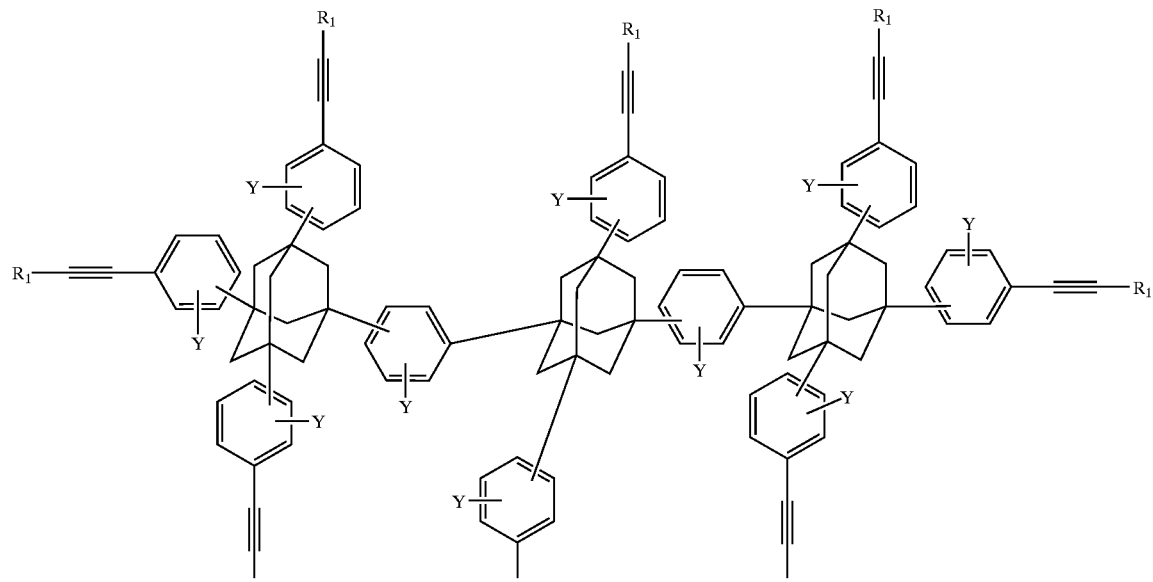
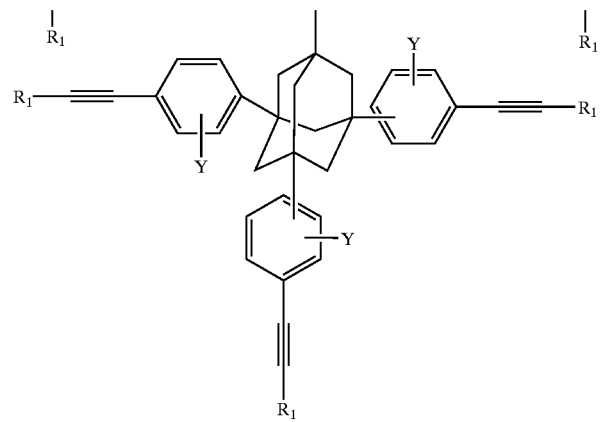

Preferably, the thermosetting component (a) comprises at least one diamantane oligomer or polymer of Formula X above where h is 2, i is 0, and is 0 (linear oligomer or polymer) and h is 0, i is 1, and j is 0 (branched oligomer or polymer). Thus, the present composition comprises diamantane linear tetramer as shown in Formula XXV below where $R_1$, Y, and w are as defined above

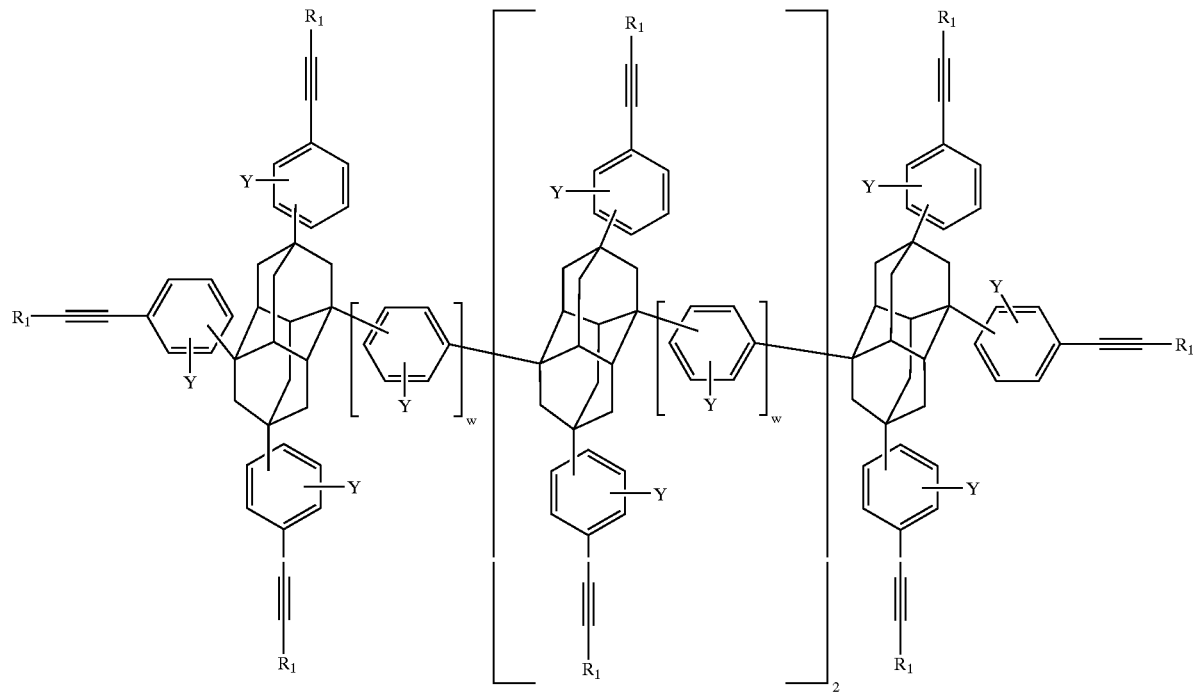

and preferably, the linear diamantane tetramer as shown in the following formula

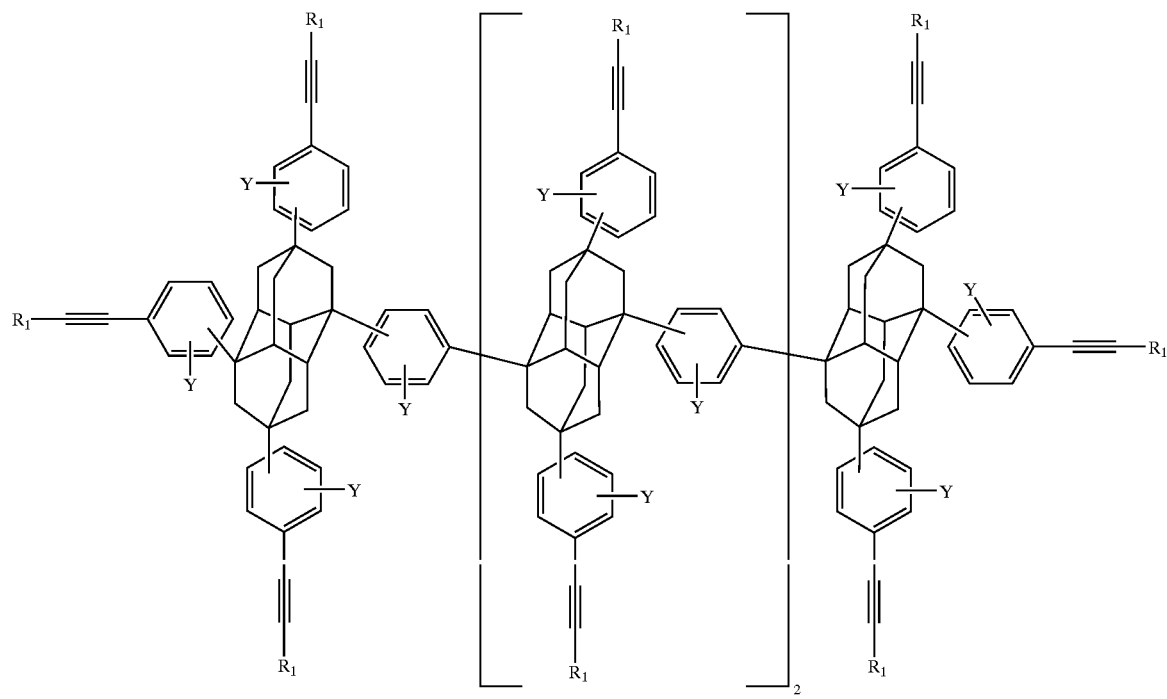

and diamantane branched tetramer as shown Formula XXVI below
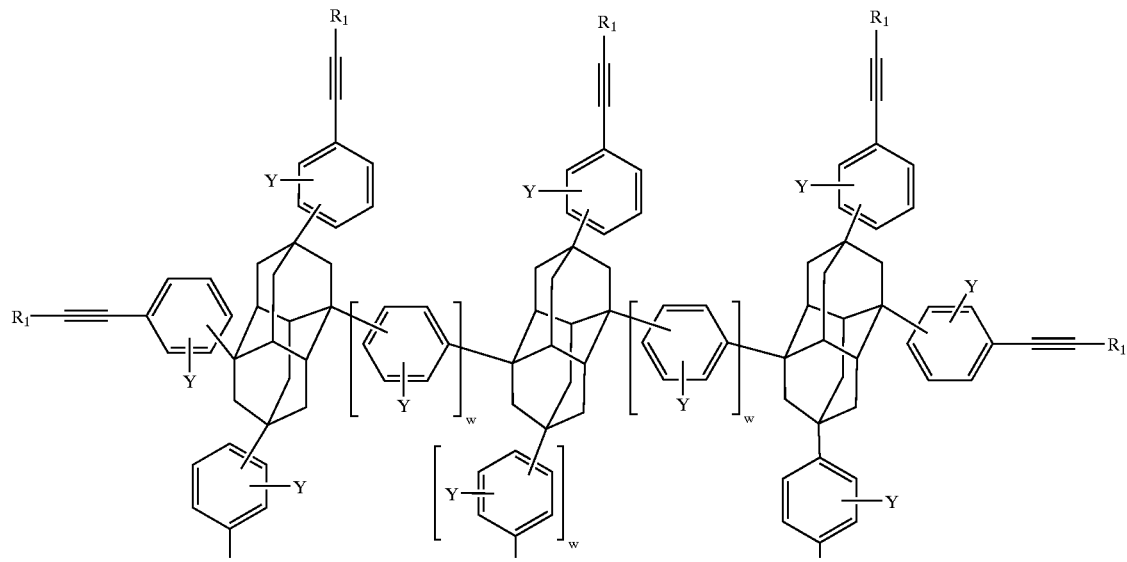
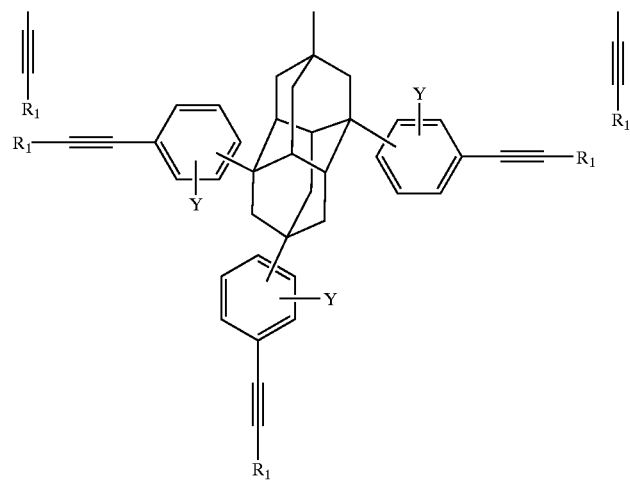

and preferably, the branched diamantane tetramer as shown in the following formula

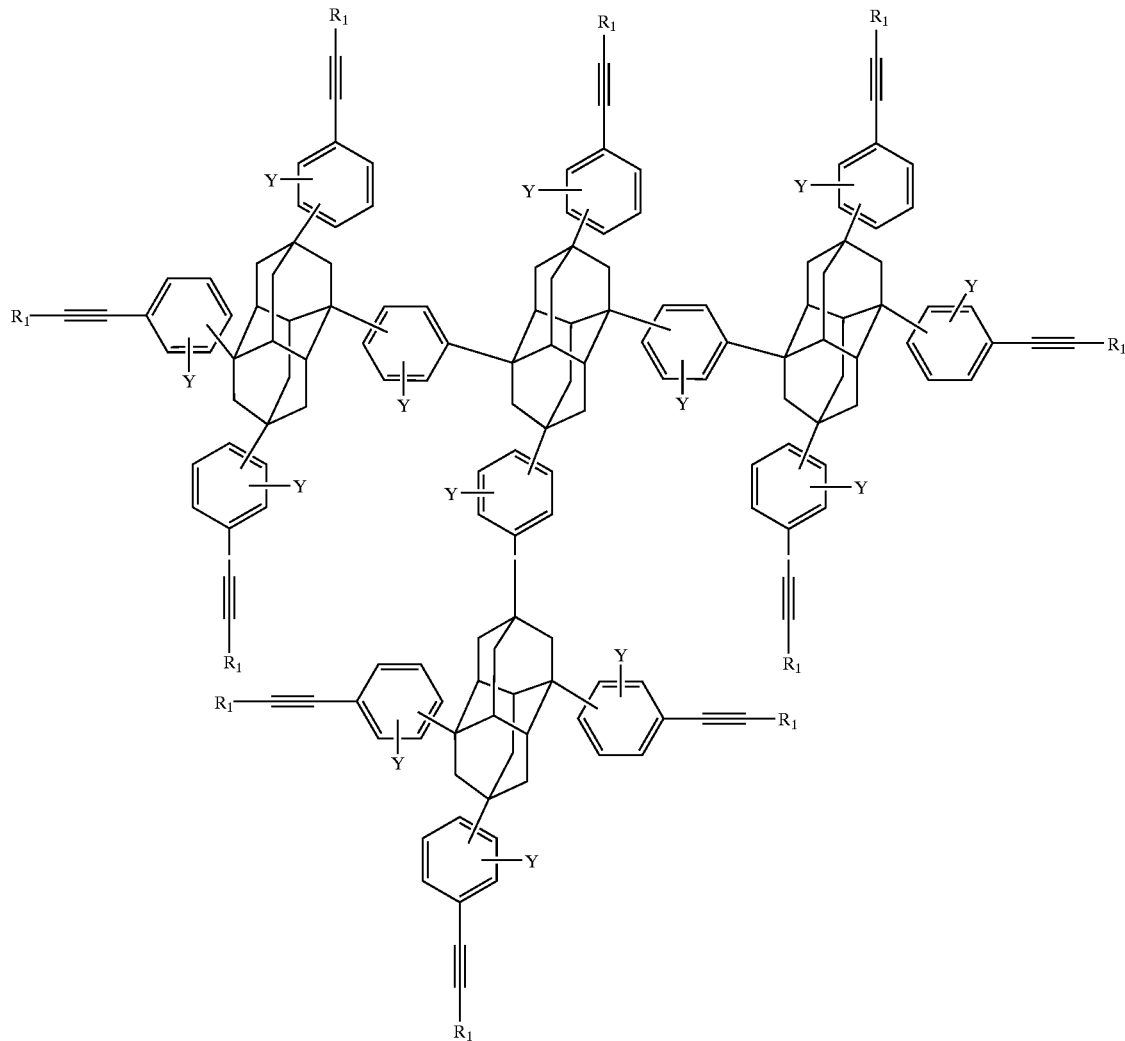

Preferably, the thermosetting component (a) comprises adamantane dimer of Formula XIX above and adamantane trimer of Formula XXI above. Preferably, the thermosetting component (a) comprises diamantane dimer of Formula XX above and diamantane trimer of Formula XXII above.

Preferably, the thermosetting component (a) comprises adamantane dimer of Formula XIX above and at least one adamantane oligomer or polymer of Formula VIII above where h is 0, i is at least 1, and j is 0. Preferably, the thermosetting component (a) comprises diamantane dimer of Formula XX above and at least one diamantane oligomer or polymer of Formula X above where h is 0, i is at least 1, and j is 0.

In both embodiments, for Formulae I and II above, preferred Q groups include aryl and aryl substituted with alkenyl and alkynyl groups and more preferred Q groups include (phenylethynyl)phenyl, phenylethynyl (phenylethynyl)phenyl, and (phenylethynyl)phenylphenyl moiety. Preferred aryls for G include phenyl, biphenyl, and terphenyl. The more preferred G group is phenyl.

The individual radicals $R_1$ of the substituted ethynyl radical on the phenyl ring attached to the adamantane or diamantane ring of the type $R_1$≡C— are in each case the same or different in Formulae VIIA, VIIB, VIIC, VIID, VIII, IXA, IXB, IXC, IXD, X, XVII, XVIII, XIX, XX, XXI, XXII, XXIII, XXIV, XXV, and XXVI above and XXVII and XXVIII below. $R_1$ is selected from hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl. Each $R_1$ may be unbranched or branched and unsubstituted or substituted and said substituents may be unbranched or branched. It is preferred that the radicals alkyl, alkenyl, alkynyl, alkoxyl, hydroxyalkyl, hydroxyalkenyl, and hydroxyalkyl contain from about 2 to about 10 carbon atoms and the radicals aryl, aryl ether, and hydroxyaryl contain from about 6 to about 18 carbon atoms. If $R_1$ stands for aryl, $R_1$ is preferably phenyl. Preferably, at least two of the $R_1C\equiv C$ groups on the phenyl groups are two different isomers. Examples of at least two different isomers include meta-, para-, and ortho-isomers. Preferably, the at least two different isomers are meta- and para-isomers. In the preferred monomer, 1,3,5,7-tetrakis [3'/4'-phenylethynyl)phenyl]adamantane (shown in FIG. 1D), five isomers form: (1) para-, para-, para-, para-; (2) para-, para-, para-, meta-; (3) para-, para-, meta-, meta-; (4) para-, meta-, meta-, meta-; and (5) meta-, meta-, meta-, meta-.

Each Y of the phenyl rings in the Formulae VIIA, VIIB, VIIC, VIID, VIII, IXA, IXB, IXC, IXD, X, XVII, XVIII, XIX, XX, XXI, XXII, XXIII, XXIV, XXV, and XXVI above and XXVII and XXVIII below is in each case the same or different and selected from hydrogen, alkyl, aryl, substituted aryl, or halogen. When Y is aryl, examples of aryl groups include phenyl or biphenyl. Y is selected from preferably hydrogen, phenyl, and biphenyl and more preferably hydrogen. Preferably, at least one of the phenyl groups between two bridgehead carbons of adamantane or diamantane exists as at least two different isomers. Examples of at least two different isomers include meta-, para-, and ortho-isomers. Preferably, the at least two isomers are meta- and para-isomers. In the most preferred dimer 1,3/4-bis{1',3',5'-tris[3"/4"-(phenylethynyl)phenyl]adamant -7'-yl}benzene (shown in FIG. 1F), 14 isomers form as follows. Preferably, the phenyl group located between the two bridgehead carbons of the adamantane exists as meta- and para-isomers. For each of the two preceding isomers, seven isomers of the $R_1C\equiv C$ groups on the phenyl groups exist as follows: (1) para-, para-, para-, para-, para-, para-; (2) para-, para-, para-, para-, para-, meta-; (3) para-, para-, para-, para-, meta-, meta-; (4) para-, para-, para-, meta-, meta-, meta-; (5) para-, para-, meta-, meta-, meta-, meta-; (6) para-, meta-, meta-, meta-, meta-, meta-; and (7) meta-, meta-, meta-, meta-, meta-, meta-.

In addition to the branched adamantane structure of Formula XXIV above, it should be understood that Formula VIII above when h is 0, i is 0, j is 1, and w is 0 or 1 represents further branching as shown in Formula XXVII below. It should be understood that branching may occur beyond that of the Formula XXVII structure because further branching of the pending adamantane units of the Formula XXVII structure may also occur.

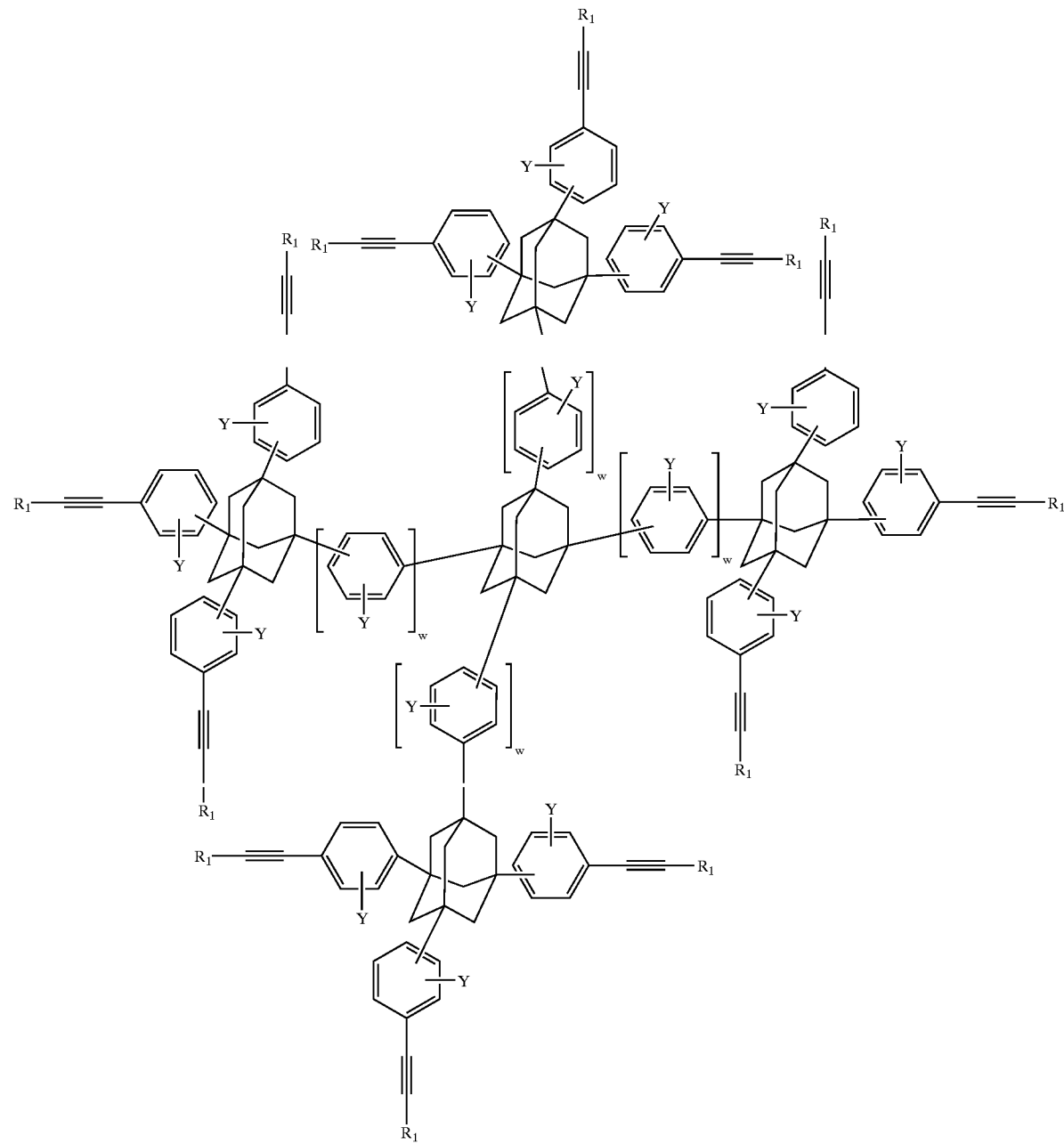

Preferably, the branched adamantane is as shown in the following formula.

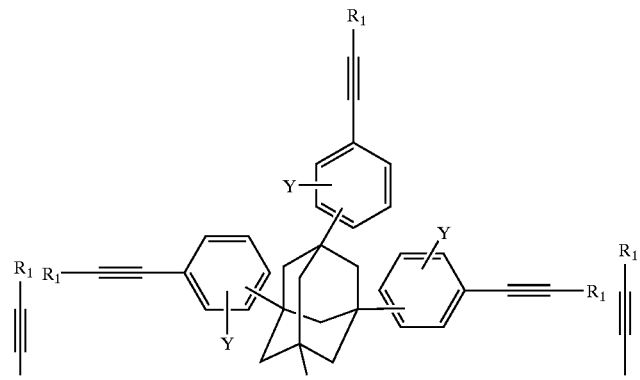

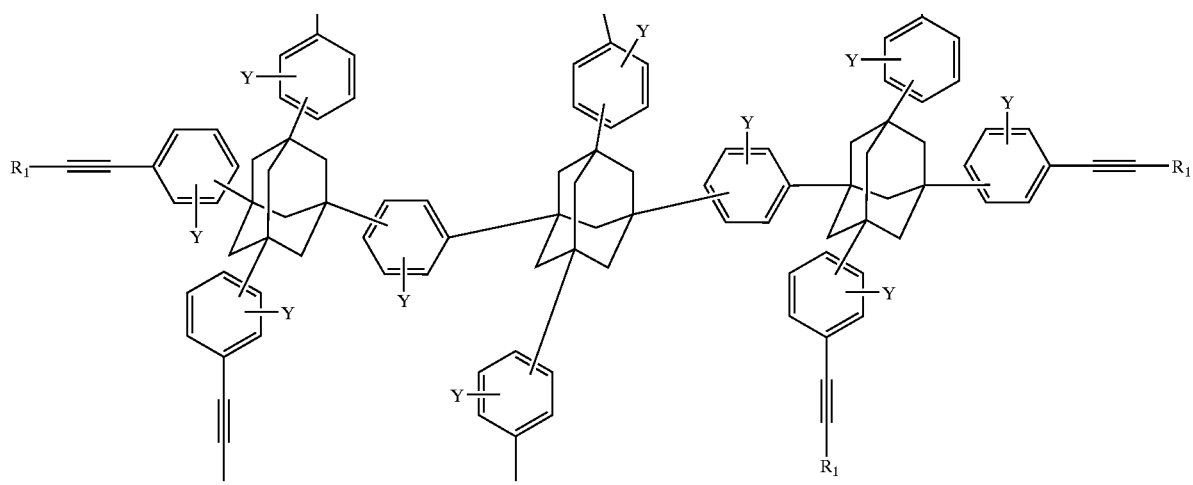

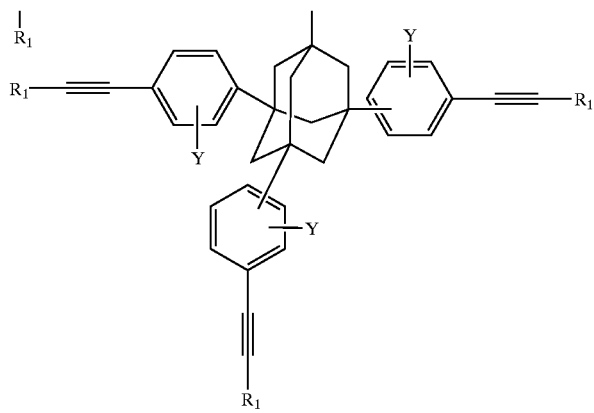

In addition to the branched diamantane structure of Formula XXVI above, it should be understood that Formula X above when h is 0, i is 0, j is 1, and w is 0 or 1 represents further branching as shown in Formula XXVIII below. It should be understood that branching may occur beyond that of the Formula XXVIII structure because further branching of the pending diamantane units of the Formula XXVIII structure may also occur.

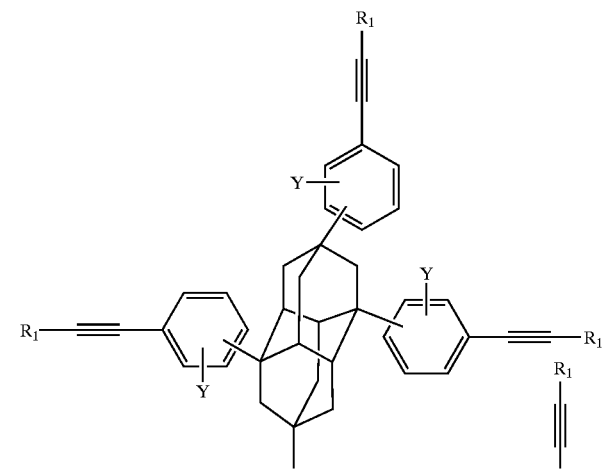
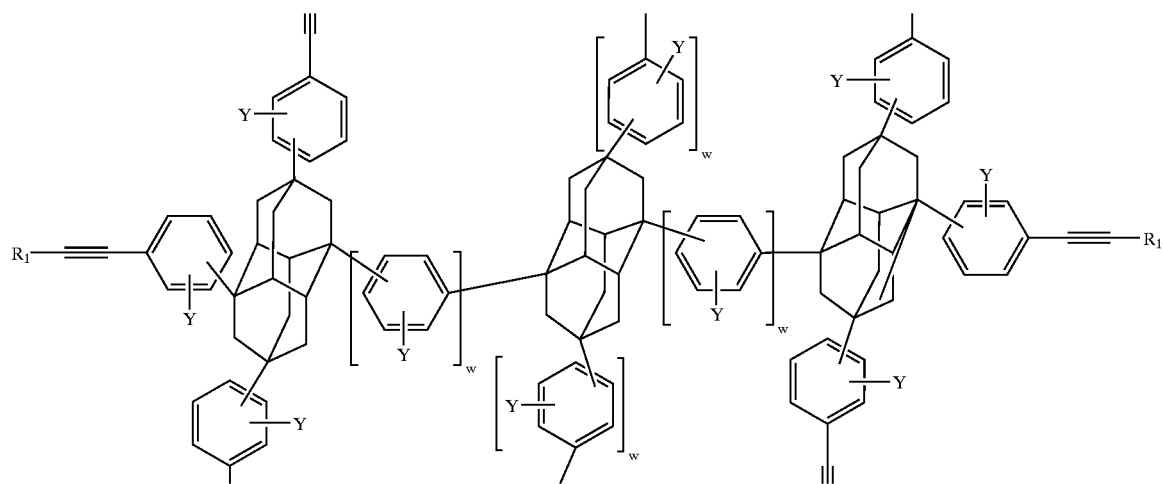
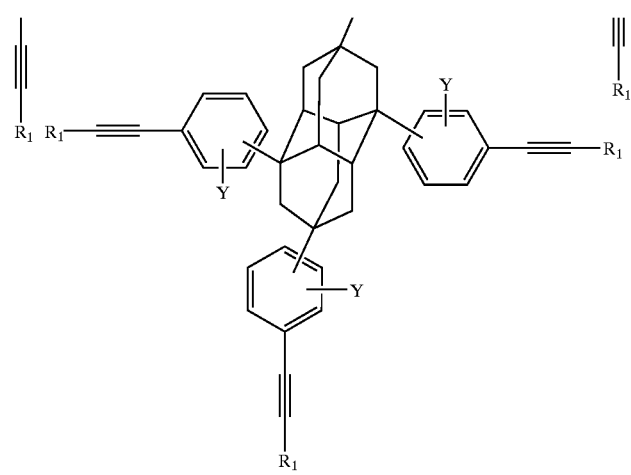

Preferably, the branched diamantane is as shown in the following formula.

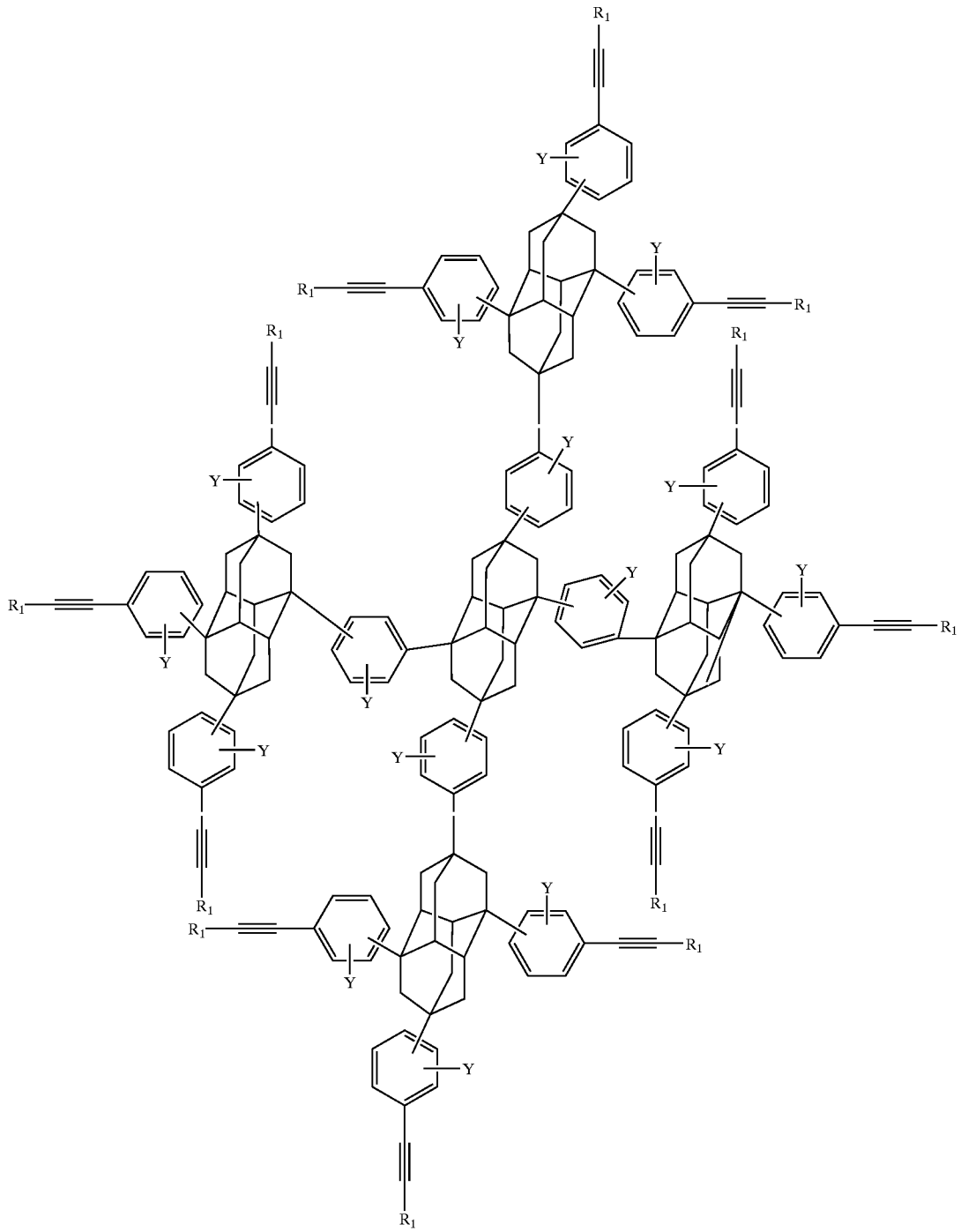

In thermosetting component (a), the monomer (a) and oligomer or polymer (b) contents are determined by the gel permeation chromatography techniques set forth below in the Analytical Test Methods section. The present composition comprises the adamantane or diamantane monomer (a) in a quantity of about 30 to about 70 area-%, more preferably about 40 to about 60 area-% and even more preferably about 45 to about 55 area-% and the oligomer or polymer (b) in a quantity of about 70 to about 30 are a-%, more preferably about 60 to about 40 area-%, and even more preferably about 55 to about 45 area-%. Most preferably, the present composition comprises the monomer (1) in a quantity of approximately 50 area-% and the oligomer or polymer (2) in a quantity of approximately 50 area-%.

The Analytical Test Methods section sets forth two Gel Permeation Chromatography Methods. Both provide similar results. One skilled in the art may elect to use the second method in that it yields additional detail on the dimer and trimer.

In general, the quantity ratio of the adamantane or diamantane monomer (1) to oligomer or polymer (2) can be set in a desired manner, e.g. by altering the molar ratio of the starting components during the preparation of the composition according to the invention, by adjusting reaction conditions, and by altering the ratio of nonsolvent to solvent during precipitation/isolation steps.

A preferred process for preparing the thermosetting component (a) comprises the following steps.

In step (A), adamantane or diamantane is reacted with halogeno benzene compound of Formula XXIX

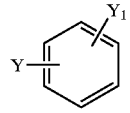

where Y is selected from hydrogen, alkyl, aryl, substituted aryl, or halogen and $Y_1$ is halogen, to form a mixture which if adamantane is used, comprises at least one monomer of Formula III

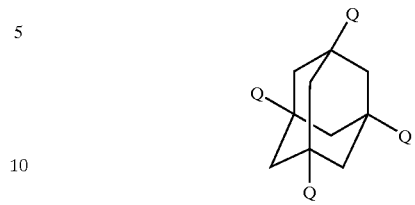

and at least one oligomer or polymer of Formula IV where h is from 0 to 10, i is from 0 to 10, j is from 0 to 10, and w is 0 or 1

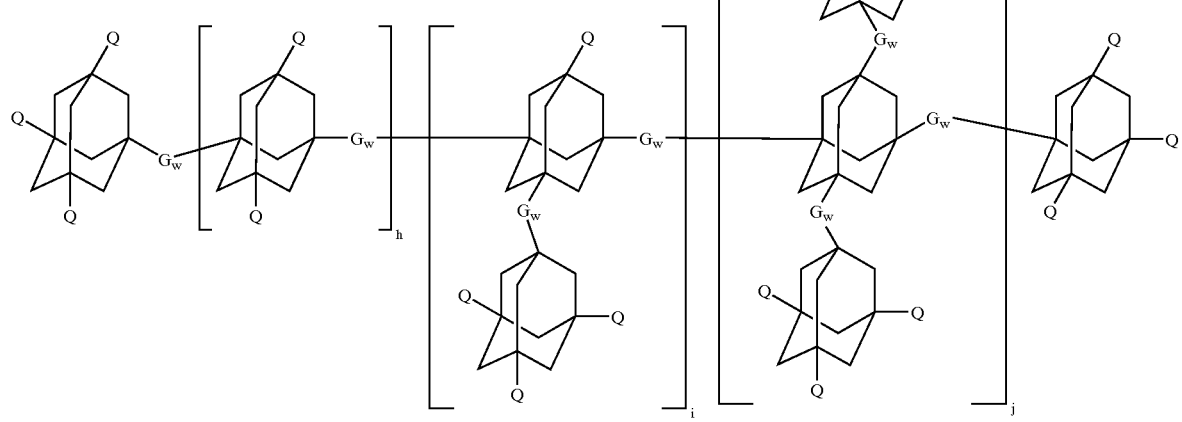

and preferably, the oligomer or polymer is of Formula XXX

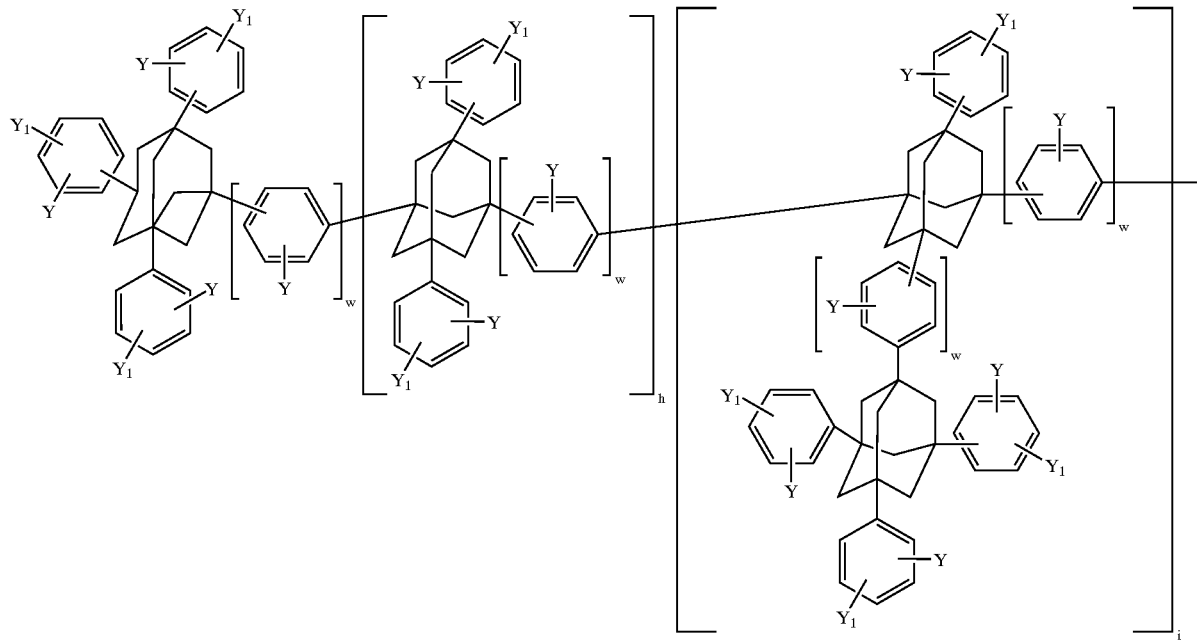

-continued
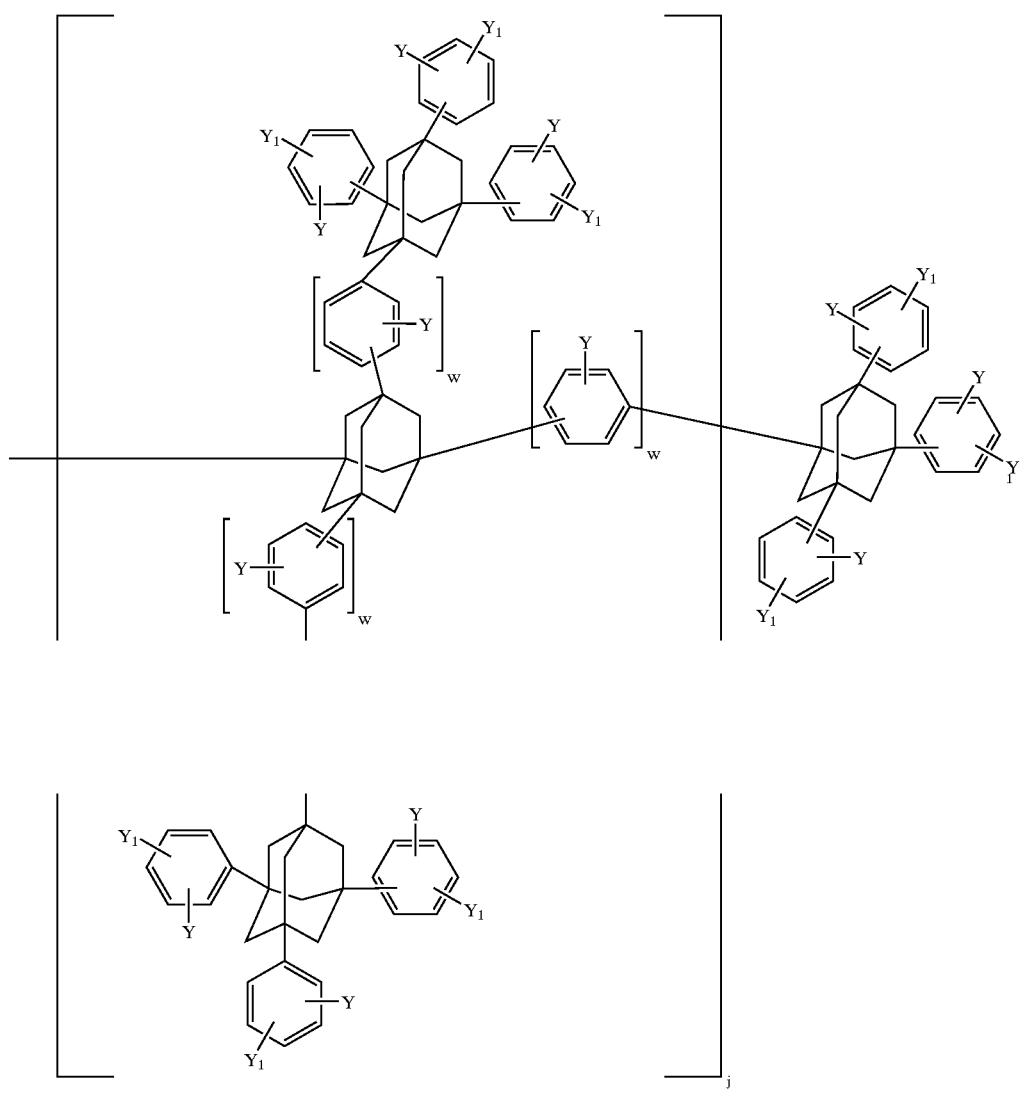
or if diamantane is used, comprises at least one monomer of Formula V
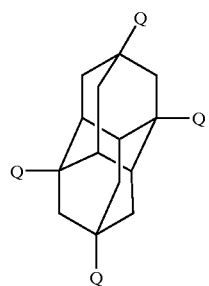
and at least one oligomer or polymer of Formula VI where h is from 0 to 10, i is from 0 to 10, j is from 0 to 10, and w is 0 or 1

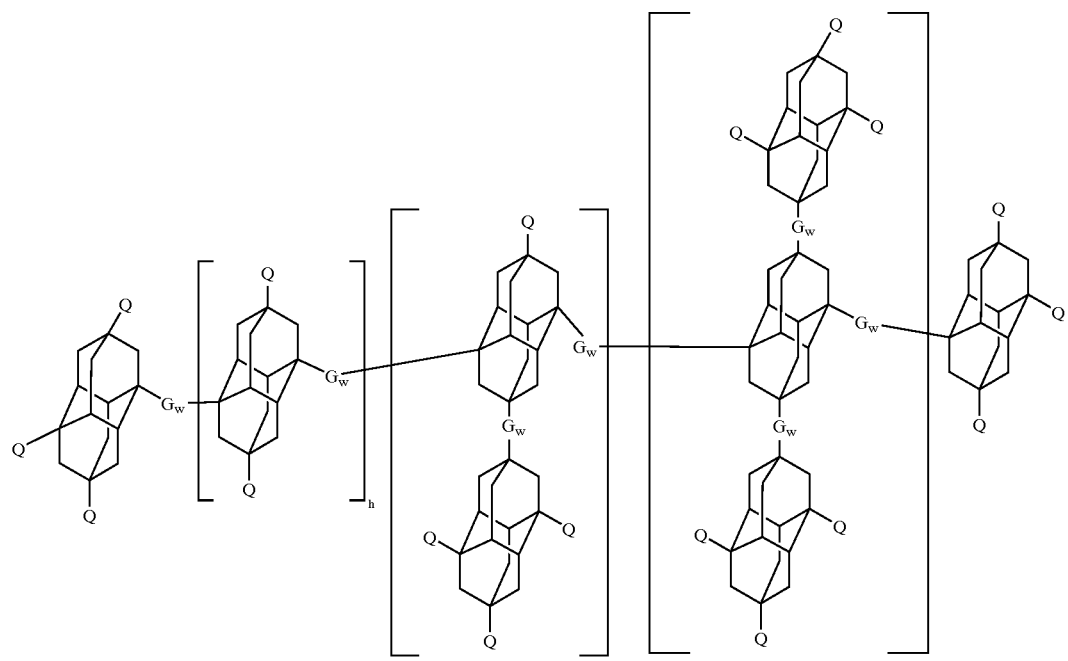
and preferably, the at least one oligomer or polymer is of Formula XXXI
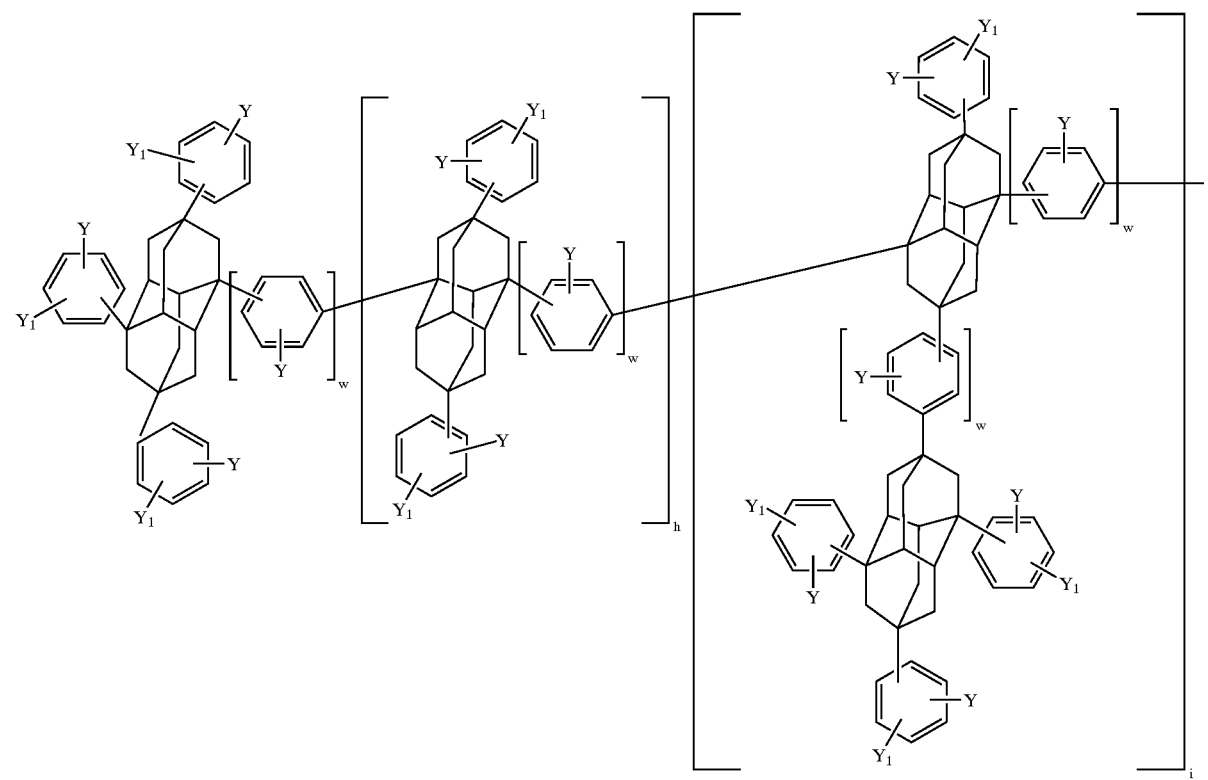

-continued

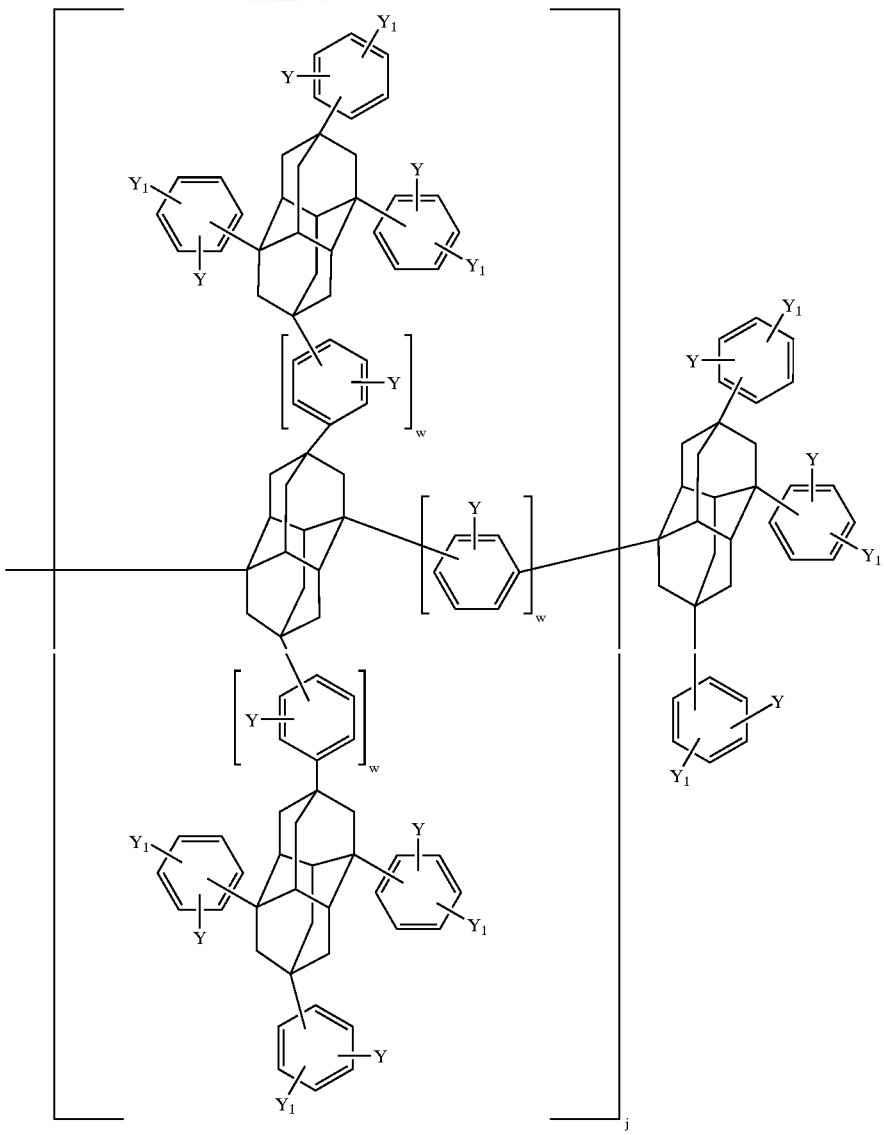

It should be understood to those skilled in the art that reaction may occur on diamantahe at bridgehead carbons other than those indicated in Formulae V and VI above.

In step (B), the mixture resulting from step (A) is reacted with terminal alkyne of the formula $R_1C\equiv CH$. Preferably, the present process forms compositions of Formulae VIIA, VIIB, VIIC, VIID and VIII or IXA, IXB, IXC, IXD, and X above.

In step (A), adamantane or diamantane is reacted with halogeno benzene compound with the Formula XXIX. In addition to the halogen radical $Y_1$ and the previously described radical Y, the halogeno benzene compound can also contain further substituents.

The halogeno benzene compound is preferably selected from bromobenzene, dibromobenzene, and iodobenzene. Bromobenzene and/or dibromobenzene are preferred, bromobenzene being even more preferred.

The reaction of adamantane or diamantane with the halogeno benzene compound (step (A)) takes place preferably through Friedel-Crafts reaction in the presence of a Lewis acid catalyst. Although all customary Lewis acid catalysts may be used, it is preferred that the Lewis acid catalyst contains at least one compound selected from aluminum(III) chloride ($AlCl_3$), aluminum(III) bromide ($AlBr_3$), and aluminum (III) iodide ($AlI_3$). Aluminum(III) chloride ($AlCl_3$) is most preferred. Despite the greater Lewis acidity of aluminum(III) bromide, its use is generally less preferred, because it has a low sublimation point of only 90° C. and is thus much more difficult to handle on an industrial scale than e.g. aluminum(III) chloride.

In a further preferred version, the Friedel-Crafts reaction is carried out in the presence of a second catalyst component. The second catalyst component preferably contains at least one compound selected from tertiary halogen alkane with 4 to 20 carbon atoms, tertiary alkanol with 4 to 20 carbon atoms, secondary and tertiary olefin with 4 to 20 carbon atoms and tertiary halogen alkyl aryl compound. In particular, the second catalyst component contains at least one compound selected from 2-bromo-2-methylpropane (tert.-butyl bromide), 2-chloro-2-methylpropane (tert.-butyl chloride), 2-methyl-2-propanol (tert.-butyl alcohol), isobutene, 2-bromopropane, and tert.-butylbromobenzene, with 2-bromo-2-methylpropane (tert.-butyl bromide) being most preferred. Overall, compounds whose alkyl groups include 5 or more carbon atoms are less suitable, as solid constituents precipitate out of the reaction solution at the end of the reaction.

It is most preferred that the Lewis acid catalyst is aluminum(III) chloride (AlCl$_3$) and the second catalyst component is 2-bromo-2-methylpropane (tert.-butyl bromide) or tert.-butylbromobenzene.

The preferable procedure for carrying out the Friedel-Crafts reaction is that adamantane or diamantane, halogeno benzene compound (e.g. bromobenzene), and Lewis acid catalyst (e.g. aluminium chloride) are mixed and heated at a temperature of 30° C. to 50° C., preferably 35° C. to 450° C. and in particular 40° C. At temperatures lower than 30° C., the reaction is not completed, i.e. a higher proportion of tri-substituted adamantane forms for example. In principle it is conceivable to use even higher temperatures than those given above (e.g. 60° C.), but this leads in an undesirable manner to a higher proportion of non-halogenated aromatic material (e.g. benzene) in the reaction mixture of step (A). The second component of the catalyst system, say tert.-butyl bromide, is then added to the above reaction solution generally over a period of 5 to 10 hours, preferably 6 to 7 hours and after the addition has ended, mixed into the reaction mixture in the temperature range named above customarily for a further 5 to 10 hours, preferably 7 hours.

Surprisingly, in addition to the monomeric tetraphenylated compound, e.g. 1,3,5,7-tetrakis(3'/4'-bromophenyl)adamantane, oligomers or polymers thereof were also found in the mixture obtained after step (A). It was wholly unexpected that the quantity ratio of adamantane monomer of Formula III to adamantane oligomer or polymer of Formula IV or diamantane monomer of Formula V to diamantane oligomer or polymer of Formula VI was controllable through the quantities of adamantane or diamantane, halogeno benzene compound (e.g. bromobenzene), and second catalyst component ( e.g. tert.-butyl bromide) used. The molar ratio of adamantane or diamantane to halogeno benzene compound to second catalyst component in the reaction mixture of step (A) is preferably 1:(5–15):(2–10) and even more preferably 1:(8–12):(4–8).

In the compounds with the Formulae XXX and XXXI, the position of the halogen substituent $Y_1$ is undefined. Preferably, the mixtures comprise meta- and para-isomers which, unlike all para-isomers, advantageously produce improved solubility and good film properties. In the reaction mixture of step (A), in addition to monomers and oligomers or polymers, starting components and by-products, such as not wholly phenylated adamantanes, can also occur.

The mixture resulting from step (A) is optionally worked up using methods known to those skilled in the art. For example, it may be necessary to remove non-reacted halogen phenyl compound, say bromobenzene, from the mixture in order to obtain a product, usable for further reaction, with a high proportion of compounds of Formulae VIIA, VIIB, VIIC, or VIID and VIII or IXA, IXB, IXC, or IXD and X. Any solvent or solvent mixture which is miscible with the halogeno benzene compound, say bromobenzene, and is suitable for the precipitation of the compounds of Formulae VIIA, VIIB, VIIC, or VIID and VIII or IXA, IXB, IXC, or IXD and X may be used for the isolation of such a product. It is preferred to introduce the mixture resulting from step (A) into a nonpolar solvent or solvent mixture, e.g. by dropping in, with preference being given to the use of aliphatic hydrocarbons with 7 to 20 carbon atoms or mixtures thereof and in particular at least one component selected from heptane fraction (boiling point 93–99° C.), octane fraction (boiling point 98–110° C.) and alkane mixture currently commercially available from Honeywell International Inc. under the tradename Spezial Benzin 80–110° C. (petroleum ether with boiling point of 80–110° C.). Spezial Benzin 80–110° C. (petroleum ether with boiling point of 80–110° C.) is most preferred. The weight ratio of organic mixture to nonpolar solvent is preferably about 1:2 to about 1:20, more preferably about 1:5 to about 1:13, and even more preferably about 1:7 to about 1:11. Alternatively, a polar solvent or solvent mixture (e.g. methanol or ethanol) can be used for the working-up of the mixture obtained after step (A), but it is less preferred, as the product mixture then precipitates out as a rubbery composition.

We have found that the peak ratio of monomer resulting from step (A) above to its dimer and trimer and oligomer in the reaction mixture shifts dramatically if the step (A) mixture is precipitated into certain solvents. This discovery advantageously allows one skilled in the art to adjust process conditions in order to achieve a targeted ratio of monomer to dimer and trimer and oligomer. To reduce this ratio, preferably, a solvent is used in which the monomer and oligomer or polymer have different solubilities.

Preferred solvents for achieving this monomer to dimer and trimer ratio shift include Spezial Benzin 80–110° C. (petroleum ether with boiling point of 80° C.–110° C.), ligroine (boiling point 90–110° C.), and heptane (boiling point 98° C.). The more preferred solvent is Spezial Benzin. More specifically, to achieve a shift from about 3:1 monomer:dimer+trimer+oligomer to about 1:1, the step (A) mixture is precipitated into Spezial Benzin or to attain a shift from about 3:1 monomer:dimer+trimer+oligomer to about 1.7–2.0:1.0, the step (A) reaction mixture is precipitated into ligroine and heptane. We know that these substantial changes in peak distribution at precipitation are explained by the loss of monomer in the precipitation filtrates: ⅔ loss in Spezial Benzin and ≦⅓ loss in ligroine and heptane, which correspond to monomer yield losses of 50 and 25–33%. In order for the ratio monomer:dimer+trimer+oligomer 3:1 to remain unchanged, the step (A) reaction mixture is precipitated into methanol where no yield losses are observed. This is corroborated by determination of yield losses of the filtrates and GPC analysis of the filtrates.

Like the synthesis described by Ortiz, the Friedel-Crafts reaction which is carried out according to a preferred version in step (A) of the present process starts direct from adamantane which is coupled with the halogeno benzene compound. Compared with previous syntheses of e.g. 1,3,5,7-tetrakis(3'/4'-bromophenyl)adamantane by Reichert et al., the present process is particularly advantageous because it is no longer necessary to produce tetrabrominated adamantanes first, which saves a reaction step. Also, less unwanted benzene forms.

It is known to those skilled in the art that the halogen radical $Y_1$ in the compounds of FormulaeIII, IV, V, and VI above can also be introduced, apart from a direct reaction of adamantane with halogen phenyl compound (e.g. with the help of a Friedel-Crafts reaction), by a multi-stage synthesis, for example, by coupling adamantane with a phenyl compound (i.e. without halogen radical$Y_1$) followed by introduction of the radical $Y_1$ say through addition with $W(Y_1)_2$ (e.g. $Br_2$) although this is not preferred.

In step (B) of the preferred process, the (optionally worked-up) mixture obtained after step (A) is reacted with terminal alkyne of the formula $R_1C\equiv CH$ where $R_1$ is as previously defined.

In the formula $R_1C\equiv CH$, $R_1$ is identical with the previously described radical $R_1$ of the adamantane product of Formulae VIIA, VIIB, VIIC, or VIID and VIIII and the diamantane product of Formulae IXA, IXB, IXC, or IXD and X. Accordingly it is most preferred to use ethynyl benzene (phenylacetylene) as terminal alkyne for the reaction in step (B).

In order, in step (B), to couple the terminal alkyne to the halogeno benzene radicals located at the adamantane system, all conventional coupling methods suitable for this purpose may be used, as described for example in Diederich, F., and Stang, P.J., (Eds.) "Metal-Catalyzed Cross-Coupling Reactions", Wiley-VCH 1998 and March, J., "Advanced Organic Chemistry", 4th Edition, John Wiley & Sons 1992, pages 717/718.

When Y on the phenyl groups is attached to two cage structure bridgehead carbons in Formula VIII above or in Formula X above, Y may react with phenylacetylene to generate terminal alkyne groups.

In a preferred version of the process according to the invention, the reaction of the (optionally worked-up) mixture obtained after step (A) with terminal alkyne is carried out in the presence of a catalyst system as used in the so-called Sonogashira coupling (cf. Sonogashira; Tohda; Hagihara; Tetrahedron Lett. 1975, page 4467). It is even more preferred to use a catalyst system which in each case contains at least one palladium-triarylphosphine complex with the formula $\{Ar_3P\}_2PdX_2$ (where Ar=aryl and X=halogen), a copper halide (e.g. CuI), a base (e.g. a trialkylamine), a triarylphosphine and a co-solvent. According to the invention, this preferred catalyst system can equally well consist of the named components. The co-solvent preferably contains at least one component selected from toluene, xylene, chlorobenzene, N,N-dimethylformamide and 1-methyl-2-pyrrolidone (N-methylpyrrolidone (NMP)). A catalyst system which contains the components bis-(triphenylphosphine)palladium (II)dichloride (i.e. $[Ph_3P]_2PdCl_2$), triphenylphosphine (i.e. $[Ph_3P]$), copper(I)-iodide, triethylamine and toluene as co-solvent is most preferred.

The preferred procedure for the reaction of the mixture obtained from step (A) (and optionally worked-up) with terminal alkyne is that the mixture is first mixed with the base (e.g. triethylamine) and the co-solvent (e.g. toluene) and this mixture is stirred for some minutes at room temperature. The palladium-triphenylphosphine complex (e.g. $Pd(PPh_3)_2Cl_2$), triphenylphosphine ($PPh_3$) and copper halide (e.g. copper(I)-iodide) are then added, and this mixture is heated in a temperature range of 50° C. to 90° C. (more preferably 80° C. to 85° C.). Terminal alkyne is then added in the named temperature range within 1 to 20 hours (more preferably 3 hours). After the ending of the addition, the mixture is heated for at least 5 to 20 hours (more preferably 12 hours) at a temperature of 75° C. to 85° C. (more preferably 80° C.). Solvent is then added to the reaction solution and distilled off under reduced pressure. Preferably, after filtration, the reaction solution is then cooled to a temperature of 20° C. to 30° C. (more preferably 25° C.). Finally, the reaction mixture of step (B), in particular for the removal of metal traces (e.g. Pd), is worked up with conventional methods which are known to those skilled in the art.

The peak ratio of monomer resulting from step (B) above to its dimer and trimer and oligomer in the reaction mixture shifts if the step (B) mixture is precipitated into certain solvents.

Surprisingly, it transpired that the reaction sequence starting direct from adamantane leads to an oligomeric or polymeric content in the reaction product of step (A) which can be controlled via the use ratio of adamantane, halogeno benzene compound and the second catalyst component, say tert.-butyl bromide. In corresponding manner, the benzene content in the reaction mixture of step (A) is also successfully regulated via this use ratio, which, because of the toxicity of benzene in industrial-scale syntheses, is of great importance. The oligomeric or polymeric content permits the same secondary chemistry as the monomer (e.g. 1,3,5,7-tetrakis(3'/4'-bromophenyl)adamantane, i.e. the oligomer or polymer is just as accessible as the monomer for the reaction with the terminal alkyne in step (B)).

In another embodiment, the present invention provides (a) a mixture of at least two different isomers of Formula XXXII

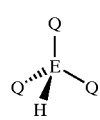

and (b) adhesion promoter as set forth above. E is a cage compound as defined above and each Q is the same or different and selected from hydrogen, aryl, branched aryl, and substituted aryl wherein the substituents include hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl. Examples of at least different isomers include meta-, para-, and ortho-isomers. Preferably, the at least two different isomers are meta- and para-isomers.

Preferably, the mixture comprises at least two different isomers of Formula XXXIII

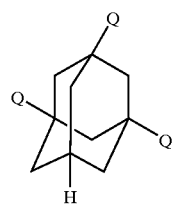

where Q is as previously defined. Preferably, the mixture comprises at least two different isomers of Formula XXXIV

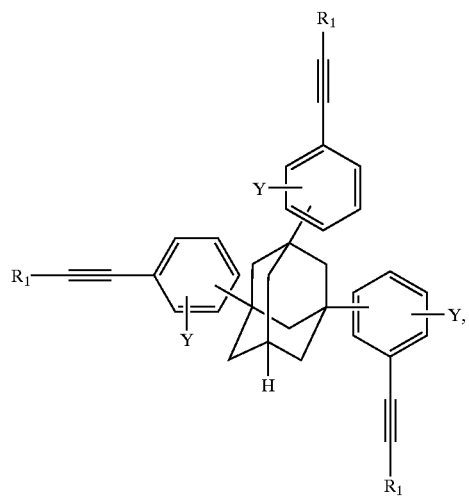

Formula XXXV

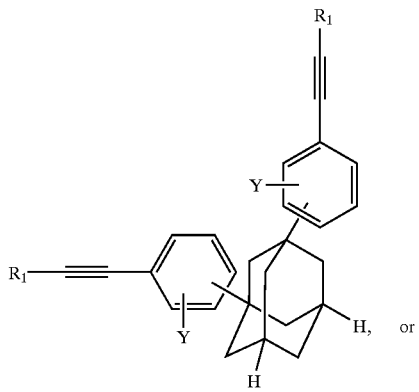

Formula XXXIX

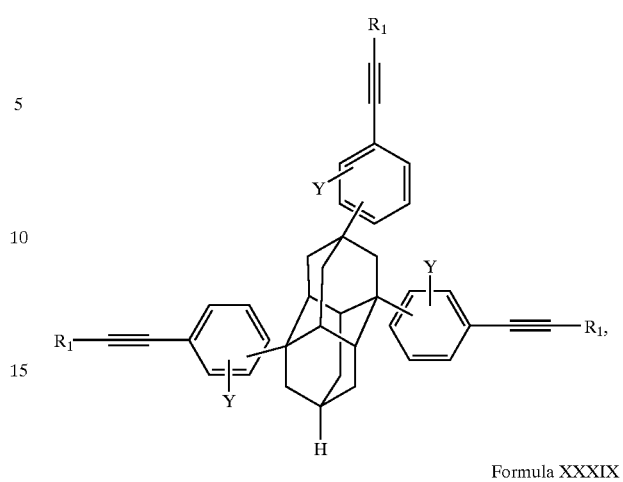

Formula XXXVI

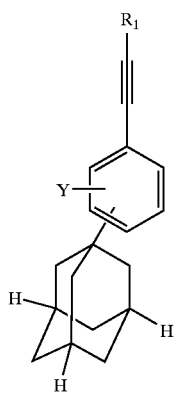

where each Y is the same or different and selected from hydrogen, alkyl, aryl, substituted aryl, or halogen and each $R_1$, is the same or different and selected from hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl.

Preferably, the mixture comprises at least two different isomers of Formula XXXVII

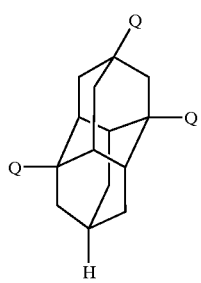

where each Q is as previously defined. Preferably, the mixture comprises at least two different isomers of Formula XXXVIII Formula XXXX

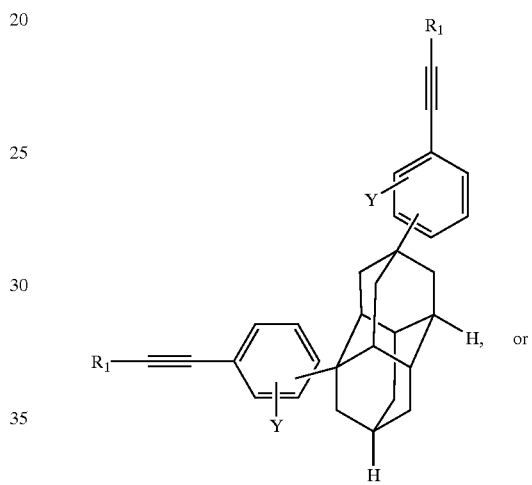

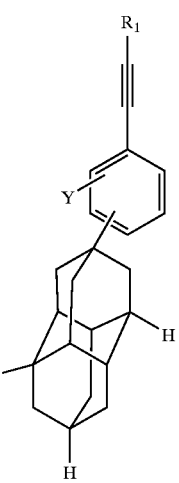

where Y and $R_1$ are as previously defined.

Adhesion Promoter (b):

Adhesion promoter (b) is disclosed in our commonly assigned pending patent application PCT/US01/50182 filed Dec. 31, 2001 which is incorporated herein by reference in its entirety.

In adhesion promoter (b), preferably at least one of the first functionality and the second functionality is selected from Si containing groups; N containing groups; C bonded to O containing groups; hydroxyl groups; and C double bonded to C containing groups. Preferably, the Si containing groups are selected from Si—H, Si—O, and Si—N; the N containing groups are selected from such as C—NH$_2$ or other secondary and tertiary amines, mines, amides, and imides; the C bonded to O containing groups are selected from =CO, carbonyl groups such as ketones and aldehydes, esters, —COOH, alkoxyls having 1 to 5 carbon atoms, ethers, glycidyl ethers; and epoxies; the hydroxyl group is phenol; and the C double bonded to C containing groups are selected from allyl and vinyl groups. For semiconductor applications, the more preferred functional groups include the Si containing groups; C bonded to O containing groups; hydroxyl groups; and vinyl groups.

An example of a preferred adhesion promoter having Si containing groups is silanes of the Formula XI: $(R_2)_k(R_3)_l Si(R_4)_m(R_5)_n$ wherein $R_2$, $R_3$, $R_4$, and $R_5$ each independently represents hydrogen, hydroxyl, unsaturated or saturated alkyl, substituted or unsubstituted alkyl where the substituent is amino or epoxy, saturated or unsaturated alkoxyl, unsaturated or saturated carboxylic acid radical, or aryl; at least two of $R_2$, $R_3$, $R_4$, and $R_5$ represent hydrogen, hydroxyl, saturated or unsaturated alkoxyl, unsaturated alkyl, or unsaturated carboxylic acid radical; and $k+l+m+n \leq 4$. Examples include vinylsilanes such as $H_2C$=CHSi$(CH_3)_2H$ and $H_2C$=CHSi$(R_{18})_3$ where $R_{18}$ is $CH_3O$, $C_2H_5O$, AcO, $H_2C$=CH, or $H_2C$ =C$(CH_3)O$—, or vinylphenylmethylsilane; allylsilanes of the formula $H_2C$=CHCH$_2$—Si$(OC_2H_5)_3$ and $H_2C$=CHCH$_2$—Si(H)(OCH$_3$)$_2$ glycidoxypropylsilanes such as (3-glycidoxypropyl)methyldiethoxysilane and (3-glycidoxypropyl)trimethoxysilane; methacryloxypropylsilanes of the formula $H_2C$=(CH$_3$)COO(CH$_2$)$_3$—Si(OR$_{19}$)$_3$ where $R_{19}$ is an alkyl, preferably methyl or ethyl; aminopropylsilane derivatives including $H_2N(CH_2)_3Si(OCH_2CH_3)_3$, $H_2N(CH_2)_3Si(OH)_3$ or $H_2N(CH_2)_3$ $_{OC(CH3)}$ $_2CH$ =CHSi(OCH$_3$)$_3$. The aforementioned silanes are commercially available from Gelest.

An example of a preferred adhesion promoter having C bonded to O containing groups is glycidyl ethers including but not limited to 1,1,1-tris-(hydroxyphenyl)ethane triglycidyl ether which is commercially available from TriQuest.

An example of a preferred adhesion promoter having C bonded to O containing groups is esters of unsaturated carboxylic acids containing at least one carboxylic acid group. Examples include trifunctional methacrylate ester, trifunctional acrylate ester, trimethylolpropane triacrylate, dipentaerythritol pentaacrylate, and glycidyl methacrylate. The foregoing are all commercially available from Sartomer.

An example of a preferred adhesion promoter having vinyl groups is vinyl cyclic pyridine oligomers or polymers wherein the cyclic group is pyridine, aromatic, or heteroaromatic. Useful examples include but not limited to 2-vinylpyridine and 4-vinylpyridine, commercially available from Reilly; vinyl aromatics; and vinyl heteroaromatics including but not limited to vinyl quinoline, vinyl carbazole, vinyl imidazole, and vinyl oxazole.

An example of a preferred adhesion promoter having Si containing groups is the polycarbosilane disclosed in commonly assigned copending allowed U.S. patent application Ser. 09/471299 filed Dec. 23, 1999 incorporated herein by reference in its entirety. The polycarbosilane is of the Formula XII:

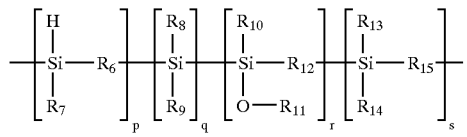

in which $R_6$, $R_{12}$, and $R_{15}$ each independently represents substituted or unsubstituted alkylene, cycloalkylene, vinylene, allylene, or arylene; $R_7$, $R_8$, $R_9$, $R_{10}$, $R_{13}$, and $R_{14}$ each independently represents hydrogen atom or organo group comprising alkyl, alkylene, vinyl, cycloalkyl, allyl, or aryl and may be linear or branched; $R_{11}$ represents organosilicon, silanyl, siloxyl, or organo group; and p, q, r, and s satisfy the conditions of [$4 \leq p+q+r+s \leq 100,000$], and q and r and s may collectively or independently be zero. The organo groups may contain up to 18 carbon atoms but generally contain from about 1 to about 10 carbon atoms. Useful alkyl groups include —CH$_2$—and —(CH$_2$)$_u$—where u>1.

Preferred polycarbosilanes of the present invention include dihydrido polycarbosilanes in which $R_6$ is a substituted or unsubstituted alkylene or phenyl, $R_7$ group is a hydrogen atom and there are no appendent radicals in the polycarbosilane chain; that is, q, r, and s are all zero. Another preferred group of polycarbosilanes are those in which the $R_7$, $R_8$, $R_9$, $R_{10}$, $R_{13}$, and $R_{14}$ groups of Formula VIII are substituted or unsubstituted alkenyl groups having from 2 to 10 carbon atoms. The alkenyl group may be ethenyl, propenyl, allyl, butenyl or any other unsaturated organic backbone radical having up to 10 carbon atoms. The alkenyl group may be dienyl in nature and includes unsaturated alkenyl radicals appended or substituted on an otherwise alkyl or unsaturated organic polymer backbone. Examples of these preferred polycarbosilanes include dihydrido or alkenyl substituted polycarbosilanes such as polydihydridocarbosilane, polyallylhydrididocarbosilane and random copolymers of polydihydridocarbosilane and polyallylhydridocarbosilane.

In the more preferred polycarbosilanes, the $R_7$ group of Formula XII is a hydrogen atom and $R_6$ is methylene and the appendent radicals q, r, and s are zero. Other preferred polycarbosilane compounds of the invention are polycarbosilanes of Formula XII in which $R_7$ and $R_{13}$ are hydrogen, $R_6$ and $R_{15}$ are methylene, and $R_{14}$ is an alkenyl, and appendent radicals q and r are zero. The polycarbosilanes may be prepared from well known prior art processes or provided by manufacturers of polycarbosilane compositions. In the most preferred polycarbosilanes, the $R_7$ group of Formula VIII is a hydrogen atom; $R_6$ is —CH$_2$—; q, r, and s are zero and p is from 5 to 25. These most preferred polycarbosilanes may be obtained from Starfire Systems, Inc. Specific examples of these most preferred polycarbosilanes follow:

| Polycarbosilane | Weight Average Molecular Weight (Mw) | Polydispersity | Peak Molecular Weight (Mp) |
|---|---|---|---|
| 1 | 400–1,400 | 2–2.5 | 330–500 |
| 2 | 330 | 1.14 | 320 |
| 3 (with 10% allyl groups) | 10,000–14,000 | 10.4–16 | 1160 |
| 4 (with 75% allyl groups) | 2,400 | 3.7 | 410 |

As can be observed in Formula XII, the polycarbosilanes utilized in the subject invention may contain oxidized radicals in the form of siloxyl groups when r >0. Accordingly, $R_{11}$ represents organosilicon, silanyl, siloxyl, or organo group when r >0. It is to be appreciated that the oxidized versions of the polycarbosilanes (r >0) operate very effectively in, and are well within the purview of the present invention. As is equally apparent, r can be zero independently of p, q, and s the only conditions being that the radicals p, q, r, and s of the Formula XII polycarbosilanes must satisfy the conditions of [$4<p+q+r+s<100,000$], and q and r can collectively or independently be zero.

The polycarbosilane may be produced from starting materials that are presently commercially available from many manufacturers and by using conventional polymerization processes. As an example of synthesis of the polycarbosilanes, the starting materials may be produced from common organo silane compounds or from polysilane as a starting material by heating an admixture of polysilane with polyborosiloxane in an inert atmosphere to thereby produce the corresponding polymer or by heating an admixture of polysilane with a low molecular weight carbosilane in an inert atmosphere to thereby produce the corresponding polymer or by heating an admixture of polysilane with a low molecular carbosilane in an inert atmosphere and in the presence of a catalyst such as polyborodiphenylsiloxane to thereby produce the corresponding polymer. Polycarbosilanes may also be synthesized by Grignard Reaction reported in U.S. Pat. No. 5,153,295 hereby incorporated by reference.

An example of a preferred adhesion promoter having hydroxyl groups is phenol-formaldehyde resins or oligomers of the Formula XIII:—[$R_{16}C_6H_2(OH)(R_{17})$]t— where $R_{16}$ is substituted or unsubstituted alkylene, cycloalkylene, vinyl, allyl, or aryl; $R_{17}$ is alkyl, alkylene, vinylene, cycloalkylene, allylene, or aryl; and t=3–100. Examples of useful alkyl groups include —$CH_2$—and —$(CH_2)_v$— where v>1. A particularly useful phenol-formaldehyde resin oligomer has a molecular weight of 1500 and is commercially available from Schenectady International Inc.

The present adhesion promoter is preferably added in small, effective amounts from about 0.5% to up to 20% based on the weight of the present thermosetting composition (a) and amounts up to about 5.0% by weight of the composition are generally more preferred.

By combining the adhesion promoter with the thermosetting component (a) and subjecting the composition to thermal or a high energy source, the resulting compositions have superior adhesion characteristics throughout the entire polymer so as to ensure affinity to any contacted surface of the coating. The present adhesion promoters also improve striation control, viscosity, and film uniformity. Visual inspection confirms the presence of improved striation control.

The present compositions may also comprise additional components such as additional adhesion promoters, antifoam agents, detergents, flame retardants, pigments, plasticizers, stabilizers, and surfactants.

Utility:

The present composition of thermosetting component (a) and adhesion promoter (b) may be combined with other specific additives to obtain specific results. Representative of such additives are metal-containing compounds such as magnetic particles, for example, barium ferrite, iron oxide, optionally in a mixture with cobalt, or other metal containing particles for use in magnetic media, optical media, or other recording media; conductive particles such as metal or carbon for use as conductive sealants; conductive adhesives; conductive coatings; electromagnetic interference (EMI)/ radio frequency interference (RFI) shielding coating; static dissipation; and electrical contacts. When using these additives, the present compositions may act as a binder. The present compositions may also be employed as protection against manufacturing, storage, or use environment such as coatings to impart surface passivation to metals, semiconductors, capacitors, inductors, conductors, solar cells, glass and glass fibers, quartz, and quartz fibers.

The present compositions of thermosetting component (a) and adhesion promoter (b) are also useful in seals and gaskets, preferably as a layer of a seal or gasket, for example around a scrim, also alone. In addition, the composition is useful in anti-fouling coatings on such objects as boat parts; electrical switch enclosures; bathtubs and shower coatings; in mildew resistant coatings; or to impart flame resistance, weather resistance, or moisture resistance to an article. Because of the range of temperature resistance of the present compositions, the present compositions may be coated on cryogenic containers, autoclaves, and ovens, as well as heat exchanges and other heated or cooled surfaces and on articles exposed to microwave radiation.

The present composition of thermosetting component (a) and adhesion promoter (b) is useful as a dielectric material. Preferably, the dielectric material has a dielectric constant k of less than or equal to about 3.0 and more preferably, from about 2.3 to 3.0. The dielectric material has a glass transition temperature of preferably at least about 350° C.

Layers of the instant compositions of thermosetting component (a) and adhesion promoter (b) may be formed by solution techniques such as spraying, rolling, dipping, spin coating, flow coating, or casting, with spin coating being preferred for microelectronics. Preferably, the present composition is dissolved in a solvent. Suitable solvents for use in such solutions of the present compositions include any suitable pure or mixture of organic, organometallic, or inorganic molecules that are volatized at a desired temperature. Suitable solvents include aprotic solvents, for example, cyclic ketones such as cyclopentanone, cyclohexanone, cycloheptanone, and cyclooctanone; cyclic amides such as N-alkylpyrrolidinone wherein the alkyl has from about 1 to 4 carbon atoms; and N-cyclohexylpyrrolidinone and mixtures thereof. A wide variety of other organic solvents may be used herein insofar as they are able to aid dissolution of the adhesion promoter and at the same time effectively control the viscosity of the resulting solution as a coating solution. Various facilitating measures such as stirring and/ or heating may be used to aid in the dissolution. Other suitable solvents include methyethylketone, methylisobutylketone, dibutyl ether, cyclic dimethylpolysiloxanes, butyrolactone, γ-butyrolactone, 2-heptanone, ethyl 3-ethoxypropionate, polyethylene glycol [di]methyl ether, propylene glycol methyl ether acetate (PGMEA), and anisole, and hydrocarbon solvents such as mesitylene, xylenes, benzene, and toluene. Preferred solvent is cyclohexanone. Typically, layer thicknesses are between 0.1 to about 15 microns. As a dielectric interlayer for microelectronics, the layer thickness is generally less than 2 microns.

Preferably, the composition of thermosetting component (a) and adhesion promoter (b) and solvent is treated at a temperature from about 30° C. to about 350° C. for about 0.5 to about 60 hours. This treatment generally forms an oligomer of the thermosetting component (a) and adhesion promoter (b) as evidenced by GPC.

The present composition may be used in electrical devices and more specifically, as an interlayer dielectric in an interconnect associated with a single integrated circuit ("IC") chip. An integrated circuit chip typically has on its surface a plurality of layers of the present composition and multiple layers of metal conductors. It may also include regions of the present composition between discrete metal conductors or regions of conductor in the same layer or level of an integrated circuit.

In application of the instant polymers to ICs, a solution of the present composition is applied to a semiconductor wafer using conventional wet coating processes such as, for example, spin coating; other well known coating techniques such as spray coating, flow coating, or dip coating may be employed in specific cases. As an illustration, a cyclohexanone solution of the present composition is spin-coated onto a substrate having electrically conductive components fabricated therein and the coated substrate is then subjected to thermal processing. An exemplary formulation of the instant composition is prepared by dissolving the present composition in cyclohexanone solvent under ambient conditions with strict adherence to a clean-handling protocol to prevent trace metal contamination in any conventional apparatus having a non-metallic lining. The resulting solution comprises based on the total solution weight, from preferably about 1 to about 50 weight percent of thermosetting component (a) and adhesion promoter (b) and about 50 to about 99 weight percent solvent and more preferably from about 3 to about 20 weight percent of thermosetting component (a) and adhesion promoter (b) and about 80 to about 97 weight percent solvent.

An illustration of the use of the present invention follows. Application of the instant compositions to form a layer onto planar or topographical surfaces or substrates may be carried out by using any conventional apparatus, preferably a spin coater, because the compositions used herein have a controlled viscosity suitable for such a coater. Evaporation of the solvent by any suitable means, such as simple air drying during spin coating, by exposure to an ambient environment, or by heating on a hot plate up to 350° C, may be employed. The substrate may have on it at least one layer of the present composition of thermosetting component (a) and adhesion promoter (b).

Substrates contemplated herein may comprise any desirable substantially solid material. Particularly desirable substrate layers comprise films, glass, ceramic, plastic, metal or coated metal, or composite material. In preferred embodiments, the substrate comprises a silicon or gallium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers. Useful substrates include silicon, silicon nitride, silicon oxide, silicon oxycarbide, silicon dioxide, silicon carbide, silicon oxynitride, titanium nitride, tantalum nitride, tungsten nitride, aluminum, copper, tantalum, organosiloxanes, organo silicon glass, and fluorinated silicon glass. In other embodiments, the substrate comprises a material common in the packaging and circuit board industries such as silicon, copper, glass, and polymers. The present compositions may also be used as a dielectric substrate material in microchips, multichip modules, laminated circuit boards, or printed wiring boards. The circuit board made up of the present composition will have mounted on its surface patterns for various electrical conductor circuits. The circuit board may include various reinforcements, such as woven nonconducting fibers or glass cloth. Such circuit boards may be single sided, as well as double sided.

Layers made from the present compositions possess a low dielectric constant, high thermal stability, high mechanical strength, and excellent adhesion to electronic substrate surfaces. Because the adhesion promoter is molecularly dispersed, these layers demonstrate excellent adhesion to all affixed surfaces including underlying substrates and overlaid capping or masking layers, such as $SiO_2$ and $Si_3N_4$ capping layers. The use of these layers eliminates the need for an additional process step in the form of at least one primer coating application to achieve adhesion of the film to a substrate and/or overlaid surface.

After application of the present composition to an electronic topographical substrate, the coated structure is subjected to a bake and cure thermal process at increasing temperatures ranging from about 50° C. up to about 450° C. to polymerize the coating. The curing temperature is at least about 300° C. because a lower temperature is insufficient to complete the reaction herein. Generally, it is preferred that curing is carried out at temperatures of from about 375° C. to about 425° C. Curing may be carried out in a conventional curing chamber such as an electric furnace, hot plate, and the like and is generally performed in an inert (non-oxidizing) atmosphere (nitrogen) in the curing chamber. In addition to furnace or hot plate curing, the present compositions may also be cured by exposure to ultraviolet radiation, microwave radiation, or electron beam radiation as taught by commonly assigned patent publication PCT/US96/08678 and U.S. Pat. Nos. 6,042,994; 6,080,526; 6,177,143; and 6,235,353, which are incorporated herein by reference in their entireties. Any non oxidizing or reducing atmospheres (e.g., argon, helium, hydrogen, and nitrogen processing gases) may be used in the practice of the present invention, if they are effective to conduct curing of the present adhesion promoter-modified thermosetting component (a) to achieve the low k dielectric layer herein.

While not to be construed as limiting, it is speculated that the thermal processing of the present low dielectric constant composition results in a crosslinked network of thermosetting component (a) and adhesion promoter (b). For example, the instant thermal processing of the present composition causes the silane portions of the preferred polycarbosilane adhesion promoter (b) to convert to silylene/silyl radicals which then react with both the unsaturated structures of thermosetting component (a) and the substrate surfaces, thereby creating a chemically bonded adherent interface for the dominant thermosetting monomer (a) precursor with these silylene/silyl radicals being available throughout the composition to act as attachment sources to fasten and secure any interface surface of contact by chemical bonding therewith. This reaction may also occur during formulation or treatment prior to layer formation. As already indicated, this dispersion of radicals throughout the composition accounts for the superb adhesion of the instant layers to both underlying substrate surfaces as well as overlayered surface structures such as cap or masking layers. Crucial to the materials discovered herein are the findings that the preferred formula I polycarbosilanes adhesion promoters have a reactive hydrido substituted silicon in the backbone structure of the polycarbosilane. This -feature of the polycarbosilane enables it to: (1) be reactive with thermosetting component (a) and; (2) generate a polycarbosilane-modified thermosetting component (a) which possesses improved adhesion performance.

As indicated earlier, the present adhesion promoter-modified thermosetting component (a) coating may act as an interlayer and be covered by other coatings, such as other dielectric ($SiO_2$) coatings, $SiO_2$ modified ceramic oxide layers, silicon containing coatings, silicon carbon containing coatings, silicon nitrogen containing coatings, silicon-nitrogen-carbon containing coatings, diamond like carbon coatings, titanium nitride coatings, tantalum nitride coatings, tungsten nitride coatings, aluminum coatings, copper coatings, tantalum coatings, organosiloxane coatings, organo silicon glass coatings, and fluorinated silicon glass coatings. Such multilayer coatings are taught in U.S. Pat. No. 4,973,526, which is incorporated herein by reference. And, as amply demonstrated, the present polycarbosilane-modified thermosetting component (a) prepared in the instant process may be readily formed as interlined dielectric layers between adjacent conductor paths on fabricated electronic or semiconductor substrates.

The present films may be used in dual damascene (such as copper) processing and substructive metal (such as aluminum or aluminum/tungsten) processing for integrated circuit manufacturing. The present compositions may be used as an etch stop, hardmask, air bridge, or passive coating for enveloping a completed wafer. The present composition may be used in a desirable all spin-on stacked film as taught by Michael E. Thomas, "Spin-On Stacked Films for Low $k_{eff}$ Dielectrics", Solid State Technology 1329 (July. 2001), incorporated herein in its entirety by reference. The present layers may be used in stacks with other layers comprising organosiloxanes such as taught by commonly assigned U.S. Pat. 6,143,855 and pending U.S. Ser. No. 10/078919 filed Feb. 19, 2002; Honeywell International Inc.'s commercially available HOSP® product; nanoporous silica such as taught by commonly assigned U.S. Pat. 6,372,666; Honeywell International Inc.'s commercially available NANO-GLASS® E product; organosilsesquioxanes taught by commonly assigned WO 01/29052; and fluorosilsesquioxanes taught by commonly assigned WO 01/29141, incorporated herein in their entirety.

EXAMPLES

Analytical Test Methods:

Proton NMR: A 2–5 mg sample of the material to be analyzed was put into an NMR tube. About 0.7 ml deuterated chloroform was added. The mixture was shaken by hand to dissolve the material. The sample was then analyzed using a Varian 400MHz NMR.

Gel Permeation Chromatography (GPC): Separation was performed with a Waters 2690 separation module with Waters 996 diode array and Waters 410 differential refractometer detectors. The separation was performed on two PLgel 3 m Mixed-E 300×7.5 mm columns with chloroform flowing at 1 ml/min. Injection volumes of 25 I of solutions of about 1 mg/ml concentration were run in duplicate. Good reproducibility was observed.

The column was calibrated with relatively monodisperse polystyrene standards between 20,000 and 500 molecular weight. With the lower molecular weight standards nine distinct components could be resolved corresponding to butyl terminated styrene monomer through oligomers with nine styrenes. The logs of the peak molecular weight of the standards were fit with a third order polynomial of the elution time. The instrumental broadening was evaluated from the ratio of the full width at half maximum to the mean elution time of toluene.

The absorbance for Preparations 1 and 2 below was a maximum at about 284 nm. The chromatograms had similar shapes at absorbance at wavelengths below about 300 nm. The results presented here correspond to 254 nm absorbance. The peaks were identified by the molecular weight of the polystyrene that would be eluting at the same time. These values should not be considered as measurements of molecular weight of the Preparation 1 and 2 oligomers. The sequential elution of higher oligomers, trimers, dimers, oligomers, and incomplete oligomers at increasing times can be quantitated.

Each component was broader than that which would be observed for a monodisperse species. This width was analyzed from the full width in minutes at half maximum of the peak. To roughly account for the instrumental broadening, we calculated $$\text{width}_{corrected} = [\text{width}_{observed}^2 - \text{width}_{instrument}^2]^{1/2}$$

where $\text{width}_{instrument}$ is the observed width of toluene corrected by the ratio of the elution times of the peak to that for toluene. The peak width was converted to a molecular weight width through the calibration curve and ratioed to the peak molecular width. Since the molecular weight of styrene oligomers was proportional to the square of their size, the relative molecular weight width can be converted to a relative oligomer size width by dividing by 2. This procedure accounted for the difference in molecular configuration of the two species.

$^{13}$C NMR: Initial measurements of $T_1$ showed a maximum of 4 s, so cycle times were set accordingly for quantitative results. All samples were dissolved in $CDCl_3$ and 4000 scans were collected. C, CH, $CH_2$, and $CH_3$ groups assigned via DEPT. DEPT clearly identified the $CH_2$ at 41 ppm, which is assigned to the 3 neighbors to a missing arm on the adamantane, and the CH at 30 ppm to the unsubstituted site. The adamantane $CH_2$'s adjacent to attached arms appeared at 46–48 ppm. Similarly, the quarternary carbon at 35 ppm and the $CH_3$ at 31.5 ppm can be assigned to a t-butyl group. In the aromatic region, the cluster of peaks between 120 and 123.5 were clearly non-protonated aromatics. Based on the chemical shifts, we assigned these as bromo aromatic carbons. The quarternary aromatics in the 145–155 ppm range were as expected for aromatic ring carbons attached to aliphatic groups, i.e. adamantane in this case. There were additional peaks at ca. 14, 23, 29 and 31.5 ppm in some of the spectra. These were assignable to heptane which was used to wash the samples. The relative amount of heptane varies substantially between samples. We did not quantify the heptane, since it is immaterial to the final performance. NMR conditions:

High resolution $^{13}$C NMR spectra acquired on a Varian Unity Inova 400.
$^{13}$C frequency: 100.572 MHz.
Gated $^1$H decoupling, using WALTZ modulation
Spectral width: 25 kHz
π/2 pulses on $^{13}$C'—13 μs.
Cycle times: 20 seconds.
data points: 100032, 2 seconds acquisition time.
Zero filled to 131072 point for FT
1 Hz exponential smoothing.

Liquid Chromatography-Mass Spectroscopy (LC-MS): This analysis was performed on a Finnigan/MAT TSQ7000 triple stage quadrupole mass spectrometer system, with an Atmospheric Pressure Ionization (API) interface unit, using a Hewlett-Packard Series 1050 HPLC system as the chromatographic inlet. Both mass spectral ion current and variable single wavelength UV data were acquired for time-intensity chromatograms.

Chromatography was conducted on a Phenomenex Luna 5-micron pheny-hexyl column (250×4.6 mm. Sample auto-injections were generally between 5 and 20 microliters of concentrated solutions, both in tetrahydrofuran and without tetrahydrofuran. The preferred preparation of concentrated sample solutions for analysis was dissolution in tetrahydrofuran, of about 5 milligrams solid product per milliliter, for 10 microliter injections. The mobile phase flow through the column was 1.0 milliliter/minute of acetonitrile/water, initially 70/30 for 1 minute then gradient programmed to 100% acetonitrile at 10 minutes and held until 40 minutes.

Atmospheric Pressure Chemical Ionization (APCI) mass spectra were recorded in both positive and negative ionization, in separate experiments. Positive APCI was more informative of molecular structure for these final products, providing protonated pseudomolecular ions including adducts with acetonitrile matrix. The APCI corona discharge was 5 microamps, about 5kV for positive ionization, and about 4kV for negative ionization. The heated capillary line was maintained at 200° C. and the vaporizer cell at 400° C. The ion detection system after quadrupole mass analysis was set at 15kV conversion dynode and 1500V electron multiplier voltage. Mass spectra were typically recorded at 1.0 second/scan from about m/z 50 to 2000 a.m.u. for negative ionization, and from about m/z 150 a.m.u. up for positive ionization. In separate positive ion experiments, the mass range was scanned up both to 2000 a.m.u. in low mass tune/calibration mode and to 4000 a.m.u. in high mass tune/calibration mode.

Differential Scanning Calorimetry (DSC): DSC measurements were performed using a TA Instruments 2920 Differential Scanning Calorimeter in conjunction with a controller and associated software. A standard DSC cell with temperature ranges from 250° C. to 725° C. (inert atmosphere: 50 ml/min of nitrogen) was used for the analysis. Liquid nitrogen was used as a cooling gas source. A small amount of sample (10–12 mg) was carefully weighed into an Auto DSC aluminum sample pan (Part #990999-901) using a Mettler Toledo Analytical balance with an accuracy of ±0.0001 grams. Sample was encapsulated by covering the pan with the lid that was previously punctured in the center to allow for outgasing. Sample was heated under nitrogen from 0° C. to 450° C. at a rate of 100° C./minute (cycle 1), then cooled to 0° C. at a rate of 100° C./minute. A second cycle was run immediately from 0° C. to 450° C. at a rate of 100° C./minute (repeat of cycle 1). The cross-linking temperature was determined from the first cycle.

FTIR analysis: FTIR spectra were taken using a Nicolet Magna 550 FTIR spectrometer in transmission mode. Substrate background spectra were taken on uncoated substrates. Film spectra were taken using the substrate as background. Film spectra were then analyzed for change in peak location and intensity.

Dielectric Constant: The dielectric constant was determined by coating a thin film of aluminum on the cured layer and then doing a capacitance-voltage measurement at 1 MHz and calculating the k value based on the layer thickness.

Glass Transition Temperature (Tg): The glass transition temperature of a thin film was determined by measuring the thin film stress as a function of temperature. The thin film stress measurement was performed on a KLA 3220 Flexus. Before the film measurement, the uncoated wafer was annealed at 500° C. for 60 minutes to avoid any errors due to stress relaxation in the wafer itself. The wafer was then deposited with the material to be tested and processed through all required process steps. The wafer was then placed in the stress gauge, which measured the wafer bow as function of temperature. The instrument calculated the stress versus temperature graph, provided that the wafer thickness and the film thickness were known. The result was displayed in graphic form. To determine the Tg value, a horizontal tangent line was drawn (a slope value of zero on the stress vs. temperature graph). Tg value was where the graph and the horizontal tangent line intersect.

It should be reported if the Tg was determined after the first temperature cycle or a subsequent cycle where the maximum temperature was used because the measurement process itself may influence Tg.

Isothermal Gravimetric Analysis (ITGA) Weight Loss: Total weight loss was determined on the TA Instruments 2950 Thermogravimetric Analyzer (TGA) used in conjunction with a TA Instruments thermal analysis controller and associated software. A Platinel II Thermocouple and a Standard Furnace with a temperature range of 25° C. to 1000° C. and heating rate of 0.1° C to 100° C./min were used. A small amount of sample (7 to 12 mg) was weighed on the TGA's balance (resolution: 0.1 g; accuracy: to ±0.1%) and heated on a platinum pan. Samples were heated under nitrogen with a purge rate of 100 ml/min (60 ml/min going to the furnace and 40 ml/min to the balance). Sample was equilibrated under nitrogen at 20° C. for 20 minutes, then temperature was raised to 200° C. at a rate of 10° C./minute and held at 200° C. for 10 minutes. Temperature was then ramped to 425° C. at a rate of 10° C./minute and held at 425° C. for 4 hours. The weight loss at 425° C. for the 4 hour period was calculated.

Shrinkage: Film shrinkage was measured by determining the film thickness before and after the process. Shrinkage was expressed in percent of the original film thickness. Shrinkage was positive if the film thickness decreased. The actual thickness measurements were performed optically using a J.A. Woollam M-88 spectroscopic ellipsometer. A Cauchy model was used to calculate the best fit for Psi and Delta (details on Ellipsometry can be found in e.g. "Spectroscopic Ellipsometry and Reflectometry" by H.G. Thompkins and William A. McGahan, John Wiley and Sons, Inc., 1999).

Refractive Index: The refractive index measurements were performed together with the thickness measurements using a J.A. Woollam M-88 spectroscopic ellipsometer. A Cauchy model was used to calculate the best fit for Psi and Delta. Unless noted otherwise, the refractive index was reported at a wavelenth of 633nm (details on Ellipsometry can be found in e.g. "Spectroscopic Ellipsometry and Reflectometry" by H.G. Thompkins and William A. McGahan, John Wiley and Sons, Inc., 1999).

Modulus and Hardness: Modulus and hardness were measured using instrumented indentation testing. The measurements were performed using a MTS Nanoindenter XP (MTS Systems Corp., Oak Ridge, Tenn.). Specifically, the continuous stiffness measurement method was used, which enabled the accurate and continuous determination of modulus and hardness rather than measurement of a discrete value from the unloading curves. The system was calibrated using fused silica with a nominal modulus of 72+−3.5 GPa. The modulus for fused silica was obtained from average value between 500 to 1000 nm indentation depth. For the thin films, the modulus and hardness values were obtained from the minimum of the modulus versus depth curve, which is typically between 5 to 1 5% of the film thickness.

Tape Test: The tape test was performed following the guidelines given in ASTM D3359-95. A grid was scribed into the dielectric layer according to the following. A tape test was performed across the grid marking in the following manner: (1) a piece of adhesive tape, preferably Scotch brand #3m600-1/2×1296, was placed on the present layer, and pressed down firmly to make good contact; and (2) the tape was then pulled off rapidly and evenly at an angle of 180° to the layer surface. The sample was considered to pass if the layer remained intact on the wafer, or to have failed if part or all of the film pulled up with the tape.

Stud Pull Test: Epoxy-coated studs were attached to the surface of a wafer containing the layers of the present invention. A ceramic backing plate was applied to the back side of the wafer to prevent substrate bending and undue stress concentration at the edges of the stud. The studs were then pulled in a direction normal to the wafer surface by a testing apparatus employing standard pull protocol steps. The stress applied at the point of failure and the interface location were then recorded.

Compatibility with Solvents: Compatibility with solvents was determined by measuring film thickness, refractive index, FTIR spectra, and dielectric constant before and after solvent treatment. For a compatible solvent, no significant change should be observed.

Preparations:

Preparation 1—Preparation of Thermosetting Component (a) (referred to herein as "P1")

Step (a): Preparation of Mixture of 1,3,5,7-tetrakis(3'/4'-bromophenyl)adamantane (shown in FIG. 1); 1,3/4-bis[1',3',5'-tris(3"/4"-bromophenyl)adamant-7'-yl]benzene (shown in FIG. 1); and at least 1,3-bis{3'/4'-[1",3",5"-tris(3'"/4'"-bromophenyl)adamant-7"-yl]phenyl}-5,7-bis(3""/4""-bromophenyl)adamantane (shown in FIG. 1) (collectively "P1 Step (a) Product")

A first reaction vessel was loaded with adamantane (200 grams), bromobenzene (1550 milliliters), and aluminum trichloride (50 grams). The reaction mixture was heated to 40° C. by a thermostatted water bath. Tert-butyl bromide (1206 grams) was added slowly over a period of 4–6 hours to the reaction mixture. The reaction mixture at 40° C. was stirred overnight.

A second reaction vessel was loaded with 1000 milliliters of aqueous hydrogen chloride (5% w/w). The contents of the first reaction vessel were gradually discharged into the second reaction vessel while maintaining the reaction mixture at 25–35° C. by an external ice bath. An organic phase (dark brown lower phase) was separated and washed with water (1000 milliliters). About 1700 milliliters of the organic phase remained.

A third reaction vessel was loaded with 20.4 liters of petroleum ether (mainly isooctane with a boiling range of 80° C.–110° C.). The contents of the second reaction vessel were slowly added over a period of one hour to the third reaction vessel. The resulting mixture was stirred for at least one hour. The precipitate was filtered off and the filter cake was washed twice with 300 milliliters per wash of the aforementioned petroleum ether. The washed filter cake was dried overnight at 45° C. at 40mbar. The P1 Step (a) Product yield was 407 grams dry weight. This reaction is shown in FIG. 1.

Analytical techniques including LC-MS, NMR $^{13}$C, and GPC were used to identify the product. LC-MS showed that the product is a complex mixture of monomeric and oligomeric star compounds with an adamantane core. Identified structures are presented in the following Table (Ad= adamantane; Ph=$C_6H_5$; Br=bromine; t-Bu=—$C(CH_3)_3$):

| HPLC-MS Analysis of IE1 Step (a) Product | | |
|---|---|---|
| HPLC-Retention Time, min | M+ Peak | Proposed Structure |
| 12.8 | 598 | $AdPh_3Br_3$ |
| 14 | 674 | $AdPh_4Br_3$ |
| 14 | 676 | $AdPh_3Br_4$ |
| 15.3 | 752 | $AdPh_4Br_4$ |

| HPLC-MS Analysis of IE1 Step (a) Product | | |
|---|---|---|
| HPLC-Retention Time, min | M+ Peak | Proposed Structure |
| 15.8 | 830 | $AdPh_4Br_5$ |
| 16 | 830 | $AdPh_4Br_5$ |
| 16 | 810 | $AdPh_3Br_5$(t-Bu) |
| 16 | 828 | $AdPh_5Br_4$ |
| 16.3 | 908 | $AdPh_4Br_6$ |
| 16.5 | 908 | $AdPh_4Br_6$ |
| 17.1 | 808 | $AdPh_4Br_4$(t-Bu) |
| 17.3 | 886 | $AdPh_4Br_5$(t-Bu) |
| 18.4 | 864 | $AdPh_4Br_4$(t-Bu)$_2$ |
| Broad~19+ | 1040 | $Ad_2Ph_5Br_5$ |
| | 1114 | $Ad_2Ph_7Br_4$ |
| | 1116 | $Ad_2Ph_6Br_5$ |
| | 1118 | $Ad_2Ph_5Br_6$ |
| | 1192 | $Ad_2Ph_7Br_5$ |
| | 1194 | $Ad_2Ph_6Br_6$ |
| | 1270 | $Ad_2Ph_7Br_6$ |
| | 1272 | $Ad_2Ph_6Br_7$ |
| | 1348 | $Ad_2Ph_7Br_7$ |
| | 1426 | $Ad_2Ph_7Br_8$ |
| Broad~21+ | 1096 | $Ad_2Ph_5Br_5$(t-Bu) |
| | 1172 | $Ad_2Ph_6Br_5$(t-Bu) |
| | 1174 | $Ad_2Ph_5Br_6$(t-Bu) |
| | 1250 | $Ad_2Ph_6Br_6$(t-Bu) |
| | 1326 | $Ad_2Ph_7Br_6$(t-Bu) |
| | 1328 | $Ad_2Ph_6Br_7$(t-Bu) |
| | 1404 | $Ad_2Ph_7Br_7$(t-Bu) |
| | 1482 | $Ad_2Ph_7Br_8$(t-Bu) |

NMR $^{13}$C analysis led to following peak assignments

| $^{13}$C NMR peak position, ppm | Structure |
|---|---|
| 153.6, 151.8, 151.1, 148.3, 147.6 | Quaternary aromatic carbon bonded to adamantane |
| 136.0, 134.5, 134.2, 133.1, 131.6, 131.1, 130.2, 130.0, 129.6, 129.3, 128.5, 126.9, 123.8 | Aromatic C—H |
| 123.1, 123.0, 122.9, 122.6, 121.4, 121.1, 120.3 | Aromatic C—Br |
| 47.7 | Three C—$H_2$'s of tri-substituted adamantane |
| 46.8 | C—$H_2$'s of tetra-substituted adamantane |
| 41.0 | C—$H_2$'s of Adamantane adjacent to unsubstituted Adamantane location |
| 39.3, 39.0, 38.9, 38.4, 38.1 | Quaternary (aliphatic) carbon of adamantane |
| 35.2 | Quaternary (aliphatic) carbon of t-butyl groups |
| 31.4 | C—$H_3$'s of t-butyl groups; |
| 30 | C—H of tri-substituted adamantane |

GPC Analysis Results:
1,3,5,7-tetrakis(3'/4'-bromophenyl)adamantane (shown in FIG. 4) had a peak molecular weight of about 360;
1,3/4-bis[1',3',5'-tris(3"/4"-bromophenyl)adamant-7'-yl] benzene (shown in FIG. 4) had a peak molecular weight of about 620;
1,3-bis-{3'/4'-[1",3",5"-tris (3'"/4'"-bromophenyl)adamant-7"-yl]phenyl}-5,7-bis(3""/4""-bromophenyl)adamantane (shown in FIG. 4) had a peak molecular weight of about 900 (shoulder).

Step (b): Preparation of Mixture of 1,3,5,7-tetrakis[3',4'-(phenylethynyl)phenyl]adamantane (shown in FIG. 2); 1,3/4-bis{1',3',5'-tris[3"/4"-(phenylethynyl)phenyl]adamant-7'-yl}benzene (shown in FIG. 2); and at least 1,3-bis{3'/4'-[1", 3",5"-tris[3'"/4'"-(phenylethynyl)phenyl]adamant-7"-yl]

phenyl)}-5,7-bis[3""/4""-(phenylethynyl)phenyl] adamantane (shown in FIG. 2) (collectively "P1 Step (b) Product")

A first reactor under nitrogen was loaded with toluene (1500 milliliters), triethylamine (4000 milliliters), and the P1 Step (a) Product prepared above (1000 grams dry). The mixture was heated to 80° C. and bis-(triphenyl-phosphine) palladium(II)dichloride (i.e., [$Ph_3P1_2PdCl_2$) (7.5 grams) and tri-phenylphosphine (i.e. ($Ph_3P$]) (15 grams) were added. After ten minutes, copper(I)iodide (7.5 grams) was added.

Over a period of three hours, a solution of phenylacetylene (750 grams) was added to the first reactor. The reaction mixture at 80° C. was stirred for 12 hours to ensure that the reaction was complete. Toluene (4750 milliliters) was added. The solvent was then distilled off under reduced pressure and a maximum sump temperature and the reaction mixture was cooled down to about 50° C. The triethylammonium bromide (about 1600 milliliters) was filtered off. The filter cake was washed three times with 500 milliliters per wash of toluene. The organic phase was washed with 1750 milliliters of HCl (10 w/w %) and then washed with water (2000 milliliters).

To the washed organic phase, water (1000 milliliters), ethylene diamine tetraacetic acid (EDTA) (100 grams), and dimethylglyoxime (20 grams) were added. About 150 milliliters of $NH_4OH$ (25 w/w %) were added to achieve a pH of 9. The reaction mixture was stirred for one hour. The organic phase was separated and washed with water (1000 milliliters). With a Dean-Stark trap, azeotropic drying occurred until water evolution ceased. Filtering agent dolomite (100 grams) (tradename Tonsil) was added. The mixture was heated to 100° C. for 30 minutes. Dolomite was filtered off with a cloth filter having fine pores and the remainder was washed with toluene (200 milliliters). Silica (100 grams) was added. The reaction mixture was stirred for 30 minutes. The silica was filtered off with a cloth filter having fine pores and the remainder was washed with toluene (200 milliliters). Aqueous $NH_3$ (20 ww %), in an amount of 2500 milliliters, and 12.5 g of N-acetylcysteine were added. The phases were separated. The organic phase was washed with 1000 milliliters of HCl (10% w/w) and then washed two times with 1000 milliliters per wash of water. The toluene was distilled off under a reduced pressure of about 120 mbar. The pot temperature did not exceed about 70° C. A dark brown viscous oil (1500–1700 milliliters) remained. To the hot mass in the pot, iso-butyl acetate (2500 milliliters) was added and a dark brown solution formed (4250 milliliters).

Figure 2:
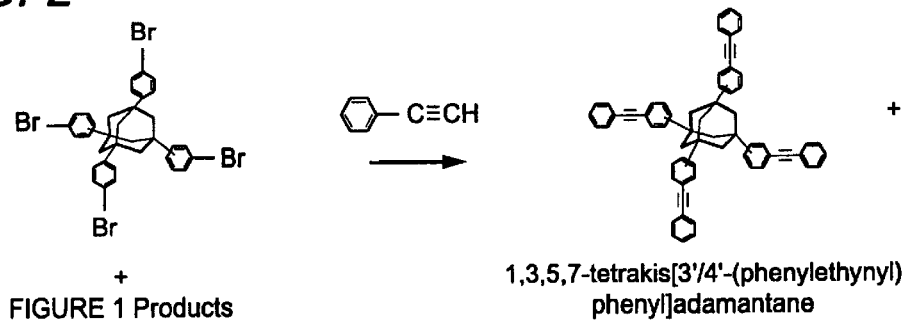
FIG. 2 illustrates a method for preparing adamantane based compositions (referred to herein as "P1 Step (b) Product" and the "P2 Step (b) Product"), which is also described in Preparation 1, Step (b) and Preparation 2, Step (b) under the Examples Section and which compositions are useful as the thermosetting component in the present compositions.
Figure 2:
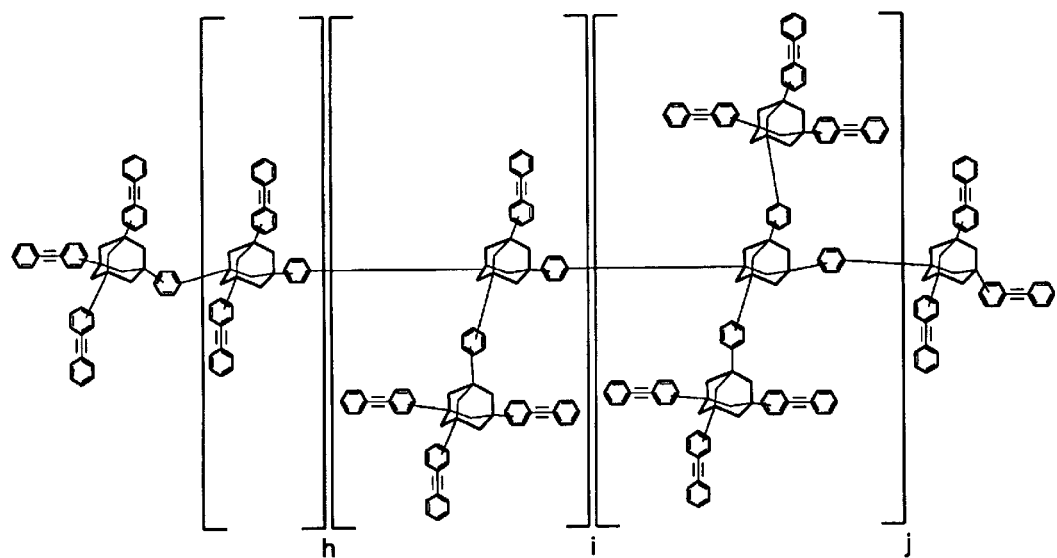
Figure 2:
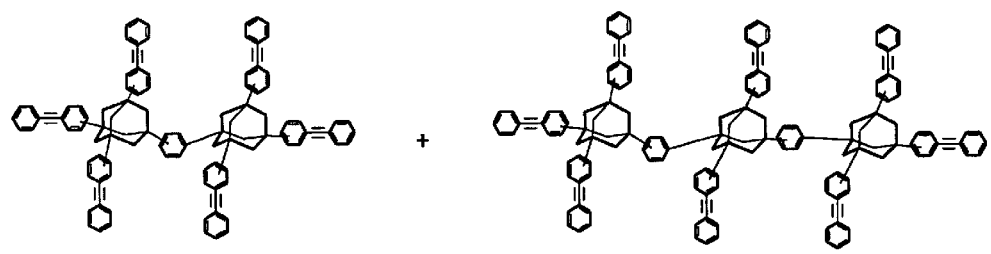

A second reactor was loaded with 17000 milliliters of petroleum ether (mainly isooctane with a boiling range of 80° C.–110° C.). The contents of the first reactor were added over a period of one hour to the second reactor and stirred overnight. The precipitate was filtered and washed four times with 500 milliliters per wash of the aforedescribed petroleum ether. The product was dried under reduced pressure for four hours at 45° C. and five hours at 80° C. The P1 Step (B) Product yield was 850–900 grams. This reaction is shown in FIG. 2.

Analytical techniques including LC-MS, NMR $^1$H, NMR $^{13}$C, GPC, and FTIR were used to identify the product.

LC-MS analysis showed that the product is a complex mixture of monomeric and oligomeric star compounds with adamantane core. Identified structures are presented in the following Table (Ad=adamantane cage; T is tolanyl-$PhC{\equiv}CC_6H_4$—; t-Bu =—$C(CH_3)_3$):

| # | M+ Peak | Proposed Structure |
|---|---|---|
| 1[a] | 664 | $AdT_3H$ |
| 2[a] | 840 | $AdT_4$ |
| 3[a] | 720 | $Ad(H)T_3$(t-Bu) |
| 4[a,b] | 896 | $AdT_4$(t-Bu) |
| 5[a,b] | 1326 | $Ad_2T_6$ |
| 6[b,b] | 1402 | $Ad_2T_6(C_6H_4)$ |

[a]Analogs with MW ± 100 a.u. (plus or minus PhC≡C-group) were observed for all these general structures
[b]Analogs with missing Tolanyl arm (-176 a.u.) were observed for these structures $^1$H NMR identified aromatic protons (6.9–8 ppm, 2.8±0.2H) and adamantane cage protons (1.7–2.7 ppm, 1±0.2H).

$^{13}$C NMR led to following peak assignments:

| $^{13}$C NMR peak position, ppm | Structure |
|---|---|
| 151.3, 151, 150, 149.9, 149.8, 149.3, 149.2 | Quaternary aromatic carbons attached to adamantane ring |
| 132–131, 128.5, 125.3, 125.2 129.6–129.1 | C—H aromatic carbon Aromatic ring carbons |
| 123.7–122.9, 121.8, 121.1, 120.9 | Quaternary aromatic carbon attached to acetylene |
| 93.6 | Quaternary acetylene carbon (on di-substituted ring) |
| 90.7, 90.3, 90.1, 89.7, 89.5, 89.4, 89.1, 88.8, 88.7 | Quaternary acetylene carbon |
| 47.5, 46.7 | C—$H_2$ of tetra-substituted adamantane |
| 47.1 | C—$H_3$ tetra-substituted adamantane |
| 41 | C—$H_2$ tri substituted adamantane |
| 39.6 | C—$H_3$ tri-substituted adamantane |
| 39.5, 39.2–39.0, 38.6, 38.2, 35 | Quaternary carbon of tetra-substituted adamantane |
| 32 | C—$H_3$ of t-butyl group on aromatic ring |
| 30 | C—H of tri-substituted adamantane |

Figure 5:
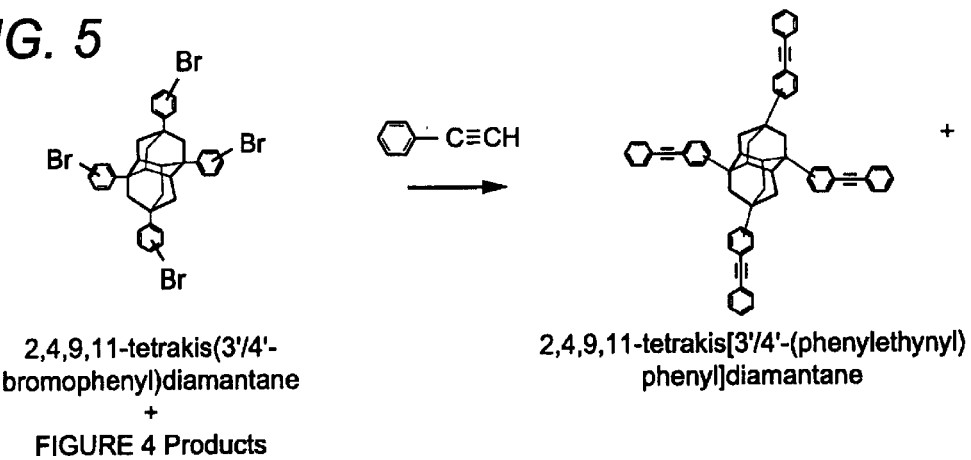
FIG. 5 illustrates a method for preparing diamantane based compositions which are useful as the thermosetting component in the present compositions.
Figure 5:
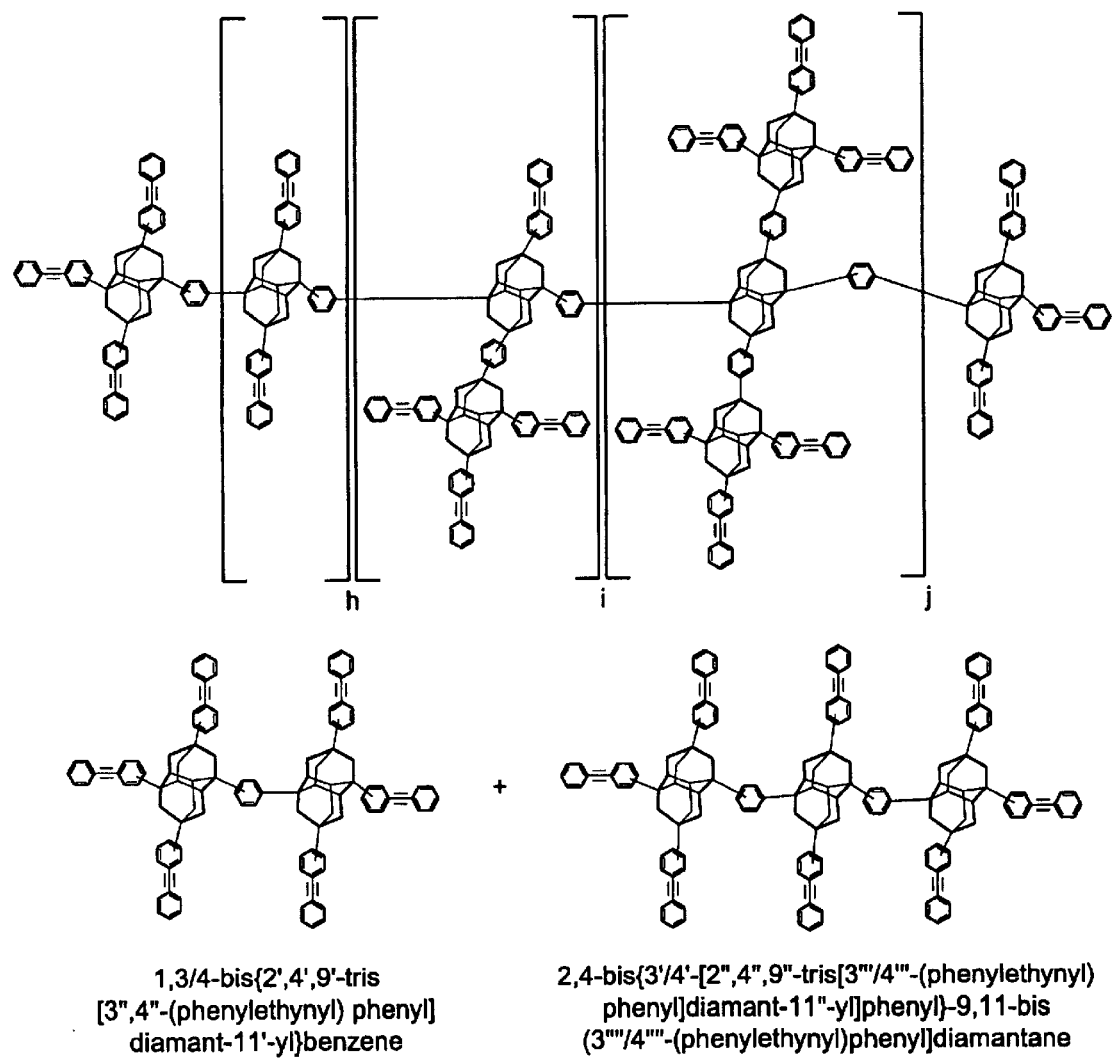

GPC Analysis Results:

1,3,5,7-tetrakis[3'/4'-(phenylethynyl)phenyl]adamantane (shown in FIG. 5 had a peak molecular weight of about 744;

1,3/4-bis{1',3',5',-tris(3"/4"-(phenylethynyl)phenyl) adamant-7'-yl}benzene had a peak molecular weight of about 1300;

1,3-bis-{3'/4'-[1",3"5"-tris(3'"/4'"-(phenylethynyl) phenyl)adamantane-7"-yl]phenyl}-5,7-bis(3""/4""-(phenylethynyl)phenyl)adamantane (shown in FIG. 5) had a peak molecular weight of about 1680 (shoulder).

From GPC, the ratio of the monomeric and small molecules to oligomeric compounds was 50±5%.

| PEAKS IN CENTIMETERS$^{-1}$ (PEAK INTENSITY) | STRUCTURE |
|---|---|
| 3050 (weak) | Aromatic C—H |
| 2930 (weak) | Aliphatic C—H on adamantane |

-continued

| PEAKS IN CENTIMETERS⁻¹ (PEAK INTENSITY) | STRUCTURE |
|---|---|
| 2200 (very weak) | Acetylene |
| 1600 (very strong) | Aromatic C=C |
| 1500 (strong) | |
| 1450 (medium) | |
| 1350 (medium) | |

Preparation 2-Preparation of Thermosetting Component (a) (referred to herein as "P2")

Step (a): Preparation of Mixture of 1,3,5,7-tetrakis(3'/40'-bromophenyl)adamantane (shown in FIG. 1); 1,3/4-bis[1',3∝,5'-tris(3"/4"-bromophenyl)adamant-7'-yl] benzene (shown in FIG. 1); and at least 1,3-bis{3'/4'-[1",3",5"-tris(3'"/4'"-bromophenyl)adamant-7"-yl]phenyl}-5,7-bis(3""/4""-bromophenyl)adamantane(shown in FIG. 1)(collectively "P2 Step (a) Product").

A first reaction vessel was loaded with 1,4-dibromobenzene (587.4 grams) and aluminum trichloride (27.7 grams). This reaction mixture was heated to 90° C. by a thermostatted water bath and maintained at this temperature for one hour without stirring and for an additional one hour with stirring. The reaction mixture was cooled down to 50° C. Adamantane (113.1 grams) was added to the cooled reaction mixture. Over a period of four hours, t-butyl-bromobenzene (796.3 grams) was added to the reaction mixture. The reaction mixture was stirred for an additional 12 hours.

A second reaction vessel was loaded with HCl (566 milliliters, 10% aqueous w/w). The contents of the first reaction vessel at 50° C. were discharged into the second reaction vessel while maintaining the mixture at 25–35° C. by an external ice bath. The reaction mass was a light brown suspension. The organic phase was a dark brown lower phase and separated from the reaction mixture. The separated organic phase was washed with water (380 milliliters). After this washing, about 800 milliliters of organic phase remained.

A third reaction vessel was loaded with heptane (5600 milliliters). Slowly over a period of one hour, the contents of the second reaction vessel were added to the third reaction vessel. The suspension was stirred for at least four hours and the precipitate was filtered off. The filter cake was washed twice with 300 milliliters per wash of heptane. The P2 Step (a) Product yield was 526.9 grams (wet) and 470.1 grams (dry).

Analytical techniques including LC-MS, NMR $^{13}$C, and GPC were used to identify the product. LC-MS showed that the product is a complex mixture of monomeric and oligomeric star compounds with an adamantane core. Identified structures are presented in the following Table (Ad=adamantane; Ph=$C_6H_5$; Br=bromine; t-Bu=—$C(CH_3)_3$):

HPLC-MS Analysis of IE2 Step (a) Product

| HPLC-Retention Time, min | M+ Peak | Proposed Structure |
|---|---|---|
| 12.8 | 598 | $AdPh_3Br_3$ |
| 14 | 674 | $AdPh_4Br_3$ |
| 14 | 676 | $AdPh_3Br_4$ |
| 15.3 | 752 | $AdPh_4Br_4$ |
| 15.8 | 830 | $AdPh_4Br_5$ |
| 16 | 830 | $AdPh_4Br_5$ |
| 16 | 810 | $AdPh_3Br_5$(t-Bu) |
| 16 | 828 | $AdPh_5Br_4$ |
| 16.3 | 908 | $AdPh_4Br_6$ |
| 16.5 | 908 | $AdPh_4Br_6$ |

HPLC-MS Analysis of IE2 Step (a) Product

| HPLC-Retention Time, min | M+ Peak | Proposed Structure |
|---|---|---|
| 17.1 | 808 | $AdPh_4Br_4$(t-Bu) |
| 17.3 | 886 | $AdPh_4Br_5$(t-Bu) |
| 18.4 | 864 | $AdPh_4Br_4$(t-Bu)$_2$ |
| broad~19+ | 1040 | $Ad_2Ph_5Br_5$ |
| | 1114 | $Ad_2Ph_7Br_4$ |
| | 1116 | $Ad_2Ph_6Br_5$ |
| | 1118 | $Ad_2Ph_5Br_6$ |
| | 1192 | $Ad_2Ph_7Br_5$ |
| | 1194 | $Ad_2Ph_6Br_6$ |
| | 1270 | $Ad_2Ph_7Br_6$ |
| | 1272 | $Ad_2Ph_6Br_7$ |
| | 1348 | $Ad_2Ph_7Br_7$ |
| | 1426 | $Ad_2Ph_7Br_8$ |
| broad~21+ | 1096 | $Ad_2Ph_5Br_5$(t-Bu) |
| | 1172 | $Ad_2Ph_6Br_5$(t-Bu) |
| | 1174 | $Ad_2Ph_5Br_6$(t-Bu) |
| | 1250 | $Ad_2Ph_6Br_6$(t-Bu) |
| | 1326 | $Ad_2Ph_7Br_6$(t-Bu) |
| | 1328 | $Ad_2Ph_6Br_7$(t-Bu) |
| | 1404 | $Ad_2Ph_7Br_7$(t-Bu) |
| | 1482 | $Ad_2Ph_7Br_8$(t-Bu) |

NMR $^{13}$C analysis led to following peak assignments:

| $^{13}$C NMR peak position, ppm | Structure |
|---|---|
| 153.6, 151.8, 151.1, 148.3, 147.6 | Quaternary aromatic carbon bonded to adamantane |
| 136.0, 134.5, 134.2, 133.1, 131.6, 131.1, 130.2, 130.0, 129.6, 129.3, 128.5, 126.9, 123.8 | Aromatic C—H |
| 123.1, 123.0, 122.9, 122.6, 121.4, 121.1, 120.3 | Aromatic C—Br |
| 47.7 | Three C—$H_2$'s of tri-substituted adamantane |
| 46.8 | C—$H_2$'s of tetra-substituted adamantane |
| 41.0 | C—$H_2$'s of Adamantane adjacent to unsubstituted Adamantane location |
| 39.3, 39.0, 38.9, 38.4, 38.1 | Quaternary (aliphatic) carbon of adamantane |
| 35.2 | Quaternary (aliphatic) carbon of t-butyl groups |
| 31.4 | C—$H_3$'s of t-butyl groups; |
| 30 | C—H of tri-substituted adamantane |

GPC Analysis Results:

1,3,5,7-tetrakis(3'/4'-bromophenyl)adamantane (shown in FIG. 4) had a peak molecular weight of about 360;

1,3/4-bis[1',3',5'-tris(3"/4"-bromophenyl)adamant-7'-yl]benzene (shown in FIG. 4) had a peak molecular weight of about 570;

1,3-bis-{3'/4'-[1",3",5"-tris(3'"/4'"-bromophenyl)adamant-7"-yl]phenyl}-5,7-bis(3""/4""-bromophenyl)adamantane (shown in FIG. 4) had a peak molecular weight of about 860 (shoulder).

Step (b): Preparation of Mixture of 1,3,5,7-tetrakis[3',4'-(phenylethynyl)phenyl]adamantane (shown in FIG. 2); 1,3/4-bis{1',3',5'-tris[3"/4"-(phenylethynyl)phenyl]adamant-7'-yl}benzene (shown in FIG. 2); and at least 1,3-bis{3'/4'-[1",3",5"-tris[3'"/4'"-(phenylethynyl)phenyl]adamant-7"-yl]phenyl}-5,7-bis[3""/4""-(phenylethynyl)phenyl]adamantane (shown in FIG. 2)(collectively "P2 Step (b) Product")

A first reaction pot under nitrogen was loaded with toluene (698 milliliters), triethylamine (1860 milliliters), and the P2 Step (a) Product prepared above (465 grams dry). The mixture was heated to 80° C. Palladium-triphenylphosphine complex (i.e. [Ph(PPh$_3$)$_2$Cl$_2$](4.2 grams) was added to the reaction mixture. After waiting ten minutes, triphenylphosphine (i.e., PPh$_3$)(8.4 grams) was added to the reaction mixture. After waiting another ten mintues, copper(I)-iodide (4.2 grams) was added to the reaction mixture.

Over a period of three hours, a solution of phenylacetylene (348.8 grams) was added to the reaction mixture. The reaction mixture at 80° C. was stirred for 12 hours to ensure that the reaction was complete. Toluene (2209 milliliters) was added to the reaction mixture and then distilled off under reduced pressure and a maximum sump temperature. The reaction mixture was cooled down to about 50° C. and the triethylammonium bromide was filtered off. The filter cake was washed twice with 250 milliliters per wash of toluene. The organic phase was washed with HCl (10 w/w %)(500 milliliters) and water (500 milliliters).

To the organic phase, water (500 milliliters), EDTA (18.6 grams), and dimethylglyoxime (3.7 grams) were added. NH$_4$OH (25 w/w %)(about 93 milliliters) was added to keep the pH=9. The reaction mixture was stirred for one hour. The organic phase was separated from the insoluble material and the emulsion containing the palladium-complex. The separated organic phase was washed with water (500 milliliters). With a Dean-Stark trap, azeotropic drying of the washed organic phase occurred until water evolution ceased. Filtering agent dolomite (tradename Tonsil)(50 grams) was added and the reaction mixture was heated to 100° C. for 30 minutes. The dolomite was filtered off with a cloth filter having fine pores and the organic material was washed with toluene (200 milliliters). Silica (50 grams) was added and the reaction mixture was stirred for 30 minutes. The silica was filtered off with a cloth filter having fine pores and the organic material was washed with toluene (200 milliliters). Aqueous NH$_3$ (20% w/w)(250 milliliters) and N-acetylcysteine (12.5 grams) were added. The phases were separated. The organic phase was washed with HCl(10% w/w)(500 milliliters). The organic material was washed twice with 500 milliliters per wash of water. The toluene was distilled off under reduced pressure of about 120 mbar. The pot temperature did not exceed 70° C. A dark brown viscous oil (about 500–700 milliliters) remained. To the hot mass in the pot, iso-butyl acetate (1162 milliliters) was added. A dark brown solution (about 1780 milliliters) formed.

A second reaction pot was loaded with heptane (7120 milliliters). Over a period of one hour, the contents of the first reaction pot were added to the second reaction pot. The precipitate was stirred for at least three hours and filtered off. The product was washed four times with 250 milliliters per wash of heptane. The product was dried under reduced pressure of 40 mbar at 80° C. The P2 Step (b) Product yield was 700 grams wet or 419 grams dry.

Analytical techniques including LC-MS, NMR $^1$H, NMR $^{13}$C, GPC, and FTIR were used to identify the product.

LC-MS analysis showed that the product is a complex mixture of monomeric and oligomeric star compounds with adamantane core. Identified structures are presented in the following Table (Ad=adamantane cage; T is tolanyl-PhC≡CC$_6$H$_4$—; t-Bu=—C(CH$_3$)$_3$):

| # | M+ Peak | Proposed Structure |
|---|---------|--------------------|
| 1[a] | 664 | AdT$_3$H |
| 2[a] | 840 | AdT$_4$ |
| 3[a] | 720 | Ad(H)T$_3$(t-Bu) |
| 4[a,b] | 896 | AdT$_4$(t-Bu) |
| 5[a,b] | 1326 | Ad$_2$T$_6$ |
| 6[a,b] | 1402 | Ad$_2$T$_6$(C$_6$H$_4$) |

[a]Analogs with MW ± 100 a.u. (plus or minus PhC≡C-group) were observed for all these general structures
[b]Analogs with missing Tolanyl arm (−176 a.u.) were observed for these structures $^1$H NMR identified aromatic protons (6.9–8 ppm, 2.8±0.2H) and adamantane cage protons (1.7–2.7 ppm, 1±0.2H).

$^{13}$C NMR analysis led to following peak assignments:

| $^{13}$C NMR peak position, ppm | Structure |
|---------------------------------|-----------|
| 151.3, 151, 150, 149.9, 149.8, 149.3, 149.2 | Quaternary aromatic carbons attached to adamantane ring |
| 132–131, 128.5, 125.3, 125.2 129.6–129.1 | C—H aromatic carbon Aromatic ring carbons |
| 123.7–122.9, 121.8, 121.1, 120.9 | Quaternary aromatic carbon attached to acetylene |
| 93.6 | Quaternary acetylene carbon (on di-substituted ring) |
| 90.7, 90.3, 90.1, 89.7, 89.5, 89.4, 89.1, 88.8, 88.7 | Quaternary acetylene carbon |
| 47.5, 46.7 | C—H$_2$ of tetra-substituted adamantane |
| 47.1 | C—H$_3$ tetra-substituted adamantane |
| 41 | C—H$_2$ tri substituted adamantane |
| 39.6 | C—H$_3$ tri-substituted adamantane |
| 39.5, 39.2–39.0, 38.6, 38.2, 35 | Quaternary carbon of tetra-substituted adamantane |
| 32 | C—H$_3$ of t-butyl group on aromatic ring |
| 30 | C—H of tri-substituted adamantane |

GPC Analysis Results:

1,3,5,7-tetrakis[3'/4'-(phenylethynyl)phenyl]adamantane (shown in FIG. 5) had a peak molecular weight of about 763;

1,3/4-bis{1',3',5'-tris(3"/4"-(phenylethynyl)phenyl) adamant-7'-yl}benzene (shown in FIG. 5) had a peak molecular weight of about 1330;

1,3-bis-{3'/4'-[1",3",5"-tris(3'"/4'"-(phenylethynyl) phenyl)adamant-7"-yl]phenyl}-5,7-bis(3""/4""-(phenylethynyl)phenyl)adamantane (shown in FIG. 5) had a peak molecular weight of about 1520 (shoulder).

From GPC, the ratio of the monomeric and small molecules to oligomeric compounds was 50±5%.

FTIR showed the following:

| PEAKS IN CENTIMETERS$^{-1}$ (PEAK INTENSITY) | STRUCTURE |
| --- | --- |
| 3050 (weak) | Aromatic C—H |
| 2930 (weak) | Aliphatic C—H on adamantane |
| 2200 (very weak) | Acetylene |
| 1600 (very strong) | Aromatic C=C |
| 1500 (strong) | |
| 1450 (medium) | |
| 1350 (medium) | |

Preparation 3

Impact of Solvent on ratio of 1,3,5,7-tetrakis[3',4'-(phenylethynyl)phenyl]adamantane to 1,3/4-bis{1',3',5'-tris[3"/4"-phenylethynyl)phenyl]adamant-7'-yl}benzene and at least 1,3-bis{3'/4'-[1",3",5"-tris[3'"/4'"-(phenylethynyl)phenyl]adamant-7"-yl]phenyl}-5,7-bis[3""/4""-(phenylethynyl)phenyl]adamantane 850 milliliters of P1 Step (a) Product was divided into four equal parts, and subjected to precipitation in petroleum ether, ligroine, heptane, and methanol. Each part was precipitated into 2520 ml of the solvent, vacuum filtered (Buchner funnel diam. 185 mm), washed on filter twice by 150 ml of the solvent, then dried in a vacuum oven for two hours at about 20° C., overnight at 40° C., and at 70–80° C. to constant weight.

Precipitation into hydrocarbons resulted in very dispersed light beige powders that dried without complications. Precipitation into methanol gave heavy, brownish granular solid (particles size approximately 1 mm), which formed tar when dried at 20° C. This product was dried further.

Reaction mixtures were analyzed by GPC during the reaction and before precipitation. All filtrates and final solids were analyzed by GPC and the results are in Table 5. In Table 5, PPT stands for precipitation, monomer is 1,3,5,7-tetrakis(3'/4'-bromophenyl)adamantane; dimer is 1,3/4-bis[1',3',5'-tris(3"/4"-bromophenyl)adamant-7'-yl]benzene; and trimer is 1,3-bis{3'/4'-[1",3",5"-tris(3'"/4'"-bromophenyl)adamant-7"-yl]phenyl}-5,7-bis(3""/4""-bromophenyl)adamantane.

TABLE 5

| Peak Ratio [monomer to (dimer + trimer)] before PPT | Solvent For PPT | Peak Ratio [monomer to (dimer + trimer)] after PPT |
| --- | --- | --- |
| 75.0:25.0 | Petroleum Ether | 52.5:47.4 |
| 75.0:25.0 | Ligroine | 64.0:36.0 |
| 75.0:25.0 | Heptane | 66.2:33.8 |
| 75.0:25.0 | Methanol | 75.0:25.0 |

To summarize these results, the peak ratio of monomer to (dimer+trimer) in the reaction mixture was about 3:1. The product lost in hydrocarbons precipitation filtrates was mostly (>90%) monomer while losses in washing filtrates were negligible. There is no product in methanol precipitation filtrates. The monomer to (dimer+trimer) ratio after precipitation increases (1:1→3:1), and monomer losses in the filtrates decrease (56→0%) in the sequence: petroleum ether, ligroine, heptane, and methanol.

Preparation 4—Preparation of Thermosetting Component (a)

The 1,3/4-bis{1',3',5'-tris[3"/4"-(phenylethynyl)phenyl]adamant-7'-yl}benzene in the Preparation 1 product mixture is separated using preparative liquid chromatography (PLC). PLC is similar to the HPLC method described above but uses larger columns to separate larger quantities of the mixture (from several grams to several hundred grams). The separated 1,3/4-bis{1',3',5'-tris[3"/4"-(phenylethynyl)phenyl]adamant-7'-yl}benzene is dissolved in solvent, spun unto silicon wafers, then baked and cured into a film, and used in a microchip or in a multichip module.

Preparation 5—Preparation of Thermosetting Component (a)

The 1,3-bis{3'/4'-[1",3",5"-tris[3'"/4'"-(phenylethynyl)phenyl]adamant-7"-yl]phenyl}-5,7-bis[3""/4""-(phenylethynyl)phenyl]adamantane in the Preparation 1 product mixture is separated using preparative liquid chromatography (PLC). The separated 1,3-bis(3'/4'-[1",3",5"-tris[3'"/4'"-(phenylethynyl)phenyl]adamant-7"-yl]phenyl}-5,7-bis[3""/4""-(phenylethynyl)phenyl]adamantane is dissolved in solvent, spun unto silicon wafers, then baked and cured into a film, and used in a microchip or in a multichip module.

Preparation 6—Preparation of Thermosetting Component (a)

Figure 3:
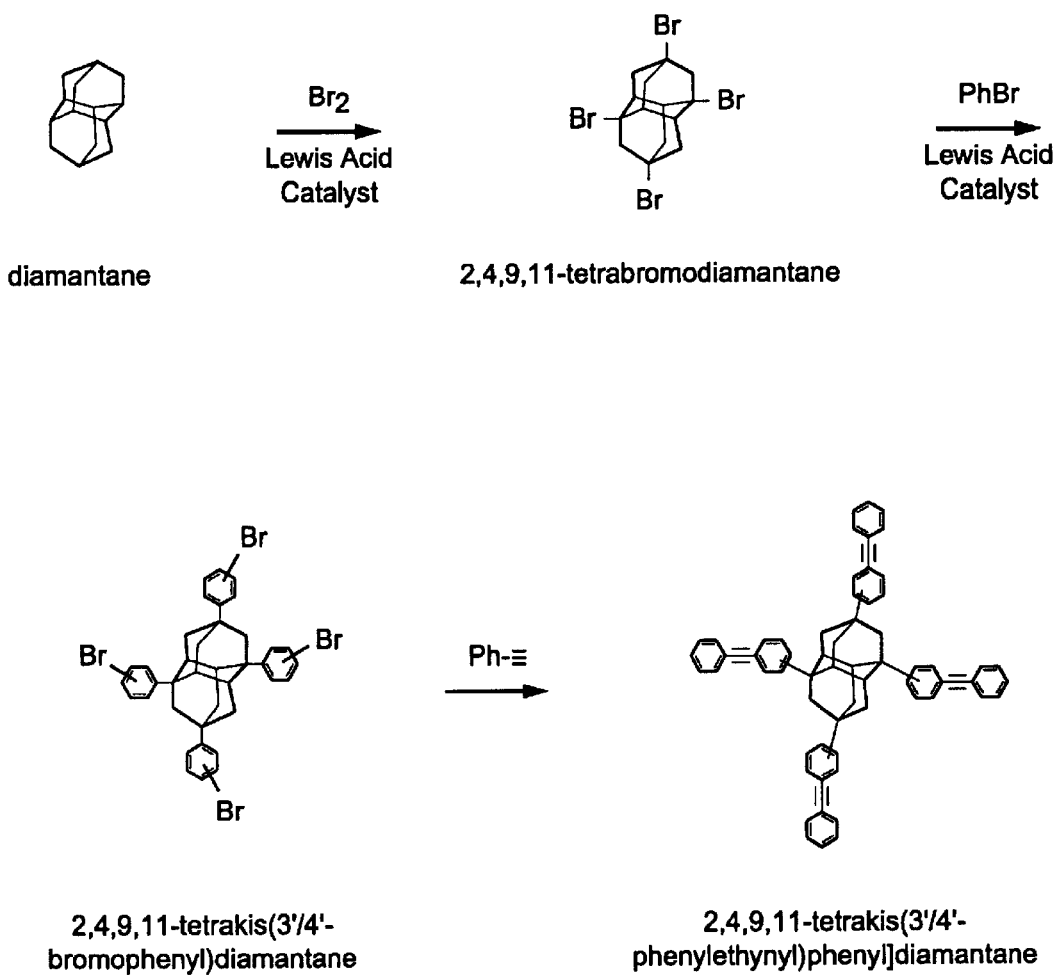
FIG. 3 illustrates one method for making diamantane based compositions useful as the (a) thermosetting component in the present compositions.

The diamantane monomer of Formula V and oligomer or polymer of diamantane monomer of Formulae VI, XI, XIII, XV, XVIII, XIX and XXI are prepared using the following method. As shown in FIG. 3, diamantane is converted using bromine and a Lewis Acid catalyst to brominated diamantane product. The brominated diamantane product is then reacted with bromobenzene in the presence of a Lewis Acid catalyst to form bromophenylated diamantane. The bromophenylated diamantane is then reacted with a terminal alkyne in the presence of a catalyst system as used in the so-called Sonogashira coupling reaction. The product at each step is worked up as described in our pending patent application PCT/US01/22204 filed Oct. 17, 2001.

Preparation 7—Preparation of Thermosetting Component (a)

Figure 4:
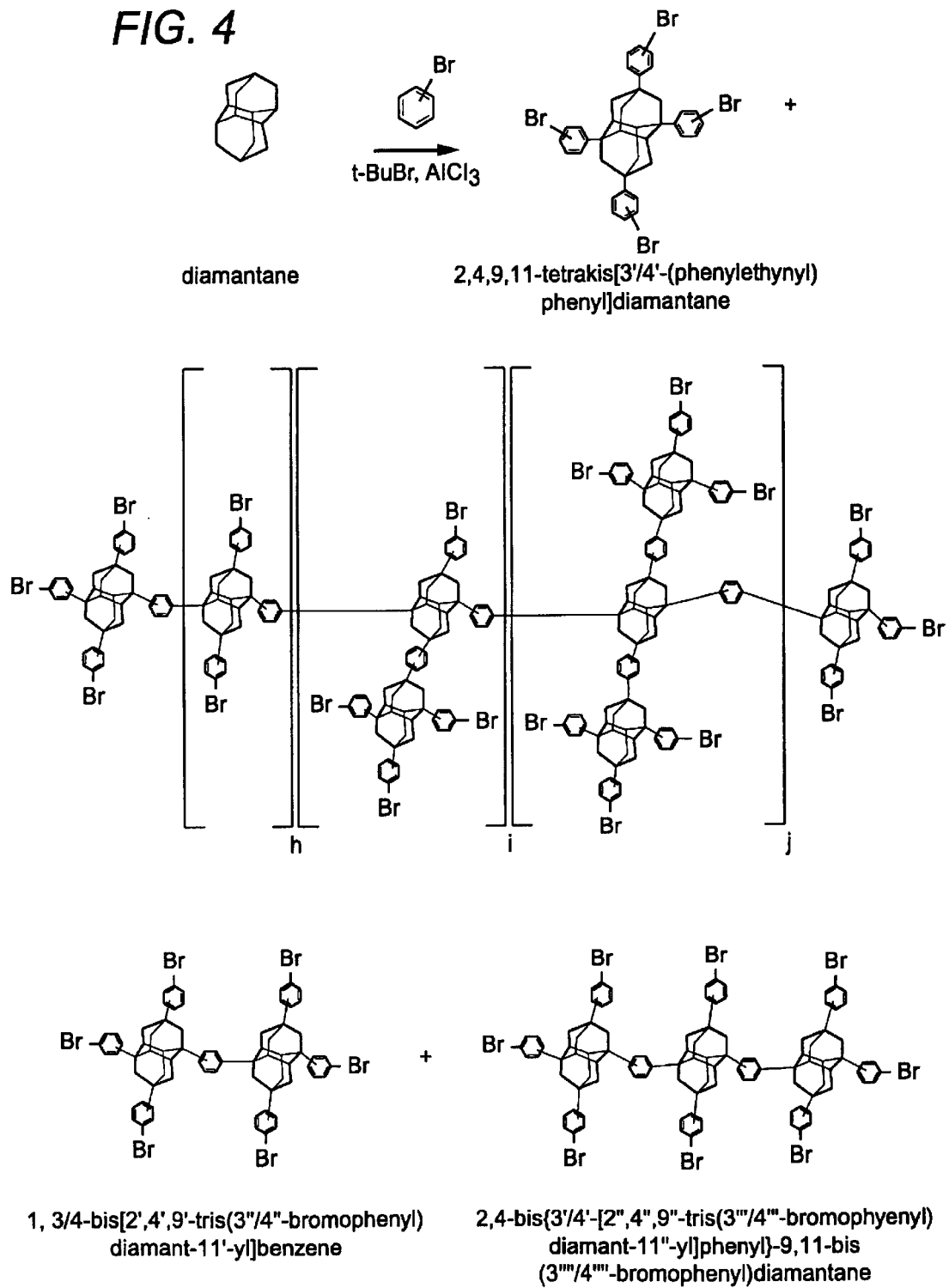
FIG. 4 illustrates a method for preparing diamantane based compositions which are useful as the thermosetting component in the present compositions.

The diamantane monomer of Formula V and oligomer or polymer of diamantane monomer of Formulae VI, XI, XIII, XV, XVIII, XIX, and XXI are prepared using the following method. As shown in FIGS. 4 and 5, diamantane is converted to the bromophenylated compositions of diamantane using similar synthetic procedures as described in Preparations 1 and 2. In FIGS. 4 and 5, diamantane is reacted with a substituted halogen phenyl compound in the presence of a Lewis Acid catalyst as described in Preparations 1 and 2, and/or a second catalyst component as described in Preparation 2. A mixture of monomers, dimers, trimers, and higher oligomers is obtained after work-up of the reaction mixtures. In FIG. 5, the bromophenylated diamantane mixture is then reacted with a terminal alkyne in the presence of catalyst to produce the alkyne-substituted diamantane compositions of the present invention.

EXAMPLES

Inventive Example 1

About 180–210 grams of the thermosetting component (a) from Preparation 1 or 2 above was added to a flask and dissolved by shaking and swirling the flask. The adhesion promoter (b) used was polycarbosilane $(CH_2SiH_2)_q$ where q is 20–30. The desired concentration of the adhesion promoter (b) was determined, added to the flask, and varied between 0.5 and 7 percent by weight. The mass of xylene needed was added to the flask. The temperature was set to 155° C. The reaction mixture was refluxed overnight for about 14–16 hours. The solution was rotavapped at 60° C. to a thick oil (350–450 grams). Cyclohexanone (1000 milliliters±10 milliliters) was added to the flask. The two preceding steps were repeated three times. GPC showed, in addition to the GPC results of Preparation 1 or 2 above, oligomer with peak molecular weight of 30,000 formed and also oligomer with peak molecular weight of 5,000 formed.

Inventive Example 2

About 180–210 grams of the thermosetting component (a) from Preparation 1 or 2 above was added to a flask and dissolved by shaking and swirling the flask. The adhesion promoter (b) used was ortho-cresol novolak having a molecular weight of 1760 and commercially available from Schenectady International Inc. Based on a desired three weight percent of the adhesion promoter (b), the needed mass of the adhesion promoter (b) was calculated to be six grams and added to the flask. The flask contents were stirred until the adhesion promoter was dissolved (about one to two hours). The GPC results are similar to those of Preparation 1 or 2 above.

Inventive Example 3

Comparative A is a polyarylene ether taught by Honeywell U.S. Pat. No. 5,986,045. For Inventive Example 3, the composition of Inventive Example 1 was applied to a substrate using typical coating conditions known to those skilled in the art.

The resulting spun-on composition was baked for one minute under $N_2$ (<50 ppm $O_2$) at each of the following temperatures: 125° C., 250° C., and 350° C. The furnace cure condition was 400° C. for 60 minutes in $N_2$ (15 liters/minute) with ramping up from 250° C. at 5° K. per minute. The cure temperature range was from 350° C. to 450° C. Alternatively, a hot plate cure condition at 350° C. to 450° C. for 1–5 minutes in $N_2$ may be used. The resulting layers were analyzed according to the analytical test methods set forth above. The layer properties are reported in Table.

TABLE 6

| PROPERTY | Comparative A | Inventive Example 3 |
| --- | --- | --- |
| Electrical: | | |
| Dielectric constant @ 1 MHx | 2.85 | 2.60 ± 0.2 |
| Thermal: | | |
| Shrinkage (%) after 425° C./10 hours | 4.0 | 3.5 |
| ITGA weight loss After 425° C./0–30 min (%) | 1.2 | <1 |
| ITGA weight loss After 425° C./30–150 minutes | 1.6 | 1.5–2 |
| Mechanical: | | |
| $T_g$ (° C.) first cycle | 400 | >400 |
| $T_g$ (° C.) second cycle | 400 | >450 |
| Modulus (Gpa) | 5.0 (film thickness = .8 μm) | 6.0 ± 0.2 (film thickness = 1.6 mm) |
| Hardness (Gpa) | 0.4 (film thickness = .8 μm) | 0.6 ± 0.1 (film thickness = 1.6 μm) |
| Stud Pull Strength (kpsi) | >11 | >11 |
| Tape Test | Pass | Pass |
| Refractive Index @ 633 nm | 1.675 | 1.62 |
| Compatible with Solvents | Yes | Yes |

The Tg improvement is significant for use in a harsh high temperature processing environment and the modulus improvement contributes to mechanical stability.

Inventive Examples 4–10

For Inventive Examples 4–7, Inventive Example 2 was followed to produce the compositions of Table III except that the amount of ortho-cresol novolak adhesion promoter (b) was varied. For Inventive Examples 8–10, Inventive Example 1 was followed to produce the compositions of Table 7 except that the amount of polycarbosilane promoter (b) was varied.

TABLE 7

| PROPERTY | INVENTIVE EXAMPLE 4 | INVENTIVE EXAMPLE 5 | INVENTIVE EXAMPLE 6 | INVENTIVE EXAMPLE 7 | INVENTIVE EXAMPLE 8 | INVENTIVE EXAMPLE 9 | INVENTIVE EXAMPLE 10 |
| --- | --- | --- | --- | --- | --- | --- | --- |
| Ortho-cresol Novolak (weight %) | 0.5 | 1.0 | 2.0 | 3.0 | — | — | — |
| Polycarbosilane (weight %) | — | — | — | — | 1.0 | 2.0 | 3.0 |
| % Expansion | 6.48 | 5.92 | 5.80 | 5.62 | 5.39 | 5.08 | 4.92 |
| % Shrinkage (425° C./10 hours) | 2.97 | 2.45 | 2.44 | 2.54 | 2.28 | 2.34 | 2.49 |
| Tape Test | Pass | Pass | Pass | Pass | Pass | Pass | Pass |
| Stud Pull (mean, ksi) | 9.7, 11.3 | 10.7, 11.2 | 9.1, 11.7 | 10.4, 11.4 | 8.5, 11.4 | 7.0, 9.7 | 7.9, 10.0 |

Thus, specific embodiments and applications of compositions and methods to produce a low dielectric constant polymer have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A composition comprising:
   (a) thermosetting component comprising: (1) optionally at least one monomer of Formula I

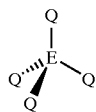

and (2) at least one oligomer or polymer of Formula II

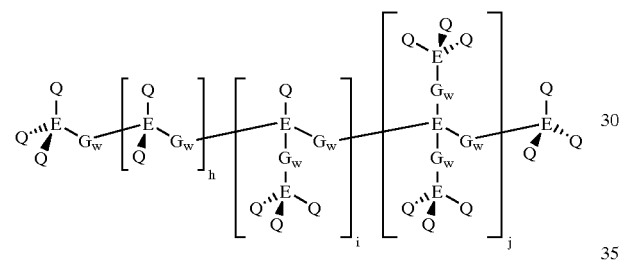

where said E is a cage compound; each of said Q is the same or different and selected from hydrogen, aryl, branched aryl, and substituted aryl wherein said substituents include hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl; said $G_w$ is aryl or substituted aryl where substituents include halogen and alkyl; said h is from 0 to 10; said i is from 0 to 10; said j is from 0 to 10; and said w is 0 or 1;

(b) adhesion promoter comprising a compound having at least bifunctionality wherein the bifunctionality may be the same or different and the first functionality is capable of interacting with said thermosetting component (a) and the second functionality is capable of interacting with a substrate when said composition is applied to said substrate.

2. The composition of claim 1 wherein said thermosetting component (a) comprises said at least one monomer (1) of Formula III

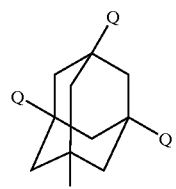

and said at least one oligomer or polymer (2) of Formula IV

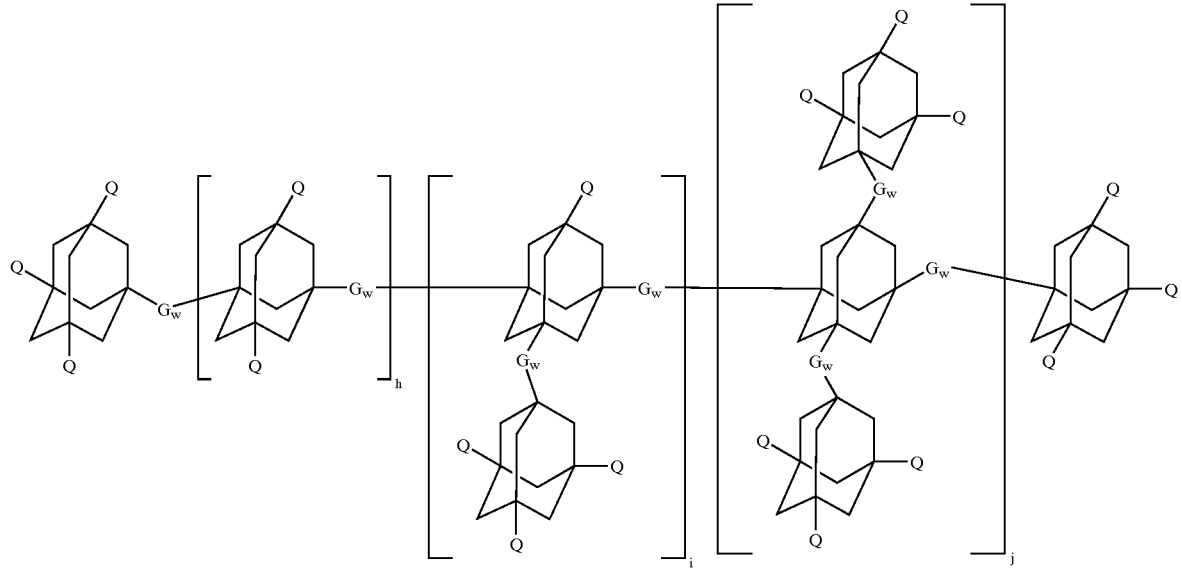

or said at least one monomer (1) of Formula V
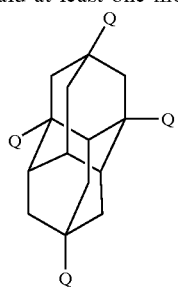
and said at least one oligomer or polymer (2) of Formula VI
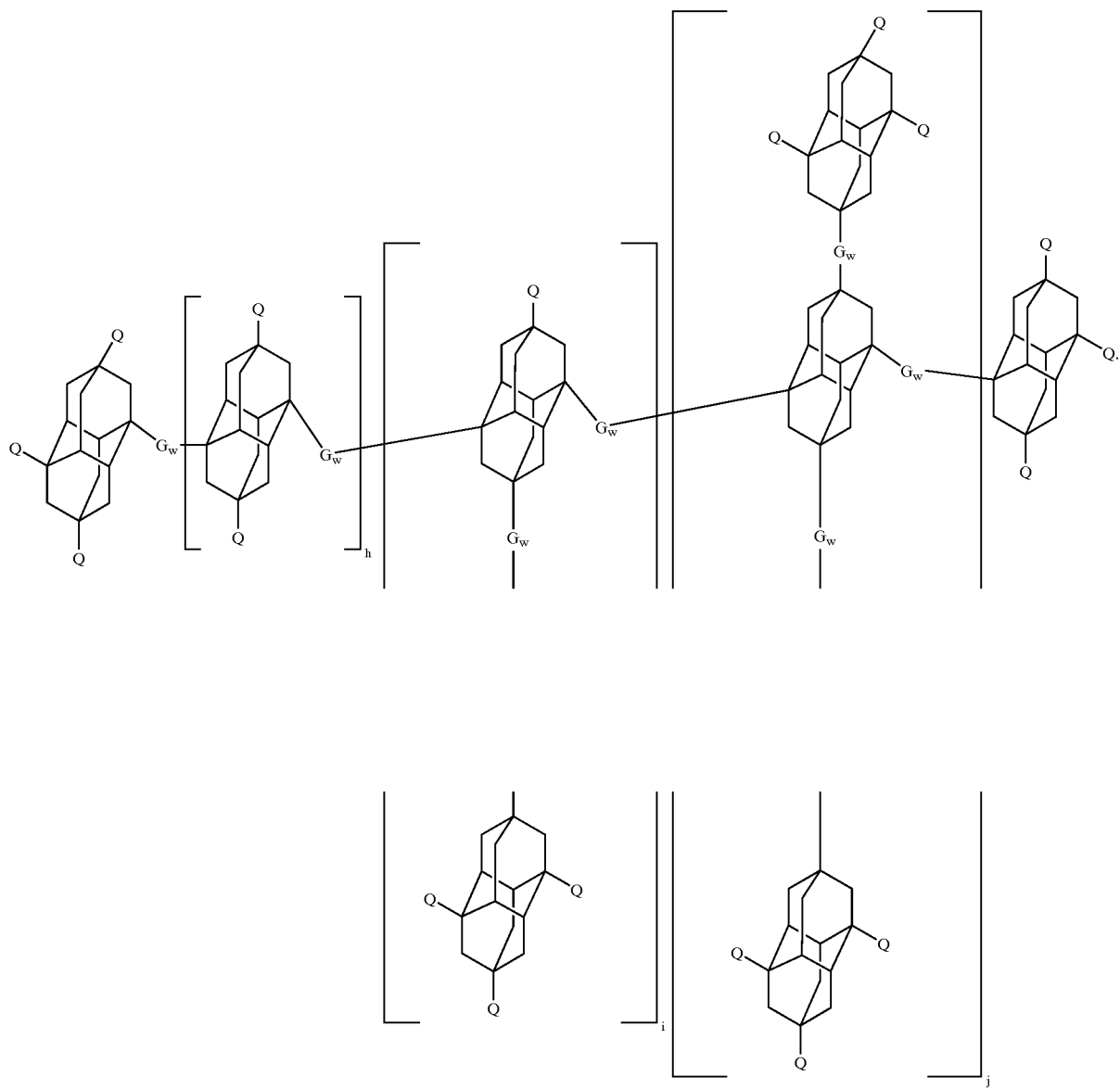

3. The composition of claim 2 wherein said at least one oligomer or polymer (2) is adamantane dimmer of Formula XIV

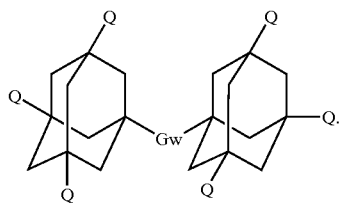

4. The composition of claim 2 wherein said at least one oligomer or polymer (2) is adamantane trimer of Formula XV

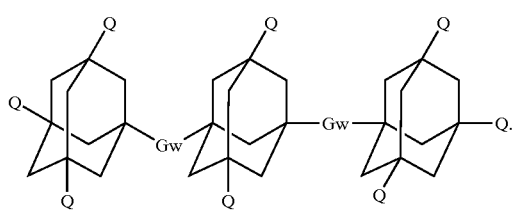

5. The composition of claim 2 wherein said thermosetting component (a) comprises (1) adamantane monomer of Formula VIIA

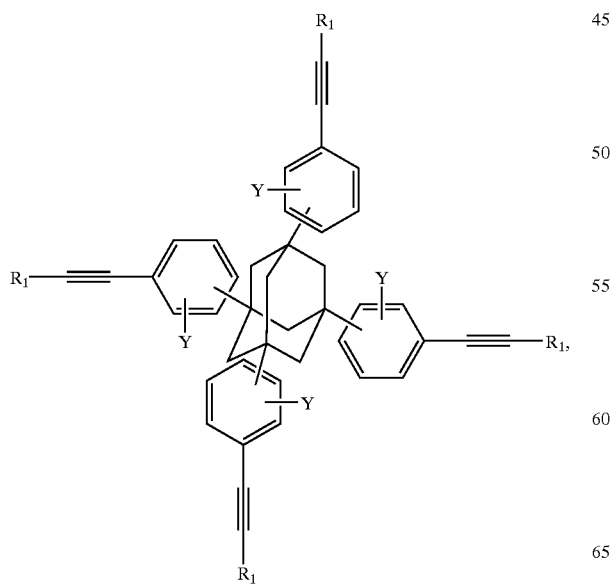

-continued

Formula VIIB

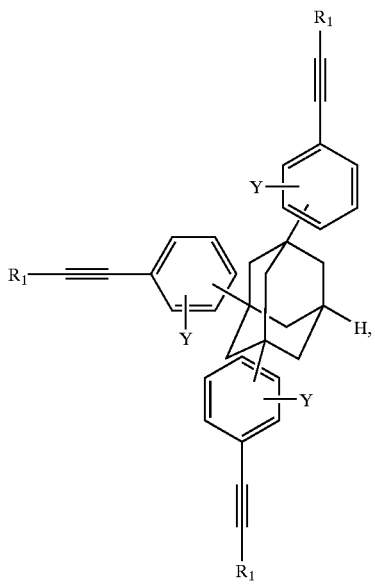

Formula VIIC

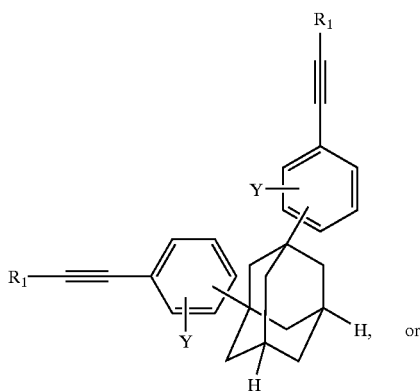

or

Formula VIID

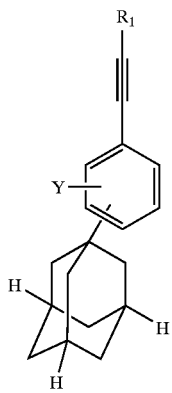

and (2) adamantane oligomer or polymer of Formula VIII

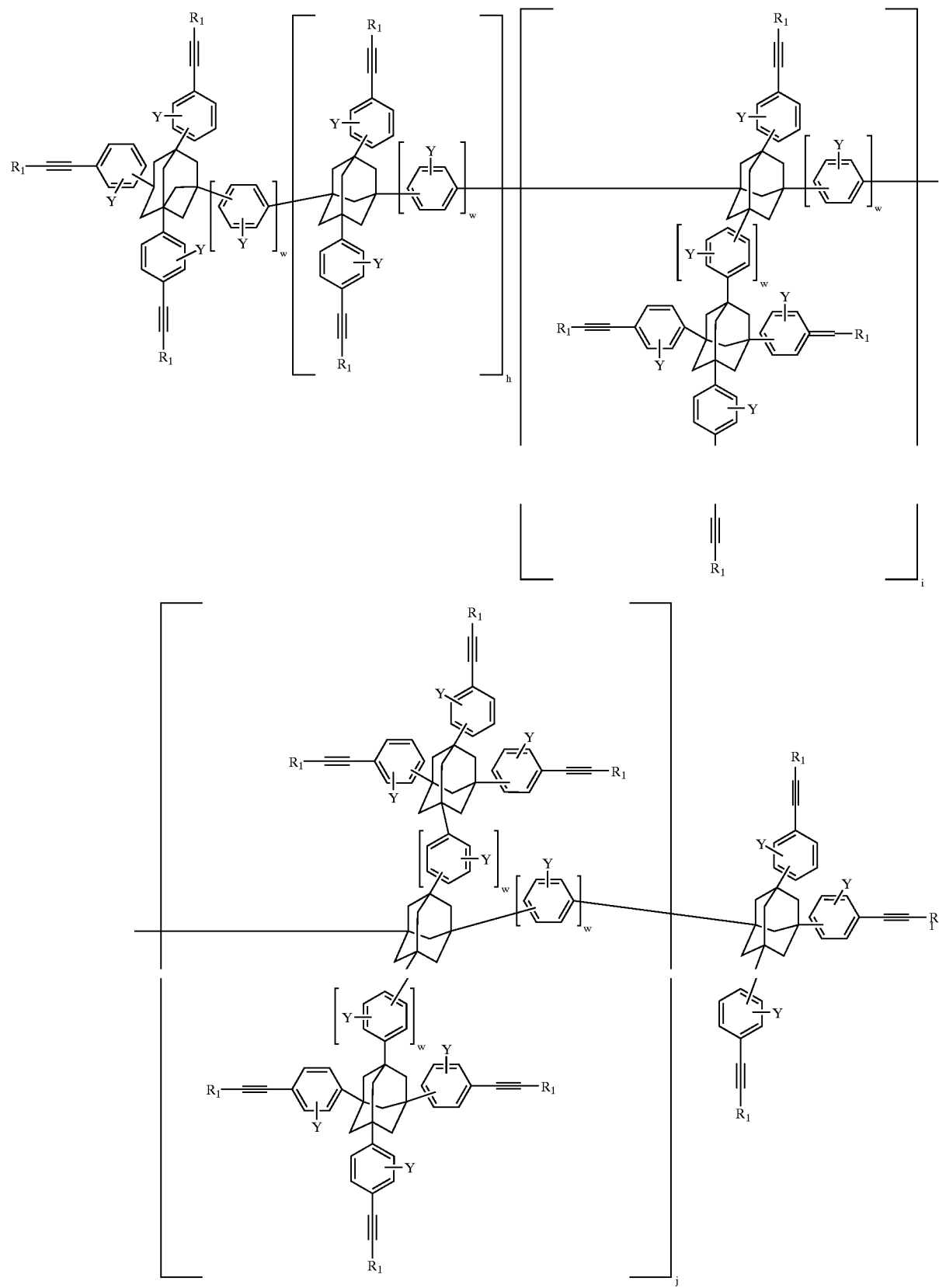

or (I) diamantane monomer of Formula IXA
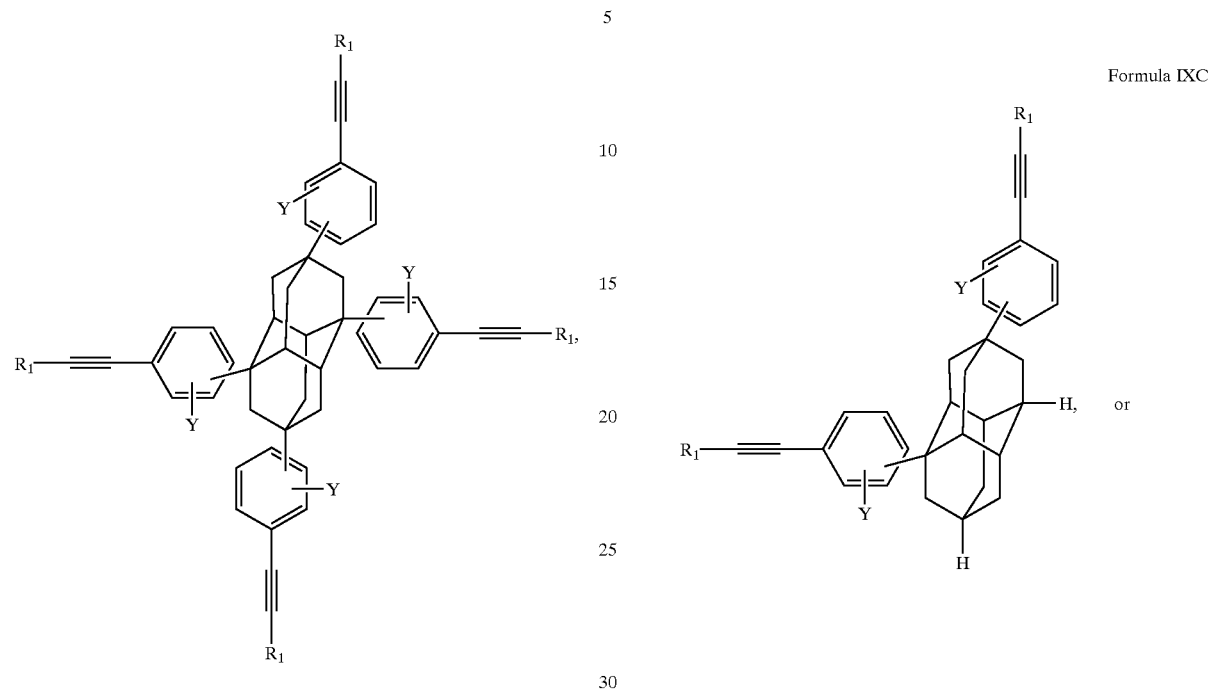
Formula IXB
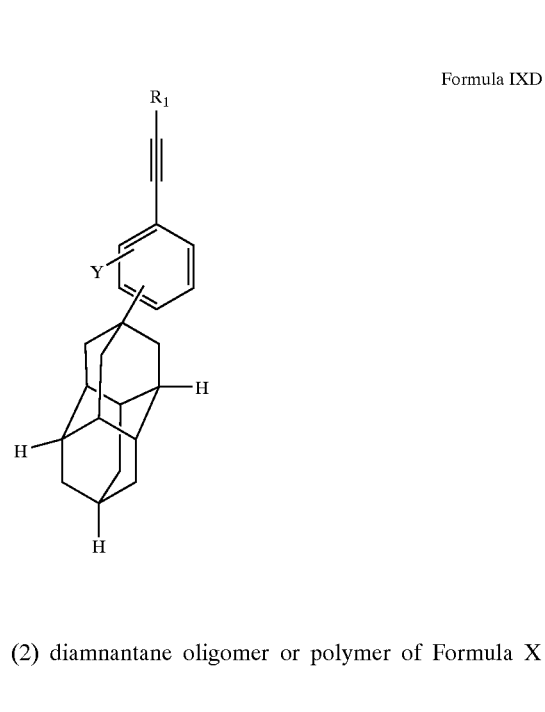
Formula IXC
Formula IXD
and (2) diamnantane oligomer or polymer of Formula X 143 144
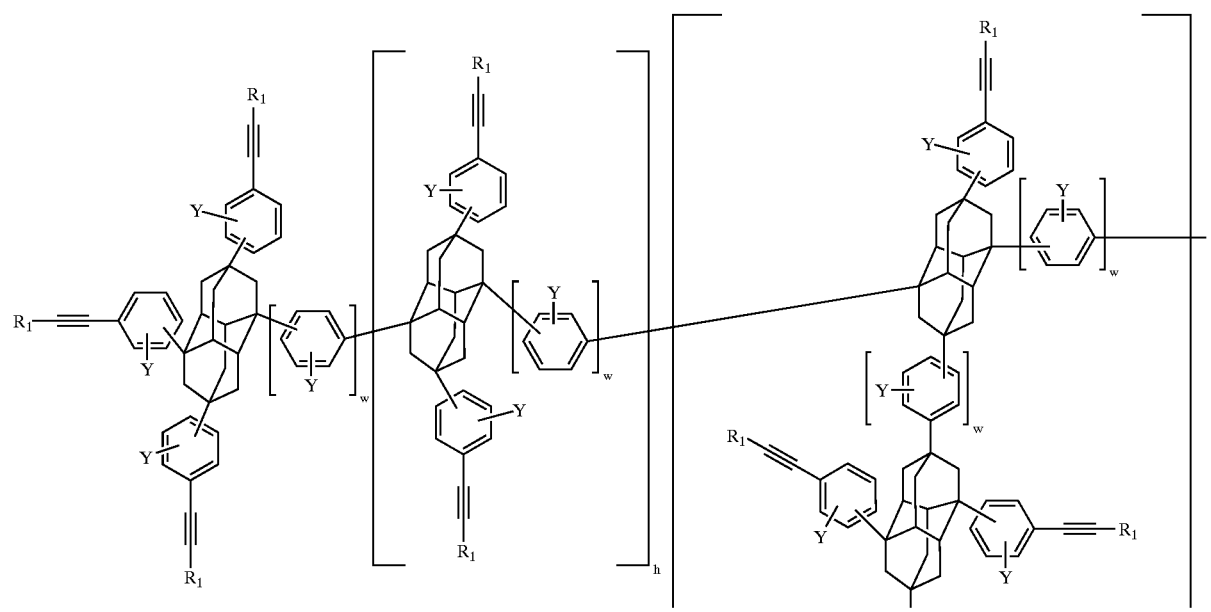
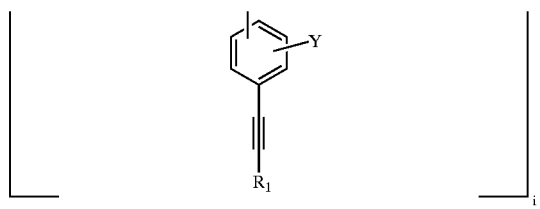
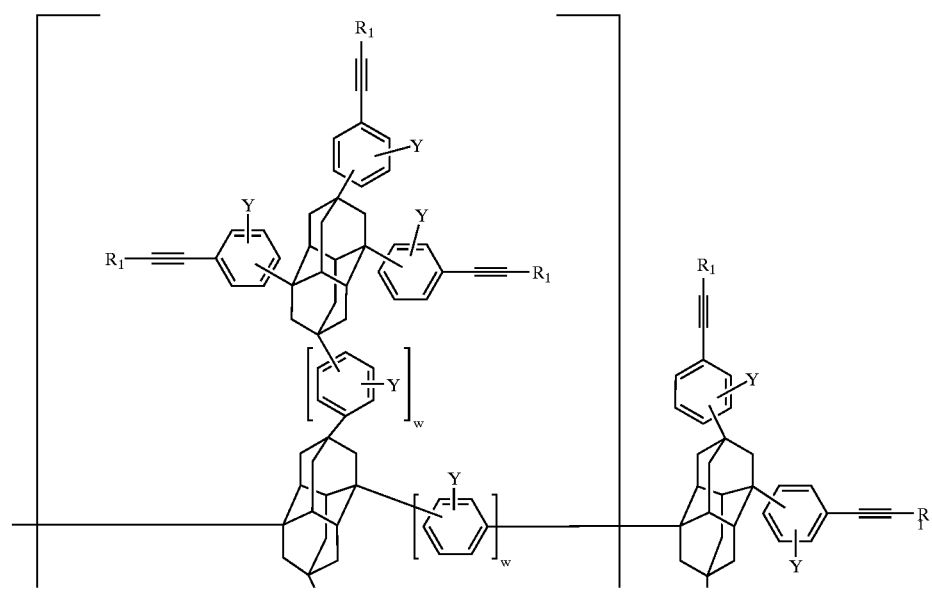

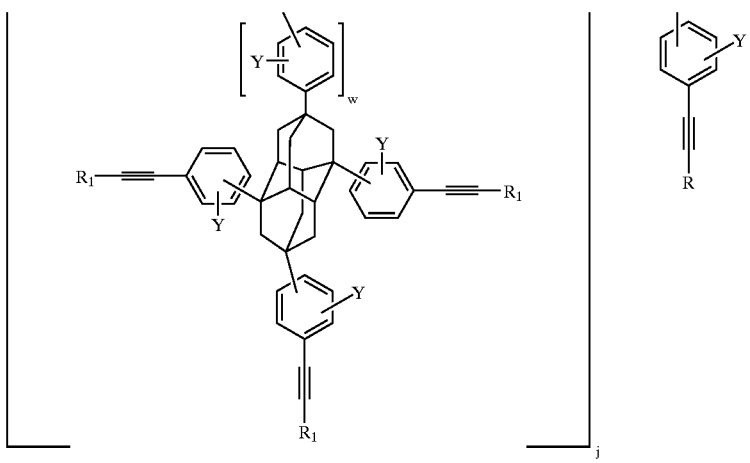

where said h is from 0 to 10; said i is from 0 to 10; said j is from 0 to 10; each of said $R_1$ is the same or different and selected from hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl; and each of said Y is the same or different and is selected from hydrogen, alkyl, aryl, substituted aryl, or halogen.

6. The composition of claim 5 wherein said $R_1$ is aryl or substituted aryl and said Y is hydrogen, phenyl, or biphenyl.

7. The composition of claim 6 wherein said adamantane monomer of Formula VIIA, VIIB, VIIC, or VIID is present in an amount of about 30 to about 70 area-% and said adamantane oligomer or polymer of Formula VIII is present in an amount of about 70 to about 30 area-%, preferably in an amount of about 40 to about 60 area-% and said adamantane oligomer or polymer of Formula VIII is present in an amount of about 60 to about 40 area-%, and more preferably in an amount of about 45 to about 55 area-% and said adamantane oligomer or polymer of Formula IV is present in an amount of about 55 to about 45 area-%, wherein area-% is defined as the peak area belonging to the monomer or the peak area belonging to the oligomer or polymer, which is related to the total of all the peak areas in the chromatogram.

8. The composition of claim 6 wherein said (2) adamantane oligomer or polymer is of Formula XVII where h is 0 or 1

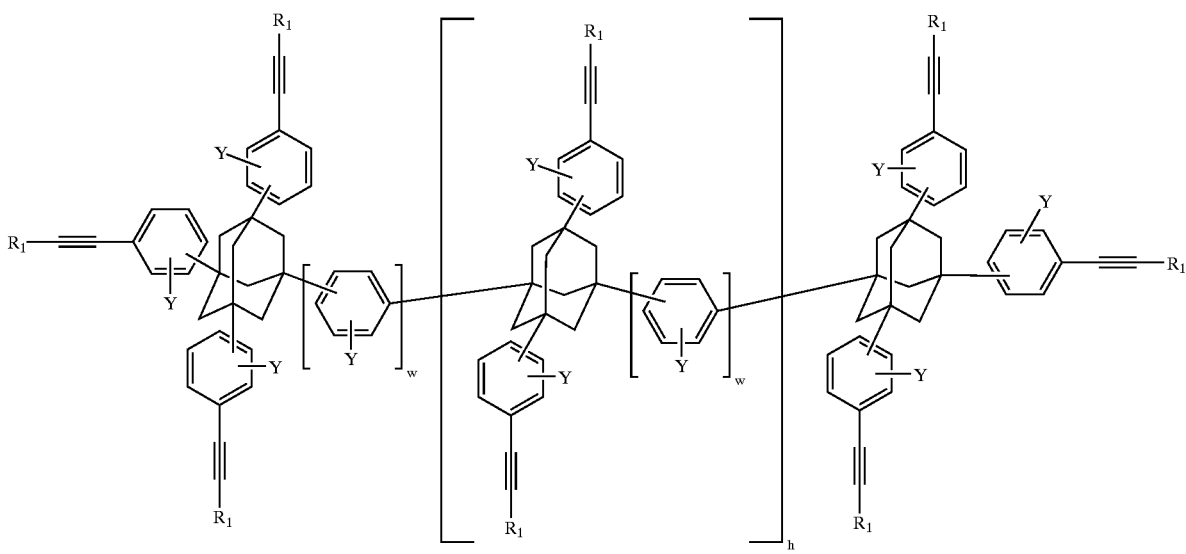

or said (2) diamantane oligomer or polymer is of Formula XVIII where h is 0 or 1

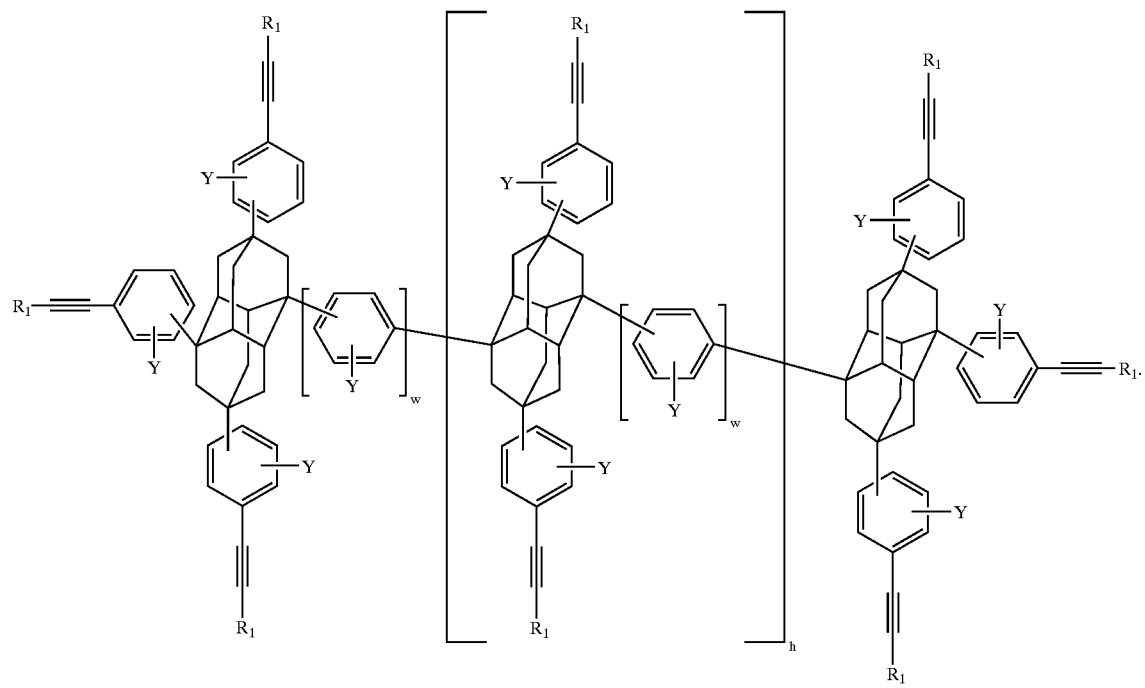
9. The composition of claim 8 wherein said (2) adamantane oligomer or polymer is dimer of Formula XIX
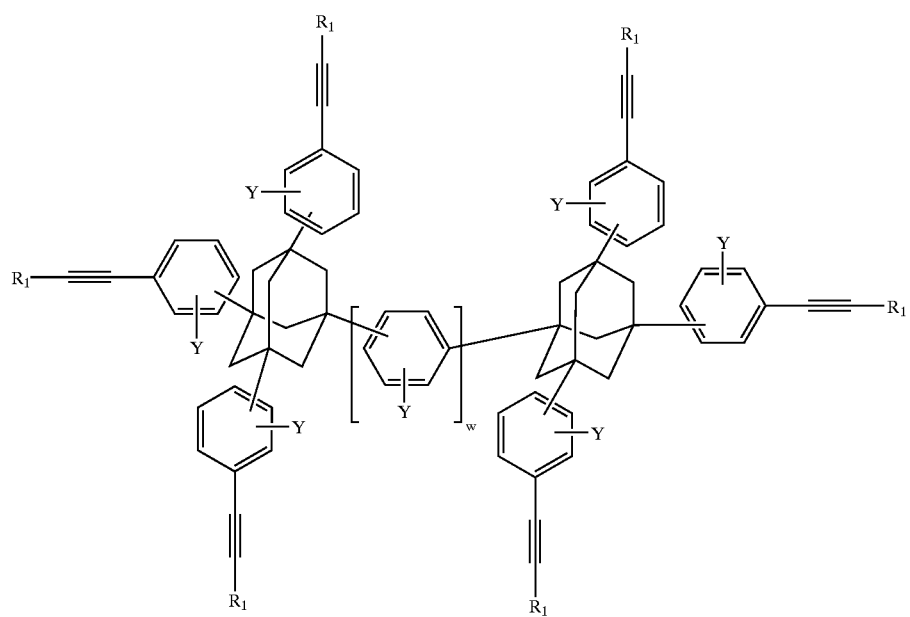
or said (2) diamantane oligomer or polymer is dimer of Formula XX

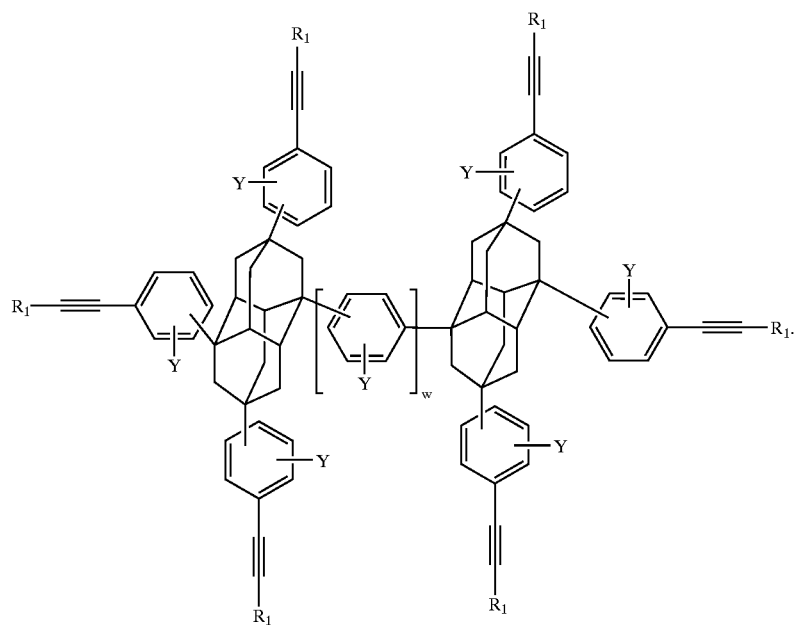
10. The composition of claim 8 wherein said (2) adamantane oligomer or polymer is trimer of Formula XXI
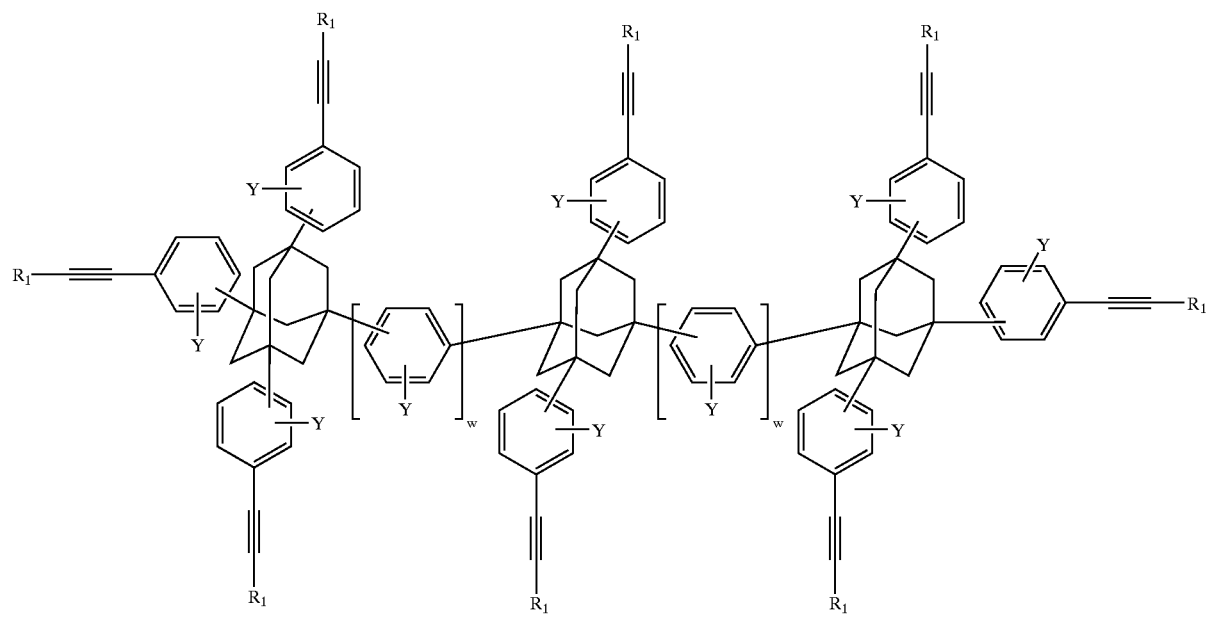
or said (2) diamantane oligomer or polymer is trimer of Formula XXII

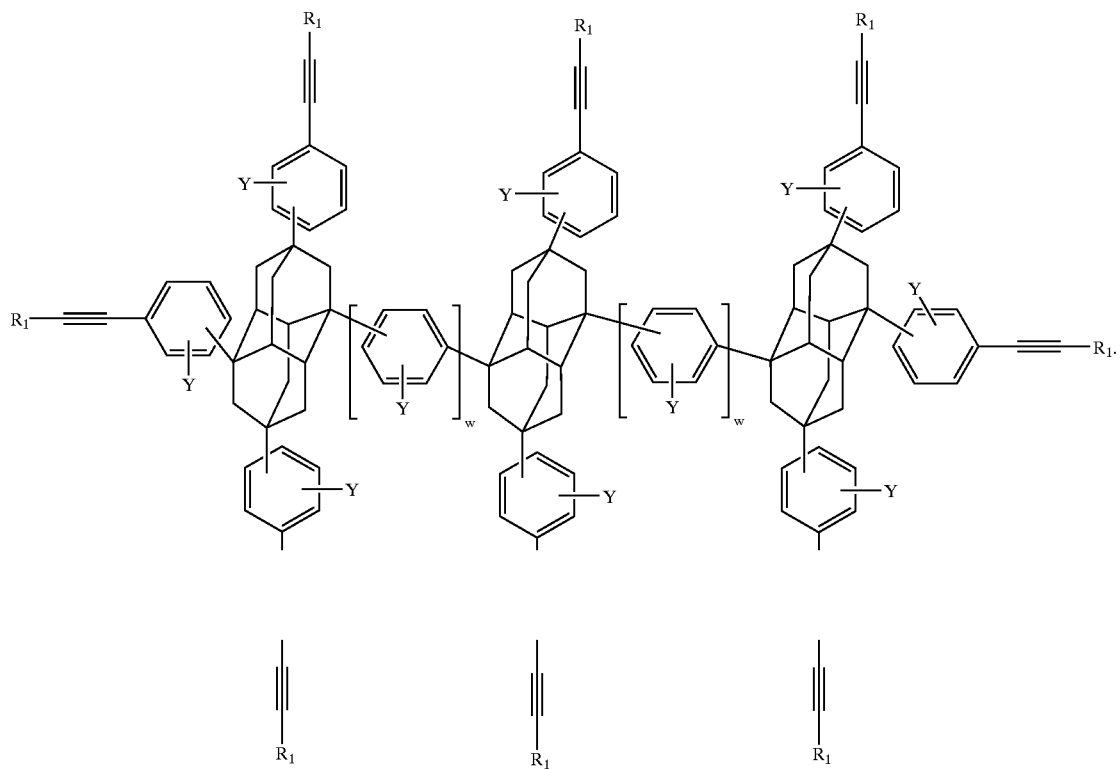
11. The composition of claim 6 wherein said (2) adamantane oligomer or polymer is a mixture of Formula XXIII
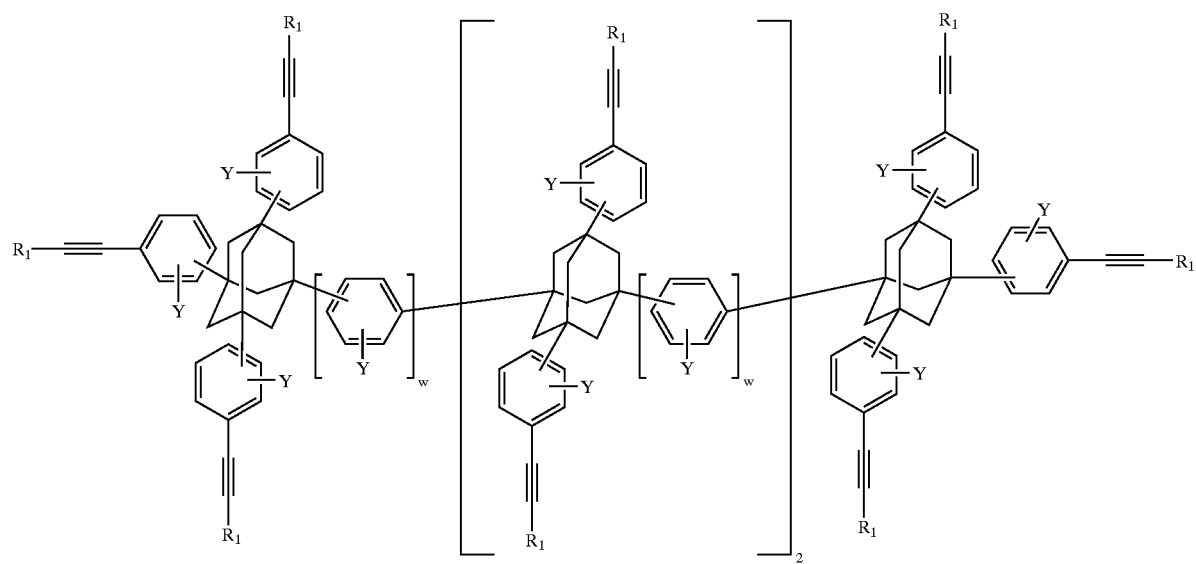
and of Formula XXV

153
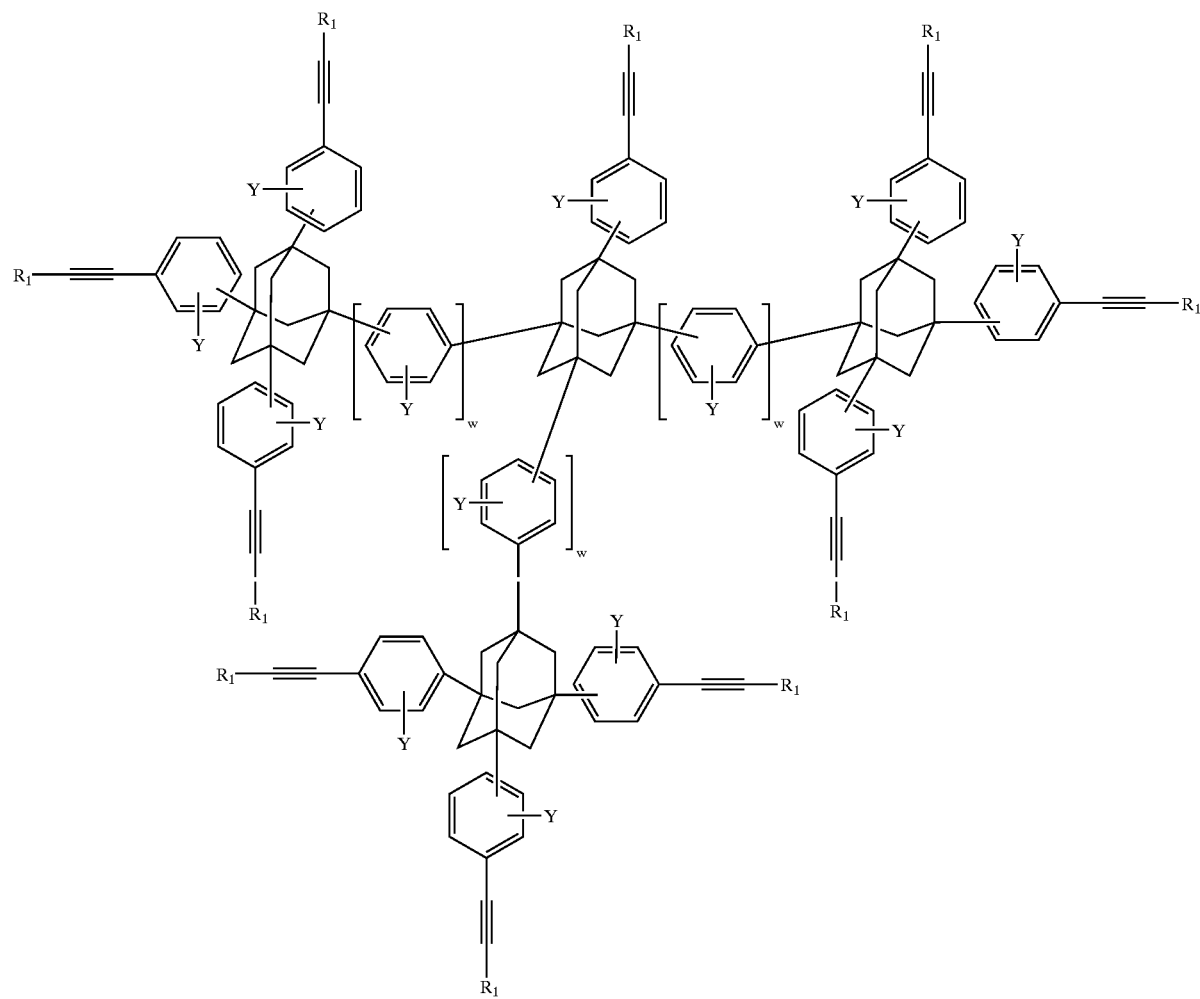
or said (2) diamnantane oligomer or polymer is a mixture of
Formula XXV
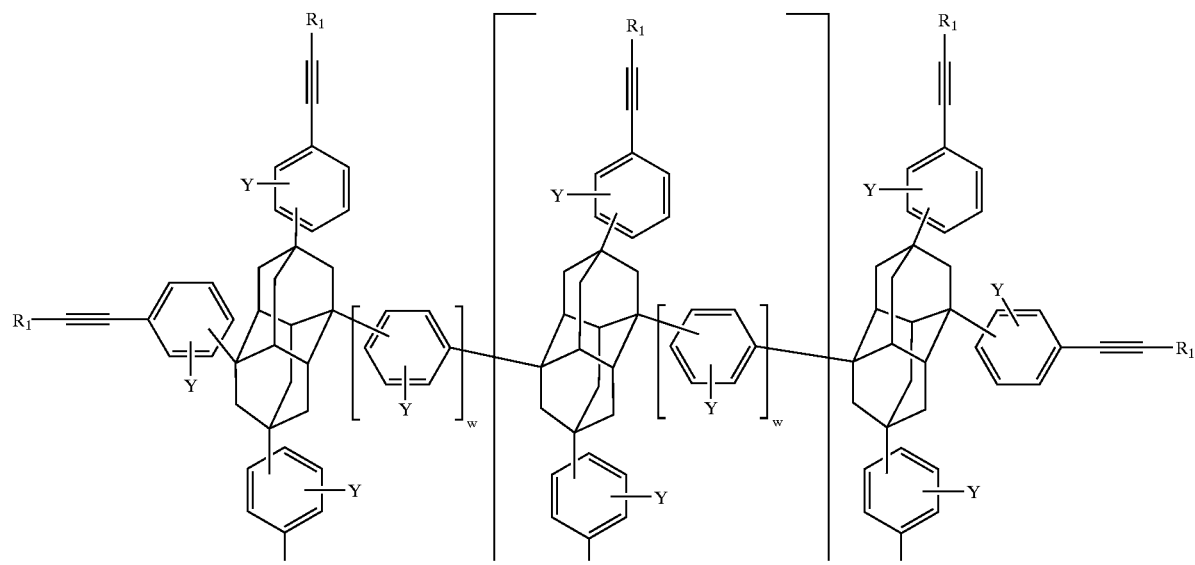

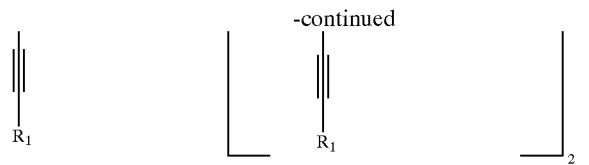
and of Formula XXVI
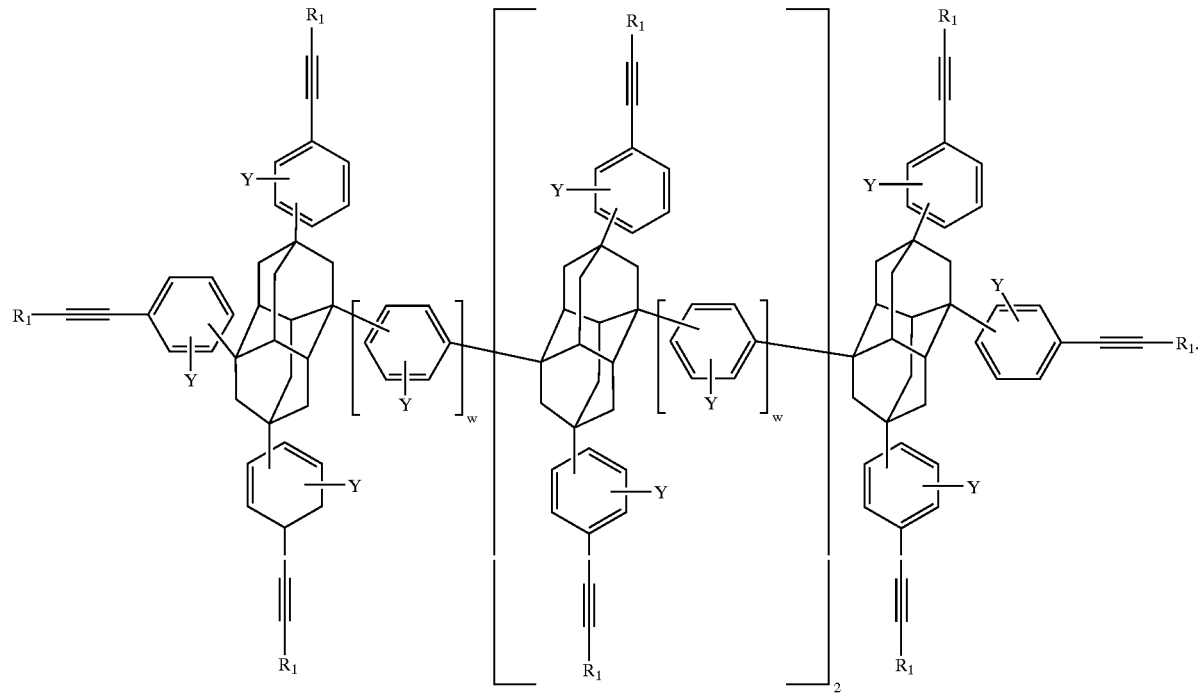
12. The composition of claim 6 wherein said thermosetting component (a), said monomer (1) and said oligomer or polymer (2) are adamantane based components.
13. The composition of claim 6 wherein said thermosetting component (a), said oligomer or polymer (2) comprises a mixture of adamantane dimer of Formula XIX
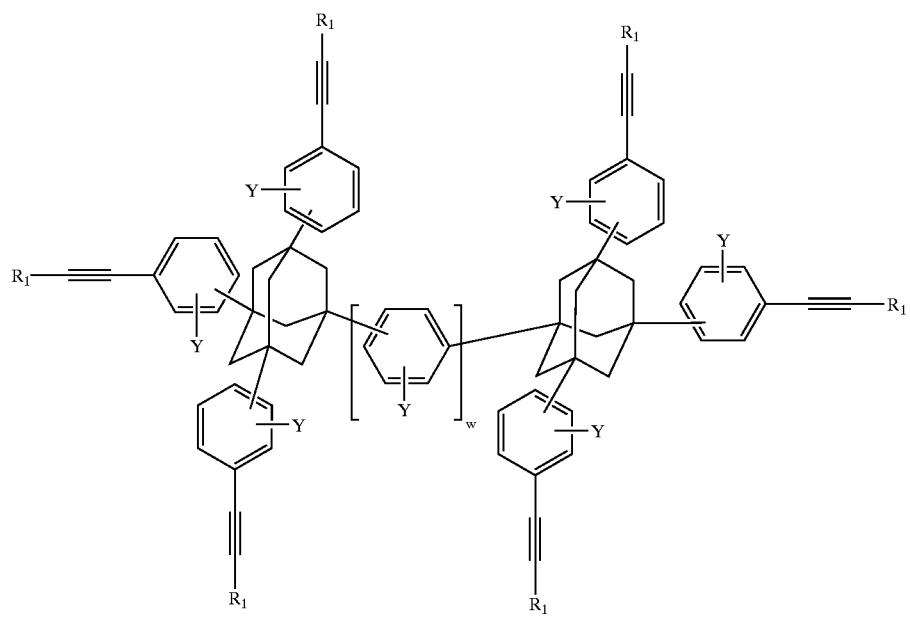
and adamantane trimer of Formula XXI

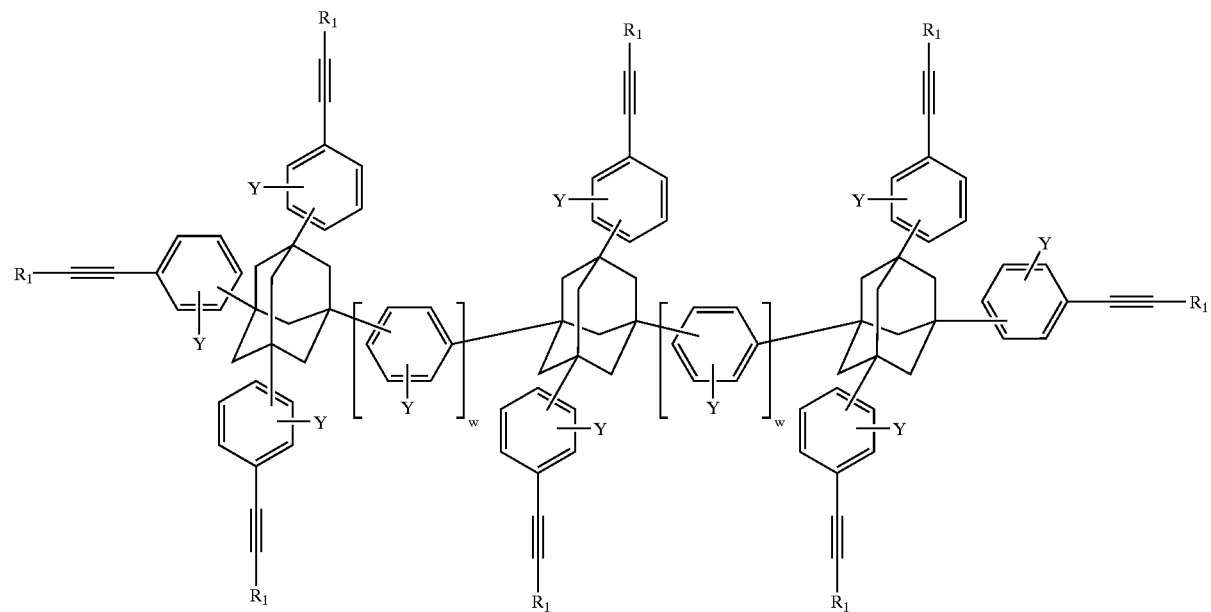
or diamantane dimer of Formula XX
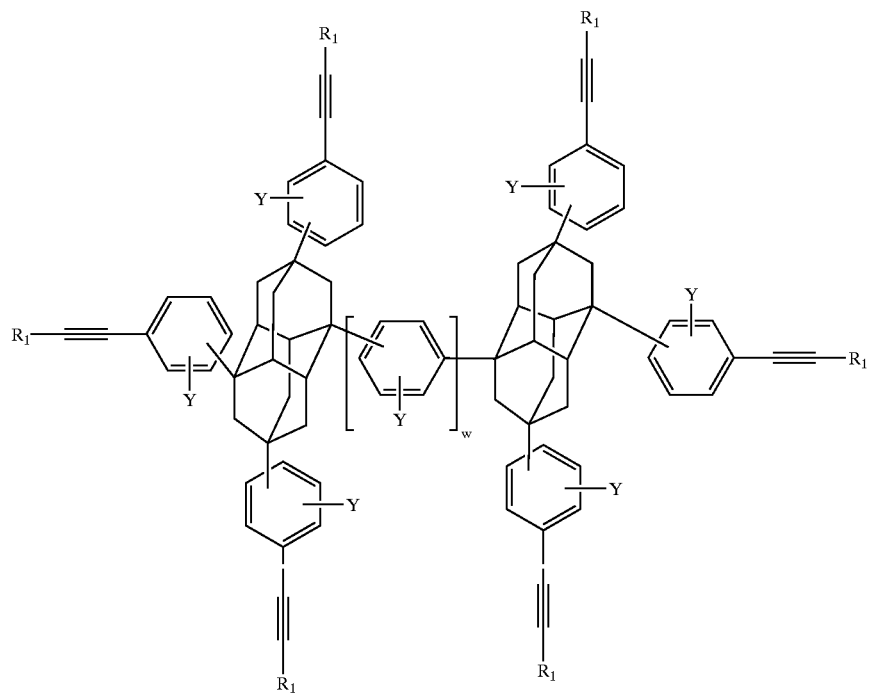
and diamantane trimer of Formula XXII

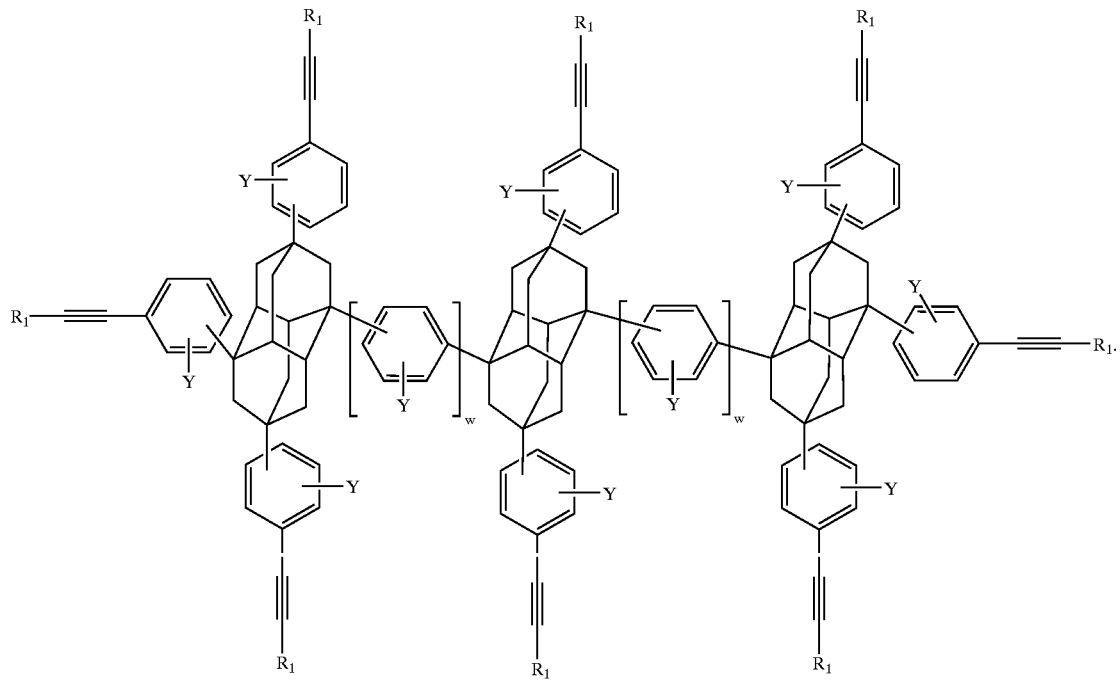

14. The composition of claim 13 wherein at least two of said $R_1C\equiv C$ groups on said phenyl groups are two different isomers and at least one of said phenyl groups between two bridgehead carbons of said adamantane monomers exists as two different isomers.

15. The composition of claim 14 wherein said at least two isomers are meta- and para-isomers.

16. The composition of claim 15 comprising at least two of said oligomer or polymer.

17. The composition of claim, 16 wherein at least one of said first functionality and said second functionality of said adhesion promoter (b) is selected from the group consisting of Si containing groups; N containing groups; C bonded to O containing groups; hydroxyl-containing groups; and C double bonded to C containing groups.

18. The composition of claim 17 wherein said Si containing groups are selected from the group consisting of Si—H, Si—O, and Si—N; said N containing groups are selected from the group consisting of amines, imines, amides, and imides; said C bonded to O containing groups are selected from the group consisting of carbonyl groups, esters, —COOH, alkoxyls having 1 to 5 carbon atoms, ethers, glycidyl ethers, and epoxies; said hydroxyl group is phenol; and said C double bonded to C containing groups are selected from the group consisting of allyl and vinyl groups.

19. The composition of claim 16 wherein said Si containing group is selected from silanes of the Formula XI: $(R_2)_k(R_3)_l\mathrm{Si}(R_4)_m(R_5)_n$ wherein $R_2$, $R_3$, $R_4$, and $R_5$ each independently represents hydrogen, hydroxyl, unsaturated or saturated alkyl, substituted or unsubstituted alkyl where the substituent is amino or epoxy, unsaturated or saturated alkoxyl, unsaturated or saturated carboxylic acid radical, or aryl, at least two of said $R_2$, $R_3$, $R_4$, and $R_5$ represent hydrogen, hydroxyl, saturated or unsaturated alkoxyl, unsaturated alkyl, or unsaturated carboxylic acid radical, and $k+l+m+n<4$; or polycarbosilane of the Formula XI:

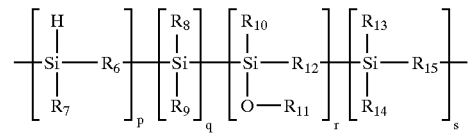

in which $R_6$, $R_{12}$, and $R_{15}$ each independently represents substituted or unsubstituted alkylene, cycloalkylene, vinylene, allylene, or arylene; $R_7$, $R_8$, $R_9$, $R_{10}$, $R_{13}$, and $R_{14}$ each independently represents hydrogen atom, alkyl alkylene, vinyl, cycloalkyl, allyl, aryl, or arylene and may be linear or branched, $R_{11}$ represents organosilicon, silanyl, siloxyl, or organo group, and p, q, r, and s satisfy the conditions of [4<p+q+r+s<100,000], and q and r and s may collectively or independently be zero;

said C bonded to O containing groups are selected from glycidyl ethers, or esters of unsaturated carboxylic acids containing at least one carboxylic acid group;

said C double bonded to C containing groups is vinyl cyclic oligomers or polymers where the cyclic group is vinyl, aromatic, or heteroaromatic; and said hydroxyl-containing group is phenol-formaldehyde resins or oligomers of the Formula XIII:—$[R_{16}C_6H_2(OH)(R_{17})]_t$— where $R_{16}$ is substituted or unsubstituted alkylene, cycloalkylene, vinyl, allyl, or aryl, $R_{17}$ is alkyl, alkylene, vinylene, cycloalkylene, allylene, or aryl, and t=3–100.

20. The composition of claim 19 wherein said adhesion promoter (b) is said phenol-formaldehyde resin or oligomer.

21. A spin-on composition comprising said oligomer of claim 6 and solvent, preferably cyclohexanone.

22. A layer comprising said polymer of claim 21.

23. The layer of claim 22 wherein said layer has a thickness up to or greater than about 1.5 microns.

24. The layer of claim 22 wherein said polymer is cured.

25. The layer of claim 24 wherein said layer has a dielectric constant of less than 3.0.

26. The layer of claim 24 wherein said layer has a glass transition temperature of at least about 350° C.

27. A substrate having thereon at least one of said layer of claim 22.

28. A microchip comprising said substrate of claim 27.

29. A method of improving adhesion of (a) thermosetting component to a substrate, the thermosetting component comprising: (1) monomer of Formula I

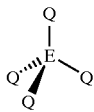

and (2) at least one oligomer or polymer of Formula II

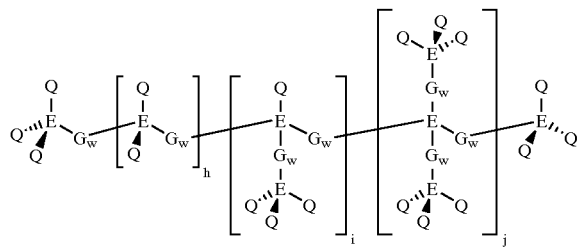

where said E is a cage compound; said Q is the same or different and selected from hydrogen, aryl, branched aryl, and substituted aryl wherein said substituents include hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl; said $G_w$ is aryl or substituted aryl where substituents include halogen and alkyl; said h is from 0 to 10; said i is from 0 to 10; said j is from 0 to 10; and said w is 0 or 1; to said substrate comprising the steps of:

adding to said thermosetting component, (b) adhesion promoter comprising compound having at least bifunctionality wherein the bifunctionality may be the same or different and the first functionality is capable of interacting with said thermosetting component (a) and the second functionality is capable of interacting with said substrate to form a composition; and applying said composition to said substrate.

30. The method of claim 29 wherein said thermosetting component (a) comprises at least one monomer (1) of Formula II

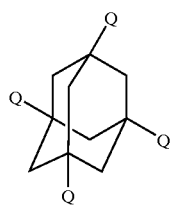

and said at least one oligomer or polymer (2) of Formula IV

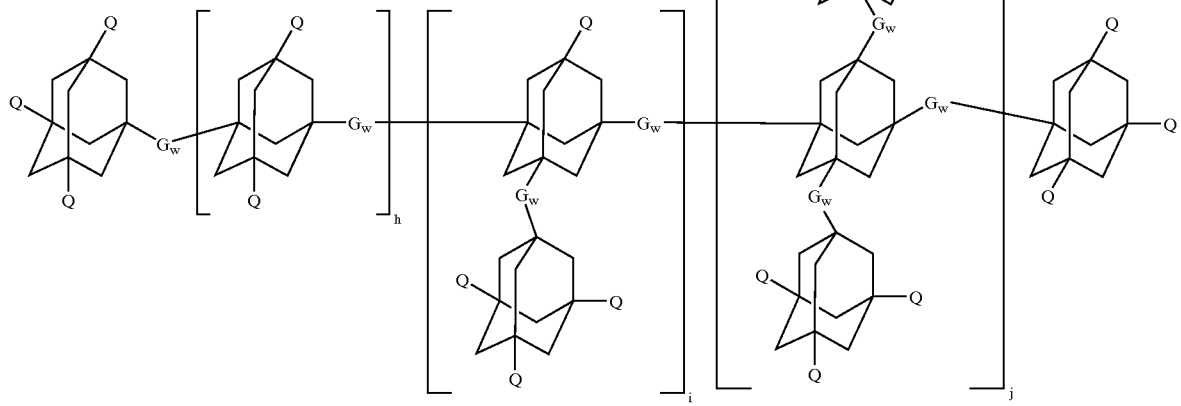

or at least one monomer (1) of Formula V
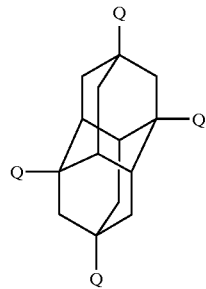
and said at least one oligomer or polymer (2) of Formula VI
31. The method of claim 30 wherein said at least one oligomer or polymer (2) is adamantane dimer of Formula XIV
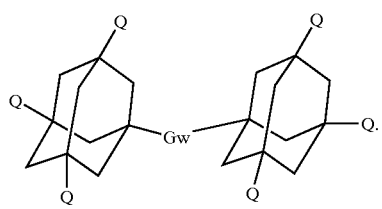
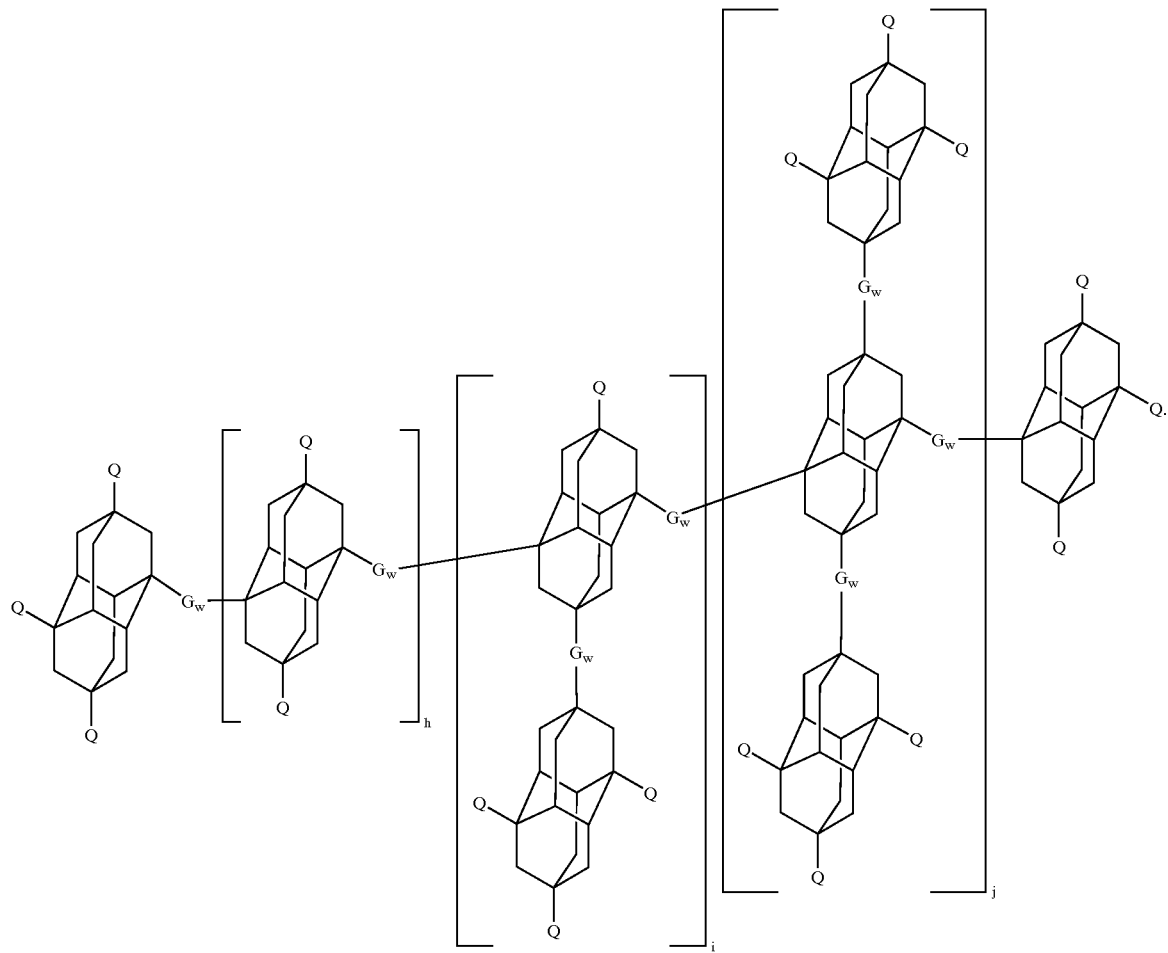

32. The method of claim 30 wherein said at least one oligomer or polymer (2) is adamantane trimer of Formula XV
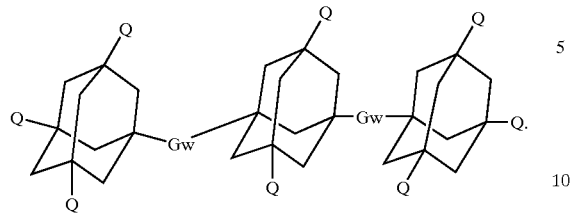
33. The method of claim 30 wherein said thermosetting component (a) comprises (1) adamantane monomer of Formula VIIA
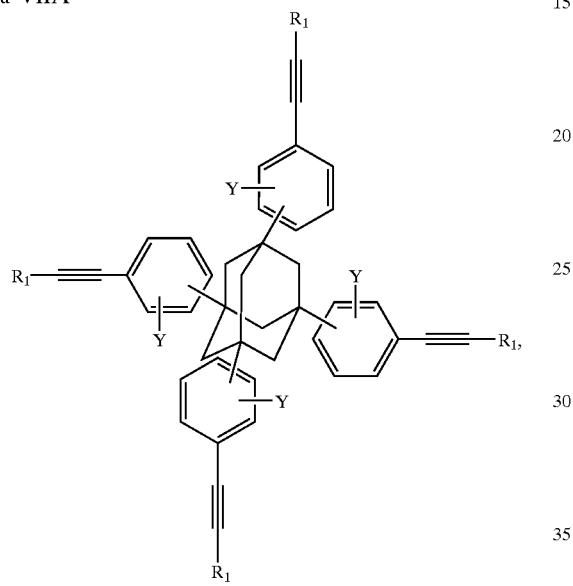
or a diamantane monomer of Formula IXB
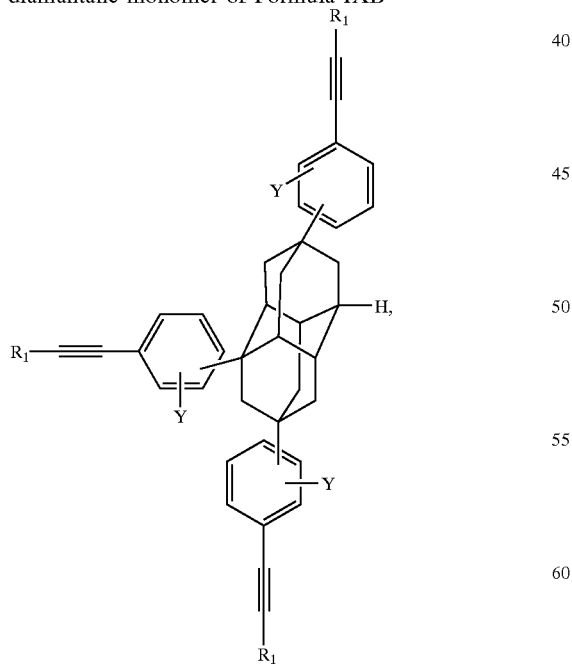
-continued
Formula IXC
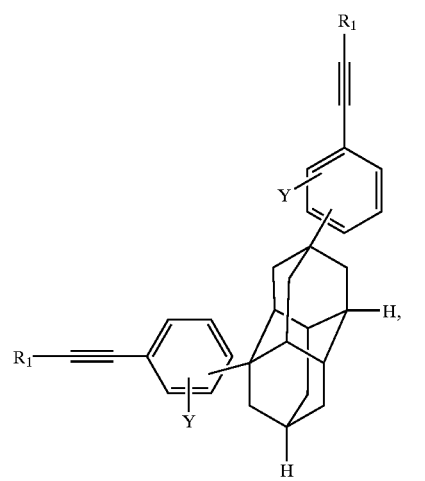
Formula IXD
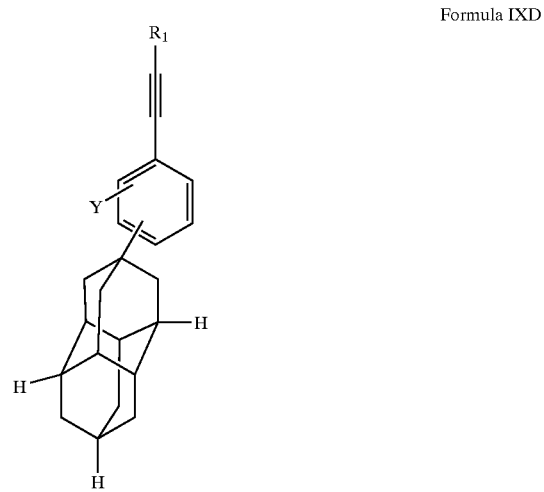
and (2) adamantane oligomer or polymer of Formula VIII

167
168
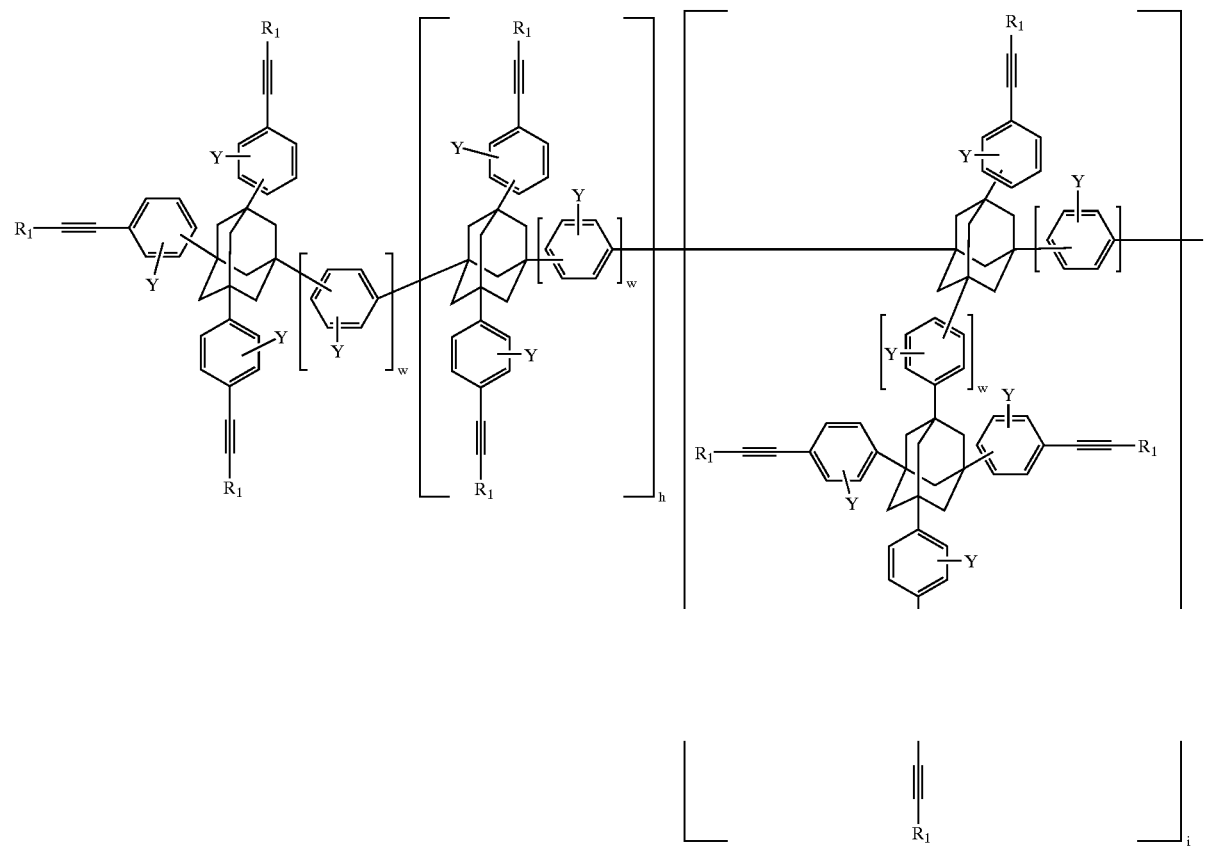
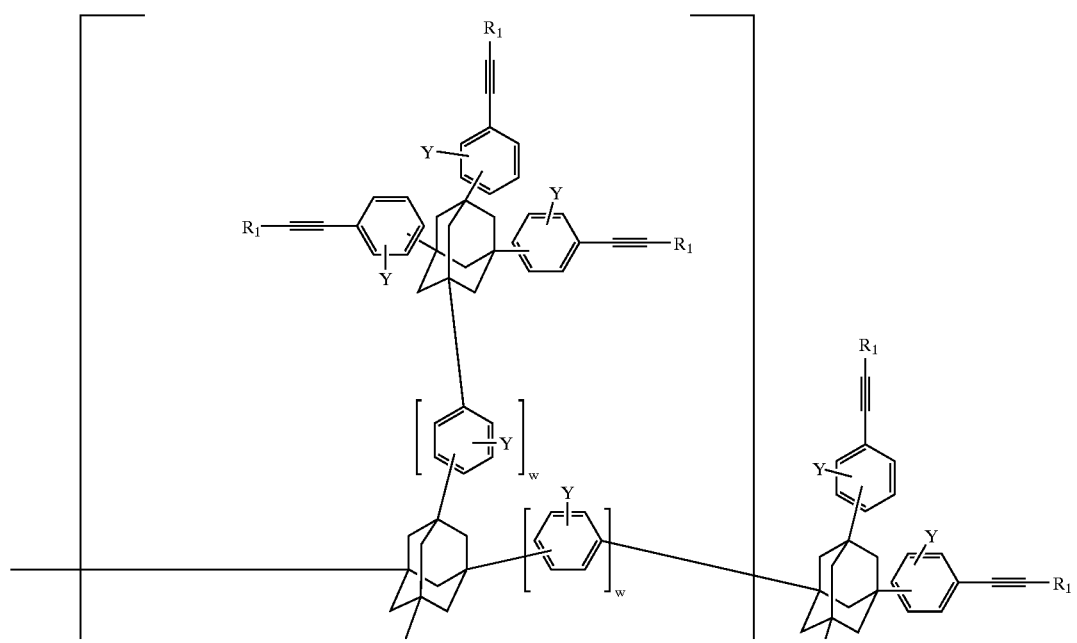

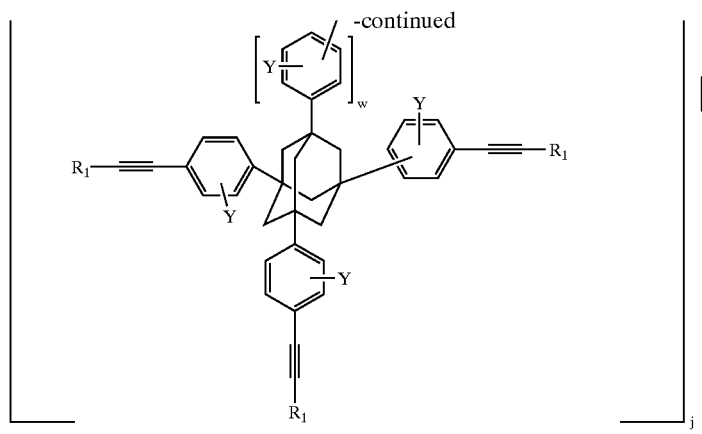
or (1) diamantane monomer of Formula IXA
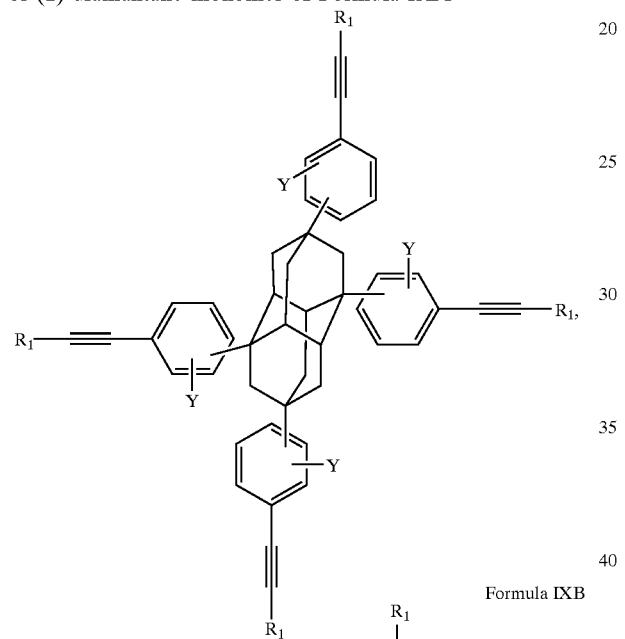
Formula IXB
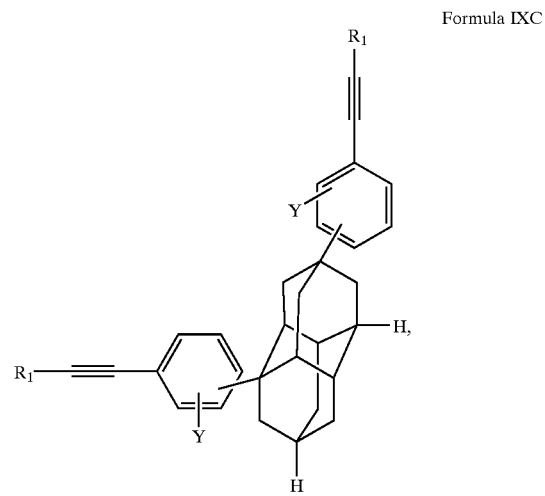
Formula IXC
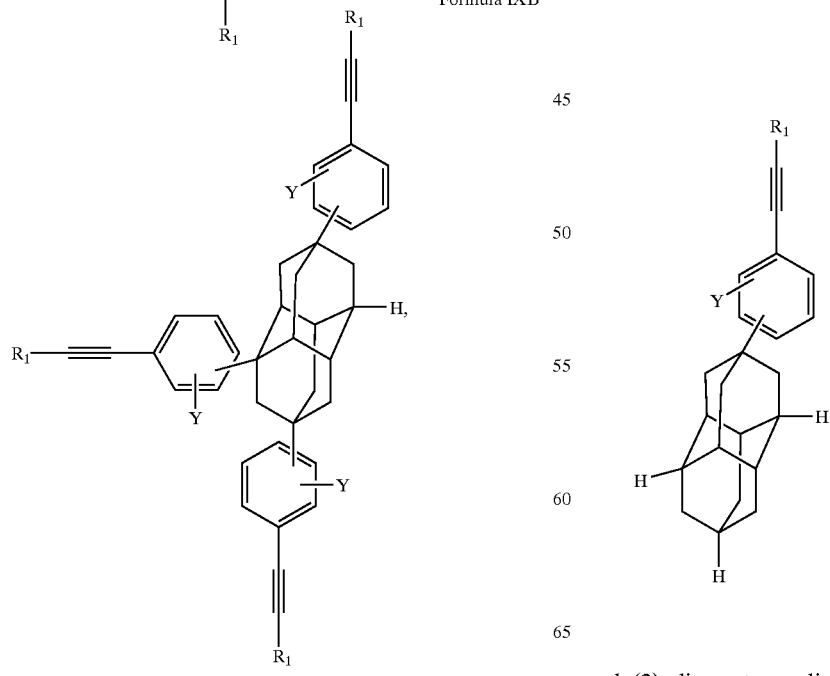
Formula IXD
and (2) diamantane oligomer or polymer of Formula X

171
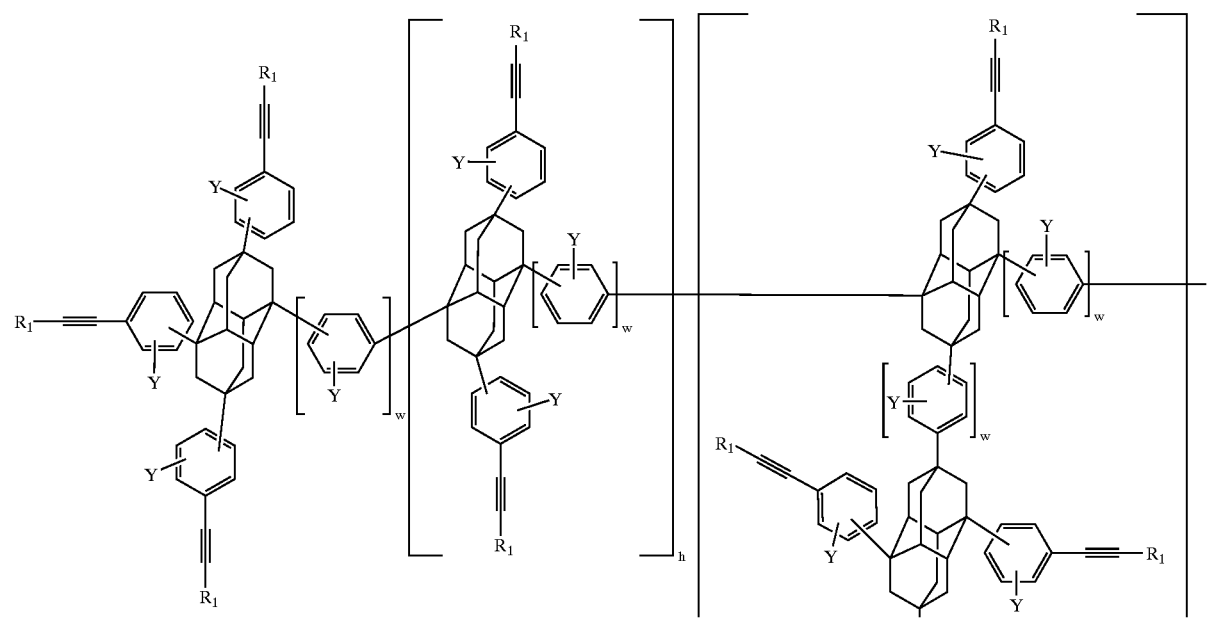
172
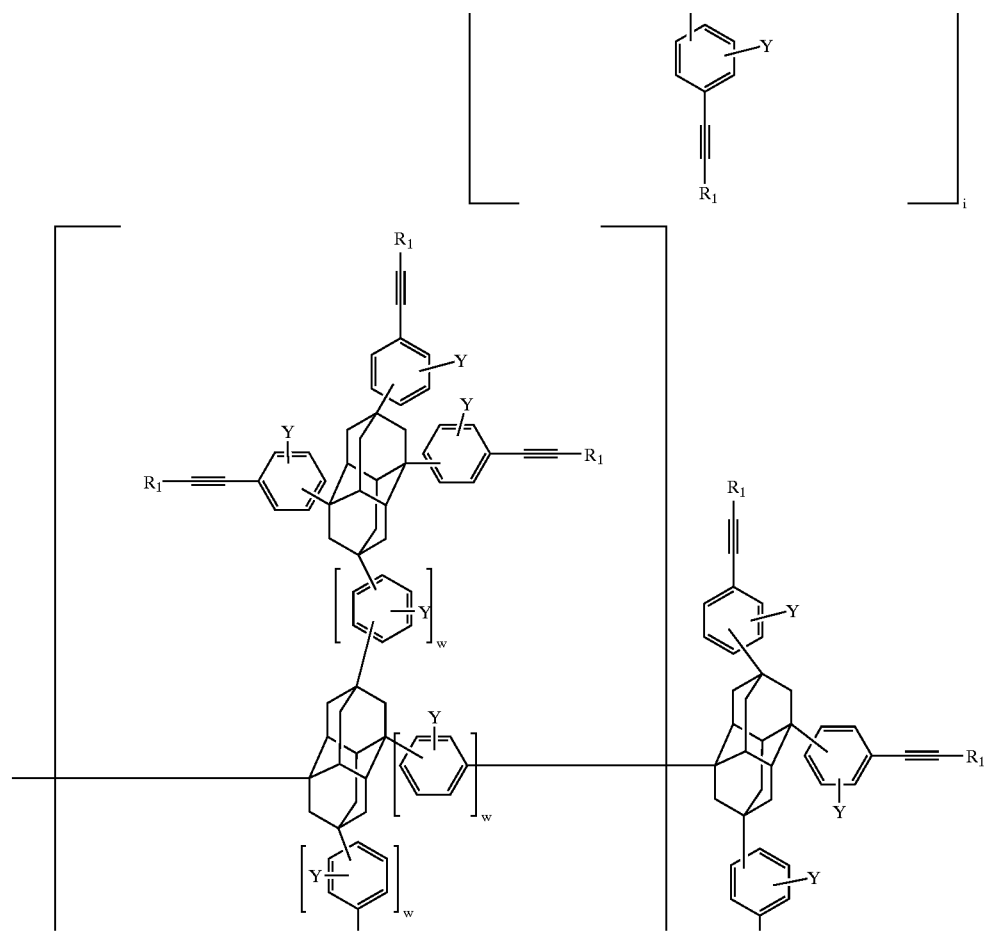

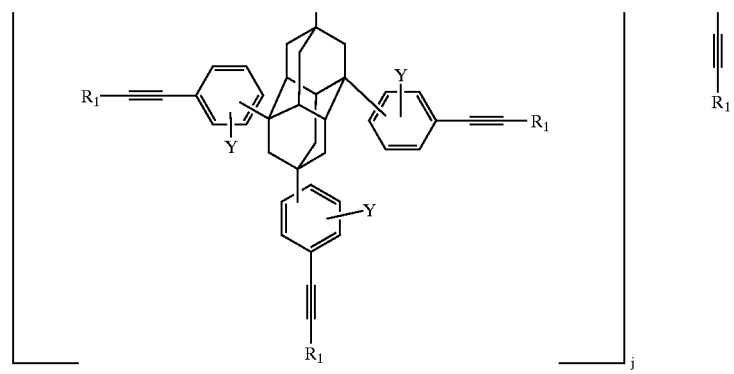

where said h is from 0 to 10; said i is from 0 to 10; said j is from 0 to 10; each of said R is the same or different and selected from hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl; and each of said Y is same or different and is selected from hydrogen, alkyl, aryl, substituted aryl, or halogen.

34. The method of claim 29, additionally comprising the step of:

curing said applied composition by furnace, hot plate, electron beam, microwave, or ultraviolet radiation.

35. The method of claim 33 wherein said $R_1$ is aryl or substituted aryl and said Y is hydrogen, phenyl, or biphenyl.

36. The method of claim 35 wherein said adamantane monomer of Formula VIIA, VIIB, VIIC, or VIID is present in an amount of about 30 to about 70 area-% and said adamantane oligomer or polymer of Formula VIII is present in an amount of about 70 to about 30 area-%, preferably in an amount of about 40 to about 60 area-% and said adamantane oligomer or polymer of Formula VIII is present in an amount of about 60 to about 40 area-%, and more preferably in an amount of about 45 to about 55 area-% and said adamantane oligomer or polymer of Formula VIII is present in an amount of about 55 to about 45 area-%, wherein area-% is defined as the peak area belonging to the monomer or the peak area belonging to the oligomer or polymer, which is related to the total of all the peak areas in the chromatogram.

37. The method of claim 35 wherein said (2) adamantane oligomer or polymer is of Formula XVII where h is 0 or 1 or said (2) diamantane oligomer or polymer is of Formula XVIII where h is 0 or 1

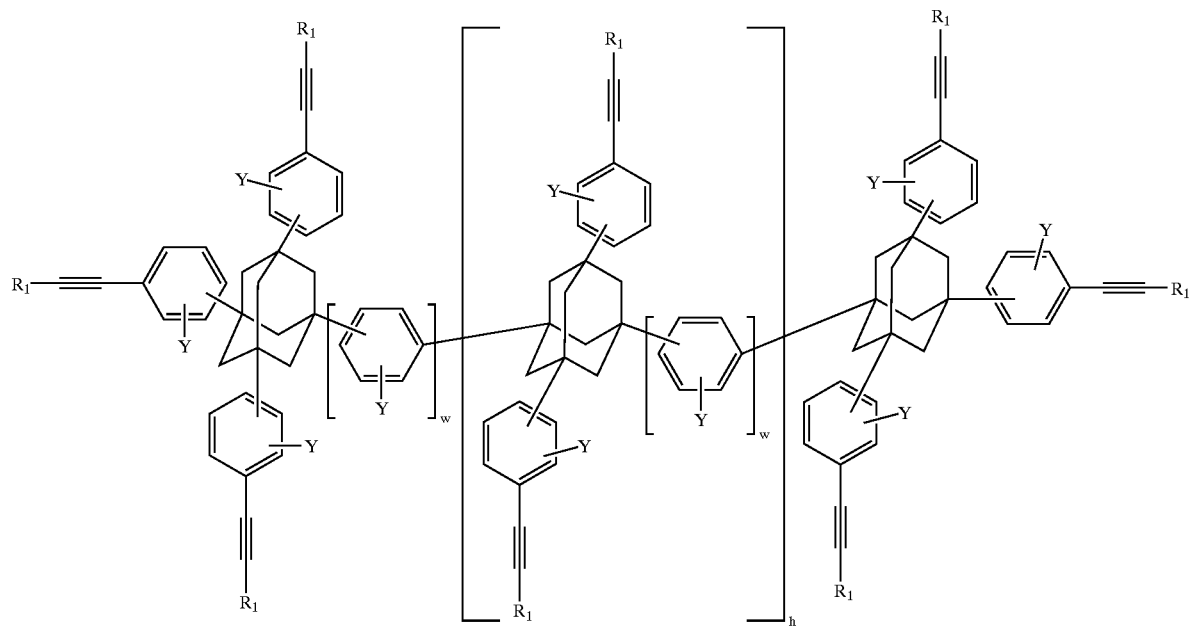

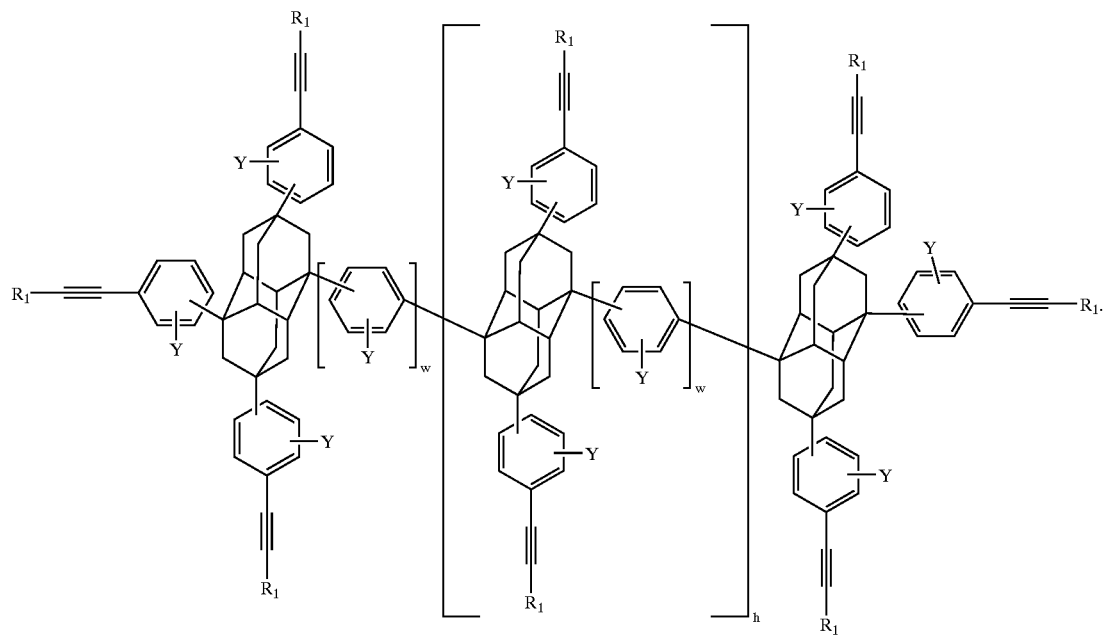
38. The method of claim 35 wherein said (2) adamantane oligomer or polymer is dimer of Formula XIX or said (2) diamantane oligomer or polymer is dimer of Formula XX
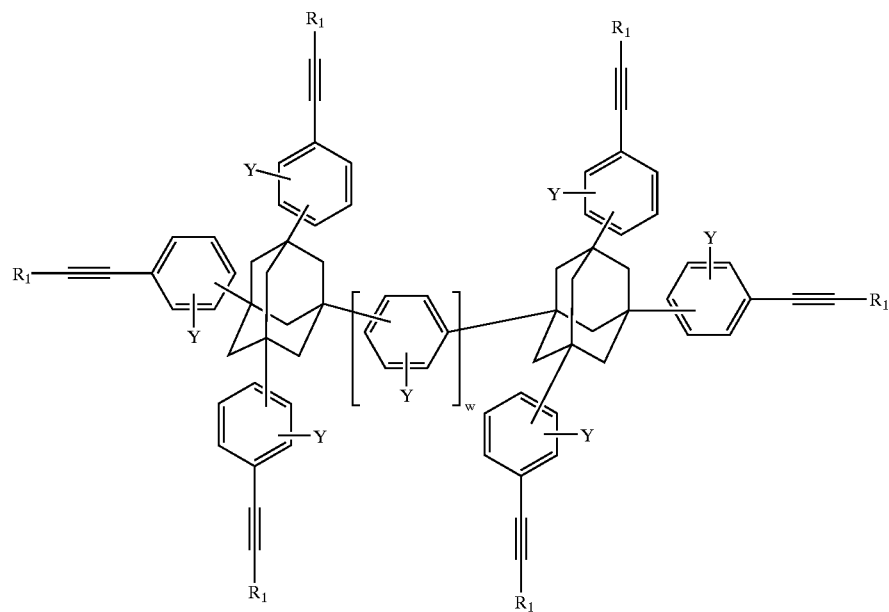

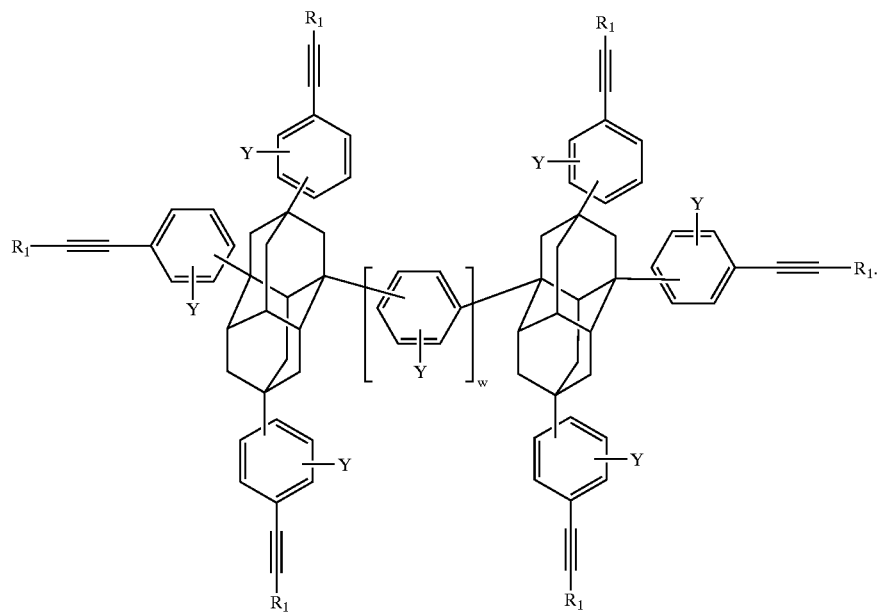
39. The method of claim 35 wherein said (2) adamantane oligomer or polymer is of trimer Formula XXI
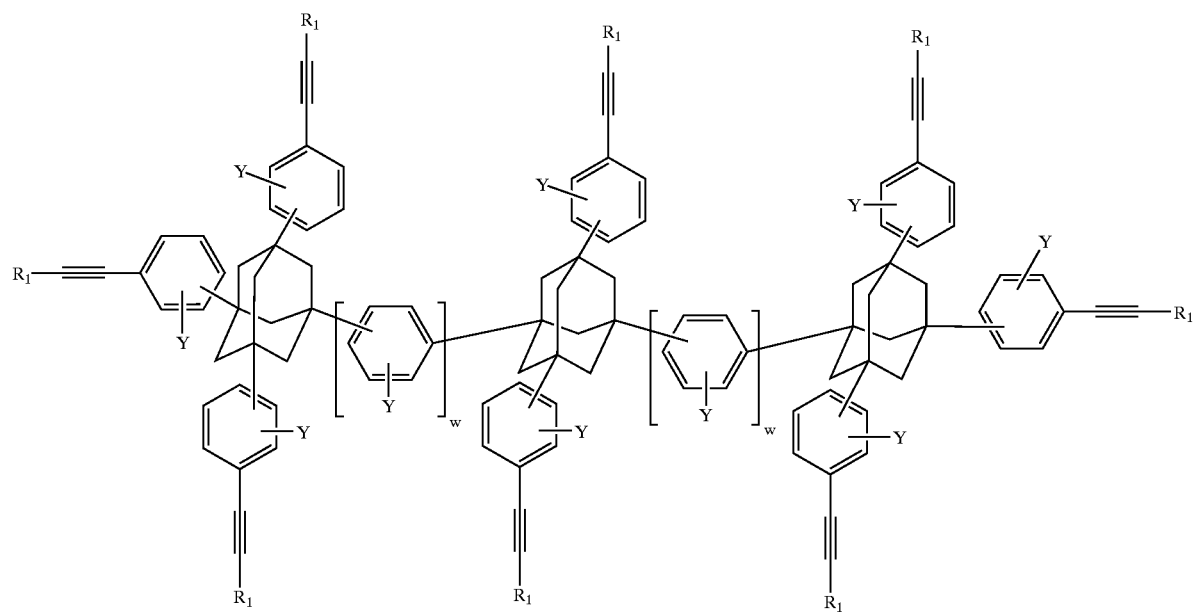
or said (2) diamantane oligomer or polymer is trimer of Formula XXII

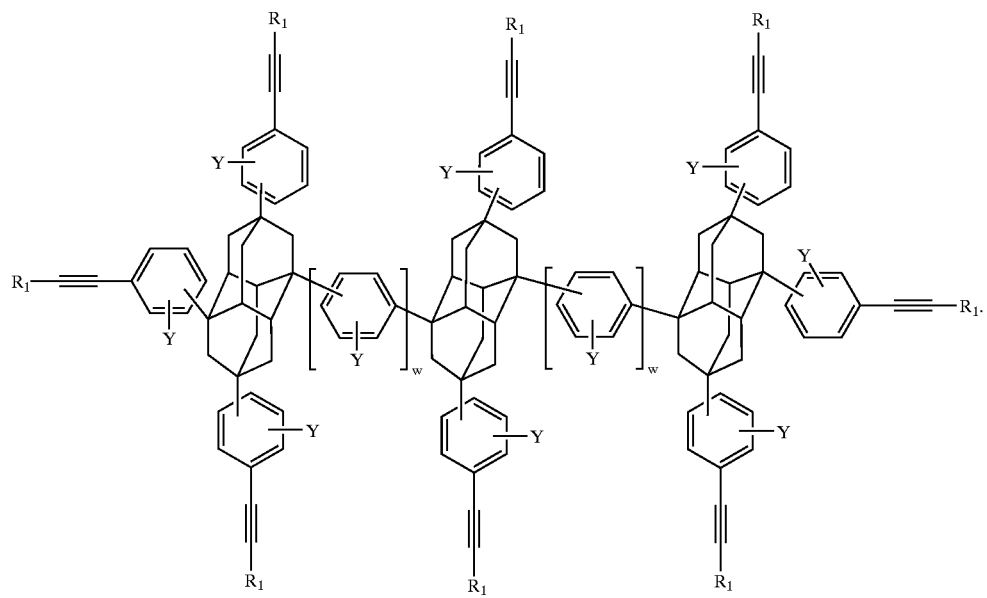
40. The method of claim 35 wherein said (2) adamantane oligomer or polymer is a mixture of Formula XXI
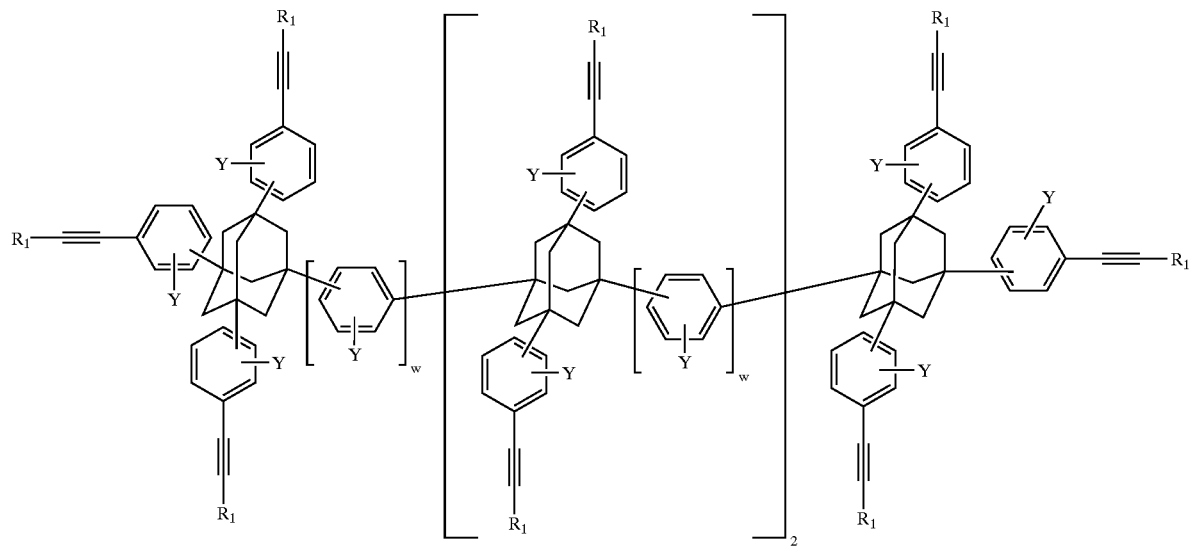
and of Formula XXV

181 182
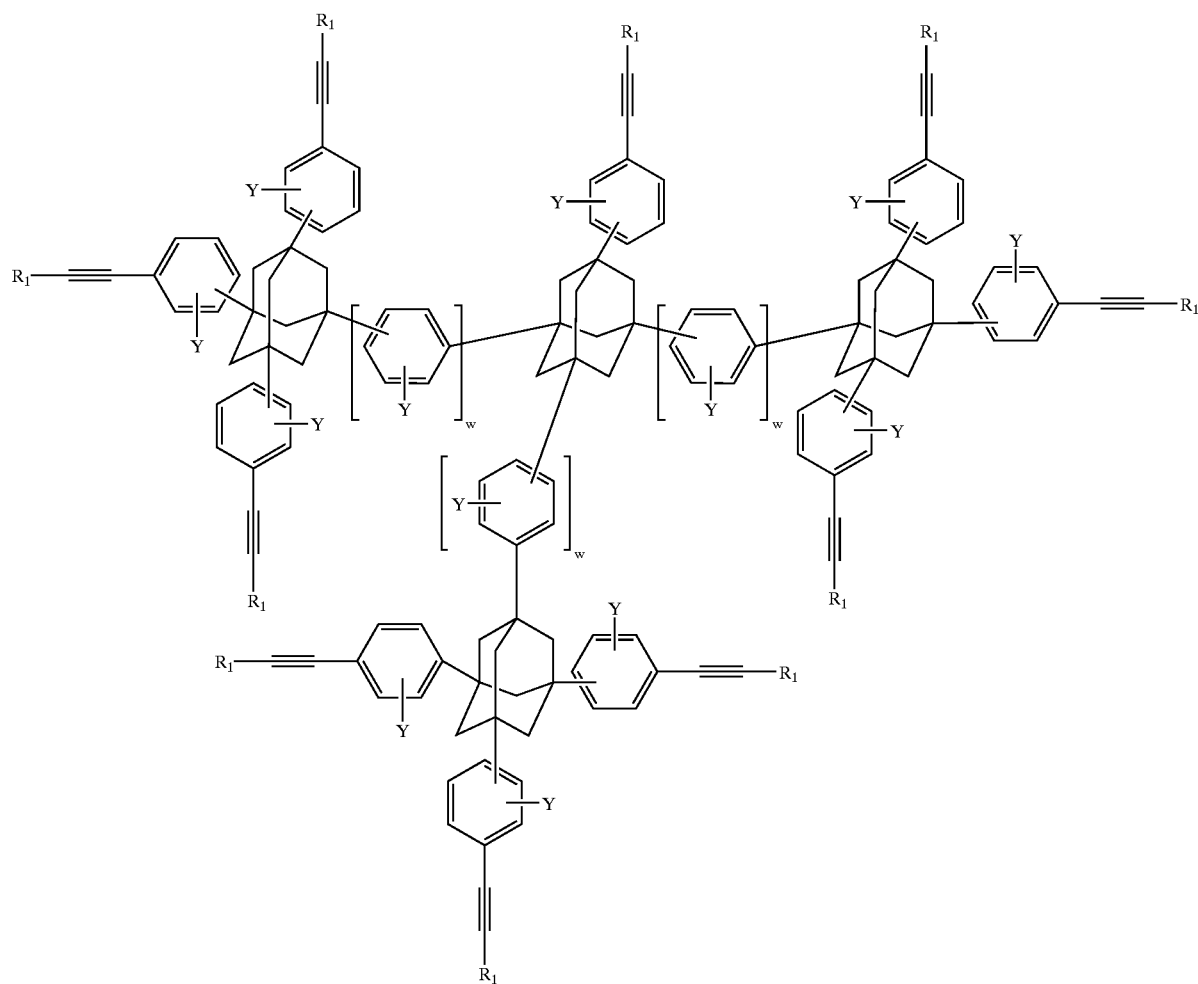
or said (2) diamantane oligomer or polymer is a mixture of
Formula X
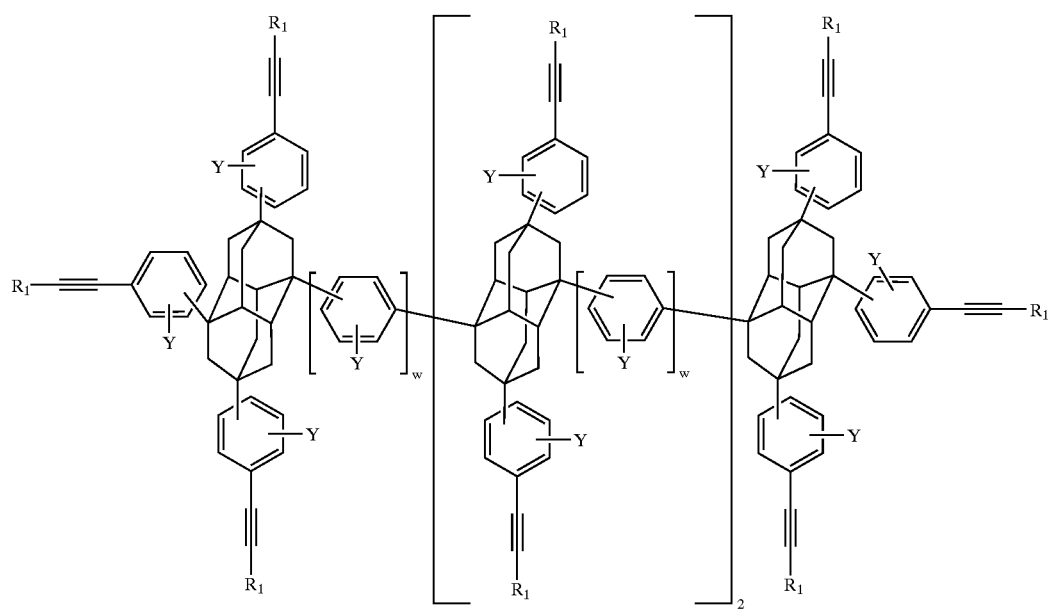

and of Formula XXVI
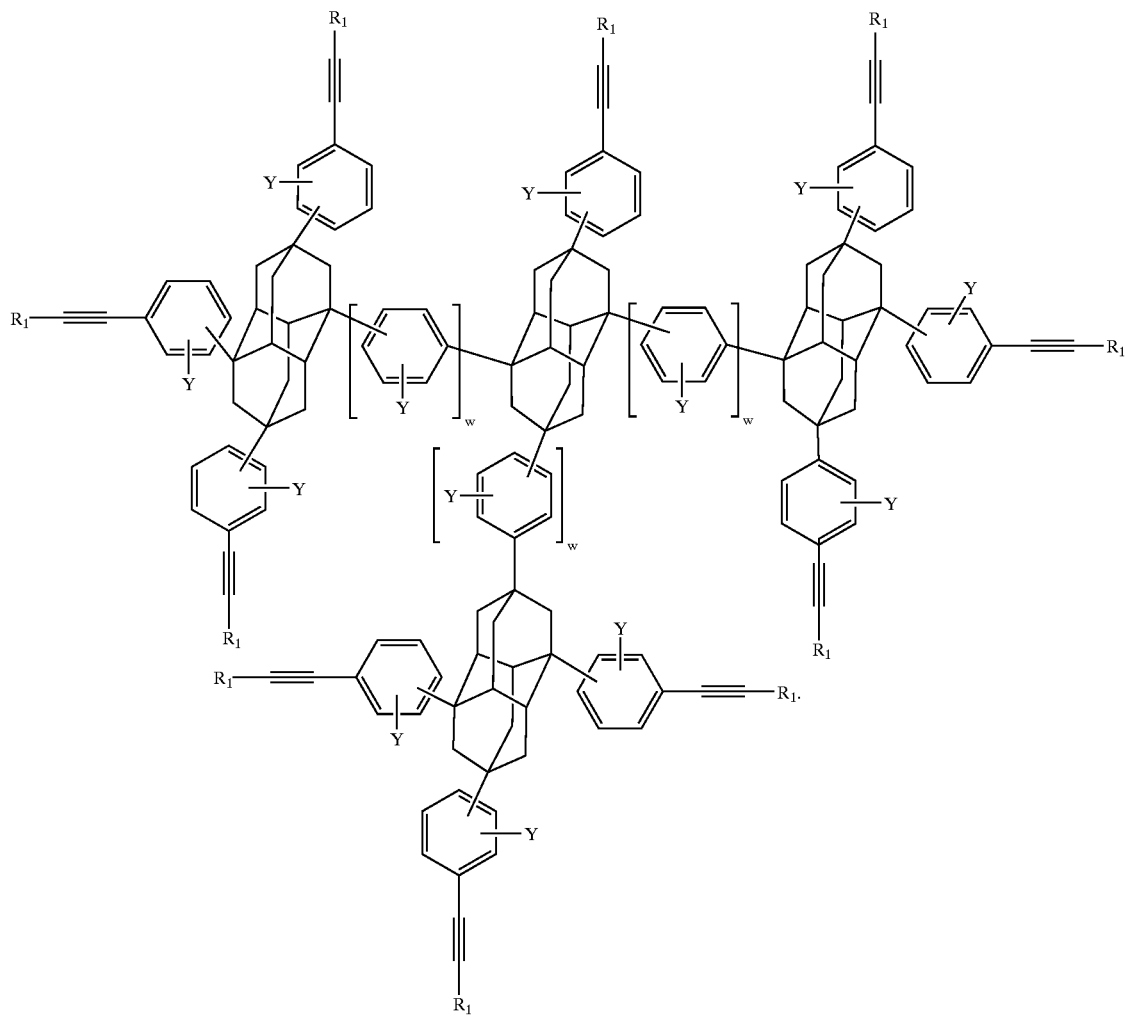
41. The method of claim 35 wherein said thermosetting component (a), said monomer (1) and said oligomer or polymer (2) are adamantane based components.
42. The method of claim 35 wherein said thermosetting component (a), said oligomer or polymer (2) comprises a mixture of adamantane dimer of Formula XIX
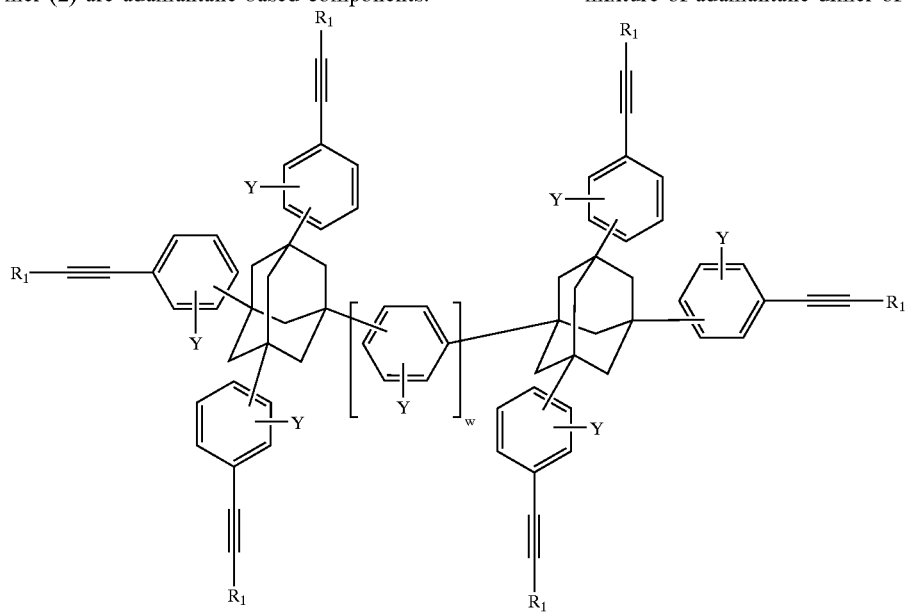

and adamantane trimer of Formula XXI
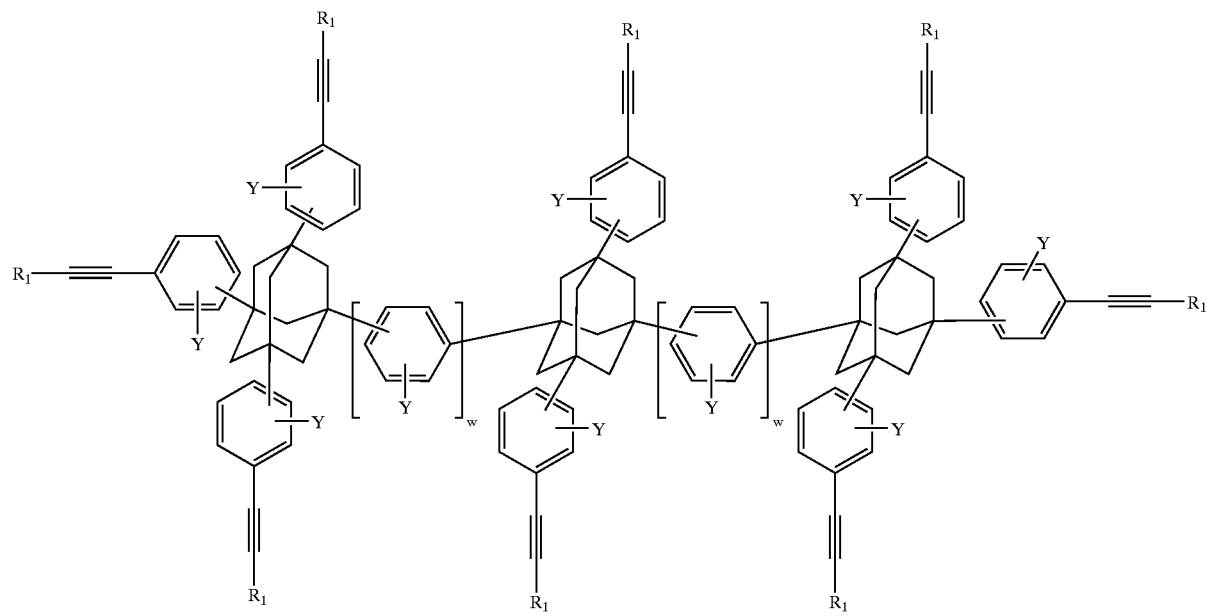
or diamantane dimer of Formula XX
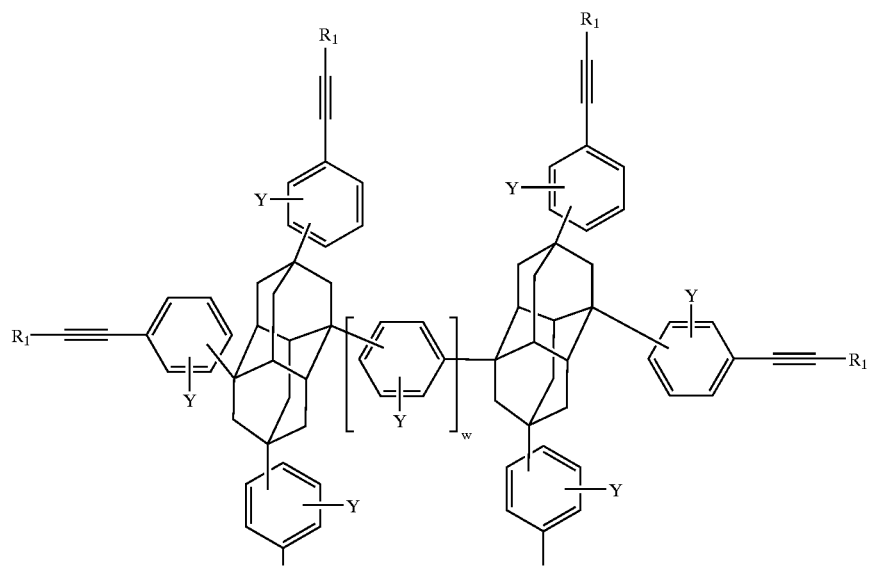
and diamantane trimer of Formula XXII

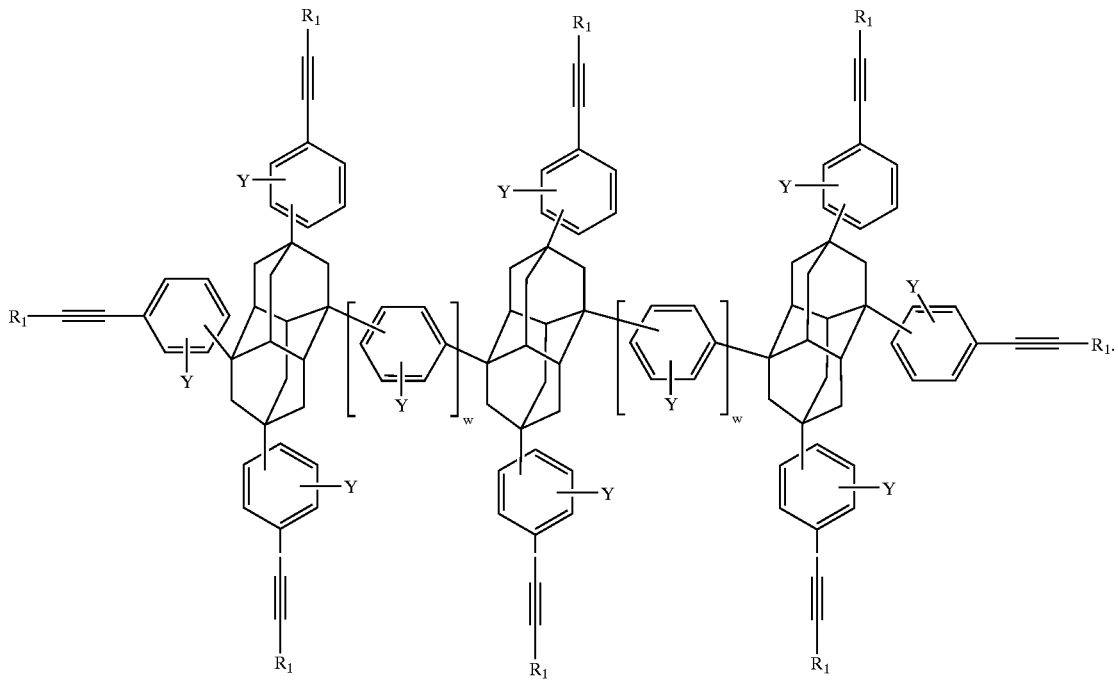

43. The method of claim 42 wherein at least two of said R$_1$C≡C groups on said phenyl groups are two different isomers and at least one of said phenyl groups between two bridgehead carbons of said adamantane monomers exists as two different isomers.

44. The method of claim 43, wherein said at least two isomers are meta- and para-isomers.

45. The method of claim 44 comprising at least two of said oligomer or polymer.

46. The method of claim 35 wherein at least one of said first functionality and said second functionality of said adhesion promoter (b) is selected from the group consisting of Si containing groups; N containing groups; C bonded to O containing groups; hydroxyl-containing groups; and C double bonded to C containing groups.

47. The method of claim 46 wherein said Si containing groups are selected from the group consisting of Si—H, Si—O, and Si—N; said N containing groups are selected from the group consisting of amines, imines, amides, and imides; said C bonded to O containing groups are selected from the group consisting of carbonyl groups, esters, —COOH, alkoxyls having 1 to 5 carbon atoms, ethers, glycidyl ethers, and epoxies; said hydroxyl group is phenol; and said C double bonded to C containing groups are selected from the group consisting of allyl and vinyl groups.

48. The method of claim 46 wherein said Si containing group is selected from silanes of the Formula XI: (R$_2$)$_k$(R$_3$)$_l$Si(R$_4$)$_m$(R$_5$)$_n$ wherein R$_2$, R$_3$, R$_4$, and R$_5$ each independently represents hydrogen, hydroxyl, unsaturated or saturated alkyl, substituted or unsubstituted alkyl where the substituent is amino or epoxy, unsaturated or saturated alkoxyl, unsaturated or saturated carboxylic acid radical, or aryl, at least two of said R$_2$, R$_3$, R$_4$, and R$_5$ represent hydrogen, hydroxyl, saturated or unsaturated alkoxyl, unsaturated alkyl, or unsaturated carboxylic acid radical, and k+l+m+n≦4; or polycarbosilane of the Formula XII:

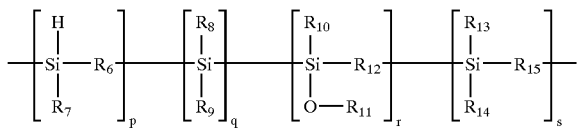

in which R$_6$, R$_{12}$, and R$_{15}$ each independently represents substituted or unsubstituted alkylene, cycloalkylene, vinylene, allylene, or arylene; R$_7$, R$_8$, R$_9$, R$_{10}$, R$_{13}$, and R$_{14}$ each independently represents hydrogen atom, alkyl, alkylene, vinyl, cycloalkyl, allyl, aryl, or arylene and may be linear or branched, R$_{11}$ represents organosilicon, silanyl, siloxyl, or organo group, and p, q, r, and s satisfy the conditions of [4≦p +q +r +s ≦100,000], and q and r and s may collectively or independently be zero;

said C bonded to O containing groups are selected from glycidyl ethers, or esters of unsaturated carboxylic acids containing at least one carboxylic acid group;

said C double bonded to C containing groups is vinyl cyclic oligomers or polymers where the cyclic group is vinyl, aromatic, or heteroaromatic; and said hydroxyl-containing group is phenol-formaldehyde resins or oligomers of the Formula IX:—[R$_{16}$C$_6$H$_2$(OH)(R$_{17}$)]$_t$— where R$_{16}$ is substituted or unsubstituted alkylene, cycloalkylene, vinyl, allyl, or aryl, R$_{17}$ is alkyl, alkylene, vinylene, cycloalkylene, allylene, or aryl, and t=3–100.

49. The method of claim 48 wherein said adhesion promoter (b) is said phenol-formaldehyde resin or oligomer.

50. A mixture of at least two different isomers of Formula XXI

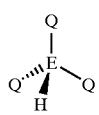

where said E is a cage compound and each of said Q is the same or different and selected from hydrogen, aryl, branched aryl, and substituted aryl.

51. The mixture of claim 50 wherein said mixture comprises at least two different isomers of Formula XXXIII

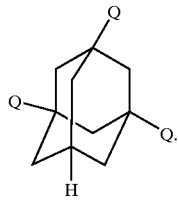

52. The mixture of claim 1 wherein said mixture comprises at least two different isomers of Formula XXXIV

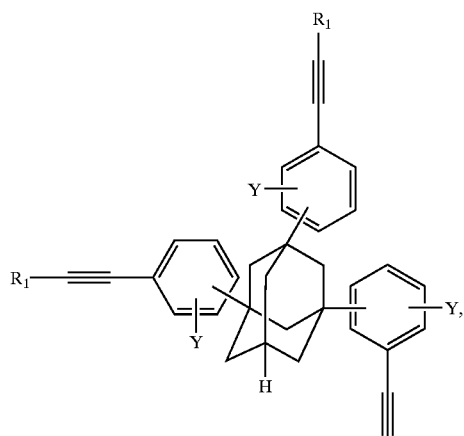

Formula XXXVI

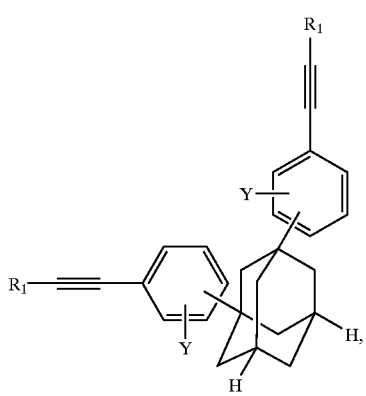

Formula XXXVII

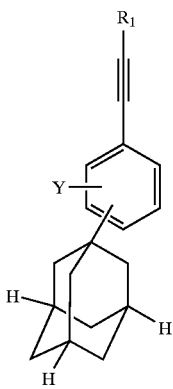

where each of said Y is the same or different and selected from hydrogen, alkyl, aryl, substituted aryl, or halogen and each of said R is the same or different and selected from hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl.

53. The mixture of claim 50 wherein said mixture comprises at least two different isomers of Formula XXXVII

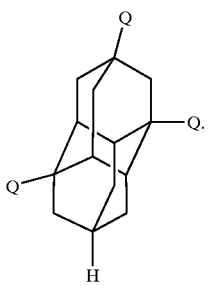

54. The mixture of claim 53 wherein the mixture comprises at least two different isomers of Formula XXXVIII

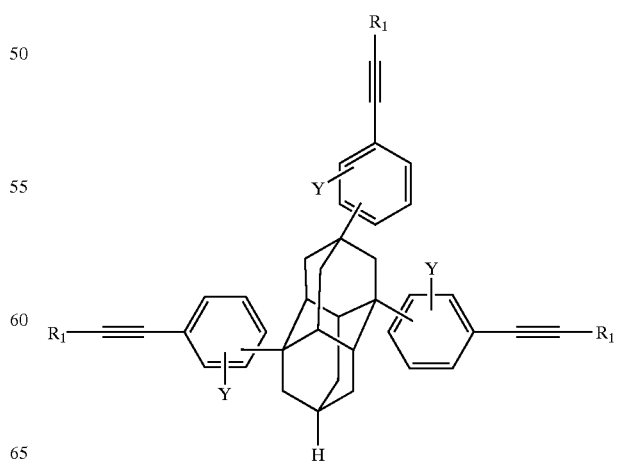

Formula XXXIX

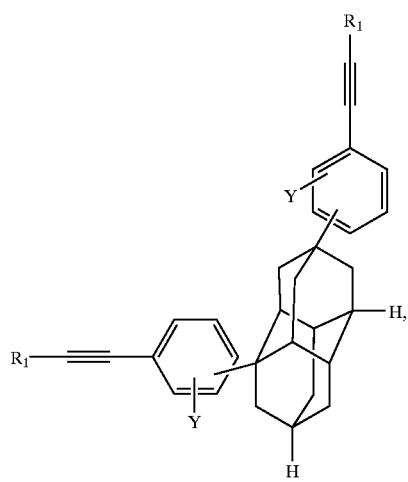

or

Formula XXXX

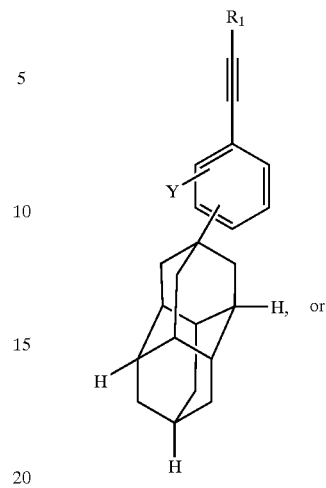

where each of said Y is the same or different and selected from hydrogen, alkyl, aryl, substituted aryl, or halogen and each of said R is the same or different and selected from hydrogen, halogen, alkyl, aryl, substituted aryl, heteroaryl, aryl ether, alkenyl, alkynyl, alkoxyl, hydroxyalkyl, hydroxyaryl, hydroxyalkenyl, hydroxyalkynyl, hydroxyl, or carboxyl.

* * * * *